US011515317B2

(12) United States Patent
Iwai et al.

(10) Patent No.: US 11,515,317 B2
(45) Date of Patent: Nov. 29, 2022

(54) THREE-DIMENSIONAL MEMORY DEVICE INCLUDING THROUGH-MEMORY-LEVEL VIA STRUCTURES AND METHODS OF MAKING THE SAME

(71) Applicant: SANDISK TECHNOLOGIES LLC, Addison, TX (US)

(72) Inventors: Takaaki Iwai, Yokkaichi (JP); Junpei Kanazawa, Yokkaichi (JP); Hisakazu Otoi, Yokkaichi (JP); Hironori Matsuoka, Nagoya (JP); Raiden Matsuno, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 228 days.

(21) Appl. No.: 16/893,995

(22) Filed: Jun. 5, 2020

(65) Prior Publication Data

US 2021/0384207 A1 Dec. 9, 2021

(51) Int. Cl.
*H01L 27/11582* (2017.01)
*H01L 27/11539* (2017.01)
(Continued)

(52) U.S. Cl.
CPC .. *H01L 27/11539* (2013.01); *H01L 27/11519* (2013.01); *H01L 27/11556* (2013.01); *H01L 27/11565* (2013.01); *H01L 27/11582* (2013.01)

(58) Field of Classification Search
CPC .................... H01L 27/11578; H01L 27/11582
See application file for complete search history.

(56) References Cited

U.S. PATENT DOCUMENTS 5,915,167 A 6/1999 Leedy
9,230,987 B2 1/2016 Pachamuthu et al.
(Continued)

FOREIGN PATENT DOCUMENTS

WO WO 2020/073158 A1 4/2020

OTHER PUBLICATIONS

U.S. Appl. No. 16/251,863, filed Jan. 18, 2019, SanDisk Technologies LLC.
(Continued)

*Primary Examiner* — Christopher A Johnson
(74) *Attorney, Agent, or Firm* — The Marbury Law Group PLLC

(57) ABSTRACT

A three-dimensional memory device can include at least one alternating stack of insulating layers and electrically conductive layers located over a semiconductor material layer, memory stack structures vertically extending through the at least one alternating stack, and a vertical stack of dielectric plates interlaced with laterally extending portions of the insulating layers of the at least one alternating stack. A conductive via structure can vertically extend through each dielectric plate and the insulating layers, and can contact an underlying metal interconnect structure. Additionally or alternatively, support pillar structures can vertically extend through the vertical stack of dielectric plates and into an opening through the semiconductor material layer, and can contact lower-level dielectric material layers embedding the underlying metal interconnect structure to enhance structural support to the three-dimensional memory device during manufacture.

15 Claims, 136 Drawing Sheets

(51) Int. Cl.

| | |
|---|---|
| ***H01L 27/11519*** | (2017.01) |
| ***H01L 27/11565*** | (2017.01) |
| ***H01L 27/11556*** | (2017.01) |

(56) References Cited

U.S. PATENT DOCUMENTS

| | | | |
|---|---|---|---|
| 9,412,749 | B1 | 8/2016 | Shimabukuro et al. |
| 9,576,967 | B1 | 2/2017 | Kimura et al. |
| 9,659,956 | B1 | 5/2017 | Pachamuthu et al. |
| 9,673,213 | B1 | 6/2017 | Yu et al. |
| 9,754,963 | B1 | 9/2017 | Kawamura et al. |
| 9,806,093 | B2 | 10/2017 | Toyama et al. |
| 9,818,693 | B2 | 11/2017 | Toyama et al. |
| 9,818,759 | B2 | 11/2017 | Kai et al. |
| 9,853,038 | B1 | 12/2017 | Cui |
| 9,876,031 | B1 | 1/2018 | Shimizu et al. |
| 9,881,929 | B1 | 1/2018 | Ravikirthi et al. |
| 9,905,573 | B1 | 2/2018 | Mada et al. |
| 9,978,766 | B1 | 5/2018 | Hosoda et al. |
| 10,014,316 | B2 | 7/2018 | Yu et al. |
| 10,038,006 | B2 | 7/2018 | Furihata et al. |
| 10,115,632 | B1 | 10/2018 | Masamori et al. |
| 10,141,331 | B1 | 11/2018 | Susuki et al. |
| 10,249,640 | B2 | 4/2019 | Yu et al. |
| 10,256,245 | B2 | 4/2019 | Ariyoshi |
| 10,269,820 | B1 | 4/2019 | Kaminaga |
| 10,290,645 | B2 | 5/2019 | Nakatsuji et al. |
| 10,290,648 | B1 | 5/2019 | Zhou et al. |
| 10,304,852 | B1 | 5/2019 | Cui et al. |
| 10,381,434 | B1 | 8/2019 | Pachamuthu et al. |
| 10,475,879 | B1 | 11/2019 | Pachamuthu et al. |
| 10,672,780 | B1 | 6/2020 | Kawamura et al. |
| 2015/0236038 | A1 | 8/2015 | Pachamuthu et al. |
| 2017/0179026 | A1 | 6/2017 | Toyama et al. |
| 2017/0179151 | A1 | 6/2017 | Kai et al. |
| 2017/0179152 | A1 | 6/2017 | Toyama et al. |
| 2017/0179153 | A1 | 6/2017 | Ogawa et al. |
| 2017/0179154 | A1 | 6/2017 | Furihata et al. |
| 2017/0236746 | A1 | 8/2017 | Yu et al. |
| 2017/0358593 | A1* | 12/2017 | Yu ...................... H01L 27/1157 |
| 2018/0061850 | A1 | 3/2018 | Mada et al. |
| 2018/0108671 | A1 | 4/2018 | Yu et al. |
| 2018/0130812 | A1 | 5/2018 | Hosoda et al. |
| 2018/0226364 | A1 | 8/2018 | Kim et al. |
| 2018/0261613 | A1 | 9/2018 | Ariyoshi |
| 2018/0301374 | A1 | 10/2018 | Masamori et al. |
| 2018/0342531 | A1 | 11/2018 | Susuki et al. |
| 2019/0006381 | A1 | 1/2019 | Nakatsuji et al. |
| 2019/0043830 | A1 | 2/2019 | Sakakibara et al. |
| 2019/0252396 | A1 | 8/2019 | Mushiga et al. |
| 2019/0252403 | A1 | 8/2019 | Kamaniga et al. |
| 2019/0252404 | A1 | 8/2019 | Kamaniga |
| 2020/0035694 | A1 | 1/2020 | Kamaniga |

OTHER PUBLICATIONS

U.S. Appl. No. 16/276,952, filed Feb. 15, 2019, SanDisk Technologies LLC.

U.S. Appl. No. 16/276,996, filed Feb. 15, 2019, SanDisk Technologies LLC.

U.S. Appl. No. 16/361,773, filed Mar. 22, 2019, SanDisk Technologies LLC.

U.S. Appl. No. 16/368,007, filed Mar. 28, 2019, SanDisk Technologies LLC.

U.S. Appl. No. 16/444,125, filed Jun. 18, 2019, SanDisk Technologies LLC.

U.S. Appl. No. 16/444,186, filed Jun. 18, 2019, SanDisk Technologies LLC.

U.S. Appl. No. 16/519,260, filed Jul. 23, 2019, SanDisk Technologies LLC.

U.S. Appl. No. 16/671,561, filed Nov. 1, 2019, SanDisk Technologies LLC.

U.S. Appl. No. 16/692,027, filed Nov. 22, 2019, SanDisk Technologies LLC.

U.S. Appl. No. 16/735,854, filed Jan. 7, 2020, SanDisk Technologies LLC.

U.S. Appl. No. 16/809,861, filed Mar. 5, 2020, SanDisk Technologies LLC.

U.S. Appl. No. 16/876,370, filed May 18, 2020, SanDisk Technologies LLC.

Iwai, T. et al., "Three-Dimensional Memory Device Including Through-Memory-Level Via Structures and Methods of Making the Same," U.S. Appl. No. 16/893,933, filed Jun. 5, 2020.

Notification of Transmittal of the International Search Report and the Written Opinion of the International Searching Authority for International Patent Application No. PCT/US2020/067154, dated Apr. 20, 2021, 12 pages.

USPTO Office Communication, Notice of Allowance and Fee(s) Due for U.S. Appl. No. 16/893,933, dated Mar. 23, 2022, 23 pages.

* cited by examiner

THREE-DIMENSIONAL MEMORY DEVICE INCLUDING THROUGH-MEMORY-LEVEL VIA STRUCTURES AND METHODS OF MAKING THE SAME

FIELD

The present disclosure relates generally to the field of semiconductor devices and specifically to a three-dimensional memory device including through-memory-level via structures and methods of making the same.

BACKGROUND

Three-dimensional memory devices may include memory stack structures. The memory stack structures overlie a substrate and extend through an alternating stack of insulating layers and electrically conductive layers. The memory stack structures include vertical stacks of memory elements provided at levels of the electrically conductive layers. Peripheral devices may be provided on the substrate underneath the alternating stack and the memory stack structures.

SUMMARY

According to an aspect of the present disclosure, a three-dimensional memory device is provided, which comprises: at least one alternating stack of insulating layers and electrically conductive layers located over an underlying interconnect structure; memory stack structures vertically extending through the at least one alternating stack; a vertical stack of dielectric oxide plates interlaced with laterally extending portions of the insulating layers of the at least one alternating stack, wherein each dielectric oxide plate is located between a respective vertically neighboring pair of insulating layers of the at least one alternating stack; and a conductive via structure vertically extending through each dielectric oxide plate within the vertical stack and each laterally extending portion of the insulating layers of the at least one alternating stack, and contacting the underlying metal interconnect structure.

According to another aspect of the present disclosure, a method of forming a three-dimensional memory device is provided, which comprises: forming at least one alternating stack of insulating layers and sacrificial material layers over an underlying interconnect structure; forming memory stack structures through the at least one alternating stack; forming an access trench through the at least one alternating stack; replacing first portions of the sacrificial material layers that are proximal to the access trench with dielectric oxide plates, wherein the dielectric oxide plates are interlaced with portions of the insulating layers of the at least one alternating stack; replacing second portions of the sacrificial material layers within electrically conductive layers; forming a conductive via structure through the dielectric oxide plates and the insulating layers directly on a top surface of the underlying metal interconnect structure.

According to yet another aspect of the present disclosure, a three-dimensional memory device is provided, which comprises: a semiconductor material layer overlying a substrate and including an opening therein; lower-level dielectric material layers located between the substrate and the semiconductor material layer and extending into the opening in the semiconductor material layer; at least one alternating stack of insulating layers and electrically conductive layers overlying the semiconductor material layer; memory stack structures vertically extending through the at least one alternating stack; a vertical stack of dielectric plates located at each level of the electrically conductive layers; a contact via structure vertically extending through the vertical stack of dielectric plates and through the opening in the semiconductor material layer; first support pillar structures vertically extending through the vertical stack of dielectric plates and contacting a portion of the lower-level dielectric material layers located within the opening in the semiconductor material layer; and second support pillar structures vertically extending through the at least one alternating stack and contacting the semiconductor material layer.

According to still another aspect of the present disclosure, a method of forming a three-dimensional memory device is provided, which comprises: forming lower-level dielectric material layers embedding metal interconnect structures over a substrate; forming a semiconductor material layer including an opening therein over the lower-level dielectric material layers; forming at least one alternating stack of insulating layers and sacrificial material layers over the semiconductor material layer; forming memory stack structures through the at least one alternating stack; forming support pillar structures through the at least one alternating stack, wherein a first subset of the support pillar structures is formed over the opening in the semiconductor material layer on the dielectric material layers, and a second subset of the support pillar structures contacts the semiconductor material layer and does not contact the dielectric material layers; forming a vertical stack of dielectric plates over the opening in the semiconductor material layer by patterning the sacrificial material layers or by replacing portions of the sacrificial material layers that with dielectric material portions; replacing remaining portions of the sacrificial material layers with electrically conductive layers; and forming a contact via structure through the vertical stack of dielectric plates and through the opening in the semiconductor material layer on one of the metal interconnect structures.

BRIEF DESCRIPTION OF THE DRAWINGS

FIG. 47E is a horizontal cross-sectional view of the fourth exemplary structure along the horizontal plane E-E' of FIG. 47B.

FIGS. 48A-48D are vertical cross-sectional views of alternative embodiments of the fourth exemplary structure.

DETAILED DESCRIPTION

Figure 1A:
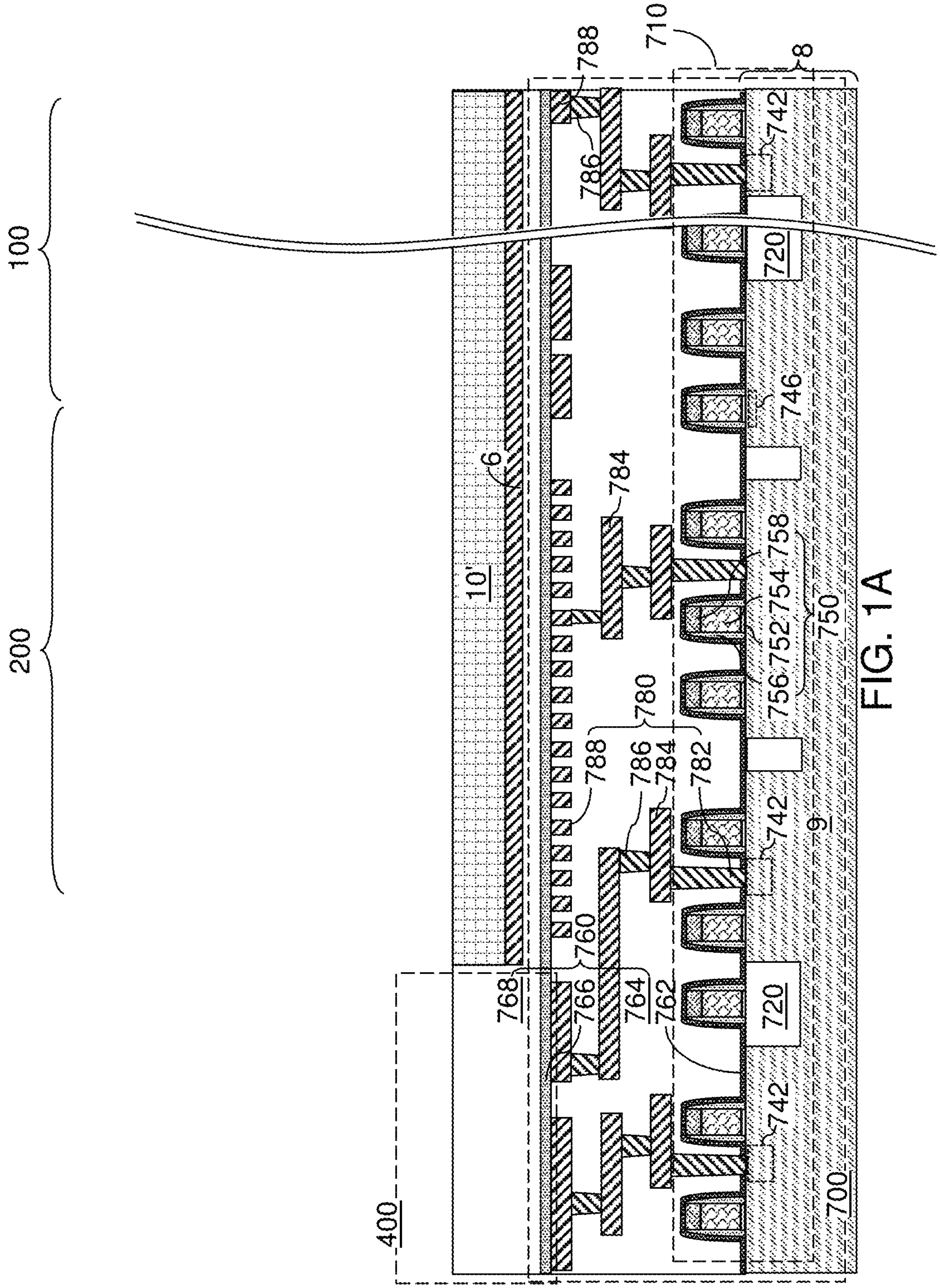
FIG. 1A is a vertical cross-sectional view of a first exemplary structure after formation of semiconductor devices, lower level dielectric layers, lower metal interconnect structures, and in-process source level material layers on a semiconductor substrate according to a first embodiment of the present disclosure.

The embodiments of the present disclosure provide a three-dimensional memory device including throughmemory-level via structures and methods of making the same, the various embodiments of which are described herein in detail.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

A monolithic three-dimensional memory array is a memory array in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Generally, a semiconductor package (or a "package") refers to a unit semiconductor device that can be attached to a circuit board through a set of pins or solder balls. A semiconductor package may include a semiconductor chip (or a "chip") or a plurality of semiconductor chips that are bonded thereamongst, for example, by flip-chip bonding or another chip-to-chip bonding. A package or a chip may include a single semiconductor die (or a "die") or a plurality of semiconductor dies. A die is the smallest unit that can independently execute external commands or report status. Typically, a package or a chip with multiple dies is capable of simultaneously executing as many number of external commands as the total number of planes therein. Each die includes one or more planes. Identical concurrent operations can be executed in each plane within a same die, although there may be some restrictions. In case a die is a memory die, i.e., a die including memory elements, concurrent read operations, concurrent write operations, or concurrent erase operations can be performed in each plane within a same memory die. In a memory die, each plane contains a number of memory blocks (or "blocks"), which are the smallest unit that can be erased by in a single erase operation. Each memory block contains a number of pages, which are the smallest units that can be selected for programming. A page is also the smallest unit that can be selected to a read operation.

Figure 1B:
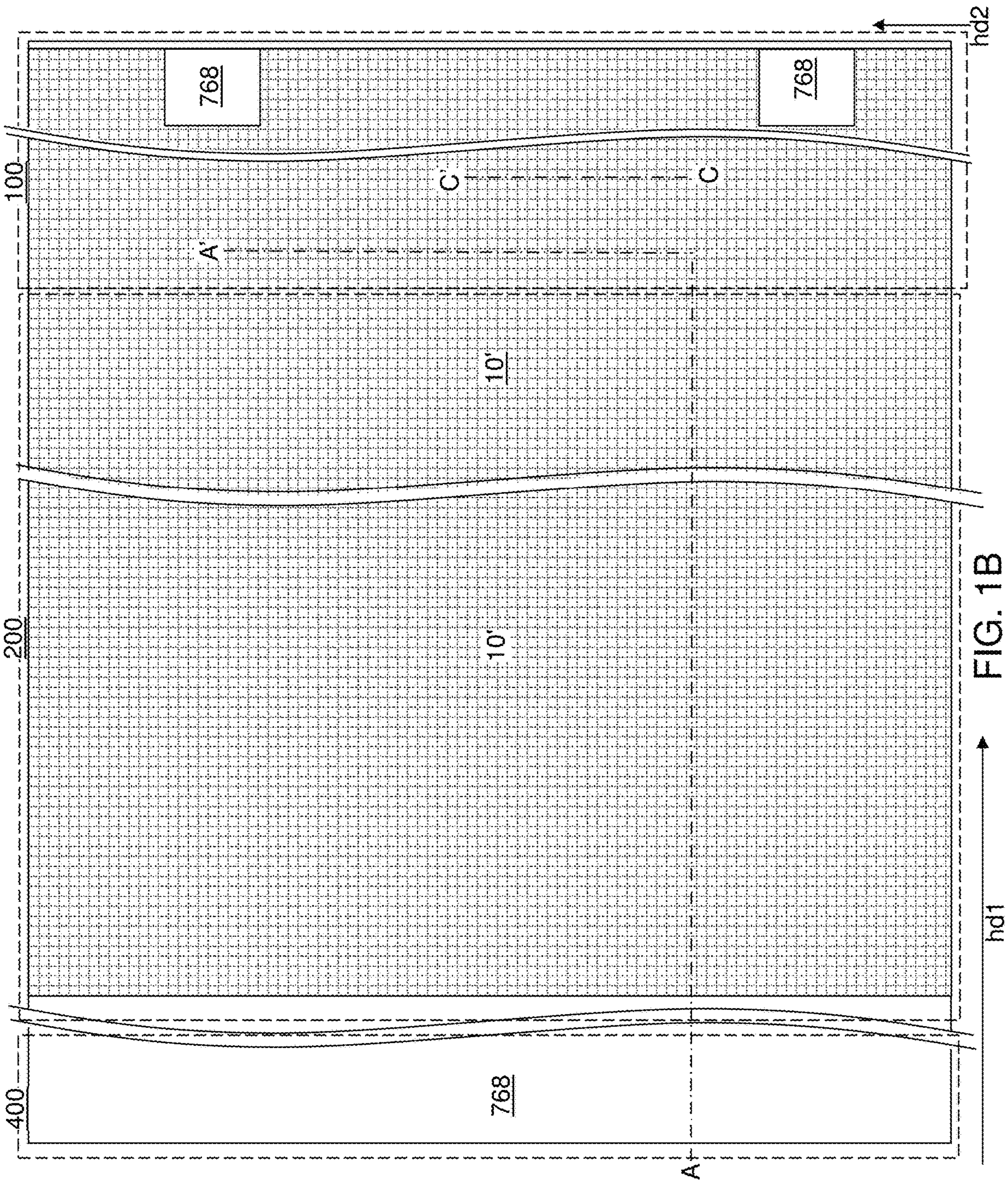
FIG. 1B is a top-down view of the first exemplary structure of FIG. 1A. The hinged vertical plane A-A' is the plane of the vertical cross-sectional view of FIG. 1A.
Figure 1C:
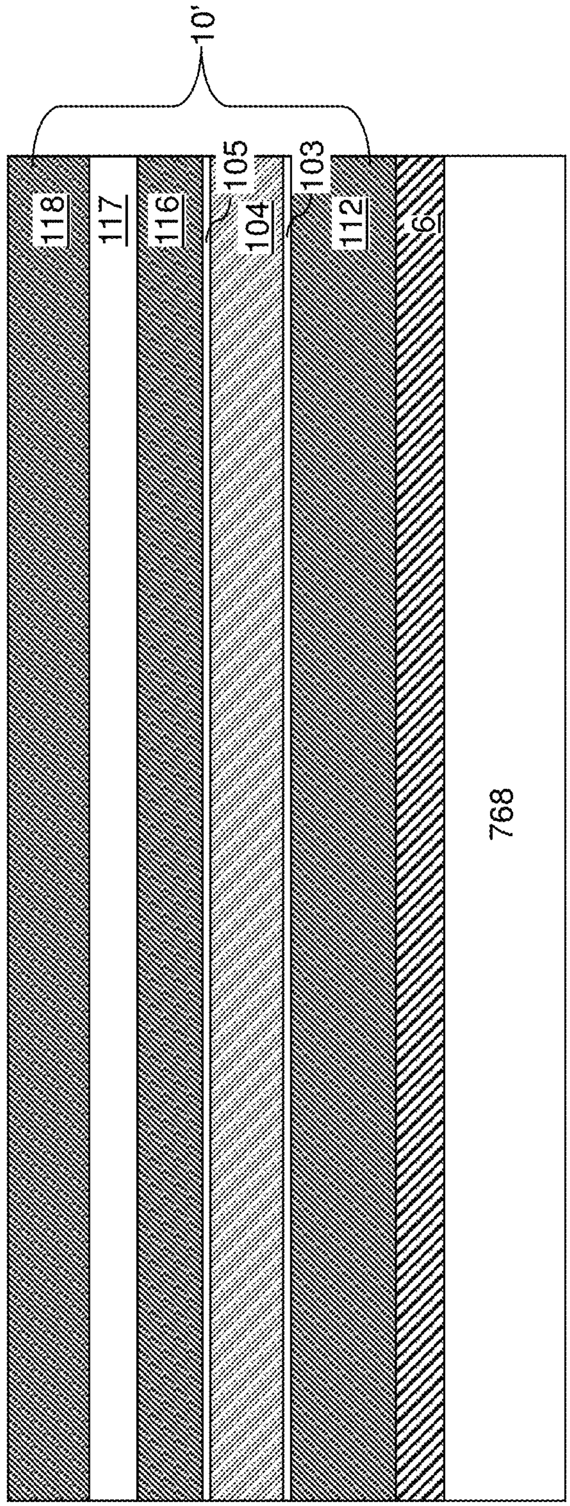
FIG. 1C is a magnified view of the in-process source level material layers along the vertical plane C-C' of FIG. 1B.

Referring to FIGS. 1A-1C, a first exemplary structure according to a first embodiment of the present disclosure is illustrated. FIG. 1C is a magnified view of an in-process source-level material layers 10' illustrated in FIGS. 1A and 1B. The first exemplary structure includes a substrate 8 and semiconductor devices 710 formed thereupon. The substrate 8 may include a substrate semiconductor layer 9 at least at an upper portion thereof. Shallow trench isolation structures 720 may be formed in an upper portion of the substrate semiconductor layer 9 to provide electrical isolation between the semiconductor devices 710. The semiconductor devices 710 may include, for example, field effect transistors including respective transistor active regions 742 (i.e., source regions and drain regions), channel regions 746, and gate structures 750. The field effect transistors may be arranged in a CMOS configuration. Each gate structure 750 may include, for example, a gate dielectric 752, a gate electrode 754, a dielectric gate spacer 756 and a gate cap dielectric 758. The semiconductor devices 710 may include any semiconductor circuitry to support operation of a memory structure to be subsequently formed, which is typically referred to as a driver circuitry, which is also known as peripheral circuitry. As used herein, a peripheral circuitry refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that may be implemented outside a memory array structure for a memory device. For example, the semiconductor devices may include word line switching devices for electrically biasing word lines of three-dimensional memory structures to be subsequently formed.

Dielectric material layers may be formed over the semiconductor devices, which are herein referred to as lower-level dielectric material layers 760. The lower-level dielectric material layers 760 may include, for example, a dielectric liner 762 (such as a silicon nitride liner that blocks diffusion of mobile ions and/or apply appropriate stress to underlying structures), first dielectric material layers 764 that overlie the dielectric liner 762, a silicon nitride layer (e.g., hydrogen diffusion barrier) 766 that overlies the first dielectric material layers 764, and at least one second dielectric layer 768. The dielectric layer stack including the lower-level dielectric material layers 760 may function as a matrix for lower-level metal interconnect structures 780 that provide electrical wiring to and from the various nodes of the semiconductor devices and landing pads for through-memory-level interconnection via structures to be subsequently formed. The lower-level metal interconnect structures 780 may be formed within the dielectric layer stack of the lower-level dielectric material layers 760 and overlies the field effect transistors. The lower-level metal interconnect structures 780 may comprise a lower-level metal line structure located under and optionally contacting a bottom surface of the silicon nitride layer 766.

For example, the lower-level metal interconnect structures 780 may be formed within the first dielectric material layers 764. The first dielectric material layers 764 may be a plurality of dielectric material layers in which various elements of the lower-level metal interconnect structures 780 are sequentially formed. Each dielectric material layer selected from the first dielectric material layers 764 may include any of doped silicate glass, undoped silicate glass, organosilicate glass, silicon nitride, silicon oxynitride, and dielectric metal oxides (such as aluminum oxide). In one embodiment, the first dielectric material layers 764 may comprise, or consist essentially of, dielectric material layers having dielectric constants that do not exceed the dielectric constant of undoped silicate glass (silicon oxide) of 3.9. The lower-level metal interconnect structures 780 may include various device contact via structures 782 (e.g., source and drain electrodes which contact the respective source and drain nodes of the device or gate electrode contacts), intermediate lower-level metal line structures 784, lower-level metal via structures 786, and landing-pad-level metal interconnect structures 788 that are configured to function as landing pads for through-memory-level interconnection via structures to be subsequently formed.

The landing-pad-level metal interconnect structures 788 may be formed within a topmost dielectric material layer of the first dielectric material layers 764 (which may be a plurality of dielectric material layers). Each of the lower-level metal interconnect structures 780 may include a metallic nitride liner and a metal fill structure. Top surfaces of the landing-pad-level metal interconnect structures 788 and the topmost surface of the first dielectric material layers 764 may be planarized by a planarization process, such as chemical mechanical planarization. The silicon nitride layer 766 may be formed directly on the top surfaces of the landing-pad-level metal interconnect structures 788 and the topmost surface of the first dielectric material layers 764.

The at least one second dielectric layer 768 may include a single dielectric material layer or a plurality of dielectric material layers. Each dielectric material layer selected from the at least one second dielectric layer 768 may include any of doped silicate glass, undoped silicate glass, and organosilicate glass. In one embodiment, the at least one first second material layer 768 may comprise, or consist essentially of, dielectric material layers having dielectric constants that do not exceed the dielectric constant of undoped silicate glass (silicon oxide) of 3.9.

An optional layer of a metallic material and a layer of a semiconductor material may be deposited over, or within patterned recesses of, the at least one second dielectric layer 768, and is lithographically patterned to provide an optional conductive plate layer 6 and in-process source-level material layers 10'. The optional conductive plate layer 6, if present, provides a high conductivity conduction path for electrical current that flows into, or out of, the in-process source-level material layers 10'. The optional conductive plate layer 6 includes a conductive material such as a metal or a heavily doped semiconductor material. The optional conductive plate layer 6, for example, may include a tungsten layer having a thickness in a range from 3 nm to 100 nm, although lesser and greater thicknesses may also be used. A metal nitride layer (not shown) may be provided as a diffusion barrier layer on top of the conductive plate layer 6. The conductive plate layer 6 may function as a special source line in the completed device. In addition, the conductive plate layer 6 may comprise an etch stop layer and may comprise any suitable conductive, semiconductor or insulating layer. The optional conductive plate layer 6 may include a metallic compound material such as a conductive metallic nitride (e.g., TiN) and/or a metal (e.g., W). The thickness of the optional conductive plate layer 6 may be in a range from 5 nm to 100 nm, although lesser and greater thicknesses may also be used.

The in-process source-level material layers 10' may include various layers that are subsequently modified to form source-level material layers. The source-level material layers, upon formation, include a source contact layer that functions as a common source region for vertical field effect transistors of a three-dimensional memory device. The in-process source-level material layers 10' may include at least one semiconductor material layer therein. In one embodiment, the in-process source-level material layers 10' may include, from bottom to top, a lower source-level material layer 112, a lower sacrificial liner 103, a source-level sacrificial layer 104, an upper sacrificial liner 105, an upper source-level semiconductor layer 116, a source-level insulating layer 117, and an optional source-select-level conductive layer 118.

The lower source-level material layer 112 and the upper source-level semiconductor layer 116 may include a doped semiconductor material such as doped polysilicon or doped amorphous silicon. The conductivity type of the lower source-level material layer 112 and the upper source-level semiconductor layer 116 may be the opposite of the conductivity of vertical semiconductor channels to be subsequently formed. For example, if the vertical semiconductor channels to be subsequently formed have a doping of a first conductivity type, the lower source-level material layer 112 and the upper source-level semiconductor layer 116 have a doping of a second conductivity type that is the opposite of the first conductivity type. The thickness of each of the lower source-level material layer 112 and the upper source-level semiconductor layer 116 may be in a range from 10 nm to 300 nm, such as from 20 nm to 150 nm, although lesser and greater thicknesses may also be used.

The source-level sacrificial layer 104 includes a sacrificial material that may be removed selective to the lower sacrificial liner 103 and the upper sacrificial liner 105. In one embodiment, the source-level sacrificial layer 104 may include a semiconductor material such as undoped amorphous silicon or a silicon-germanium alloy with an atomic concentration of germanium greater than 20%. The thickness of the source-level sacrificial layer 104 may be in a range from 30 nm to 400 nm, such as from 60 nm to 200 nm, although lesser and greater thicknesses may also be used.

The lower sacrificial liner 103 and the upper sacrificial liner 105 include materials that may function as an etch stop material during removal of the source-level sacrificial layer 104. For example, the lower sacrificial liner 103 and the upper sacrificial liner 105 may include silicon oxide, silicon nitride, and/or a dielectric metal oxide. In one embodiment, each of the lower sacrificial liner 103 and the upper sacrificial liner 105 may include a silicon oxide layer having a thickness in a range from 2 nm to 30 nm, although lesser and greater thicknesses may also be used.

The source-level insulating layer 117 includes a dielectric material such as silicon oxide. The thickness of the source-level insulating layer 117 may be in a range from 20 nm to 400 nm, such as from 40 nm to 200 nm, although lesser and greater thicknesses may also be used. The optional source-select-level conductive layer 118 may include a conductive material that may be used as a source-select-level gate electrode. For example, the optional source-select-level conductive layer 118 may include a doped semiconductor material such as doped poly silicon or doped amorphous silicon that may be subsequently converted into doped polysilicon by an anneal process. The thickness of the optional source-select-level conductive layer 118 may be in a range from 30 nm to 200 nm, such as from 60 nm to 100 nm, although lesser and greater thicknesses may also be used.

The in-process source-level material layers 10' may be formed directly above a subset of the semiconductor devices on the substrate 8 (e.g., silicon wafer). As used herein, a first element is located "directly above" a second element if the first element is located above a horizontal plane including a topmost surface of the second element and an area of the first element and an area of the second element has an areal overlap in a plan view (i.e., along a vertical plane or direction perpendicular to the top surface of the substrate 8. In one embodiment, the in-process source-level material layer 10' may have an opening in each area in which through-memory-level interconnection via structures are to be subsequently formed. For example, the in-process source-level material layer 10' may have openings in the memory array region 100. Thus, each of the at least one semiconductor material layer in the in-process source-level material layers 10' includes an opening therethrough. Each opening may be rectangular, circular, or of a shape having only a single periphery, or may have an annular shape including an inner periphery and an outer periphery. In case an opening has an annular shape, a patterned portion of the in-process source-level material layers 10' may be located inside the inner periphery.

The optional conductive plate layer 6 and the in-process source-level material layers 10' may be patterned to provide openings in areas in which through-memory-level interconnection via structures and through-dielectric contact via structures are to be subsequently formed. Patterned portions of the stack of the conductive plate layer 6 and the in-process source-level material layers 10' are present in each memory array region 100 in which three-dimensional memory stack structures are to be subsequently formed.

The optional conductive plate layer 6 and the in-process source-level material layers 10' may be patterned such that an opening extends over a staircase region 200 in which contact via structures contacting word line electrically conductive layers are to be subsequently formed. In one embodiment, the staircase region 200 may be laterally spaced from the memory array region 100 along a first horizontal direction hd1. A horizontal direction that is perpendicular to the first horizontal direction hd1 is herein referred to as a second horizontal direction hd2. In one embodiment, additional openings in the optional conductive plate layer 6 and the in-process source-level material layers 10' may be formed within the area of a memory array region 100, in which a three-dimensional memory array including memory stack structures is to be subsequently formed. A peripheral device region 400 that may be subsequently filled with a field dielectric material portion may be provided adjacent to the staircase region 200.

The region of the semiconductor devices 710 and the combination of the lower-level dielectric material layers 760 and the lower-level metal interconnect structures 780 is herein referred to an underlying peripheral device region 700, which is located underneath a memory-level assembly to be subsequently formed and includes peripheral devices for the memory-level assembly. The lower-level metal interconnect structures 780 may be formed in the lower-level dielectric material layers 760.

The lower-level metal interconnect structures 780 may be electrically connected to active nodes (e.g., transistor active regions 742 or gate electrodes 754) of the semiconductor devices 710 (e.g., CMOS devices), and may be located at the level of the lower-level dielectric material layers 760. Through-memory-level interconnection via structures may be subsequently formed directly on the lower-level metal interconnect structures 780 to provide electrical connection to memory devices that are also to be subsequently formed. Generally, semiconductor devices can be formed on a top surface of a semiconductor substrate, and a subset of the lower-level metal interconnect structures 780 can be electrically connected to a respective node of the semiconductor devices. In one embodiment, the pattern of the lower-level metal interconnect structures 780 may be selected such that the landing-pad-level metal interconnect structures 788 (which are a subset of the lower-level metal interconnect structures 780 located at the topmost portion of the lower-level metal interconnect structures 780) may provide landing pad structures for the through-memory-level interconnection via structures to be subsequently formed.

Figure 2:
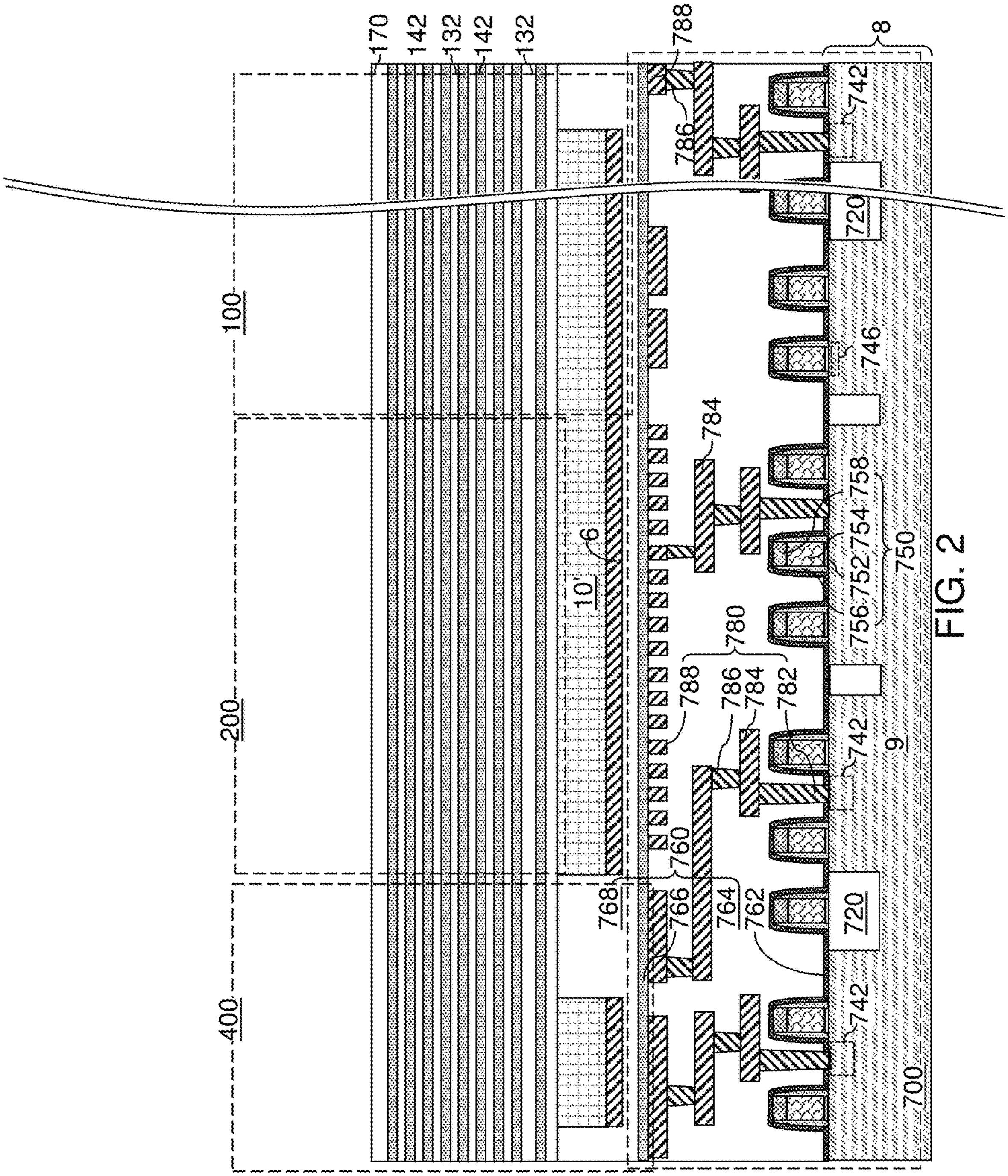
FIG. 2 is a vertical cross-sectional view of the first exemplary structure after formation of a first-tier alternating stack of first insulating layers and first sacrificial material layers according to the first embodiment of the present disclosure.
Figure 3:
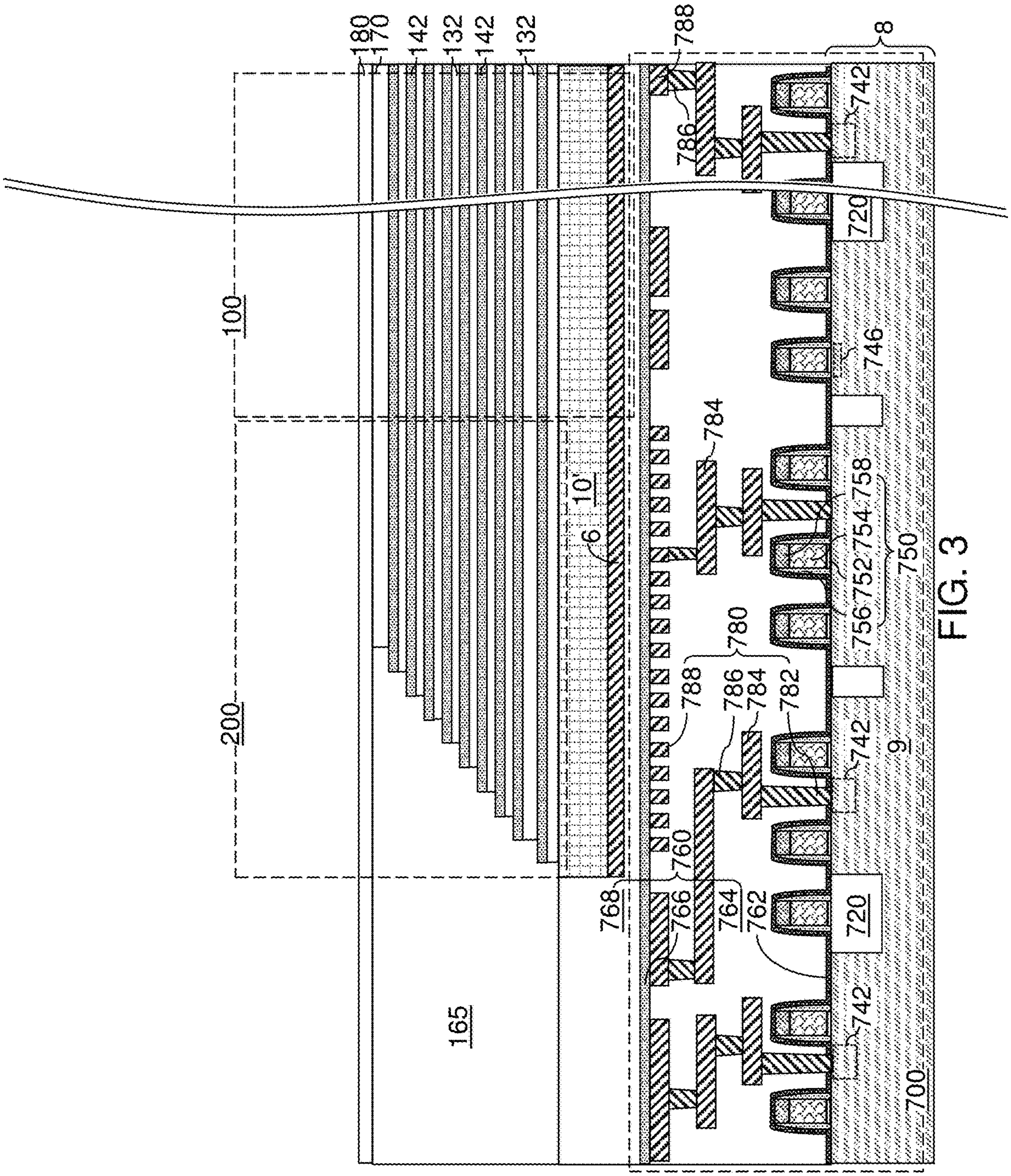
FIG. 3 is a vertical cross-sectional view of the first exemplary structure after patterning a first-tier staircase region, a first retro-stepped dielectric material portion, and an inter-tier dielectric layer according to the first embodiment of the present disclosure.

Referring to FIG. 2, an alternating stack of first material layers and second material layers may be formed. Each first material layer may include a first material, and each second material layer may include a second material that is different from the first material. In embodiments where at least another alternating stack of material layers is subsequently formed over the alternating stack of the first material layers and the second material layers, the alternating stack is herein referred to as a first-tier alternating stack. The level of the first-tier alternating stack is herein referred to as a first-tier level, and the level of the alternating stack to be subsequently formed immediately above the first-tier level is herein referred to as a second-tier level, etc.

The first-tier alternating stack may include first insulating layers 132 as the first material layers, and first sacrificial material layers as the second material layers. In one embodiment, the first sacrificial material layers may be sacrificial material layers that are subsequently replaced with electrically conductive layers. In another embodiment, the first sacrificial material layers may be electrically conductive layers that are not subsequently replaced with other layers. While the present disclosure is described using embodiments in which sacrificial material layers are replaced with electrically conductive layers, embodiments in which the sacrificial material layers are formed as electrically conductive layers (thereby obviating the need to perform replacement processes) are expressly contemplated herein.

In one embodiment, the first material layers and the second material layers may be first insulating layers 132 and first sacrificial material layers 142, respectively. In one embodiment, each first insulating layer 132 may include a first insulating material, and each first sacrificial material layer 142 may include a first sacrificial material. An alternating plurality of first insulating layers 132 and first sacrificial material layers 142 is formed over the in-process source-level material layers 10'. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness throughout, or may have different thicknesses. The second elements may have the same thickness throughout, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first-tier alternating stack (132, 142) may include first insulating layers 132 composed of the first material, and first sacrificial material layers 142 composed of the second material, which is different from the first material. The first material of the first insulating layers 132 may be at least one insulating material. Insulating materials that may be used for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 may be silicon oxide.

The second material of the first sacrificial material layers 142 may be a sacrificial material that may be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The second material of the first sacrificial material layers 142 may be subsequently replaced with electrically conductive electrodes which may function, for example, as control gate electrodes of a vertical NAND device. According to an aspect of the present disclosure, the first sacrificial material layers 142 include a dielectric material. In one embodiment, the first sacrificial material layers 142 may be material layers that comprise silicon nitride.

In one embodiment, the first insulating layers 132 may include silicon oxide, and sacrificial material layers may include silicon nitride sacrificial material layers. The first material of the first insulating layers 132 may be deposited, for example, by chemical vapor deposition (CVD). For example, if silicon oxide is used for the first insulating layers 132, tetraethylorthosilicate (TEOS) may be used as the precursor material for the CVD process. The second material of the first sacrificial material layers 142 may be formed, for example, CVD or atomic layer deposition (ALD).

The thicknesses of the first insulating layers 132 and the first sacrificial material layers 142 may be in a range from 20 nm to 50 nm, although lesser and greater thicknesses may be used for each first insulating layer 132 and for each first sacrificial material layer 142. The number of repetitions of the pairs of a first insulating layer 132 and a first sacrificial material layer 142 may be in a range from 2 to 1,024, and typically from 8 to 256, although a greater number of repetitions may also be used. In one embodiment, each first sacrificial material layer 142 in the first-tier alternating stack (132, 142) may have a uniform thickness that is substantially invariant within each respective first sacrificial material layer 142.

A first insulating cap layer 170 may be subsequently formed over the first-tier alternating stack (132, 142). The first insulating cap layer 170 includes a dielectric material, which may be any dielectric material that may be used for the first insulating layers 132. In one embodiment, the first insulating cap layer 170 includes the same dielectric material as the first insulating layers 132. The thickness of the first insulating cap layer 170 may be in a range from 20 nm to 300 nm, although lesser and greater thicknesses may also be used.

Figure 4A:
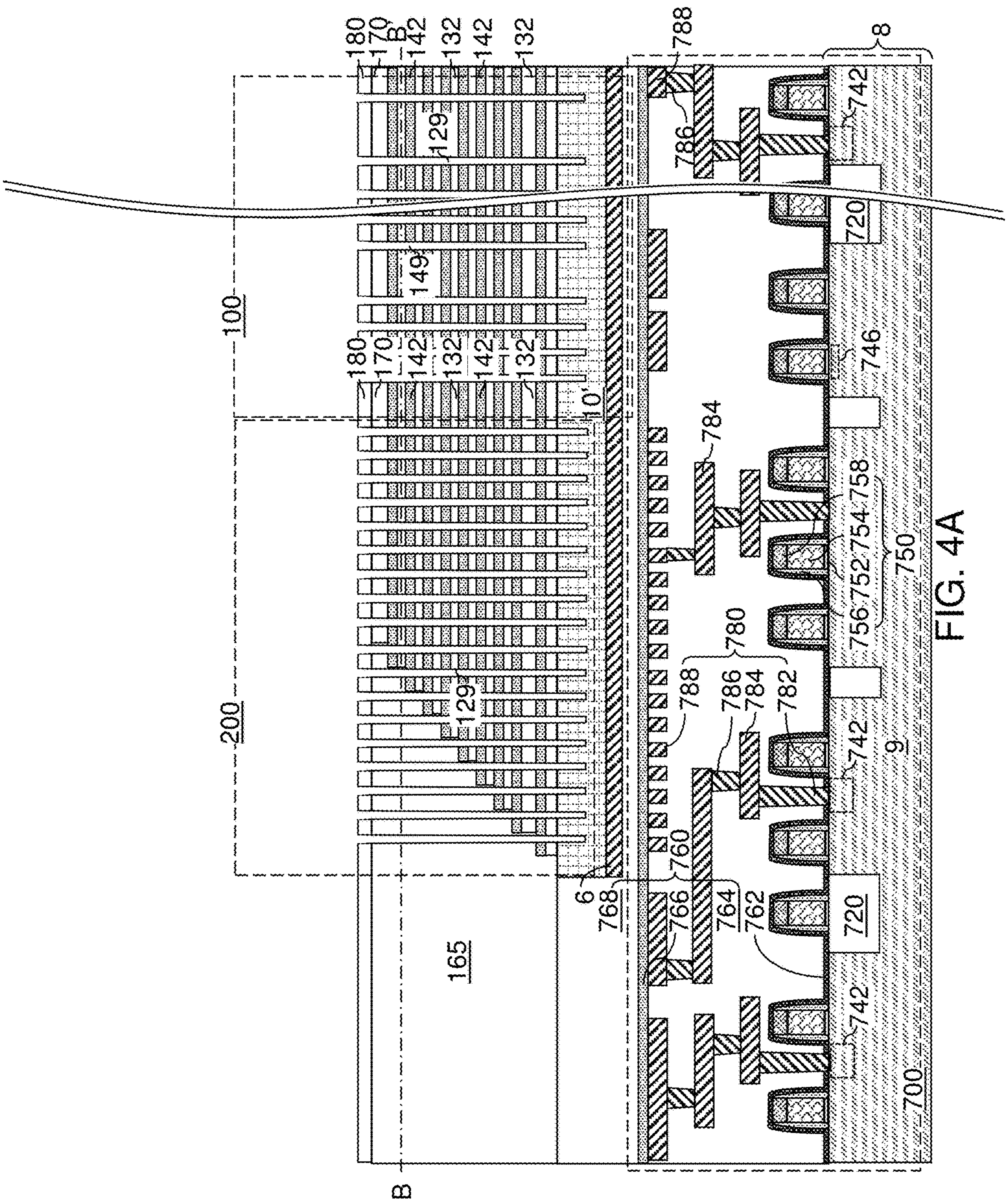
FIG. 4A is a vertical cross-sectional view of the first exemplary structure after formation of first-tier memory openings and first-tier support openings according to the first embodiment of the present disclosure.
Figure 4B:
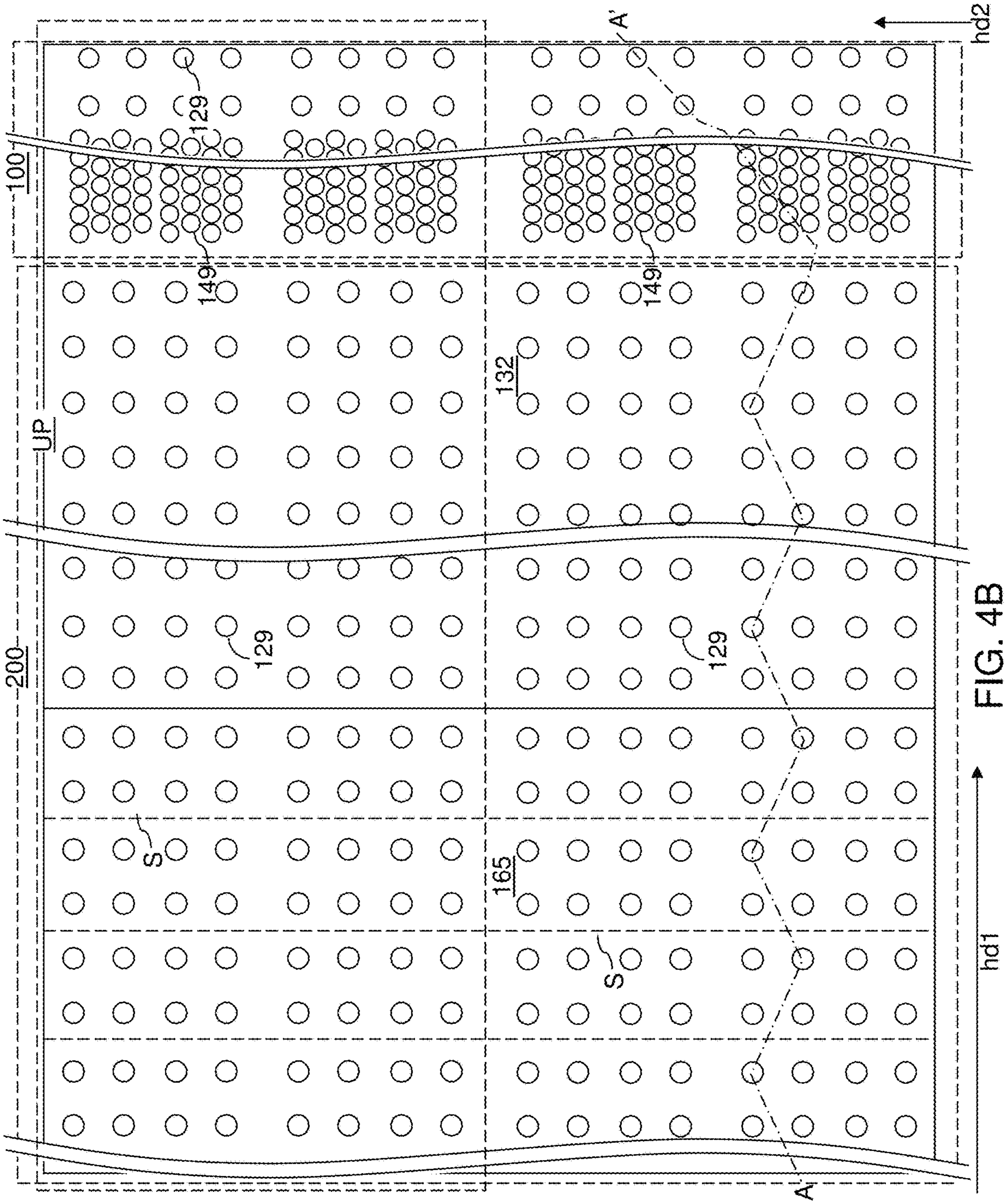
FIG. 4B is top-down view of the first exemplary structure of FIG. 4A. The hinged vertical plane A-A' corresponds to the plane of the vertical cross-sectional view of FIG. 4A.
Figure 4C:
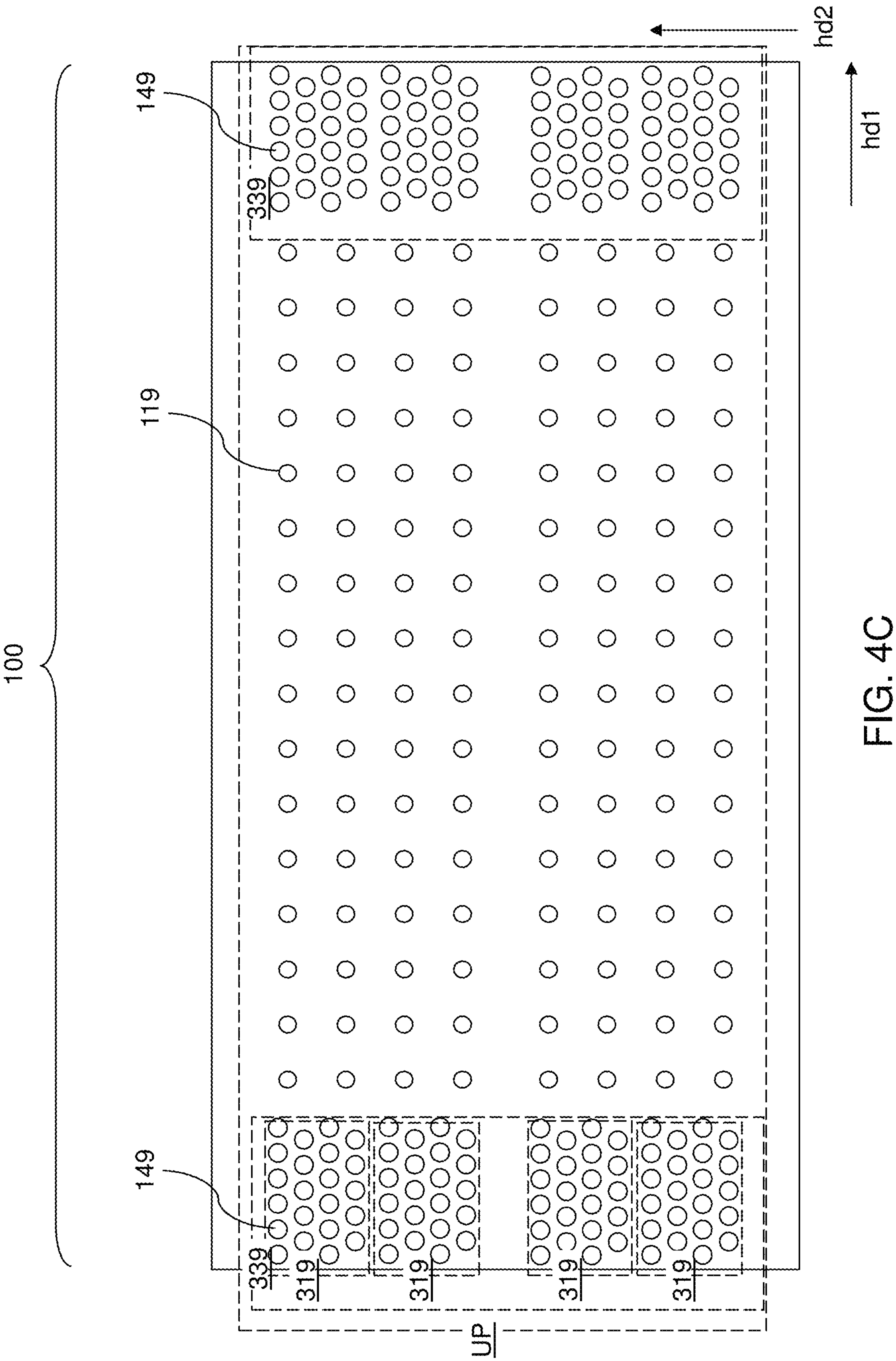
FIG. 4C is a top-down view of another area of the first exemplary structure of FIG. 4A.

Referring to FIGS. 4A-4C, various first-tier openings (149, 129, 119) may be formed through the inter-tier dielectric layer 180 and the first-tier structure (132, 142, 170, 165) and into the in-process source-level material layers 10'. A photoresist layer (not shown) may be applied over the inter-tier dielectric layer 180, and may be lithographically patterned to form various openings therethrough.

The pattern of openings in the photoresist layer may be transferred through the inter-tier dielectric layer 180 and the first-tier structure (132, 142, 170, 165) and into the in-process source-level material layers 10' by a first anisotropic etch process to form the various first-tier openings (149, 129, 119) concurrently, i.e., during the first isotropic etch process. The various first-tier openings (149, 129, 119) may include first-tier memory openings 149 and first-tier support openings (129, 119). A first subset of the first-tier support openings 119 is located in the memory array region 100, while a second subset of the first-tier support openings 129 is located in the staircase region 200. Locations of steps S in the first-tier alternating stack (132, 142) are illustrated as dotted lines in FIG. 4B.

Generally, a unit pattern UP of a combination of first-tier memory openings 149 and first-tier support openings 129 may be repeated along the second horizontal direction hd2

(e.g., bit line direction). Each unit pattern UP includes groups 339 of clusters 319 of first-tier memory openings 149 that are laterally spaced apart along the second horizontal direction hd2 and/or laterally spaced apart along the first horizontal direction hd1 (e.g., word line direction).

The first-tier memory openings 149 may be openings that are formed in the memory array region 100 through each layer within the first-tier alternating stack (132, 142) and are subsequently used to form memory stack structures therein. The first-tier memory openings 149 may be formed in clusters 319 of first-tier memory openings 149 that are laterally spaced apart along the second horizontal direction hd2. Each cluster 319 of first-tier memory openings 149 may be formed as a two-dimensional array of first-tier memory openings 149. A set of neighboring clusters 319 of first-tier memory openings 149 form a group 339 of first-tier memory openings 149.

The first subset of the first-tier support openings 119 may be formed in sections of the memory array region 100 that are not filled with the first-tier memory openings 149. For example, the first subset of the first-tier support openings 119 can be located between neighboring groups 339 of first-tier memory openings 149 as illustrated in FIG. 4C. In the first exemplary structure, the first subset of the first-tier support openings 119 can be formed into the in-process source-level material layers 10', and do not extend into the lower-level dielectric material layers 760. In other words, the first subset of the first-tier support openings 119 is laterally offset from the openings through the in-process source-level material layers 10'. The second subset of the first-tier support openings 129 can be formed in the staircase region 200 as illustrated in FIG. 4B.

The materials of the first-tier alternating stack (132, 142) are etched concurrently with the material of the first retro-stepped dielectric material portion 165 during the first anisotropic etch process. The chemistry of the initial etch step may alternate to optimize etching of the first and second materials in the first-tier alternating stack (132, 142) while providing a comparable average etch rate to the material of the first retro-stepped dielectric material portion 165. The first anisotropic etch process may use, for example, a series of reactive ion etch processes or a single reaction etch process (e.g., $CF_4/O_2/Ar$ etch). The sidewalls of the various first-tier openings (149, 129, 119) may be substantially vertical, or may be tapered.

Figure 5:
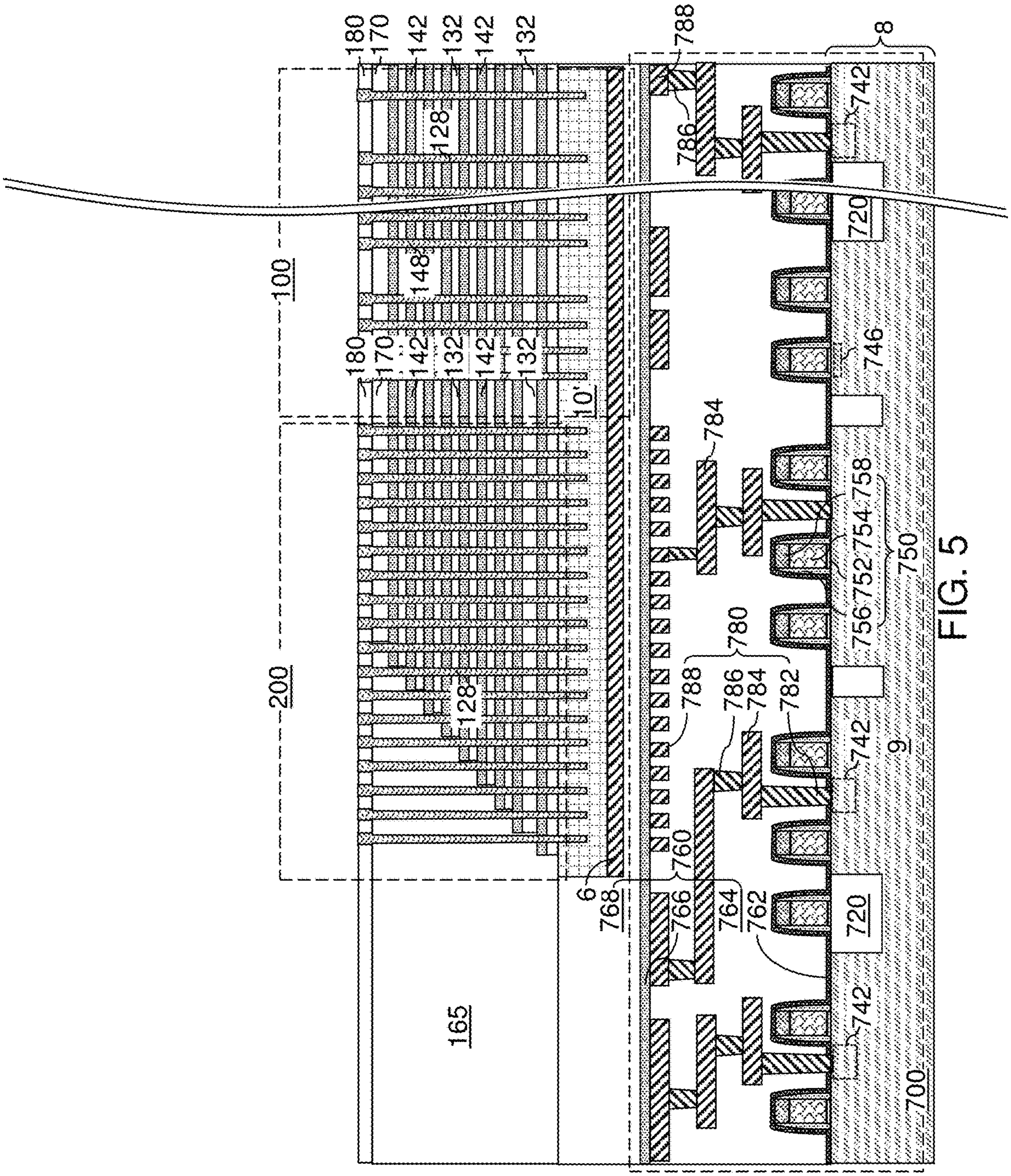
FIG. 5 is a vertical cross-sectional view of the first exemplary structure after formation of various sacrificial fill structures according to the first embodiment of the present disclosure.

Referring to FIG. 5, sacrificial first-tier opening fill portions (148, 128) may be formed in the various first-tier openings (149, 129, 119). For example, a sacrificial first-tier fill material may be deposited concurrently deposited in each of the first-tier openings (149, 129, 119). The sacrificial first-tier fill material includes a material that may be subsequently removed selective to the materials of the first insulating layers 132 and the first sacrificial material layers 142.

In one embodiment, the sacrificial first-tier fill material may include a semiconductor material such as silicon (e.g., a-Si or polysilicon), a silicon-germanium alloy, germanium, a III-V compound semiconductor material, or a combination thereof. Optionally, a thin etch stop liner (such as a silicon oxide layer or a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In another embodiment, the sacrificial first-tier fill material may include a silicon oxide material having a higher etch rate than the materials of the first insulating layers 132, the first insulating cap layer 170, and the inter-tier dielectric layer 180. For example, the sacrificial first-tier fill material may include borosilicate glass or porous or non-porous organosilicate glass having an etch rate that is at least 100 times higher than the etch rate of densified TEOS oxide (i.e., a silicon oxide material formed by decomposition of tetraethylorthosilicate glass in a chemical vapor deposition process and subsequently densified in an anneal process) in a 100:1 dilute hydrofluoric acid. In this case, a thin etch stop liner (such as a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In yet another embodiment, the sacrificial first-tier fill material may include amorphous silicon or a carbon-containing material (such as amorphous carbon or diamond-like carbon) that may be subsequently removed by ashing, or a silicon-based polymer that may be subsequently removed selective to the materials of the first-tier alternating stack (132, 142).

Portions of the deposited sacrificial material may be removed from above the topmost layer of the first-tier alternating stack (132, 142), such as from above the inter-tier dielectric layer 180. For example, the sacrificial first-tier fill material may be recessed to a top surface of the inter-tier dielectric layer 180 using a planarization process. The planarization process may include a recess etch, chemical mechanical planarization (CMP), or a combination thereof. The top surface of the inter-tier dielectric layer 180 may be used as an etch stop layer or a planarization stop layer.

Remaining portions of the sacrificial first-tier fill material comprise sacrificial first-tier opening fill portions (148, 128). Specifically, each remaining portion of the sacrificial material in a first-tier memory opening 149 constitutes a sacrificial first-tier memory opening fill portion 148. Each remaining portion of the sacrificial material in a first-tier support opening (129, 119) constitutes a sacrificial first-tier support opening fill portion 128. The various sacrificial first-tier opening fill portions (148, 128) are concurrently formed, i.e., during a same set of processes including the deposition process that deposits the sacrificial first-tier fill material and the planarization process that removes the first-tier deposition process from above the first-tier alternating stack (132, 142) (such as from above the top surface of the inter-tier dielectric layer 180). The top surfaces of the sacrificial first-tier opening fill portions (148, 128) may be coplanar with the top surface of the inter-tier dielectric layer 180. Each of the sacrificial first-tier opening fill portions (148, 128) may, or may not, include cavities therein.

Figure 6A:
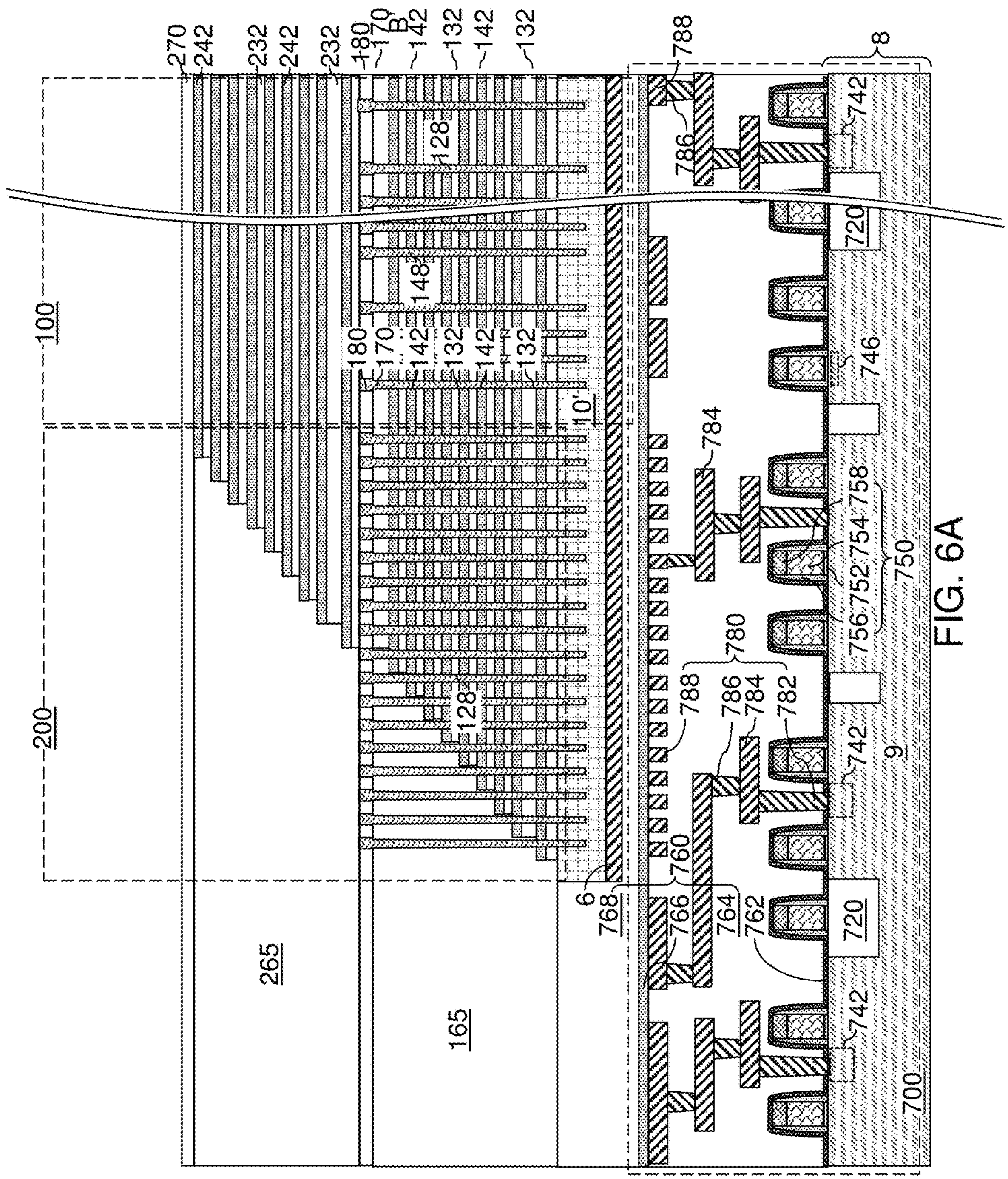
FIG. 6A is a vertical cross-sectional view of the first exemplary structure after formation of a second-tier alternating stack of second insulating layers and second sacrificial material layers, second stepped surfaces, and a second retro-stepped dielectric material portion according to the first embodiment of the present disclosure.
Figure 6B:
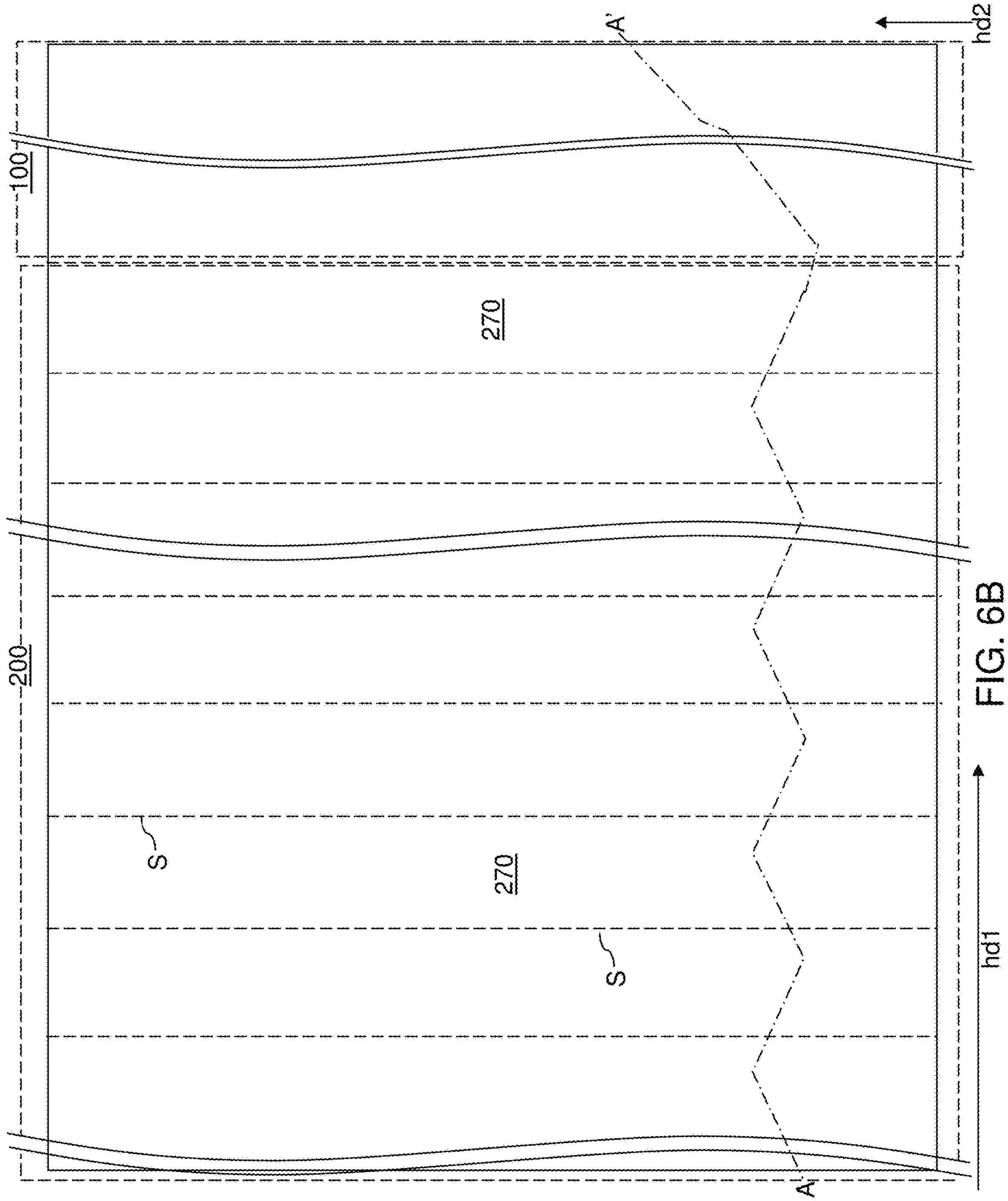
FIG. 6B is a top-down view of the first exemplary structure of FIG. 6A. The hinged vertical plane A-A' corresponds to the plane of the vertical cross-sectional view of FIG. 6A.

Referring to FIGS. 6A and 6B, a second-tier structure may be formed over the first-tier structure (132, 142, 170, 148, 128). The second-tier structure may include an additional alternating stack of insulating layers and sacrificial material layers, which may be sacrificial material layers. For example, a second-tier alternating stack (232, 242) of material layers may be subsequently formed on the top surface of the first-tier alternating stack (132, 142). The second-tier alternating stack (232, 242) includes an alternating plurality of third material layers and fourth material layers. Each third material layer may include a third material, and each fourth material layer may include a fourth material that is different from the third material. In one embodiment, the third material may be the same as the first material of the first insulating layer 132, and the fourth material may be the same as the second material of the first sacrificial material layers 142.

In one embodiment, the third material layers may be second insulating layers 232 and the fourth material layers may be second sacrificial material layers that provide vertical spacing between each vertically neighboring pair of the second insulating layers 232. In one embodiment, the third material layers and the fourth material layers may be second insulating layers 232 and second sacrificial material layers 242, respectively. The third material of the second insulating layers 232 may be at least one insulating material. The fourth material of the second sacrificial material layers 242 may be a sacrificial material that may be removed selective to the third material of the second insulating layers 232. According to an aspect of the present disclosure, the second sacrificial material layers 242 include a dielectric material, which may be the same material as the dielectric material of the first sacrificial material layers 142. The fourth material of the second sacrificial material layers 242 may be subsequently replaced with electrically conductive electrodes which may function, for example, as control gate electrodes of a vertical NAND device.

In one embodiment, each second insulating layer 232 may include a second insulating material, and each second sacrificial material layer 242 may include a second sacrificial material. In this case, the second-tier alternating stack (232, 242) may include an alternating plurality of second insulating layers 232 and second sacrificial material layers 242. The third material of the second insulating layers 232 may be deposited, for example, by chemical vapor deposition (CVD). The fourth material of the second sacrificial material layers 242 may be formed, for example, CVD or atomic layer deposition (ALD).

The third material of the second insulating layers 232 may be at least one insulating material. Insulating materials that may be used for the second insulating layers 232 may be any material that may be used for the first insulating layers 132. The fourth material of the second sacrificial material layers 242 is a sacrificial material that may be removed selective to the third material of the second insulating layers 232. Sacrificial materials that may be used for the second sacrificial material layers 242 may be any material that may be used for the first sacrificial material layers 142. In one embodiment, the second insulating material may be the same as the first insulating material, and the second sacrificial material may be the same as the first sacrificial material. In one embodiment, the first insulating layers 132 and the second insulating layers 232 can include silicon oxide, and the first sacrificial material layers 142 and the second sacrificial material layers 242 can include silicon nitride.

The thicknesses of the second insulating layers 232 and the second sacrificial material layers 242 may be in a range from 20 nm to 50 nm, although lesser and greater thicknesses may be used for each second insulating layer 232 and for each second sacrificial material layer 242. The number of repetitions of the pairs of a second insulating layer 232 and a second sacrificial material layer 242 may be in a range from 2 to 1,024, and typically from 8 to 256, although a greater number of repetitions may also be used. In one embodiment, each second sacrificial material layer 242 in the second-tier alternating stack (232, 242) may have a uniform thickness that is substantially invariant within each respective second sacrificial material layer 242.

Second stepped surfaces in the second stepped area may be formed in the staircase region 200 using a same set of processing steps as the processing steps used to form the first stepped surfaces in the first stepped area with suitable adjustment to the pattern of at least one masking layer. A second retro-stepped dielectric material portion 265 may be formed over the second stepped surfaces in the staircase region 200.

A second insulating cap layer 270 may be subsequently formed over the second-tier alternating stack (232, 242). The second insulating cap layer 270 includes a dielectric material that is different from the material of the second sacrificial material layers 242. In one embodiment, the second insulating cap layer 270 may include silicon oxide. In one embodiment, the first and second sacrificial material layers (142, 242) may comprise silicon nitride.

Generally speaking, at least one alternating stack of insulating layers (132, 232) and sacrificial material layers (such as sacrificial material layers (142, 242)) may be formed over the in-process source-level material layers 10', and at least one retro-stepped dielectric material portion (165, 265) may be formed over the staircase regions on the at least one alternating stack (132, 142, 232, 242).

Referring to FIGS. 7A-7D, various second-tier openings (249, 229, 219) may be formed through the second-tier structure (232, 242, 265, 270). A photoresist layer (not shown) may be applied over the second insulating cap layer 270, and may be lithographically patterned to form various openings therethrough. The pattern of the openings in the photoresist layer can include the pattern of the first-tier memory openings 149 and the pattern of the first-tier support openings (129, 119). In other words, the pattern of the second-tier openings (249, 229, 219) may be the same as the pattern of the first-tier openings (149, 129, 119), and may have an areal overlap.

Generally, a unit pattern UP of a combination of second-tier memory openings 249 and second-tier support openings (229, 219) may be repeated along the second horizontal direction hd2. Each unit pattern UP includes groups 439 of clusters 419 of second-tier memory openings 249 that are laterally spaced apart along the second horizontal direction hd2 and/or laterally spaced apart along the second horizontal direction hd1.

The second-tier memory openings 249 may be openings that are formed in the memory array region 100 through each layer within the second-tier alternating stack (232, 242) and are subsequently used to form memory stack structures therein. The second-tier memory openings 249 may be formed in clusters 419 of second-tier memory openings 249 that are laterally spaced apart along the second horizontal direction hd2. Each cluster 419 of second-tier memory openings 249 may be formed as a two-dimensional array of second-tier memory openings 249. A set of neighboring clusters 419 of second-tier memory openings 249 form a group 439 of second-tier memory openings 249.

Figure 7A:
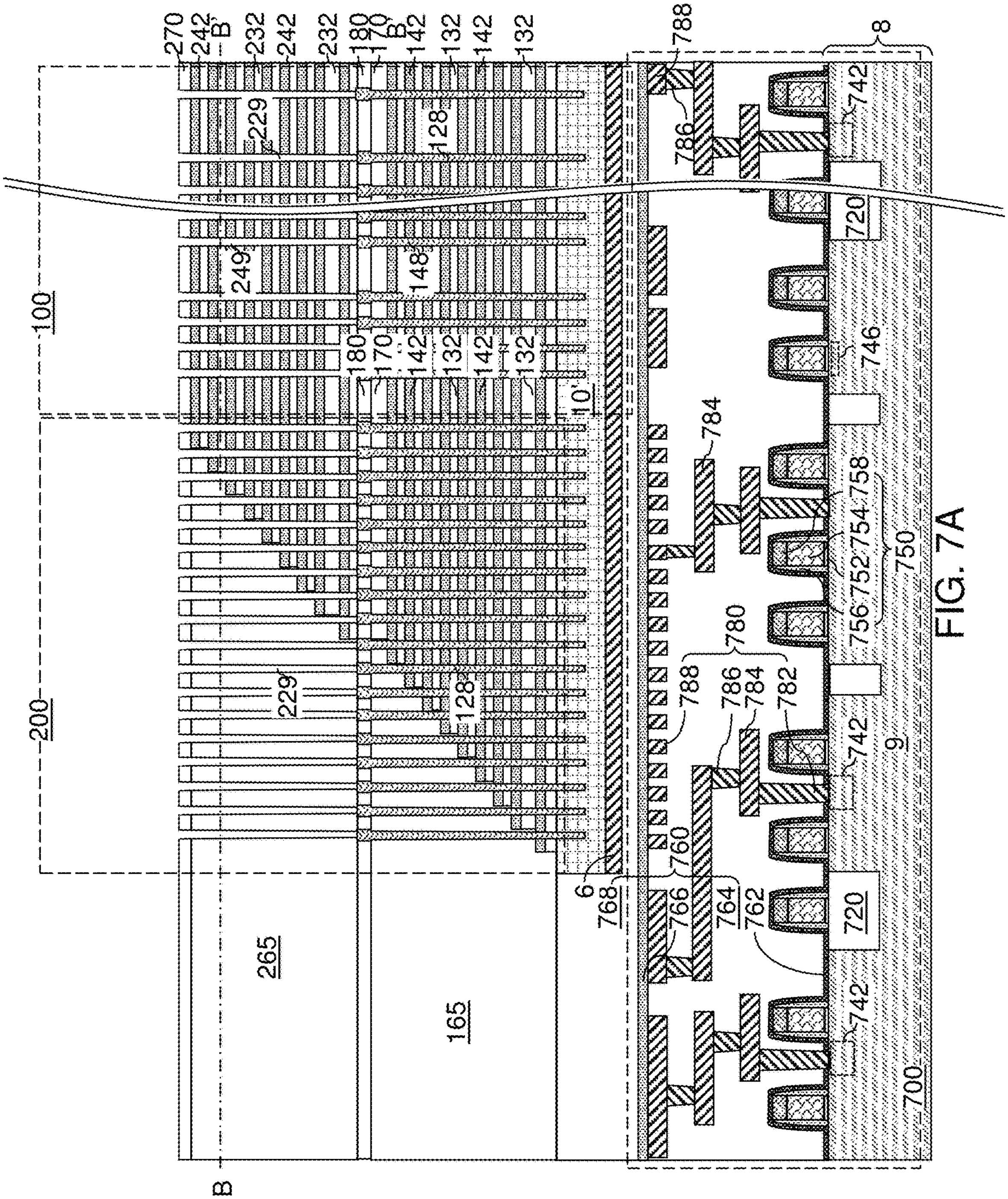
FIG. 7A is a vertical cross-sectional view of the first exemplary structure after formation of second-tier memory openings and second-tier support openings according to the first embodiment of the present disclosure.
Figure 7B:
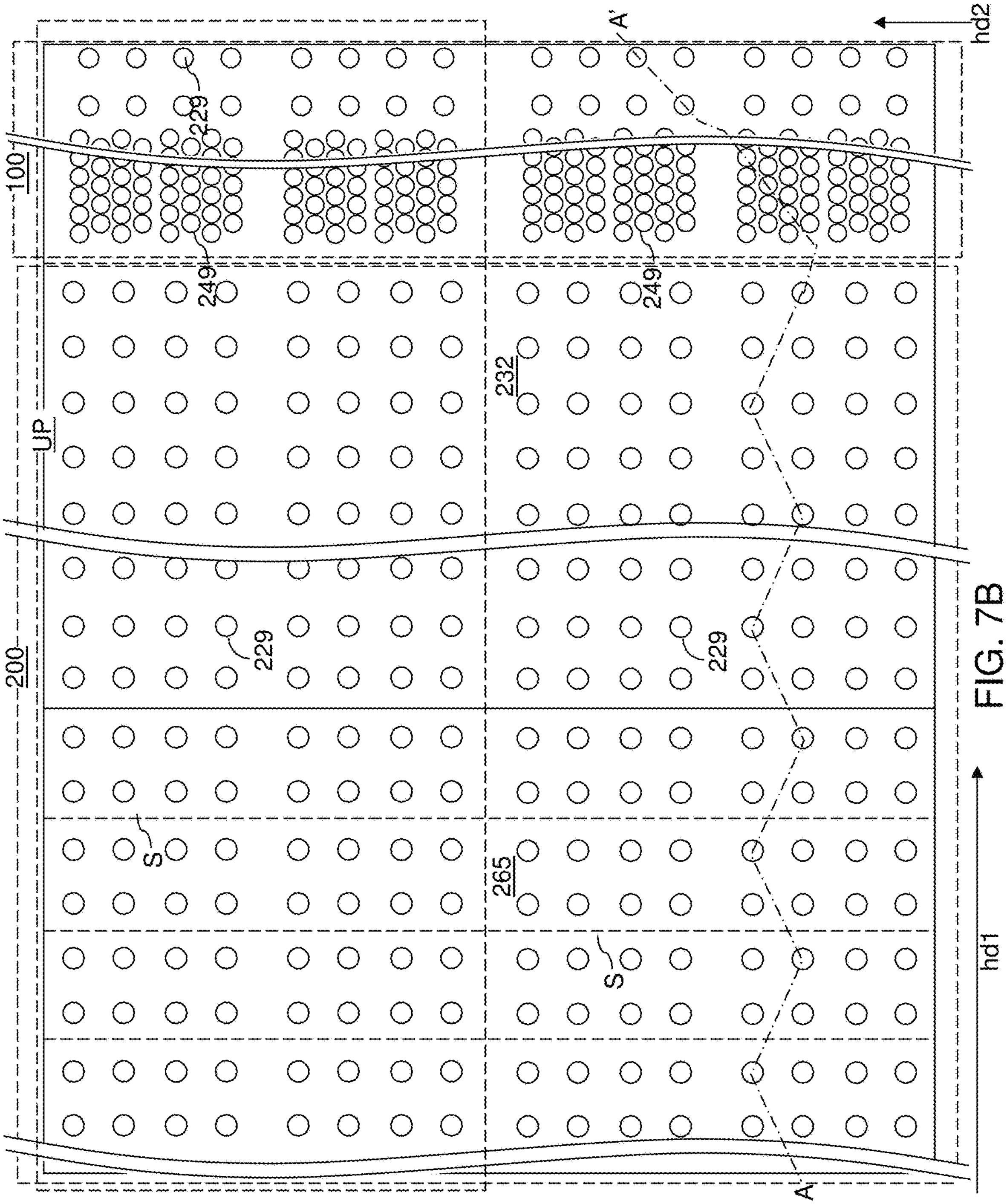
FIG. 7B is a horizontal cross-sectional view of the first exemplary structure of FIG. 7A along the plane B-B'. The hinged vertical plane A-A' corresponds to the plane of the vertical cross-sectional view of FIG. 7A.
Figure 7C:
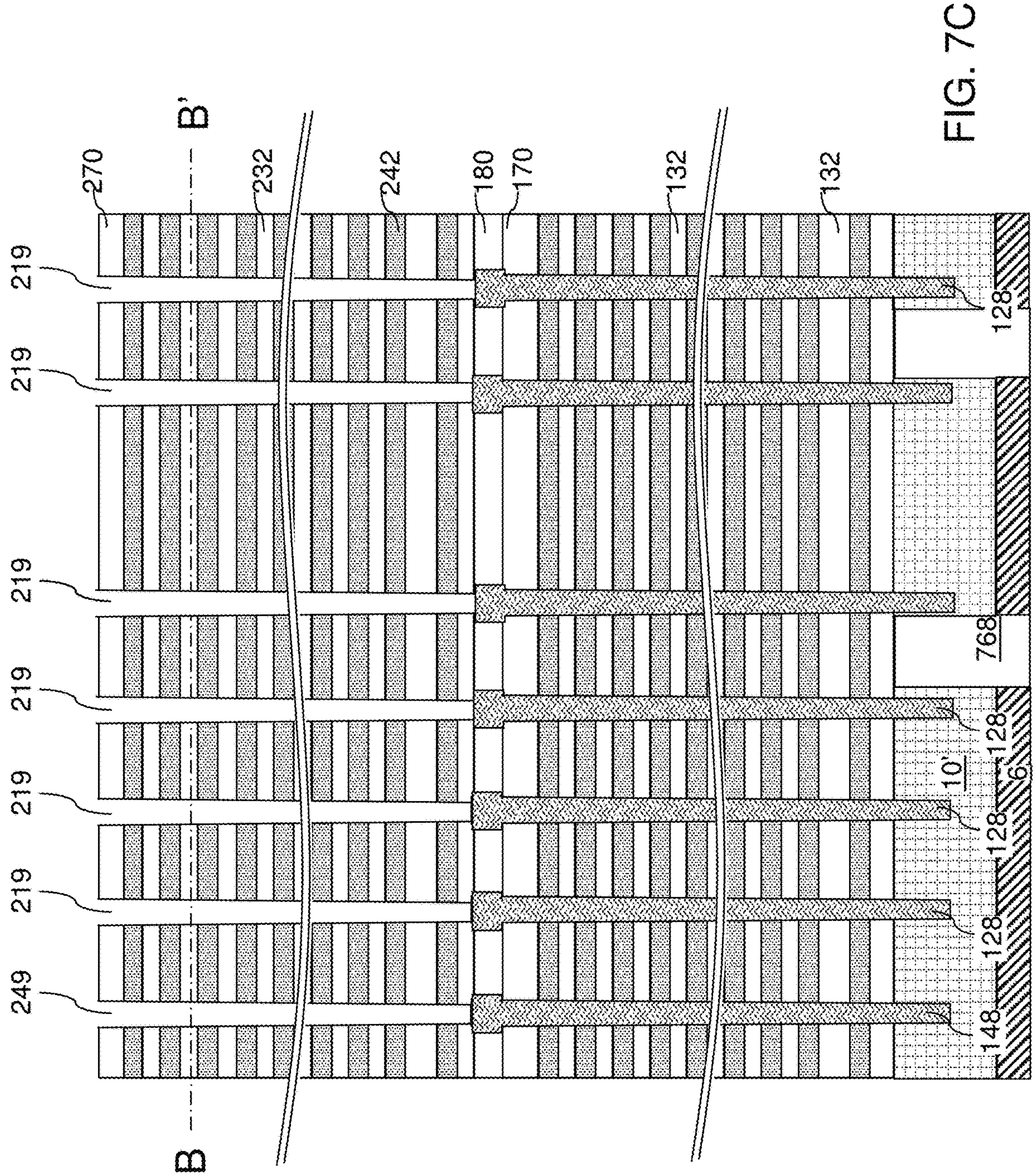
FIG. 7C is another vertical cross-sectional view of the first exemplary structure of FIGS. 7A and 7B.
Figure 7D:
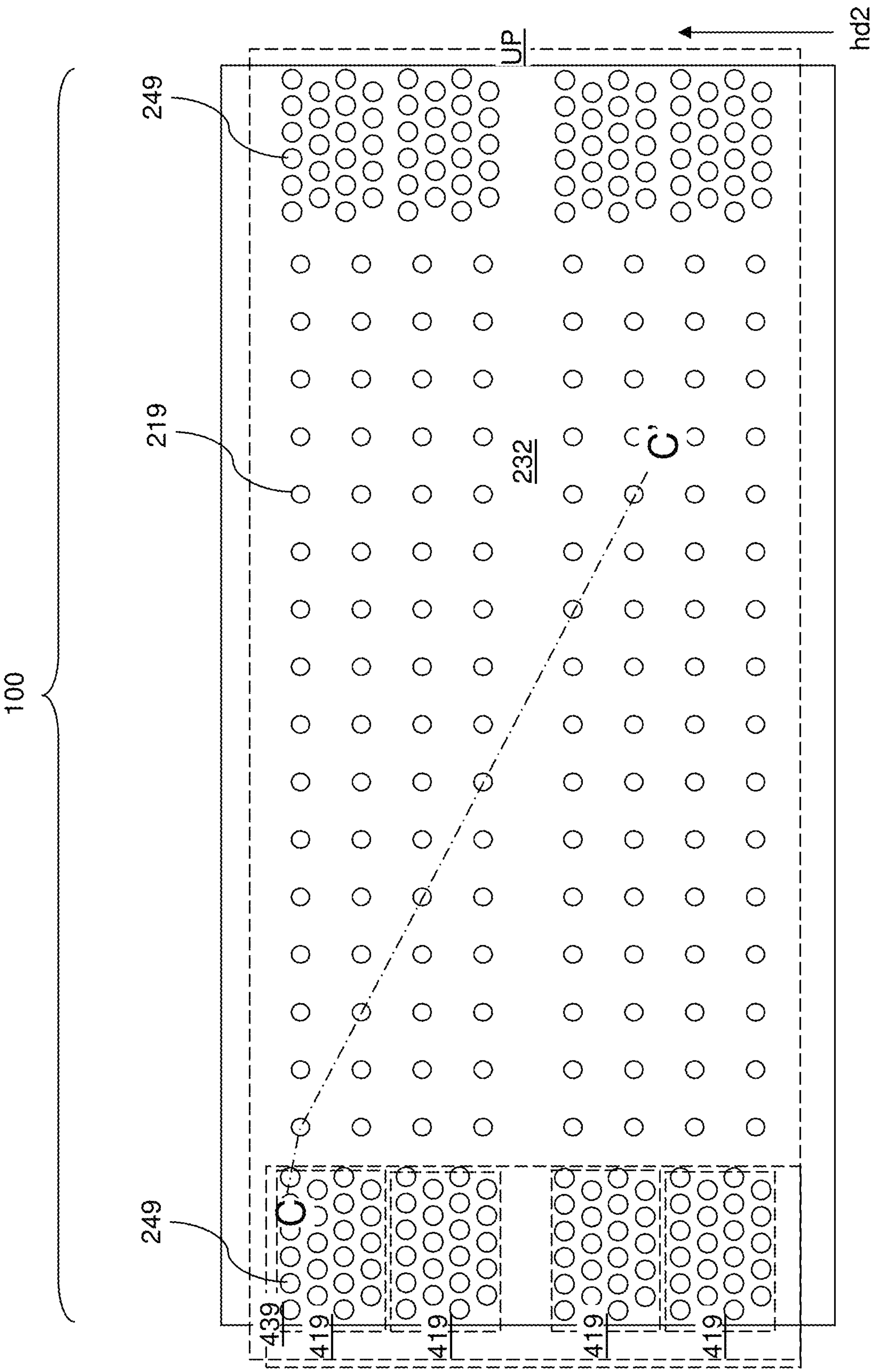
FIG. 7D is a horizontal cross-sectional view of another area of the first exemplary structure of FIG. 7A at the height of the horizontal plane B-B'. The hinged vertical plane C-C' corresponds to the plane of the vertical cross-sectional view of FIG. 7C.
Figure 8A:
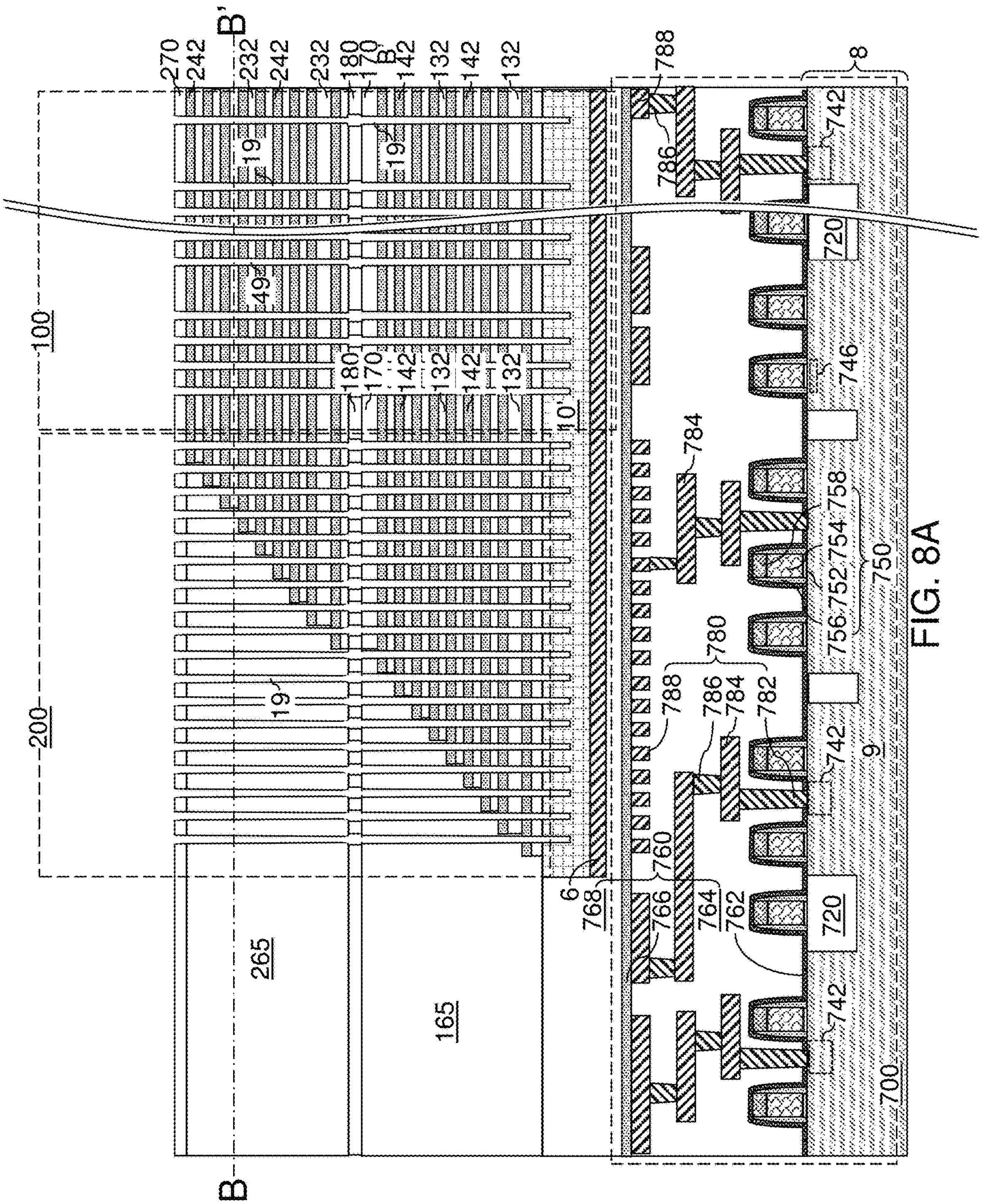
FIG. 8A is a vertical cross-sectional view of the first exemplary structure after formation of inter-tier memory openings and inter-tier support openings according to the first embodiment of the present disclosure.
Figure 8B:
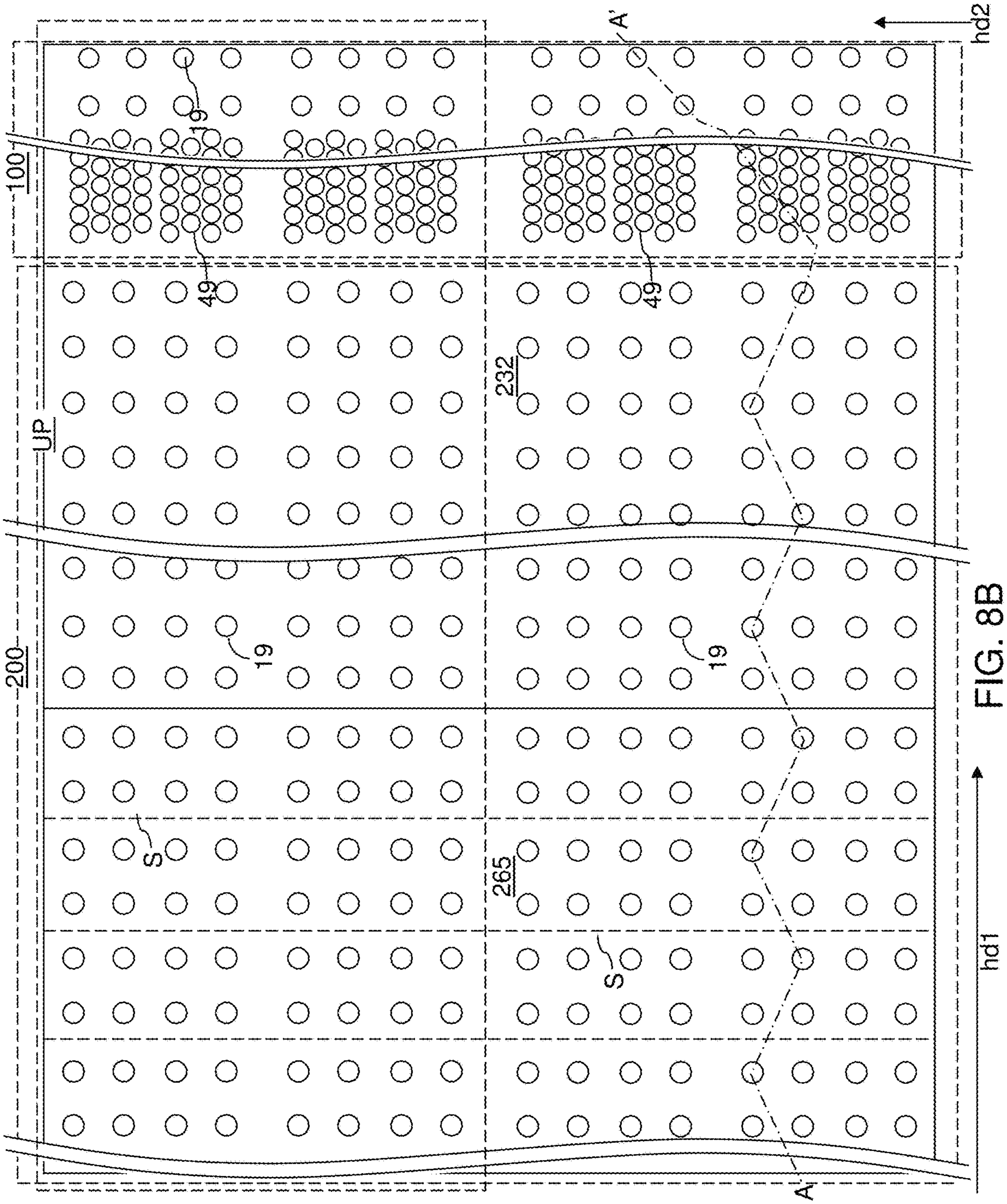
FIG. 8B is a horizontal cross-sectional view of the first exemplary structure of FIG. 8A along the plane B-B'. The hinged vertical plane A-A' corresponds to the plane of the vertical cross-sectional view of FIG. 8A.
Figure 8C:
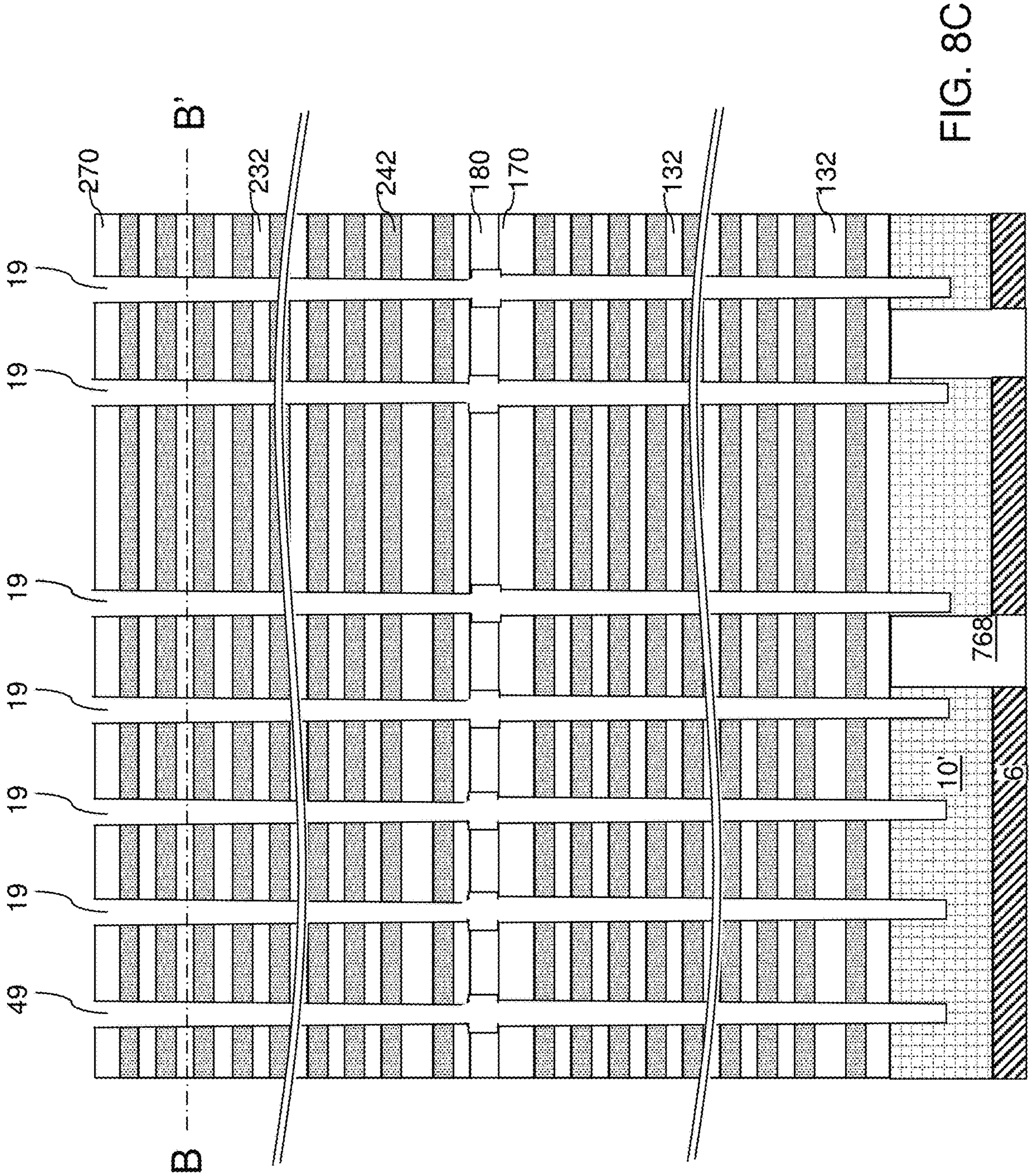
FIG. 8C is another vertical cross-sectional view of the first exemplary structure of FIGS. 8A and 8B.
Figure 8D:
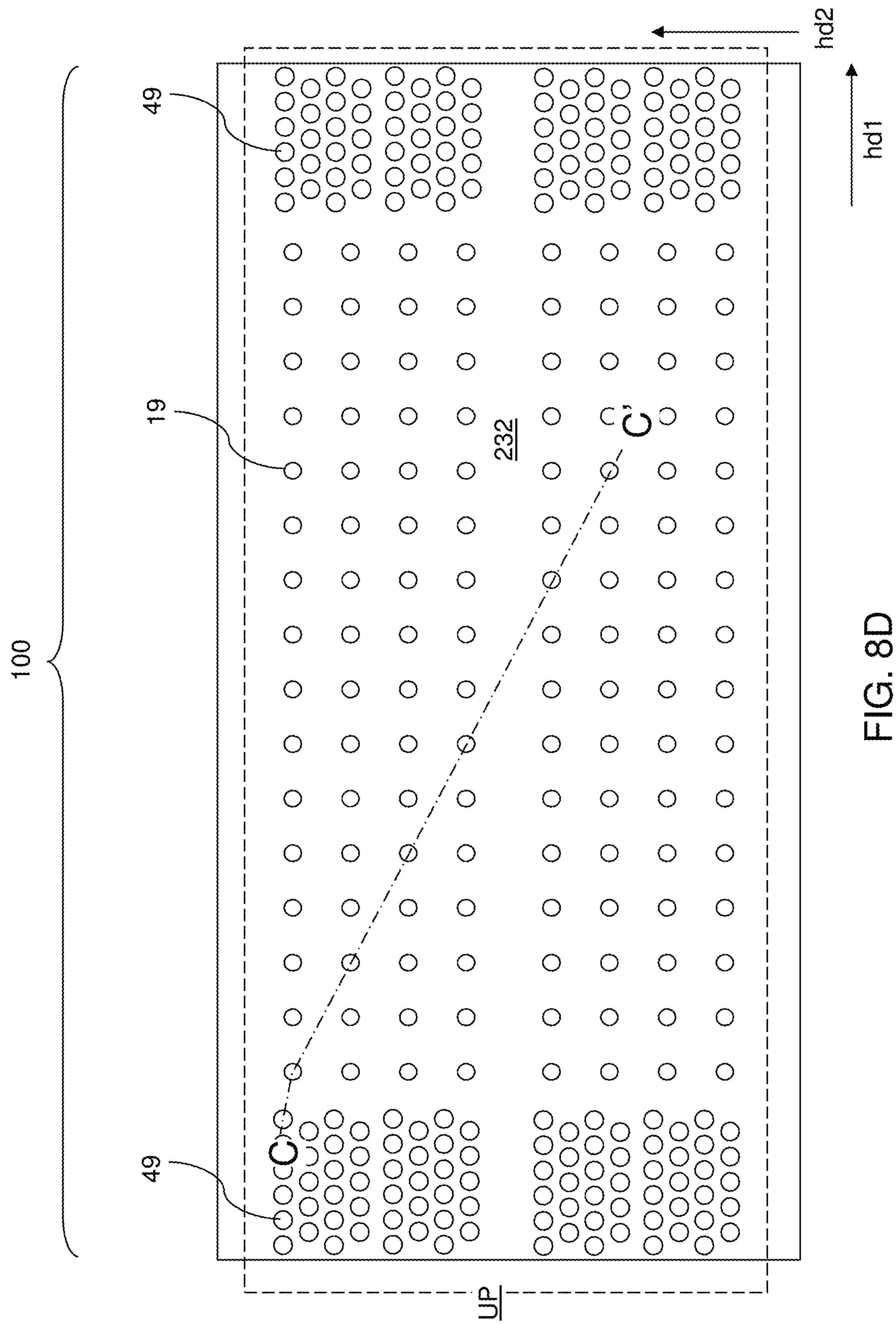
FIG. 8D is a horizontal cross-sectional view of another area of the first exemplary structure of FIG. 8A at the height of the horizontal plane B-B'. The hinged vertical plane C-C' corresponds to the plane of the vertical cross-sectional view of FIG. 8C.

A first subset of the second-tier support openings 219 may be formed in sections of the memory array region 100 that are not filled with the second-tier memory openings 249. For example, the first subset of the second-tier support openings 219 can be located between neighboring groups 439 of second-tier memory openings 249 as illustrated in FIG. 7D. A second subset of the second-tier support openings 229 can be formed in the staircase region 200 as illustrated in FIG. 7B.

The second anisotropic etch process may include an etch step in which the materials of the second-tier alternating stack (232, 242) are etched concurrently with the material of the second retro-stepped dielectric material portion 265. The chemistry of the etch step may alternate to optimize etching of the materials in the second-tier alternating stack (232, 242) while providing a comparable average etch rate to the material of the second retro-stepped dielectric material portion 265. The second anisotropic etch process may use, for example, a series of reactive ion etch processes or a single reaction etch process (e.g., $CF_4/O_2/Ar$ etch). The sidewalls of the various second-tier openings (249, 229, 219) may be substantially vertical, or may be tapered. A bottom periphery of each second-tier opening (249, 229, 219) may be laterally offset, and/or may be located entirely within, a periphery of a top surface of an underlying sacrificial first-tier opening fill portion (148, 128). The photoresist layer may be subsequently removed, for example, by ashing.

Referring to FIGS. 8A-8D, the sacrificial first-tier fill material of the sacrificial first-tier opening fill portions (148, 128) may be removed using an etch process that etches the sacrificial first-tier fill material selective to the materials of the first and second insulating layers (132, 232), the first and second sacrificial material layers (142, 242), the first and second insulating cap layers (170, 270), and the inter-tier dielectric layer 180. A memory opening 49, which is also referred to as an inter-tier memory opening 49, is formed in each combination of a second-tier memory openings 249 and a volume from which a sacrificial first-tier memory opening fill portion 148 is removed. A support opening 19, which is also referred to as an inter-tier support opening 19, may be formed in each combination of a second-tier support openings (229, 219) and a volume from which a sacrificial first-tier support opening fill portion 128 is removed. In the first exemplary structure, the support openings 19 can be formed into the in-process source-level material layers 10', and do not extend into the lower-level dielectric material layers 760. In other words, the support openings 19 are laterally offset from the openings through the in-process source-level material layers 10'.

Figure 9A:
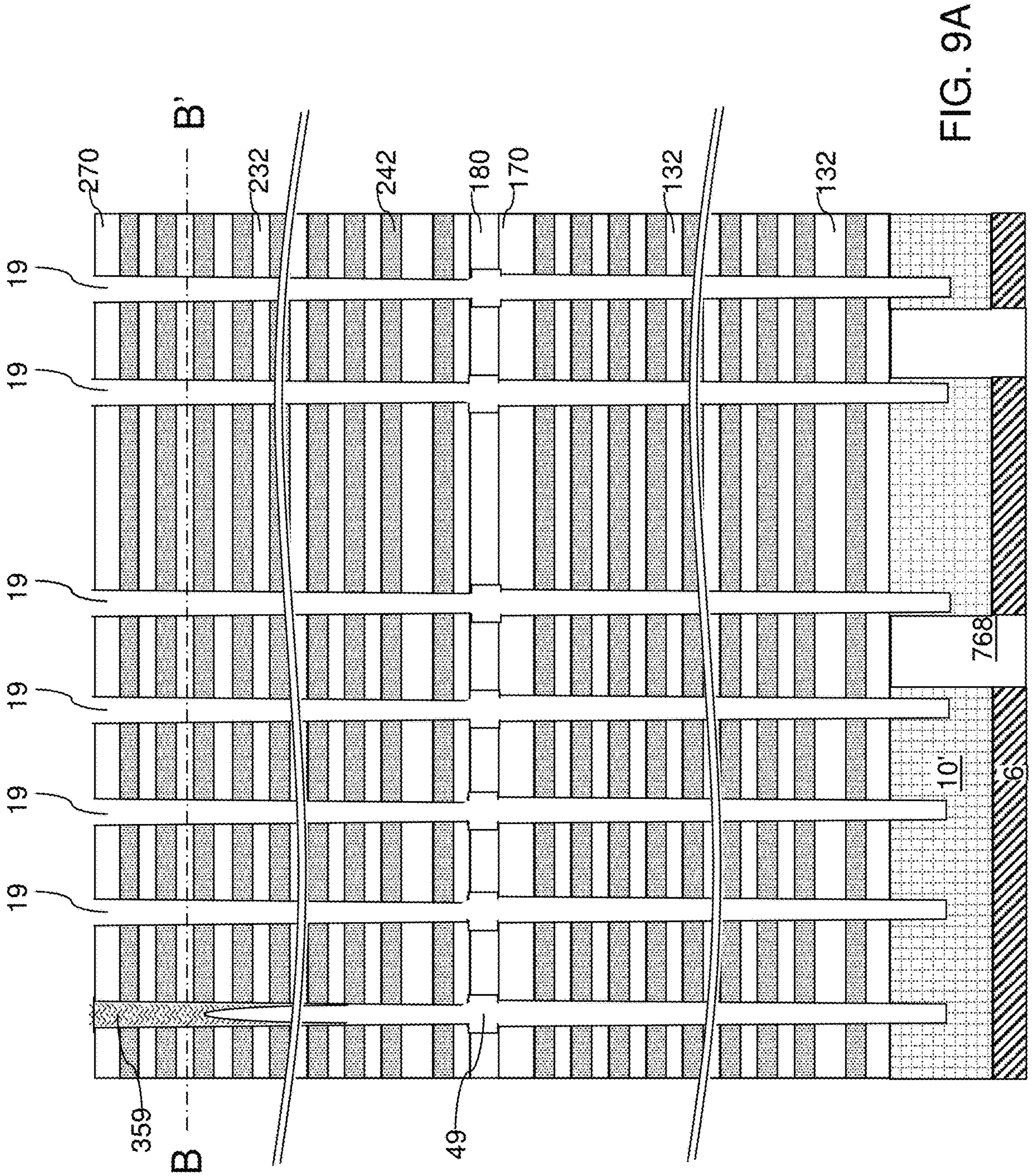
FIG. 9A is a vertical cross-sectional view of a region of the first exemplary structure after formation of sacrificial memory opening fill material portions according to the first embodiment of the present disclosure.
Figure 9B:
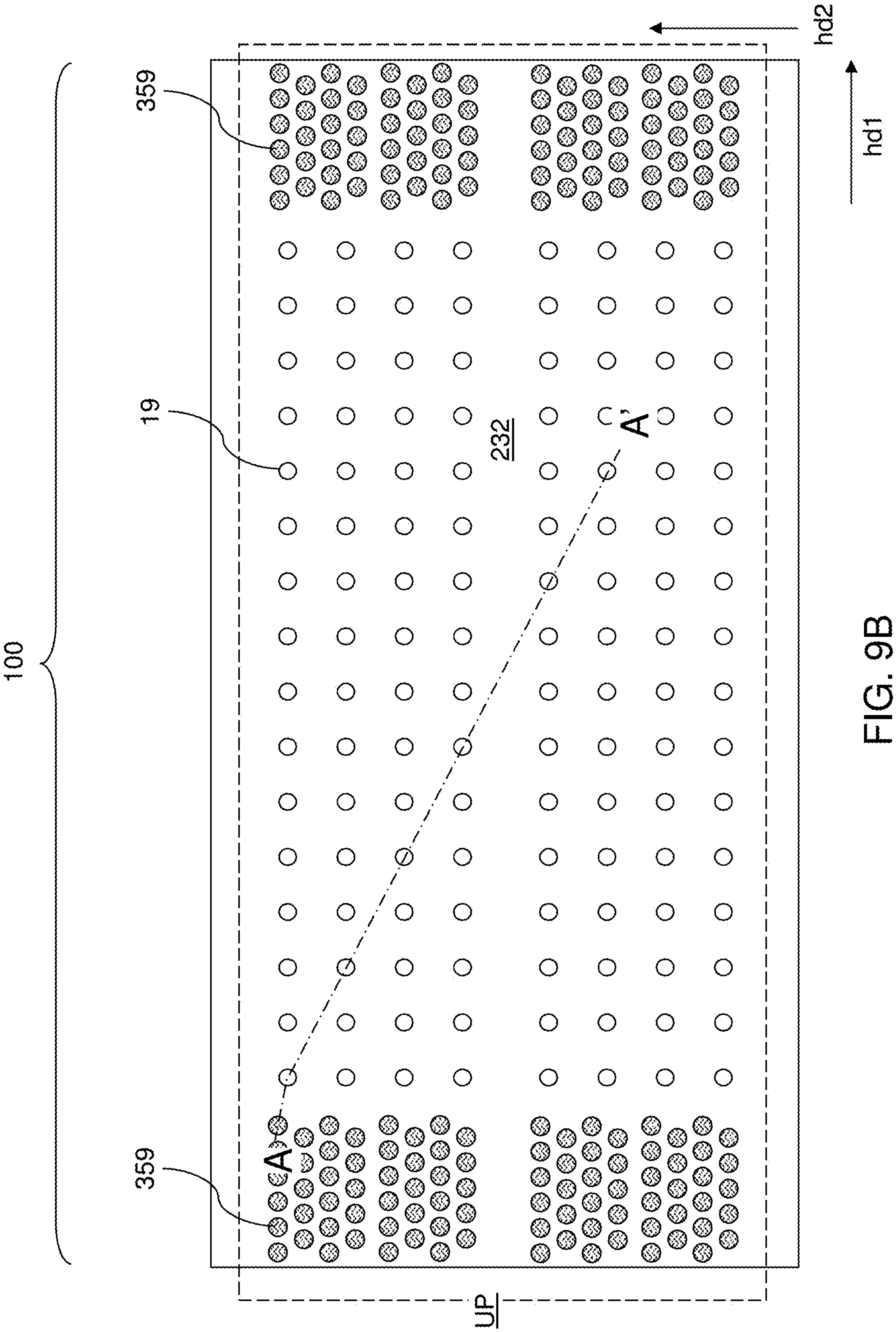
FIG. 9B is a horizontal cross-sectional view of the first exemplary structure along the plane B-B' of FIG. 9A.

Referring to FIGS. 9A and 9B, a sacrificial fill material can be deposited into the various openings (49, 19). The sacrificial fill material includes a material that can be subsequently removed selective to the materials of the first-tier alternating stack (132, 142) and the second-tier alternating stack (232, 242). In one embodiment, the sacrificial fill material can include amorphous silicon, amorphous carbon, diamond-like carbon (DLC), a polymer material, germanium, or a silicon-germanium alloy. In one embodiment, the sacrificial fill material may be anisotropically deposited to form voids at lower portions of each opening through the second-tier alternating stack (232, 242) and the first-tier alternating stack (132, 142) to facilitate removal in subsequent sacrificial material removal processes.

Excess portions of the sacrificial fill material can be removed from above the horizontal plane including the top surface of the second insulating cap layer 270 by a planarization process such as a chemical mechanical planarization process. Each remaining portion of the sacrificial fill material in the memory openings 49 constitutes a sacrificial memory opening fill material portion 359. A photoresist layer (not shown) can be applied over the first exemplary structure, and can be lithographically patterned to cover the sacrificial memory opening fill structures 359. An etch process that etches the sacrificial fill material selective to the materials of the alternating stacks (132, 142, 232, 242) can be performed to remove remaining portions of the sacrificial fill material from inside the support openings 19. According to an aspect of the first embodiment of the present disclosure, the support openings 19 vertically extend through the at least one alternating stack (132, 142, 232, 242), contact at least one semiconductor material layer within the in-process source-level material layers 10', and may be laterally spaced from portions of the lower-level dielectric material layers 760 located within the openings in the in-process source-level material layers 10' as illustrated in FIG. 9A.

Figure 10A:
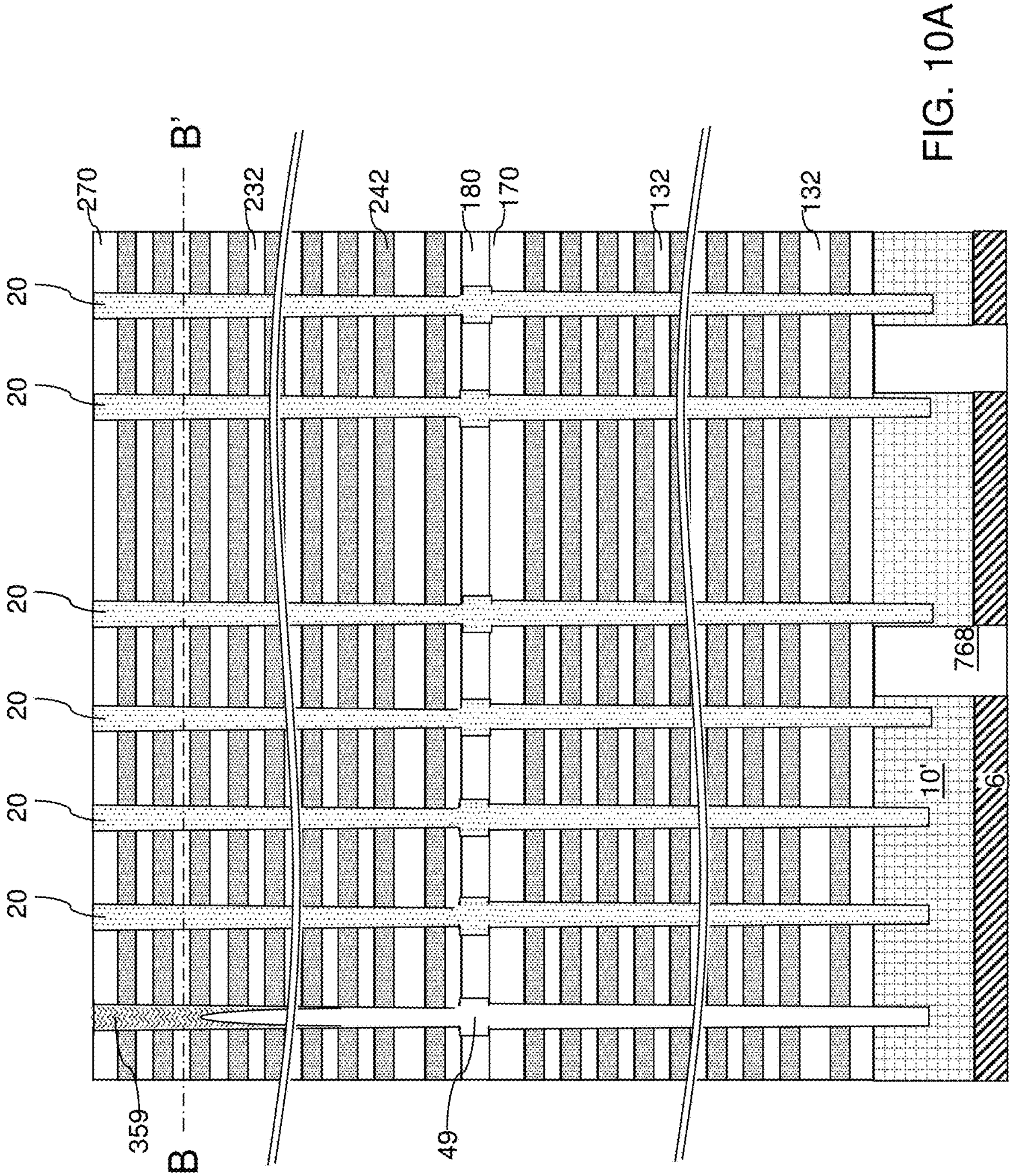
FIG. 10A is a vertical cross-sectional view of a region of the first exemplary structure after formation of support pillar structures according to the first embodiment of the present disclosure.
Figure 10B:
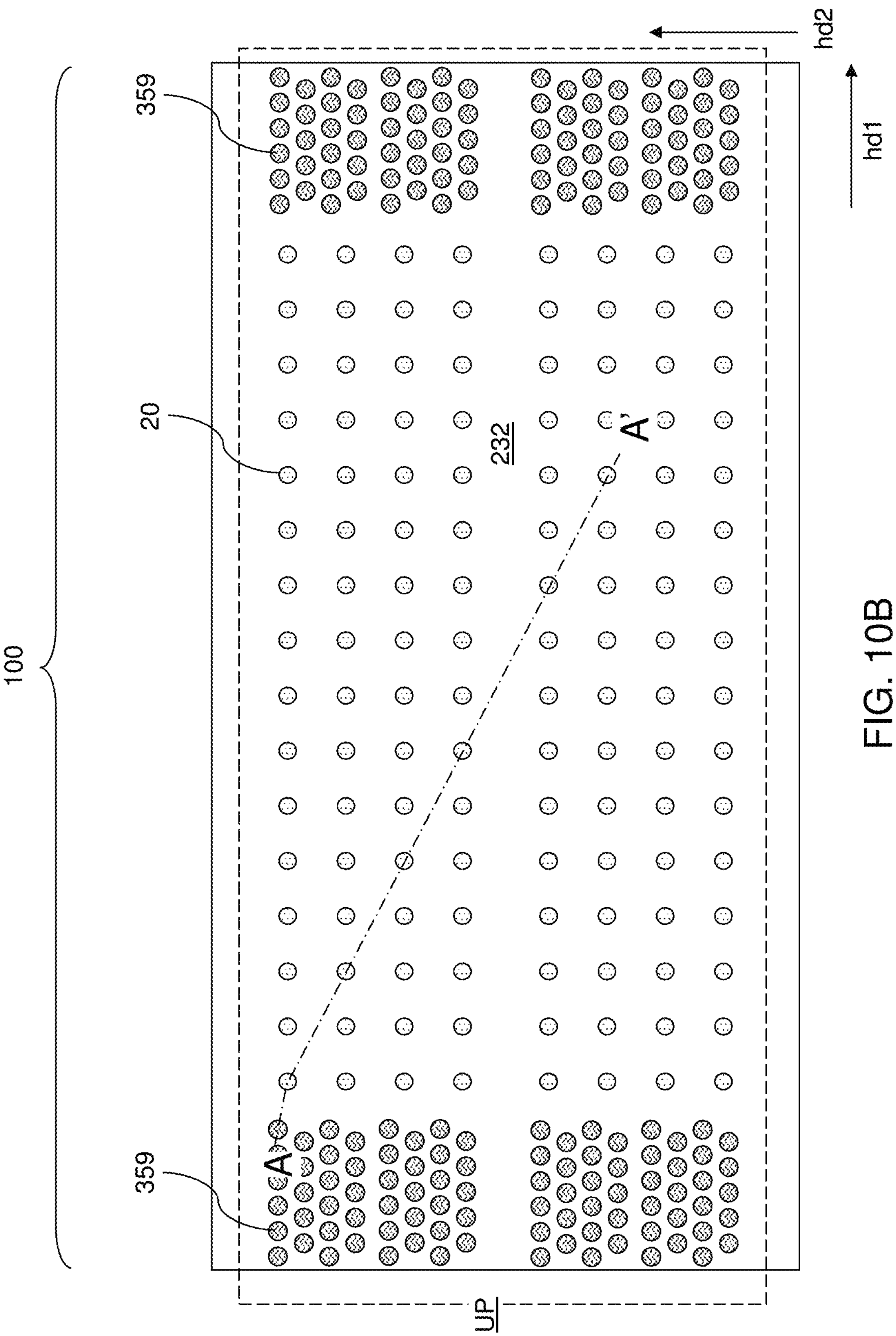
FIG. 10B is a horizontal cross-sectional view of the first exemplary structure along the plane B-B' of FIG. 10A.

Referring to FIGS. 10A and 10B, a dielectric fill material such as silicon oxide can be conformally deposited in the support openings 19. For example, a low pressure chemical vapor deposition process can be performed to deposit the dielectric fill material in each of the support openings 19. Excess portions of the dielectric fill material overlying the top surface of the second insulating cap layer 270 can be removed by a planarization process such as a recess etch process and/or a chemical mechanical planarization process. Each portion of the dielectric fill material filling a support opening 19 constitutes a support pillar structure 20. According to an aspect of the first embodiment of the present disclosure, the support pillar structures 20 vertically extend through the at least one alternating stack (132, 142, 232, 242), contact at least one semiconductor material layer within the in-process source-level material layers 10', and may be laterally spaced from portions of the lower-level dielectric material layers 760 located within the openings in the in-process source-level material layers 10' as illustrated in FIG. 10A.

Figure 11A:
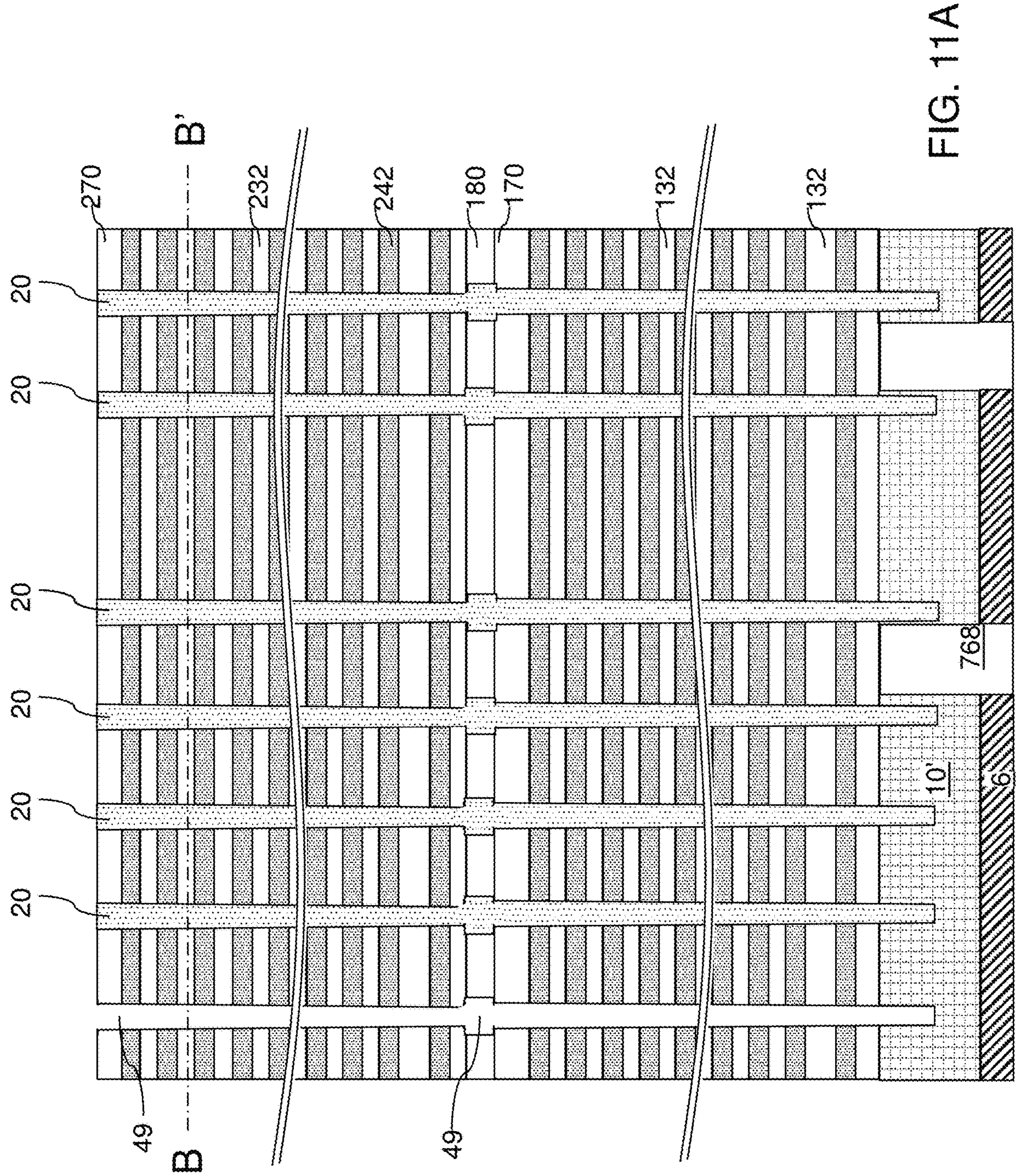
FIG. 11A is a vertical cross-sectional view of a region of the first exemplary structure after removal of the sacrificial memory opening fill material portions according to the first embodiment of the present disclosure.
Figure 11B:
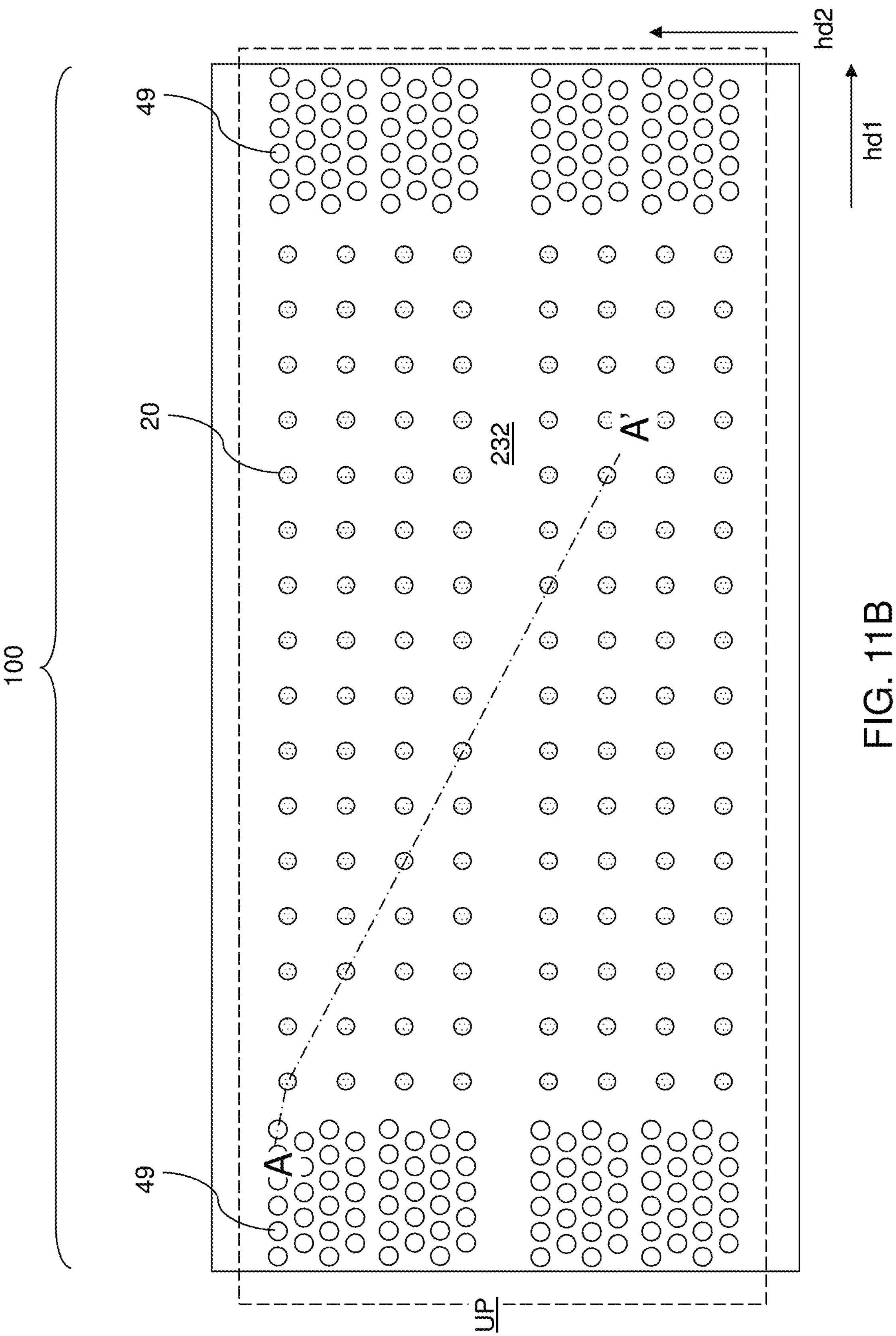
FIG. 11B is a horizontal cross-sectional view of the first exemplary structure along the plane B-B' of FIG. 11A.
Figure 12B:
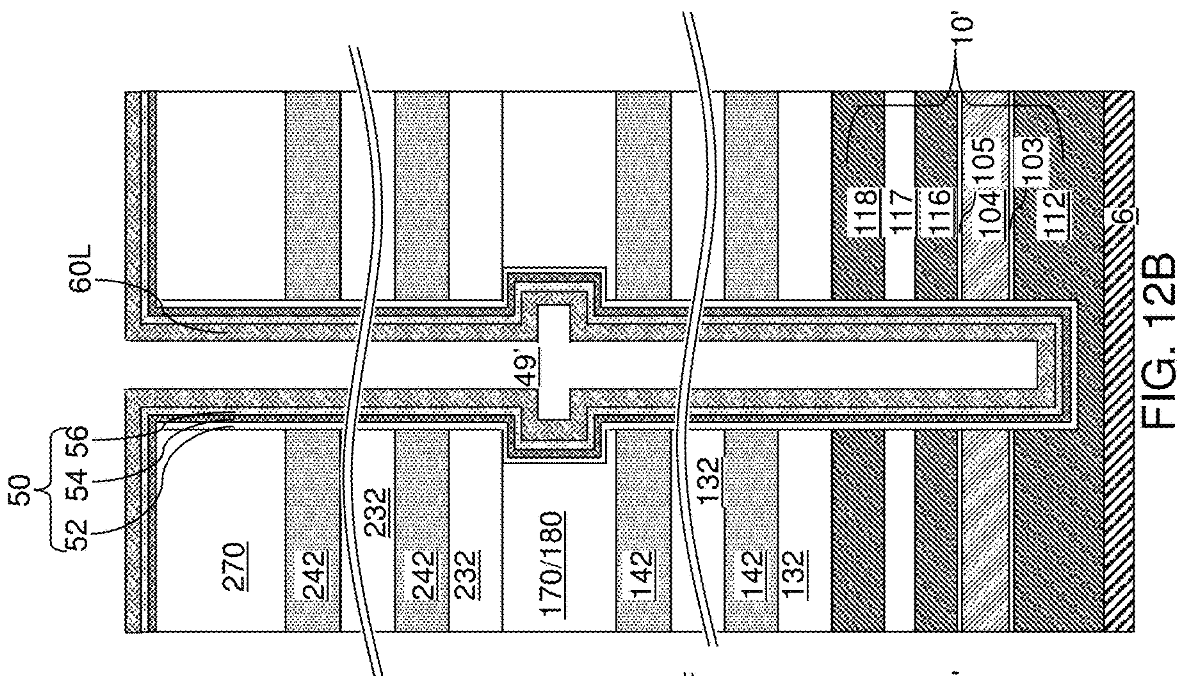
FIGS. 12A-12D illustrate sequential vertical cross-sectional views of a memory opening during formation of a memory opening fill structure according to the first embodiment of the present disclosure.
Figure 12A:
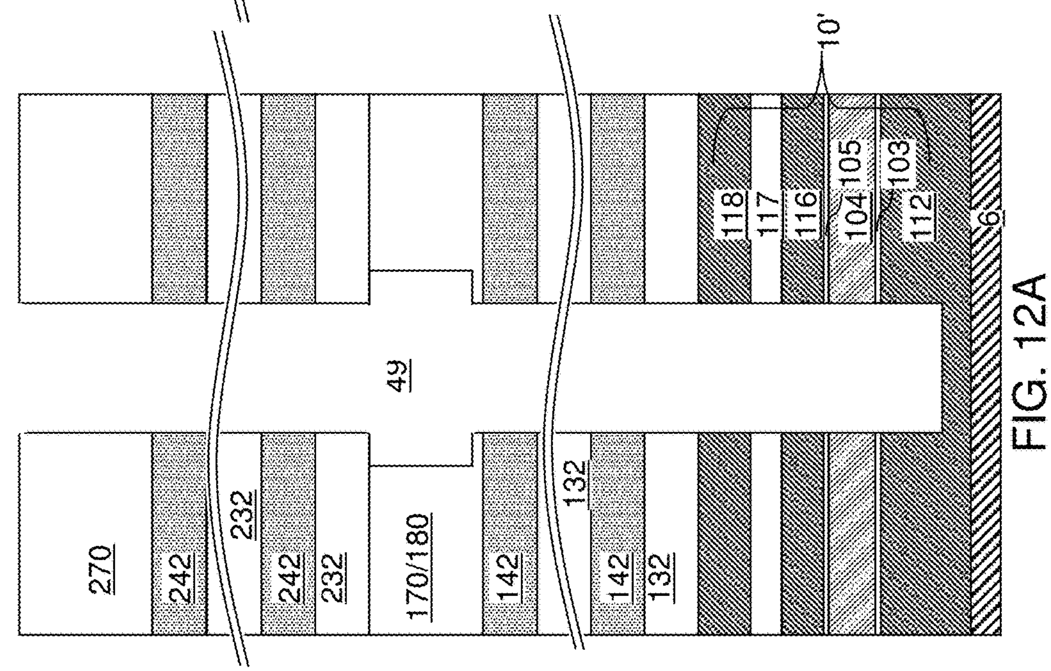

Referring to FIGS. 11A, 11B, and 12A, the sacrificial memory opening fill material portions 359 can be removed selective to the materials of the first-tier alternating stack (132, 142), the second-tier alternating stack (232, 242), the retro-stepped dielectric material portions (165, 265), and the support pillar structures 20. For example, if the sacrificial memory opening fill material portions 359 include a carbon-based material, the sacrificial memory opening fill material portions 359 can be removed by ashing. If the sacrificial memory opening fill material portions 359 include a silicon-germanium alloy or germanium, a wet etch employing a mixture of ammonium hydroxide and hydrogen peroxide can be performed to remove the sacrificial memory opening fill material portions 359. The memory openings 49 become empty.

Referring to FIG. 12B, a blocking dielectric layer 52, a charge storage layer 54, a tunneling dielectric layer 56, and a semiconductor channel material layer 60L can be sequentially deposited in each memory opening 49. The blocking dielectric layer 52 can be conformally deposited by a conformal deposition process (such as a low pressure chemical vapor deposition process), and may include a single dielectric material layer or a stack of a plurality of dielectric material layers. In one embodiment, the blocking dielectric layer 52 may include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 may include a dielectric metal oxide having a dielectric constant greater than 7.9, i.e., having a dielectric constant greater than the dielectric constant of silicon nitride. The thickness of the dielectric metal oxide layer may be in a range from 1 nm to 20 nm, although lesser and greater thicknesses may also be used. The dielectric metal oxide layer may subsequently function as a dielectric material portion that blocks leakage of stored electrical charges to control gate electrodes. In one embodiment, the blocking dielectric layer 52 includes aluminum oxide. Alternatively, or additionally, the blocking dielectric layer 52 may include a dielectric semiconductor compound such as silicon oxide, silicon oxynitride, silicon nitride, or a combination thereof.

The charge storage layer 54 can be conformally deposited over the blocking dielectric layer 52. In one embodiment, the charge storage layer 54 may be a continuous layer or patterned discrete portions of a charge trapping material including a dielectric charge trapping material, which may be, for example, silicon nitride. Alternatively, the charge storage layer 54 may include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the charge storage layer 54 includes a silicon nitride layer. In one embodiment, the sacrificial material layers (142, 242) and the insulating layers (132, 232) may have vertically coincident sidewalls, and the charge storage layer 54 may be formed as a single continuous layer. Alternatively, the sacrificial material layers (142, 242) may be laterally recessed with respect to the sidewalls of the insulating layers (132, 232), and a combination of a deposition process and an anisotropic etch process may be used to form the charge storage layer 54 as a plurality of memory material portions that are vertically spaced apart. The thickness of the charge storage layer 54 may be in a range from 2 nm to 20 nm, although lesser and greater thicknesses may also be used.

A tunneling dielectric layer 56 can be formed over the charge storage layer 54. The tunneling dielectric layer 56 includes a dielectric material through which charge tunneling may be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 may include a stack of a first silicon oxide layer, a silicon oxynitride layer, and a second silicon oxide layer, which is commonly known as an ONO stack. In one embodiment, the tunneling dielectric layer 56 may include a silicon oxide layer that is substantially free of carbon or a silicon oxynitride layer that is substantially free of carbon. The thickness of the tunneling dielectric layer 56 may be in a range from 2 nm to 20 nm, although lesser and greater thicknesses may also be used. The stack of the blocking dielectric layer 52, the charge storage layer 54, and the tunneling dielectric layer 56 constitutes a memory film 50 that stores memory bits. The combination of the blocking dielectric layer 52, the charge storage layer 54, and the tunneling dielectric layer 56 constitutes a memory film 50.

A semiconductor channel material layer 60L can be formed over the tunneling dielectric layer 56. The semiconductor channel material layer 60L may include a doped semiconductor material such as at least one elemental semiconductor material, at least one III-V compound semiconductor material, at least one II-VI compound semiconductor material, at least one organic semiconductor material, or other semiconductor materials known in the art. The conductivity type of dopants in the semiconductor channel material layer 60L is herein referred to as a first conductivity type, which may be p-type or n-type. In one embodiment, the semiconductor channel material layer 60L has a p-type doping in which p-type dopants (such as boron atoms) are present at an atomic concentration in a range from $1.0\times10^{12}/cm^3$ to $1.0\times10^{18}/cm^3$, such as from $1.0\times10^{14}/cm^3$ to $1.0\times10^{17}/cm^3$. In one embodiment, the semiconductor channel material layer 60L includes, and/or consists essentially of, boron-doped amorphous silicon or boron-doped polysilicon. In another embodiment, the semiconductor channel material layer 60L has an n-type doping in which n-type dopants (such as phosphor atoms or arsenic atoms) are present at an atomic concentration in a range from $1.0\times10^{12}/cm^3$ to $1.0\times10^{18}/cm^3$, such as from $1.0\times10^{14}/cm^3$ to $1.0\times10^{17}/cm^3$. The semiconductor channel material layer 60L may be formed by a conformal deposition method such as low pressure chemical vapor deposition (LPCVD). The thickness of the semiconductor channel material layer 60L may be in a range from 2 nm to 10 nm, although lesser and greater thicknesses may also be used. A cavity 49' is formed in the volume of each memory opening 49 that is not filled with the deposited material layers (52, 54, 56, 60L). A memory cavity 49' can be present within each unfilled volume of the memory openings 49.

Figure 12C:
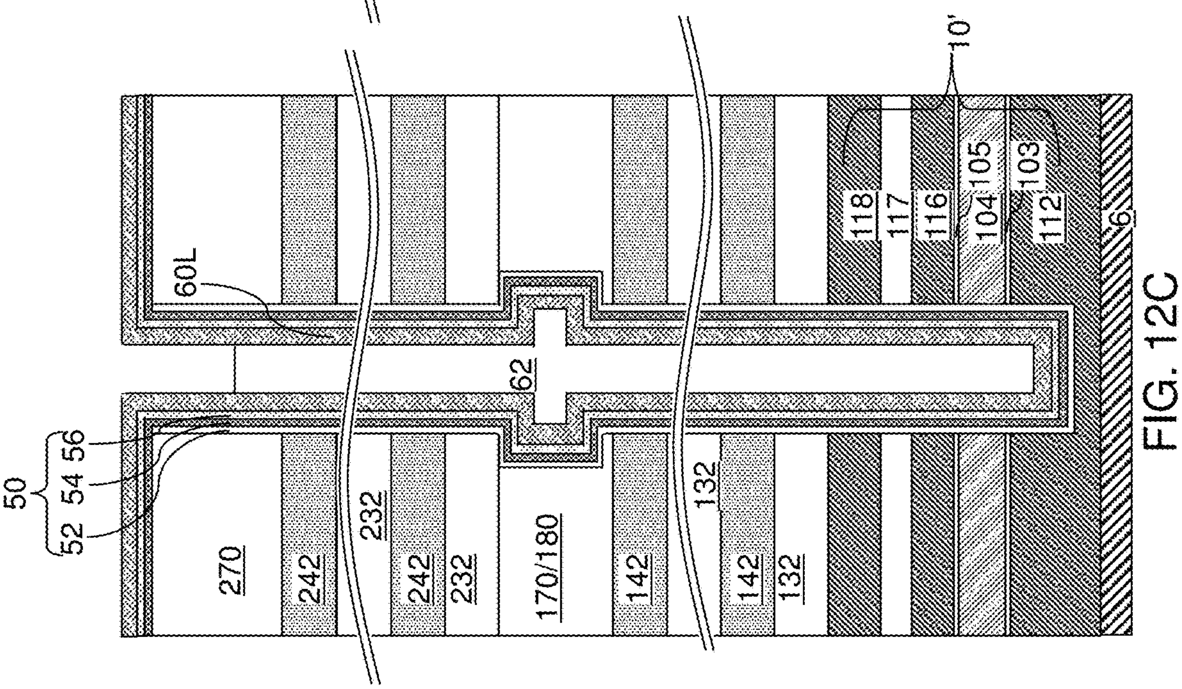

Referring to FIG. 12C, in embodiments in which the memory cavity 49' in each memory opening is not completely filled by the semiconductor channel material layer 60L, a dielectric core layer may be deposited in the memory cavity 49' to fill any remaining portion of the memory cavity 49' within each memory opening. The dielectric core layer includes a dielectric material such as silicon oxide or organo silicate glass. The dielectric core layer may be deposited by a conformal deposition method such as low pressure chemical vapor deposition (LPCVD), or by a self-planarizing deposition process such as spin coating. The horizontal portion of the dielectric core layer overlying the second insulating cap layer 270 may be removed, for example, by a recess etch. The recess etch continues until top surfaces of the remaining portions of the dielectric core layer are recessed to a height between the top surface of the second insulating cap layer 270 and the bottom surface of the second insulating cap layer 270. Each remaining portion of the dielectric core layer constitutes a dielectric core 62.

Figure 12D:
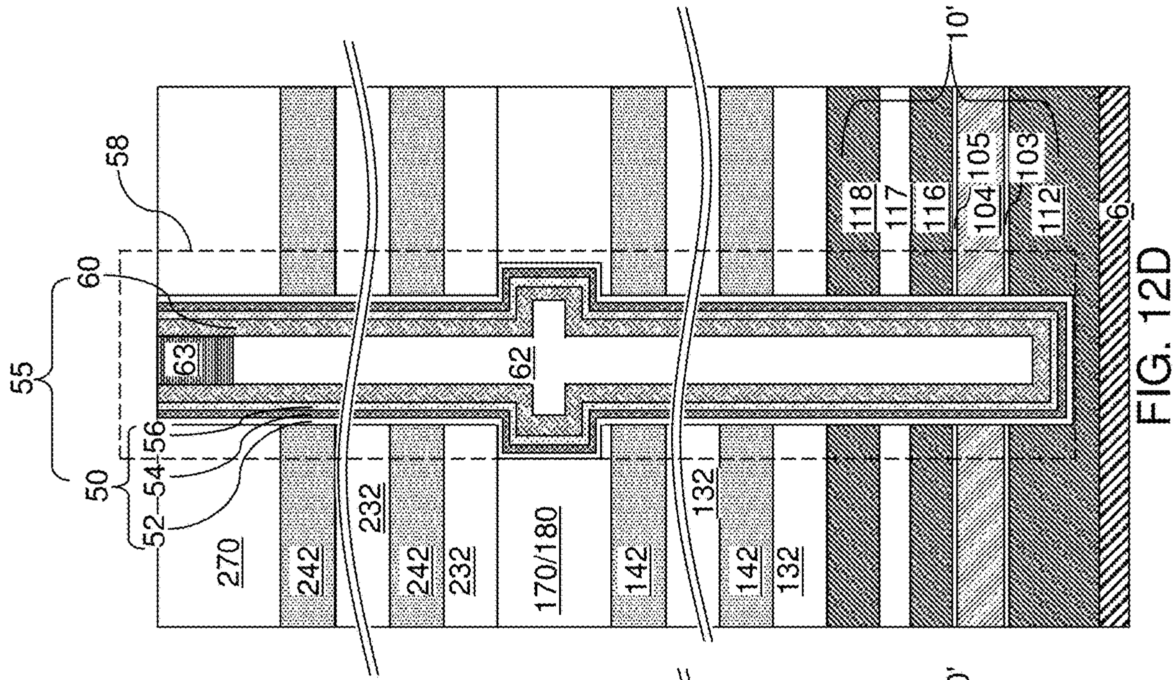

Referring to FIG. 12D, a doped semiconductor material may be deposited in cavities overlying the dielectric cores 62. The doped semiconductor material has a doping of the opposite conductivity type of the doping of the semiconductor channel material layer 60L. In one embodiment, the doped semiconductor material has an n-type doping. Portions of the deposited doped semiconductor material, the semiconductor channel material layer 60L, the tunneling dielectric layer 56, the charge storage layer 54, and the blocking dielectric layer 52 that overlie the horizontal plane including the top surface of the second insulating cap layer 270 may be removed by a planarization process such as a chemical mechanical planarization (CMP) process.

Each remaining portion of the doped semiconductor material-constitutes a drain region 63. The dopant concentration in the drain regions 63 may be in a range from $5.0\times10^{19}/cm^3$ to $2.0\times10^{21}/cm^3$, although lesser and greater dopant concentrations may also be used. The doped semiconductor material may be, for example, doped polysilicon.

Each remaining portion of the semiconductor channel material layer 60L constitutes a vertical semiconductor channel 60 through which electrical current may flow when a vertical NAND device including the vertical semiconductor channel 60 is turned on. A tunneling dielectric layer 56 may be surrounded by a charge storage layer 54, and laterally surrounds a vertical semiconductor channel 60. Each adjoining set of a blocking dielectric layer 52, a charge storage layer 54, and a tunneling dielectric layer 56 collectively constitute a memory film 50, which may store electrical charges with a macroscopic retention time. In some embodiments, a blocking dielectric layer 52 may not be present in the memory film 50 at this step, and a backside blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 (which is a vertical semiconductor channel) within a memory opening 49 constitutes a memory stack structure 55. The memory stack structure 55 may be a combination of a vertical semiconductor channel 60, a tunneling dielectric layer 56, a plurality of memory elements comprising portions of the charge storage layer 54, and an optional blocking dielectric layer 52. Each combination of a memory stack structure 55, a dielectric core 62, and a drain region 63 within a memory opening 49 constitutes a memory opening fill structure 58. Each drain region 63 in a memory opening fill structure 58 is electrically connected to an upper end of a respective one of the vertical semiconductor channels 60. The in-process source-level material layers 10', the first-tier structure (132, 142, 170, 165), the second-tier structure (232, 242, 270, 265), the inter-tier dielectric layer 180, and the memory opening fill structures 58 collectively constitute a memory-level assembly.

The memory stack structures 55 are formed through the alternating stack {(132, 142), (232, 242)}. Each of the memory stack structures 55 comprises a vertical semiconductor channel 60 and a vertical stack of memory elements located in the memory film 50 at levels of the sacrificial material layers (142, 242). Each vertical stack of memory elements comprises charge storage material portions (i.e., portions of a charge storage layer 54) located at each level of the sacrificial material layers 142 and laterally spaced from a vertical semiconductor channel 60 within a same memory opening 49 by a tunneling dielectric layer 56.

Figure 13A:
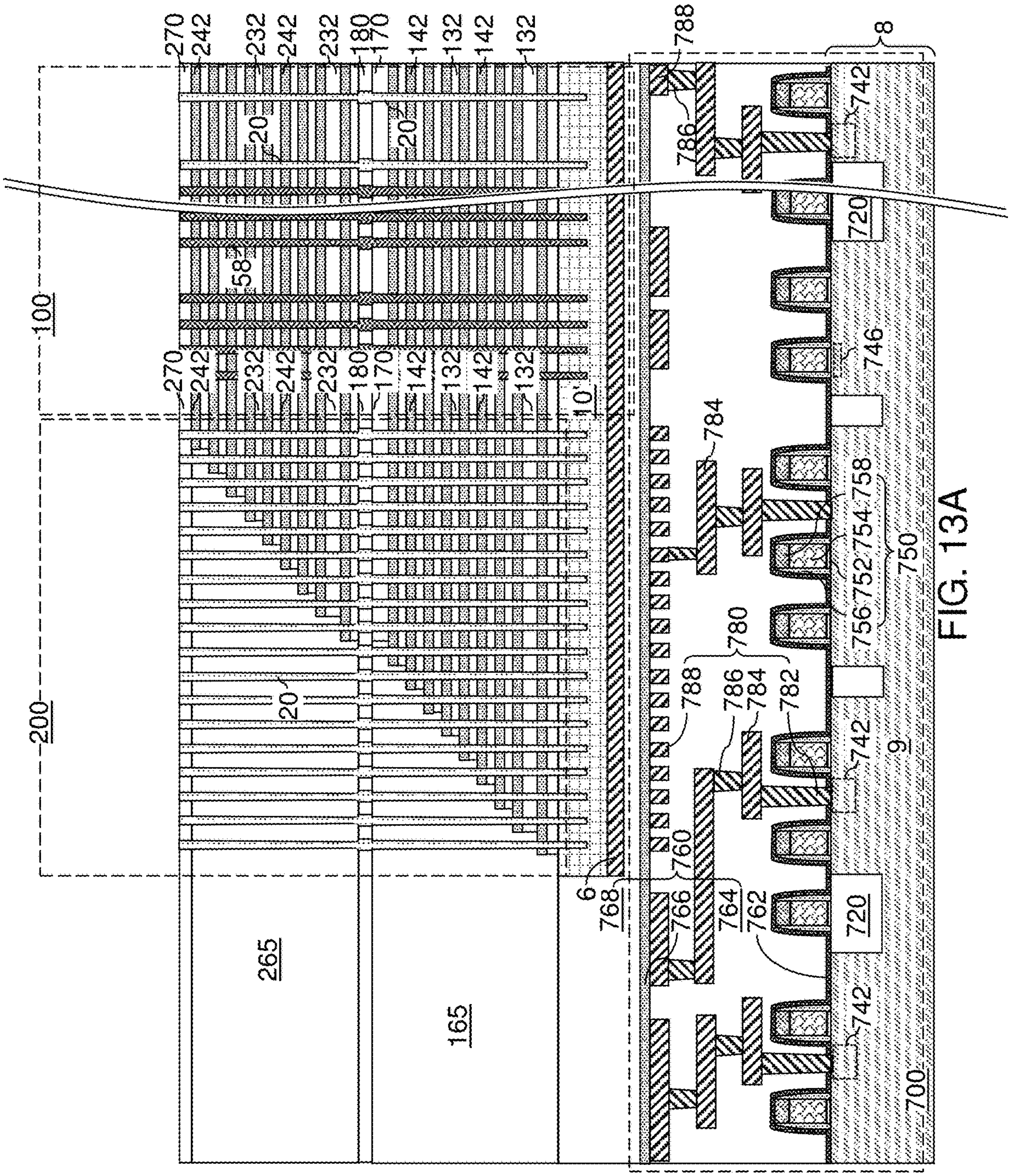
FIG. 13A is a vertical cross-sectional view of the first exemplary structure after formation of memory opening fill structures according to the first embodiment of the present disclosure.
Figure 13B:
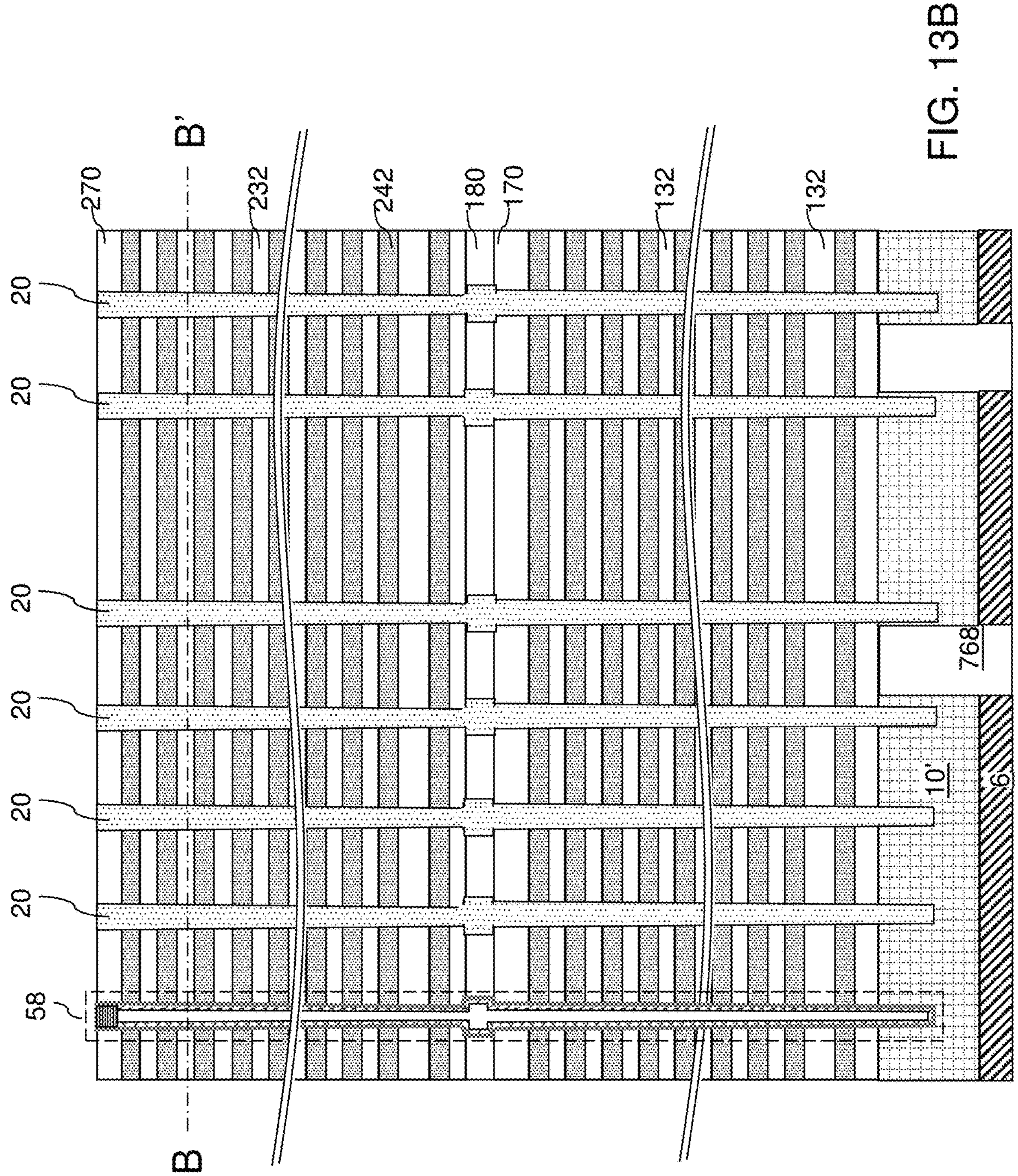
FIG. 13B is another vertical cross-sectional view of the first exemplary structure of FIGS. 8A and 8B.
Figure 13C:
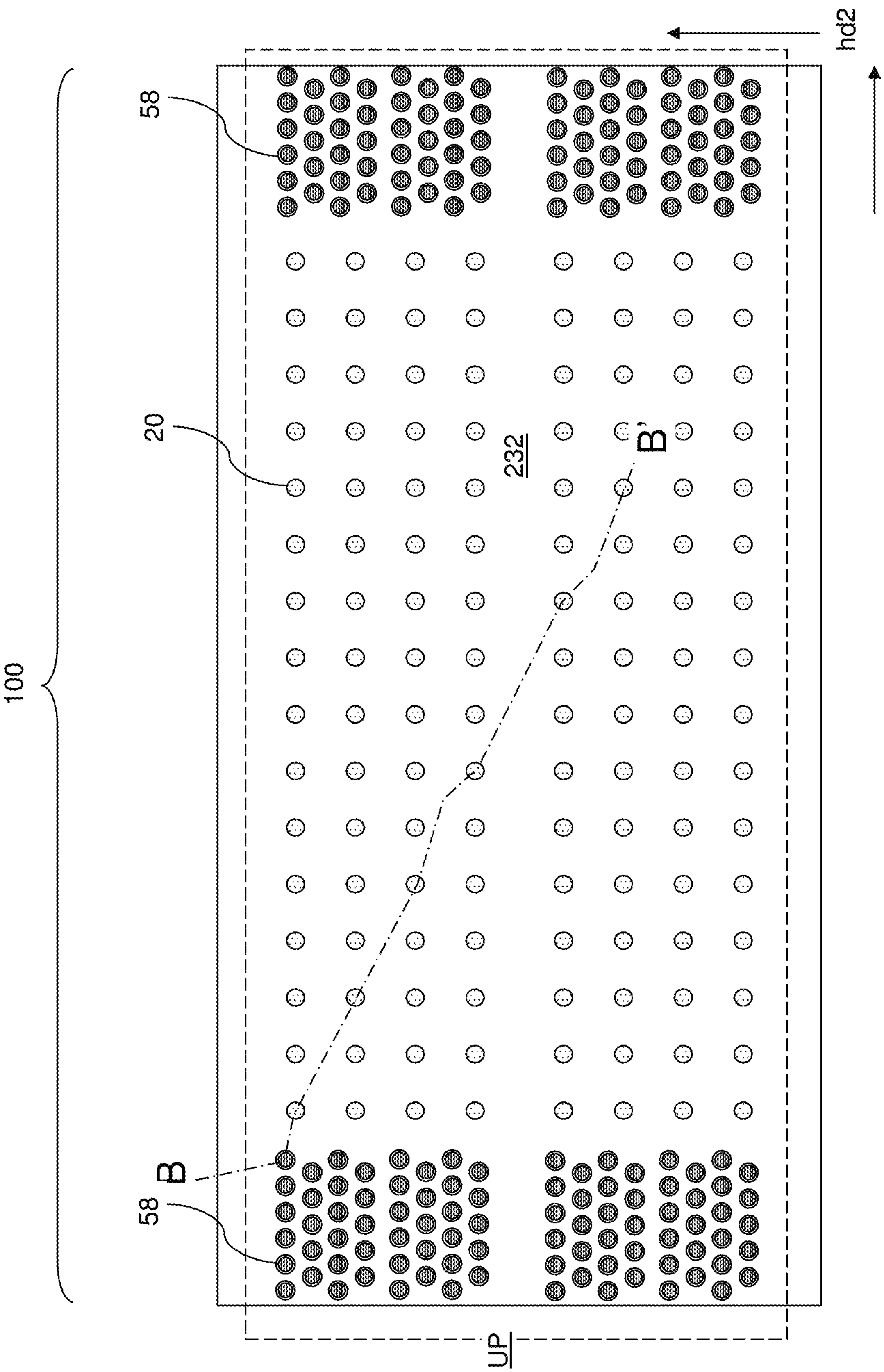
FIG. 13C is a horizontal cross-sectional view of the first exemplary structure along the horizontal plane C-C' of FIG. 13B. The hinged vertical plane B-B' corresponds to the plane of the vertical cross-sectional view of FIG. 13B.
Figure 14A:
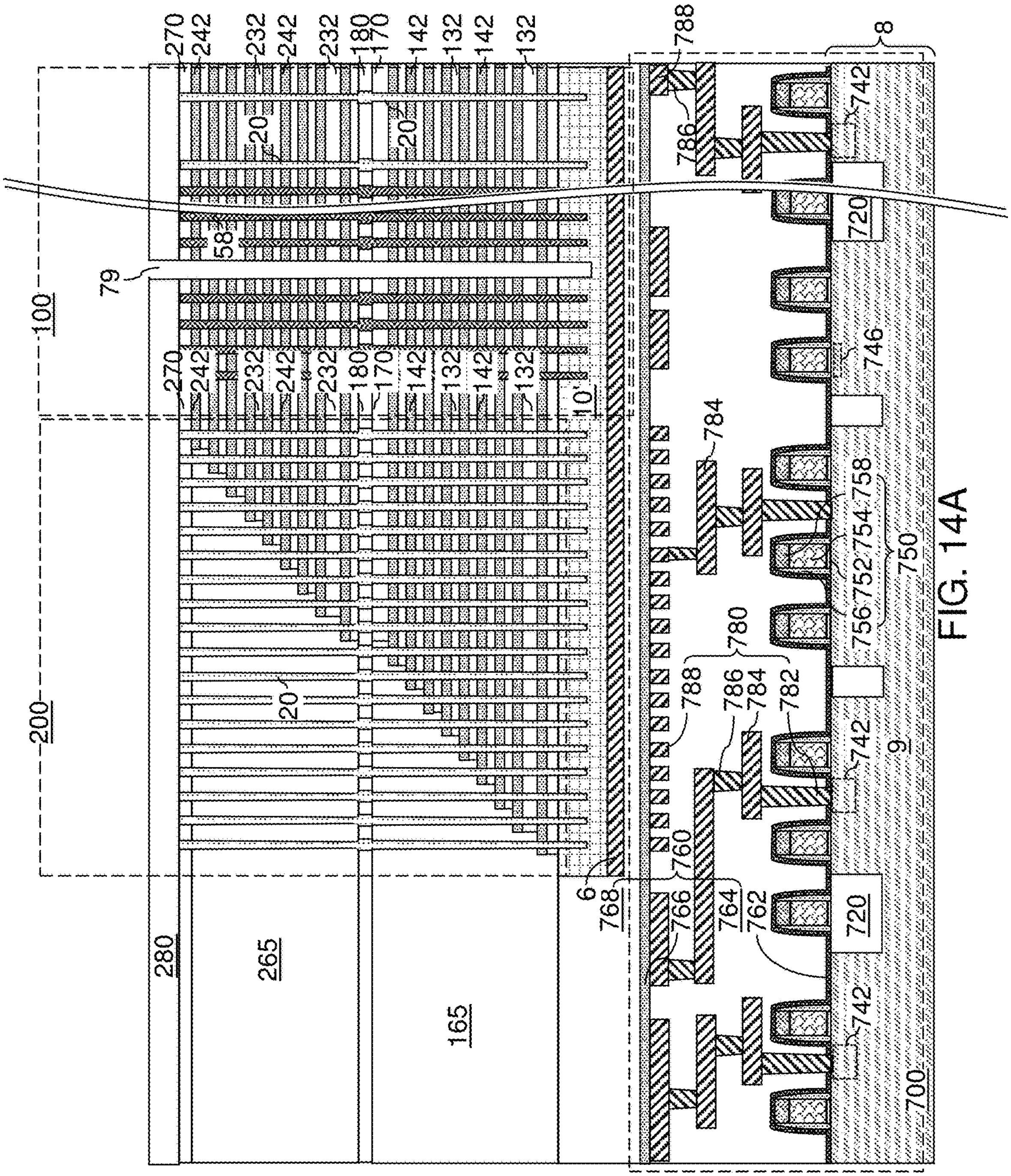
FIG. 14A is a vertical cross-sectional view of the first exemplary structure after formation of backside trenches and access trenches according to the first embodiment of the present disclosure.
Figure 14B:
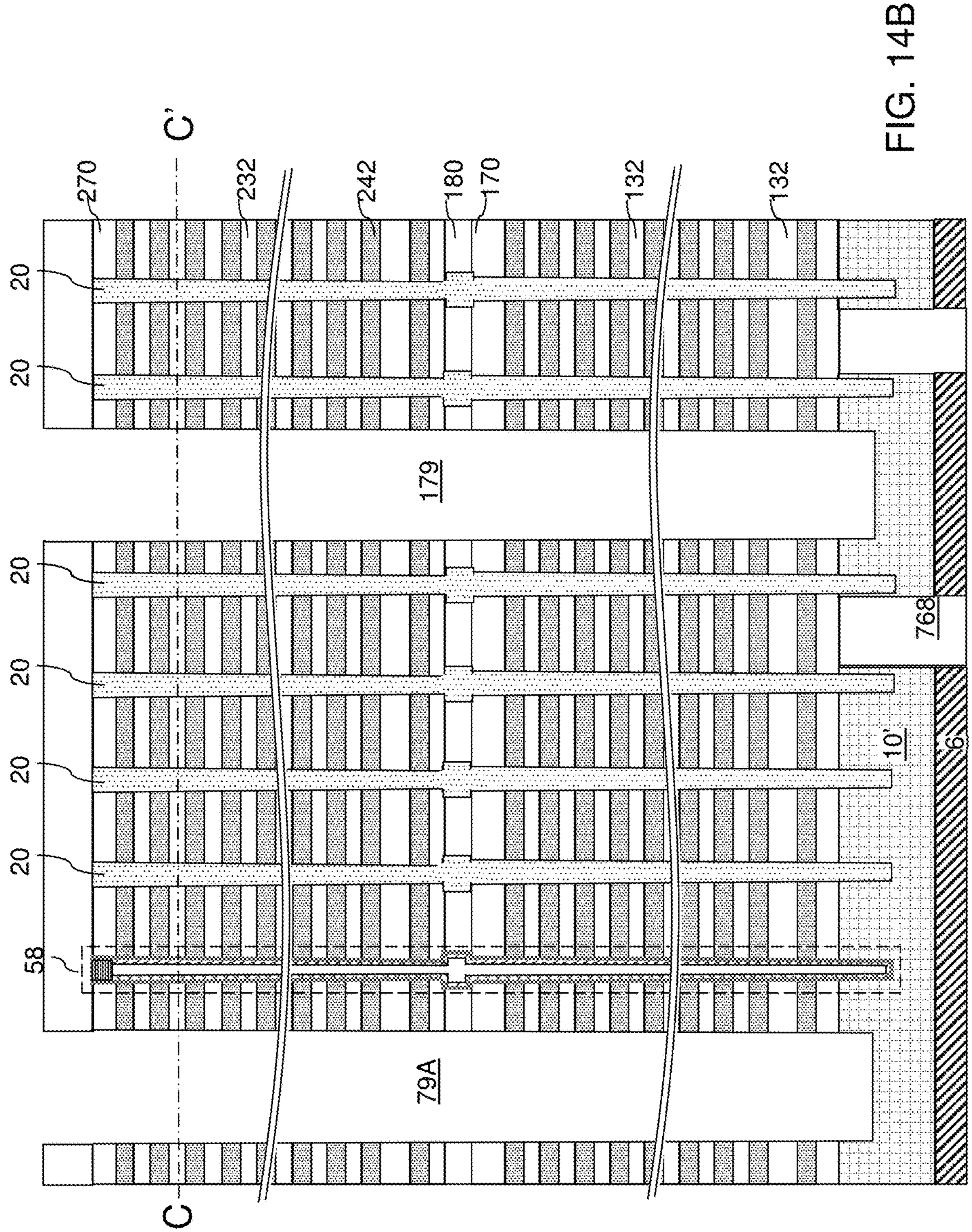
FIG. 14B is another vertical cross-sectional view of the first exemplary structure of FIG. 14A.
Figure 14C:
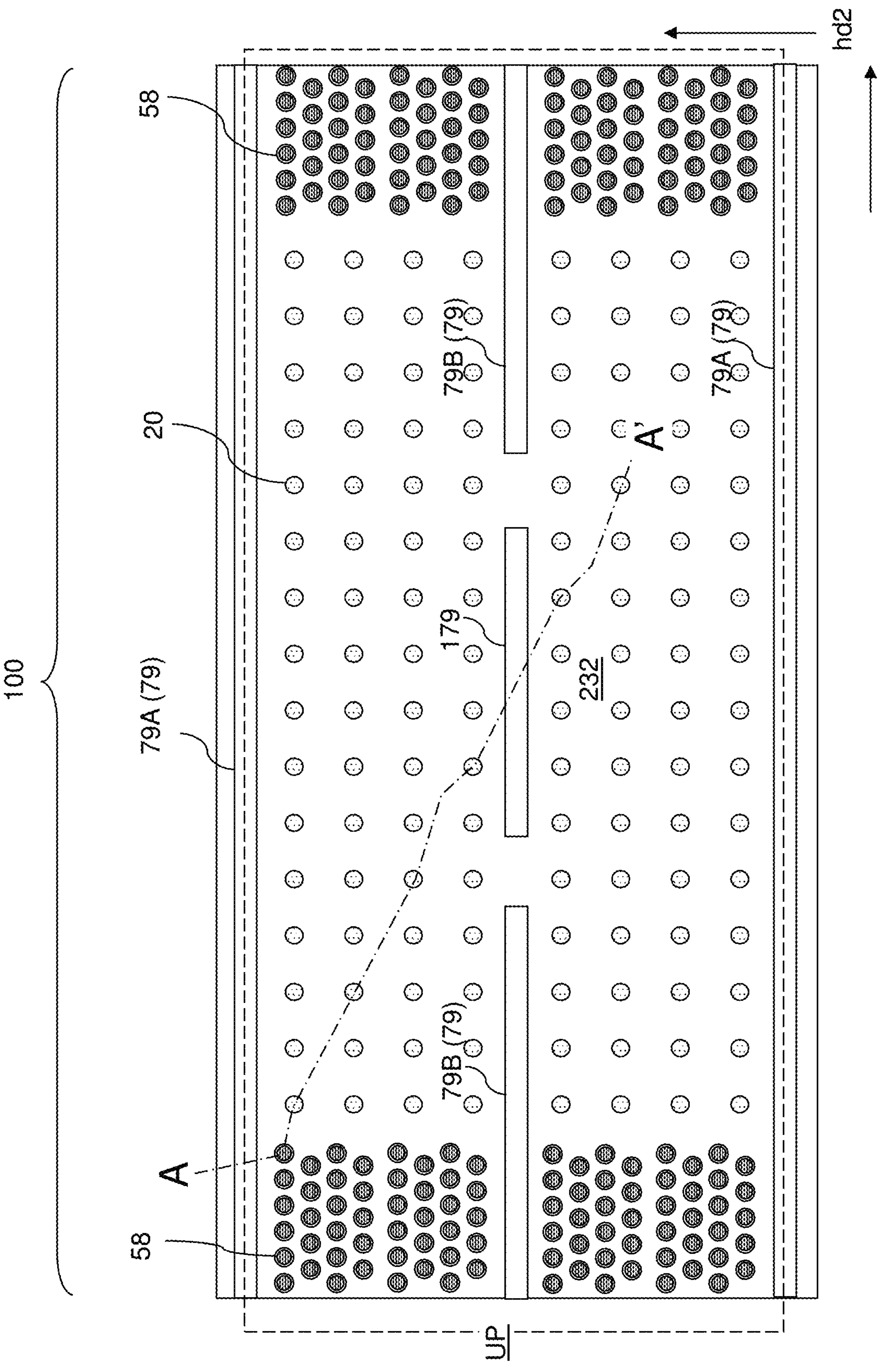
FIG. 14C is a horizontal cross-sectional view of the first exemplary structure along the horizontal plane C-C' of FIG. 14B. The hinged vertical plane B-B' corresponds to the plane of the vertical cross-sectional view of FIG. 14B.

Referring to FIGS. 13A-13C, the first exemplary structure is illustrated after formation of the memory opening fill structures 58. Each of the alternating stacks {(132, 142), (232, 242)} comprises a terrace region in which each sacrificial material layer (142, 242) other than a topmost sacrificial material layer (142, 242) within the alternating stack {(132, 142) and/or (232, 242)} laterally extends farther than any overlying sacrificial material layer (142, 242) within the alternating stack {(132, 142) and/or (232, 242)}. The terrace region includes stepped surfaces of the alternating stack that continuously extend from a bottommost layer within the alternating stack {(132, 142) or (232, 242)} to a topmost layer within the alternating stack {(132, 142) or (232, 242)}. Support pillar structures 20 extend through the stepped surfaces and through a retro-stepped dielectric material portion (165 or 265) that overlies the stepped surfaces.

A first subset of the memory stack structures 55 is located in a first portion of a memory array region 100 in which each layer of the first-tier alternating stack (132, 142) and each layer of the second-tier alternating stack (232, 242) are present. A second subset of the memory stack structures 55 is located in a second portion of the memory array region 100 in which each layer of the first-tier alternating stack (132, 142) and each layer of the second-tier alternating stack (232, 242) are present and are laterally spaced from the first portion of the memory array region 100 along a first horizontal direction hd1.

Referring to FIGS. 14A-14D, a first contact-level dielectric layer 280 may be formed over the second-tier structure (232, 242, 270, 265). The first contact-level dielectric layer 280 includes a dielectric material such as silicon oxide, and may be formed by a conformal or non-conformal deposition process. For example, the first contact-level dielectric layer 280 may include undoped silicate glass and may have a thickness in a range from 100 nm to 600 nm, although lesser and greater thicknesses may also be used.

A photoresist layer (not shown) may be applied over the first contact-level dielectric layer 280, and may be lithographically patterned to form various openings in the memory array region 100 and the staircase region 200. The openings in the photoresist layer include first elongated openings that laterally extend along the first horizontal direction hd1 through at least one staircase region 200 and at least a portion of the memory array region 100. A first subset of the first elongated openings can laterally extend through the entire width of the memory array region 100 along the first horizontal direction hd1. A second subset of the first elongated openings can laterally extend through a portion of the memory array region 100 and can terminate within an area of the memory array region 100 including an array of support pillar structures 20. The second subset of the first elongated openings laterally extends between groups of memory opening fill structures 58 and support pillar structures 20 that are laterally spaced along the first horizontal direction hd1.

Further, the openings in the photoresist layer may include second elongated openings located entirely within the area of the memory array region 100 including the array of support pillar structures 20. Thus, each second elongated opening has a lesser lateral extent that the lateral extent of the memory array region 100 along the first horizontal direction hd1. The second elongated openings extend along the first horizontal direction hd1 between a respective neighboring pair of the second subset of the first elongated openings that are laterally spaced apart along the first horizontal direction hd1 in one vertical plane which extends in the first horizontal direction hd1.

An anisotropic etch may be performed to transfer the pattern in the photoresist layer through underlying material portions including the alternating stacks {(132, 142), (232, 242)} and an upper portion of the in-process source-level material layers 10'. Backside trenches 79 may be formed underneath the first elongated openings in the photoresist layer through the first contact-level dielectric layer 280, the second-tier structure (232, 242, 270, 265), and the first-tier structure (132, 142, 170, 165), and into the in-process source-level material layers 10'. Portions of the first contact-level dielectric layer 280, the second-tier structure (232, 242, 270, 265), the first-tier structure (132, 142, 170, 165), and the in-process source-level material layers 10' that underlie the first elongated openings in the photoresist layer may be removed to form the backside trenches 79. In one embodiment, the backside trenches 79 may be formed between groups of memory stack structures 55 that are laterally spaced apart along the second horizontal direction. A top surface of a source-level sacrificial layer 104 may be physically exposed at the bottom of each backside trench 79. The alternating stack {(132, 232), (142, 242)} as provided at the processing steps of FIGS. 13A-13C may be divided into a plurality of alternating stacks {(132, 232), (142, 242)} of respective insulating layers (132, 232) and respective sacrificial material layers (142, 242) by the backside trenches 79. A first subset of backside trenches 79A is formed through the first subset of the first elongated openings in the photoresist layer. The first set of the backside trenches 79A laterally extends through the entire width of the memory array region 100 along the first horizontal direction hd1. A first subset of backside trenches 79B is formed through the second subset of the first elongated openings in the photoresist layer. The second subset of the backside trenches 79B can laterally extend through a portion of the memory array region 100 and can terminate within an area of the memory array region 100 including an array of support pillar structures 20.

Access trenches 179 may be formed underneath the second elongated openings in the photoresist layer through the first contact-level dielectric layer 280, the second-tier structure (232, 242, 270, 265), and the first-tier structure (132, 142, 170, 165), and into the in-process source-level material layers 10'. Portions of the first contact-level dielectric layer 280, the second-tier structure (232, 242, 270, 265), the first-tier structure (132, 142, 170, 165), and the in-process source-level material layers 10' that underlie the second elongated openings in the photoresist layer may be removed to form the access trenches 179. The access trenches 179 can be located entirely within the area of the memory array region 100 that includes an array of support pillar structures 20 located between a neighboring pair of clusters of memory opening fill structures 58 that are laterally spaced apart along the first horizontal direction hd1. In one embodiment, the access trenches 179 can be formed between a pair of backside trenches 79B that are laterally spaced apart along the first horizontal direction hd1, and can be aligned to the pair of backside trenches 79B along the second horizontal direction hd2. Each access trench 179 may be located between a neighboring pair of backside trenches 79A. Each access trench 179 has a lesser lateral extent that the lateral extent of the memory array region 100 along the first horizontal direction hd1. A top surface of a source-level sacrificial layer 104 may be physically exposed at the bottom of each access trench 179. The backside trenches 79 and the access trenches 179 are concurrently formed by a same anisotropic etch process.

Figure 15A:
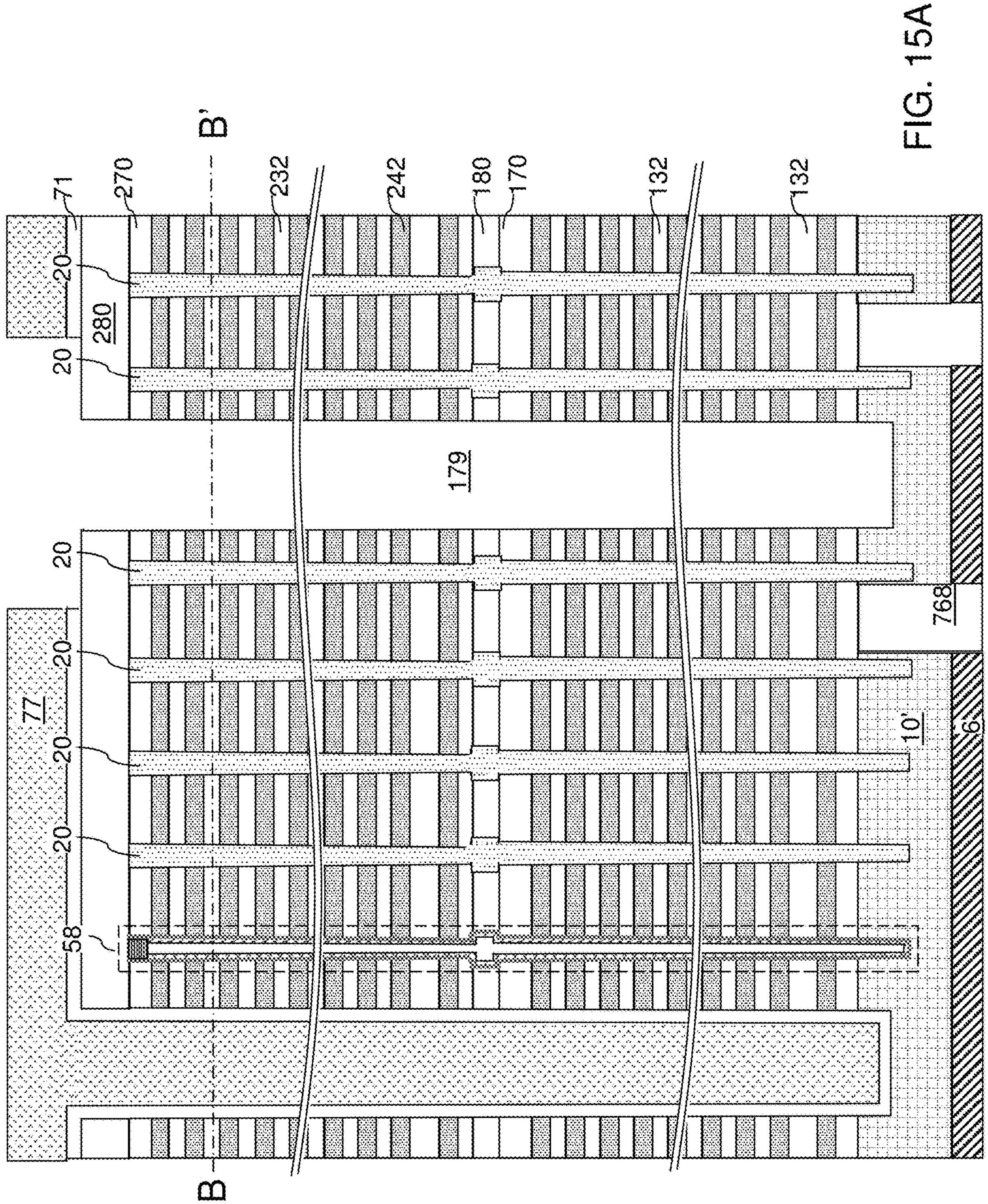
FIG. 15A is a vertical cross-sectional view of the first exemplary structure after formation and patterning of an etch barrier liner according to the first embodiment of the present disclosure.
Figure 15B:
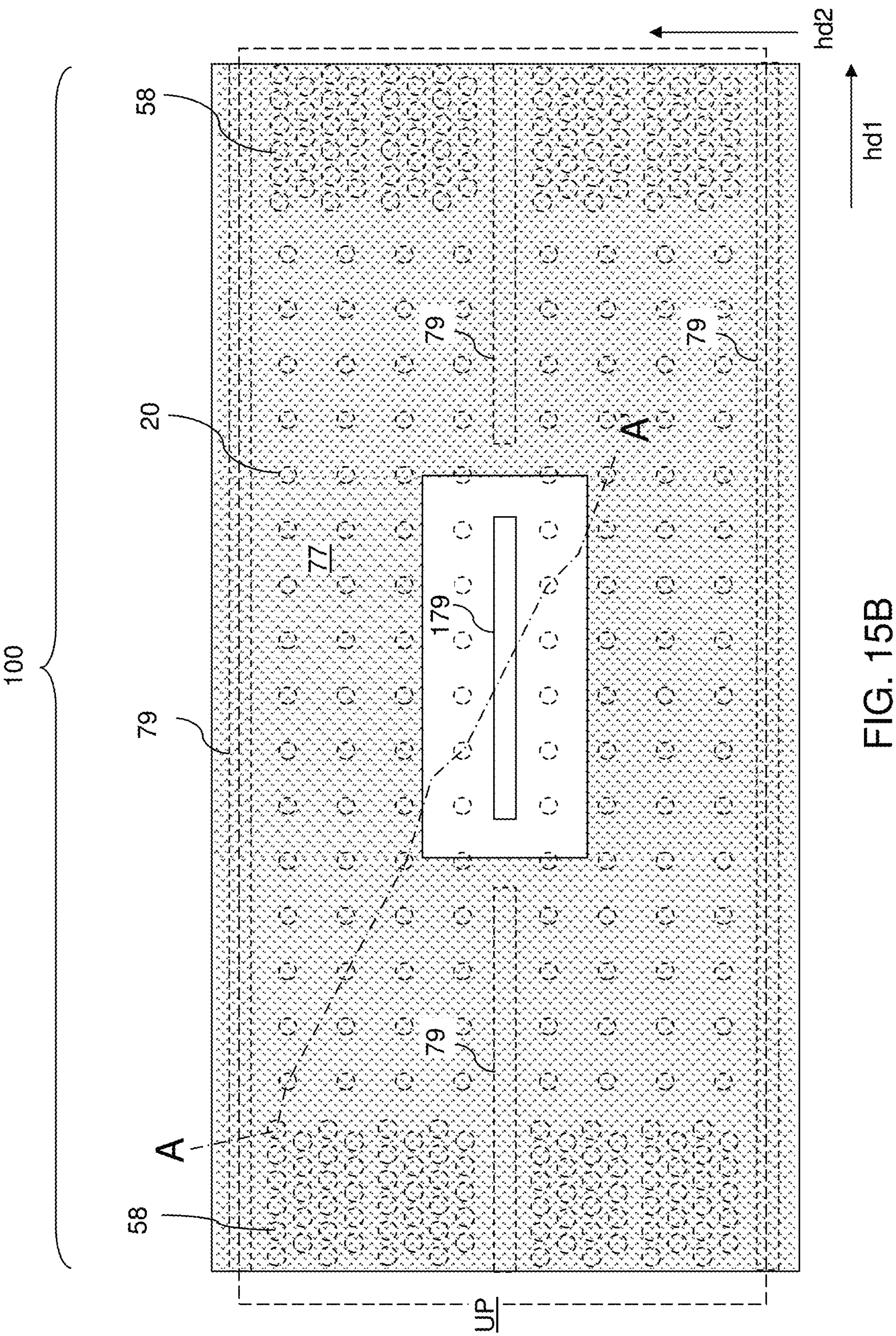
FIG. 15B is a horizontal cross-sectional view of the first exemplary structure along the horizontal plane B-B' of FIG. 15A. The hinged vertical plane A-A' corresponds to the plane of the vertical cross-sectional view of FIG. 15A.

Referring to FIGS. 15A and 15B, an etch barrier liner 71 can be conformally deposited in the backside trenches 79 and the access trenches 179 and over the first contact-level dielectric layer 280 by a conformal deposition process. The etch barrier liner 71 includes a dielectric material that is different from the materials of the first sacrificial material layers 142 and the second sacrificial material layers 242. For example, the etch barrier liner 71 can include silicon oxide. The thickness of the etch barrier liner 71 can be in a range from 5 nm to 100 nm, such as from 10 nm to 50 nm, although lesser and greater thicknesses can also be employed.

A photoresist layer 77 can be applied over the first exemplary structure, and can be lithographically patterned to cover the backside trenches 79 without covering the access trenches 179. Unmasked portions of the etch barrier liner 71 can be removed by performing an isotropic etch process. For example, if the etch barrier liner 71 includes silicon oxide, a wet etch process employing hydrofluoric acid can be performed to remove unmasked portions of the etch barrier liner 71. Thus, the etch barrier liner 71 is removed from the sidewalls of the access trench 179 without removing the etch barrier liner 71 from the sidewalls of the backside trenches 79.

Figure 16A:
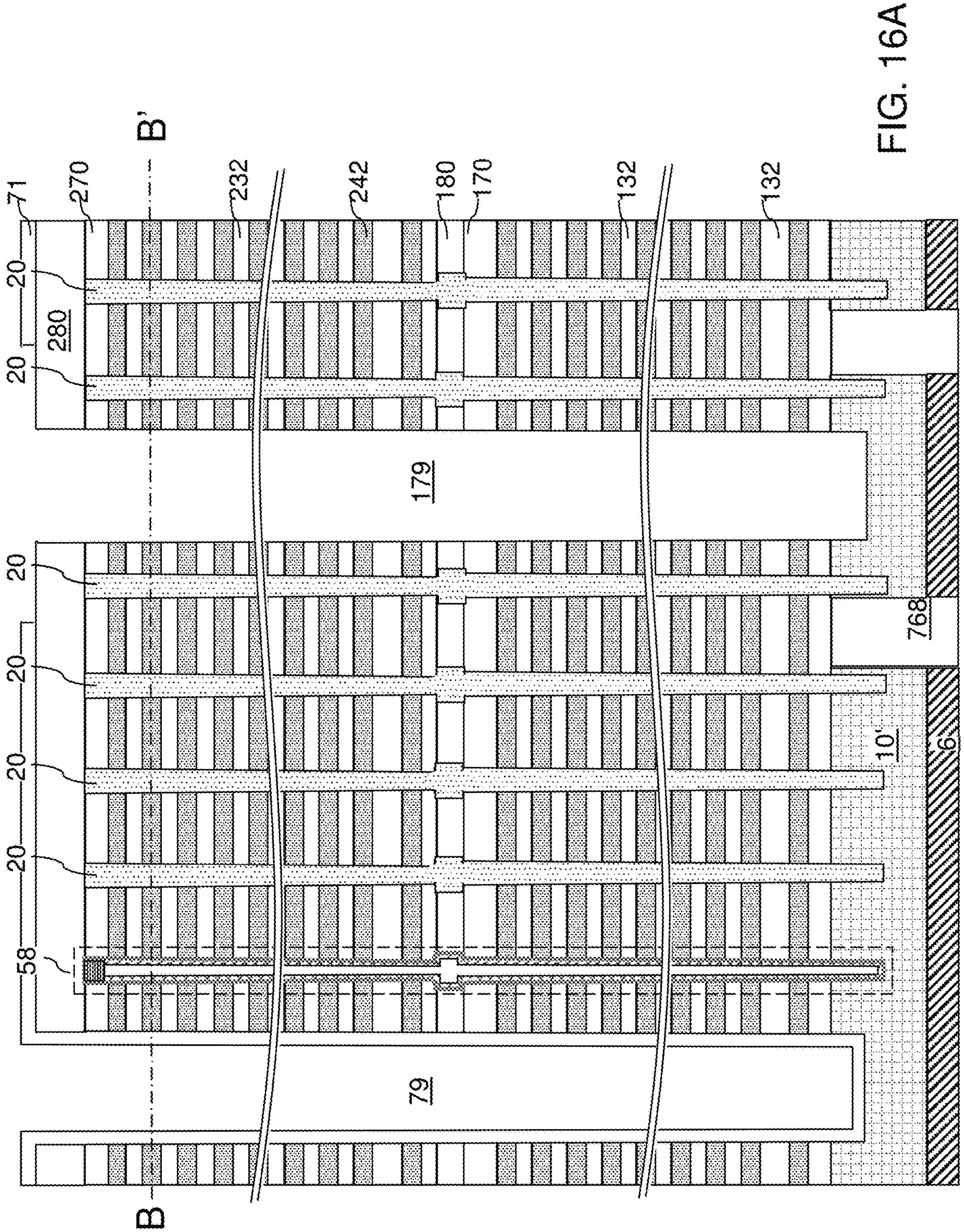
FIG. 16A is a vertical cross-sectional view of the first exemplary structure after formation and patterning of an etch barrier liner according to the first embodiment of the present disclosure.
Figure 16B:
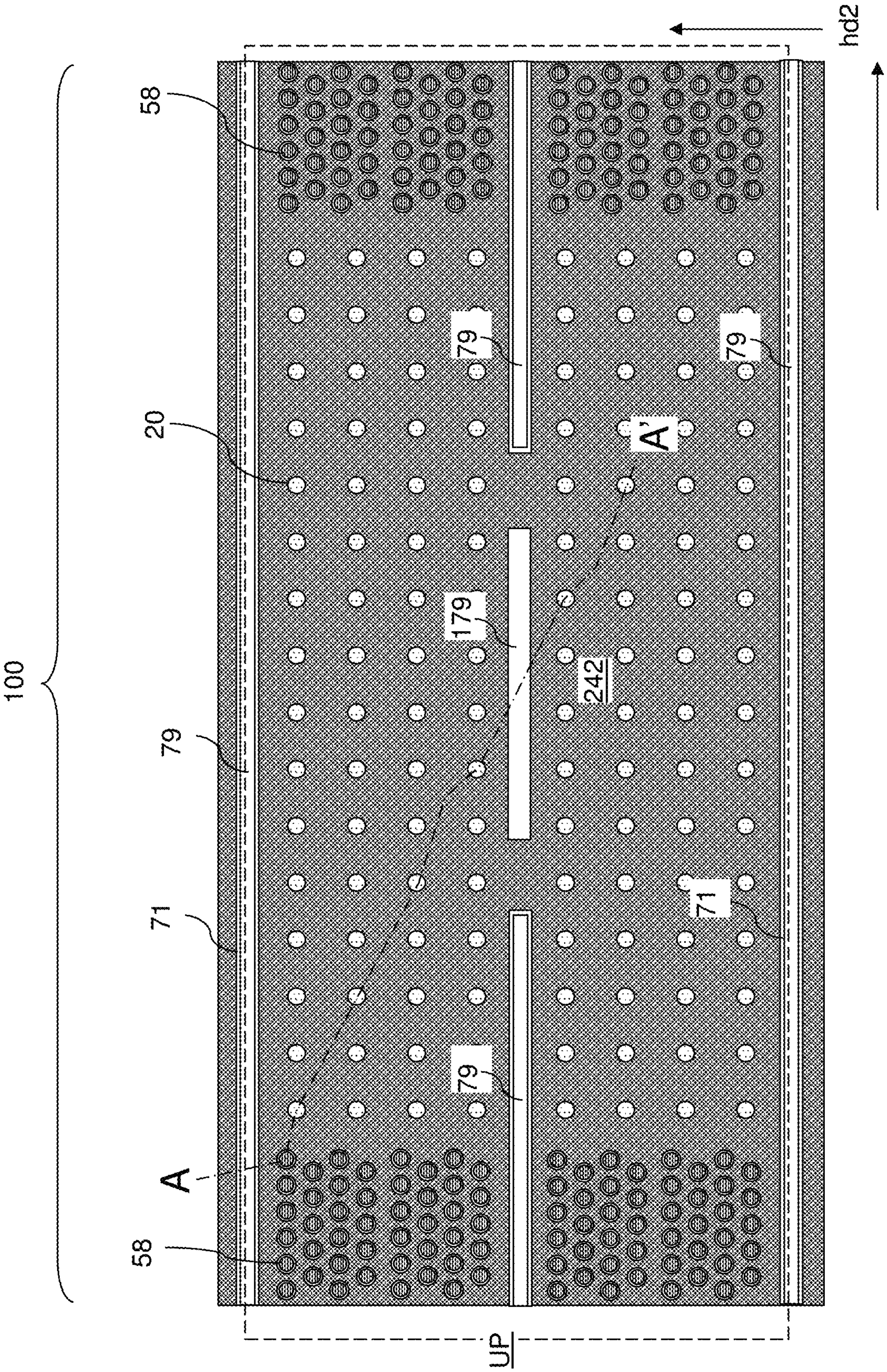
FIG. 16B is a horizontal cross-sectional view of the first exemplary structure along the horizontal plane B-B' of FIG. 16A. The hinged vertical plane A-A' corresponds to the plane of the vertical cross-sectional view of FIG. 16A.

Referring to FIGS. 16A and 16B, the photoresist layer 77 can be subsequently removed, for example, by ashing. Sidewalls of the access trenches 179 are physically exposed after removal of the photoresist layer 77. Sidewalls of the backside trenches 79 are covered by the etch barrier liner 71. Thus, sidewalls of the backside trenches 79 can be masked with the etch barrier liner 71 without the etch barrier liner 71 covering sidewalls of the access trench 179.

Figure 17A:
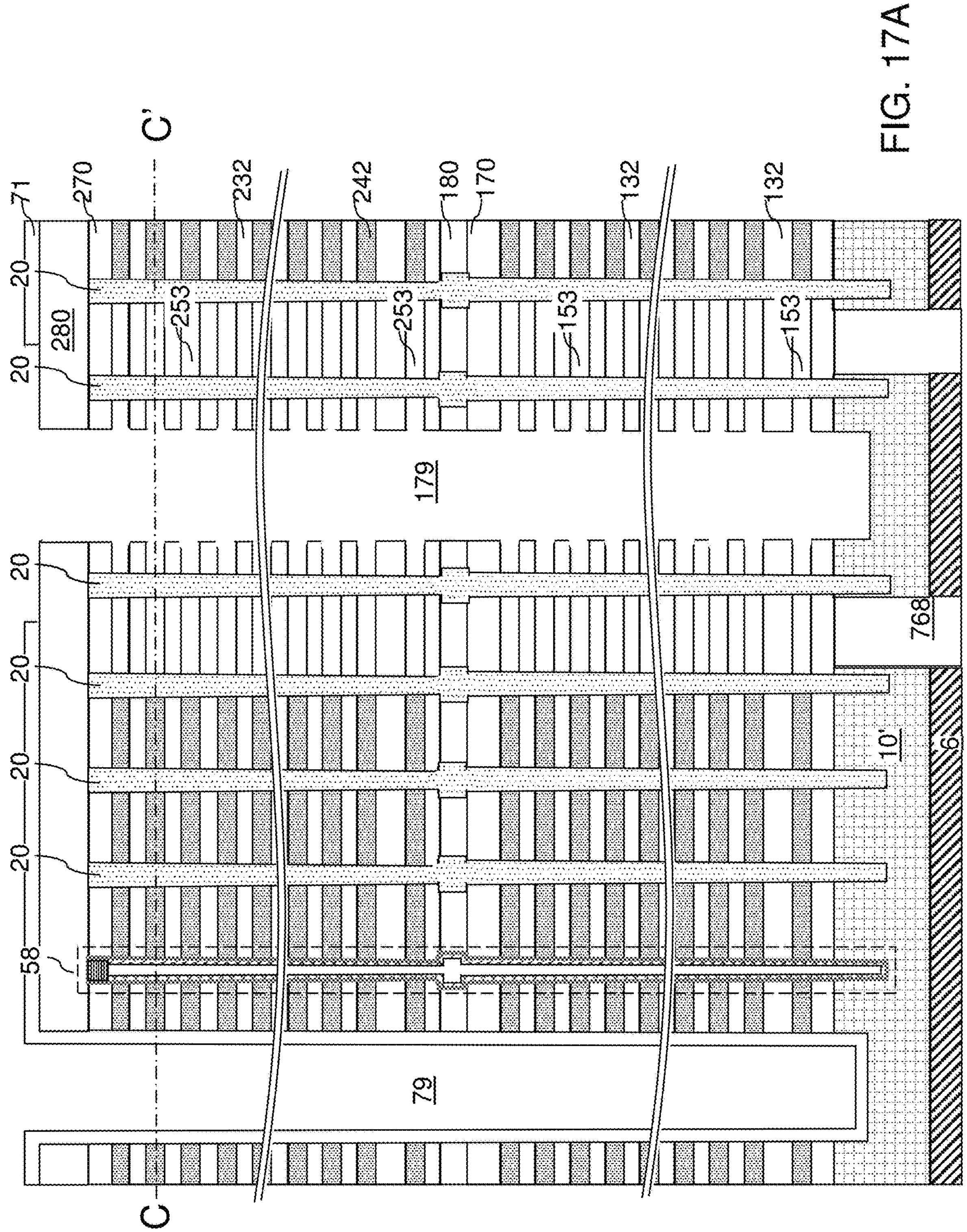
FIG. 17A is a vertical cross-sectional view of the first exemplary structure after formation of fin cavities around each access trench according to the first embodiment of the present disclosure.
Figure 17B:
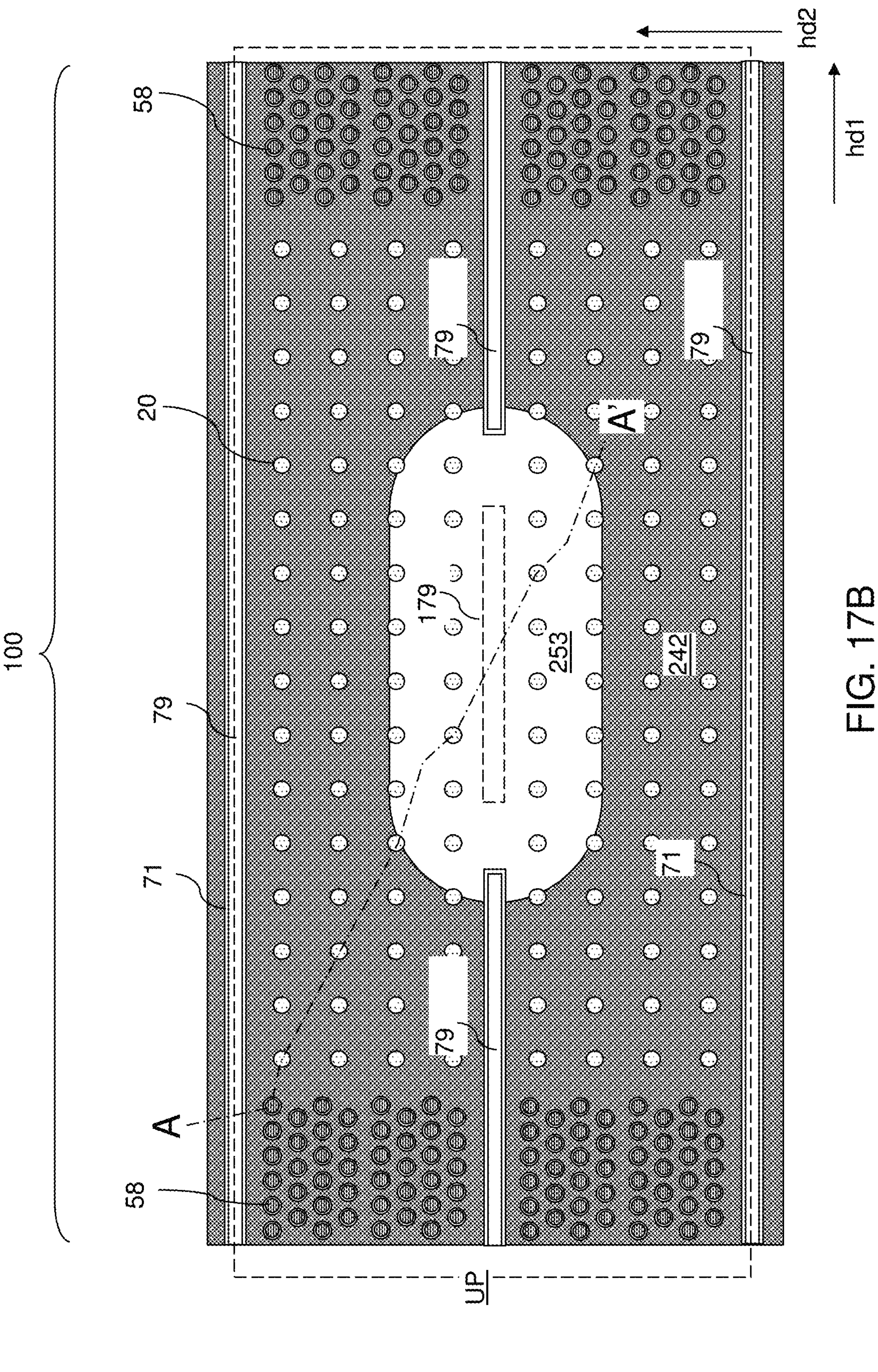
FIG. 17B is a horizontal cross-sectional view of the first exemplary structure along the horizontal plane B-B' of FIG. 17A. The hinged vertical plane A-A' corresponds to the plane of the vertical cross-sectional view of FIG. 17A.

Referring to FIGS. 17A and 17B, an isotropic etch process can be performed to laterally recess the first sacrificial material layers 142 and the second sacrificial material layers 242 through the access trenches 179 selective to the first insulating layers 132 and the second insulating layers 232. For example, if the first sacrificial material layers 142 and the second sacrificial material layers 242 include silicon nitride and if the first insulating layers 132 and the second insulating layers 232 include silicon oxide, a wet etch process employing hot phosphoric acid can be performed to remove portions of the sacrificial material layers (142, 242) that are proximal to the access trenches 179 selective to the insulating layers (132, 232).

Fin-shaped lateral recesses are formed in volumes from which portions of the sacrificial material layers (142, 242) are removed. The fin-shaped lateral recesses are herein referred to as fin cavities (153, 253). The fin cavities (153, 253) include first fin cavities 153 that are formed at levels of the first sacrificial material layers 142 and second fin cavities 253 that are formed at levels of the second sacrificial material layers 242. A vertical stack of fin cavities (153, 253) can be formed around each access trench 179 according to the first embodiment of the present disclosure. The fin cavities (153, 253) can have a uniform thickness, and can have outer boundaries that are equidistant from sidewalls of a respective access trench 179.

In one embodiment, at least one support pillar structure 20 can be physically exposed to the fin cavities (153, 253). In one embodiment, at least one support pillar structure 20 can be laterally surrounded by each of the fin cavities (153, 253) that are formed around an access trench 179. In one embodiment, a plurality of support pillar structures 20 can be physically exposed to, and can be laterally surrounded by, a vertical stack of fin cavities (153, 253) that laterally surrounds an access trench 179.

Generally, the fin cavities (153, 253) can be formed around each access trench 179 by isotropically etching the portions of the sacrificial material layers (142, 242) that are proximal to the access trenches 179 selective to the insulating layers (132, 232). The duration of the isotropic etch process that forms the fin cavities (153, 253) can be selected such that a first subset of the support pillar structures 20 is physically exposed to the fin cavities (153, 253), while a second subset of the support pillar structures 20 is not physically exposed to fin cavities (153, 253) upon formation of the fin cavities (153, 253).

Figure 18A:
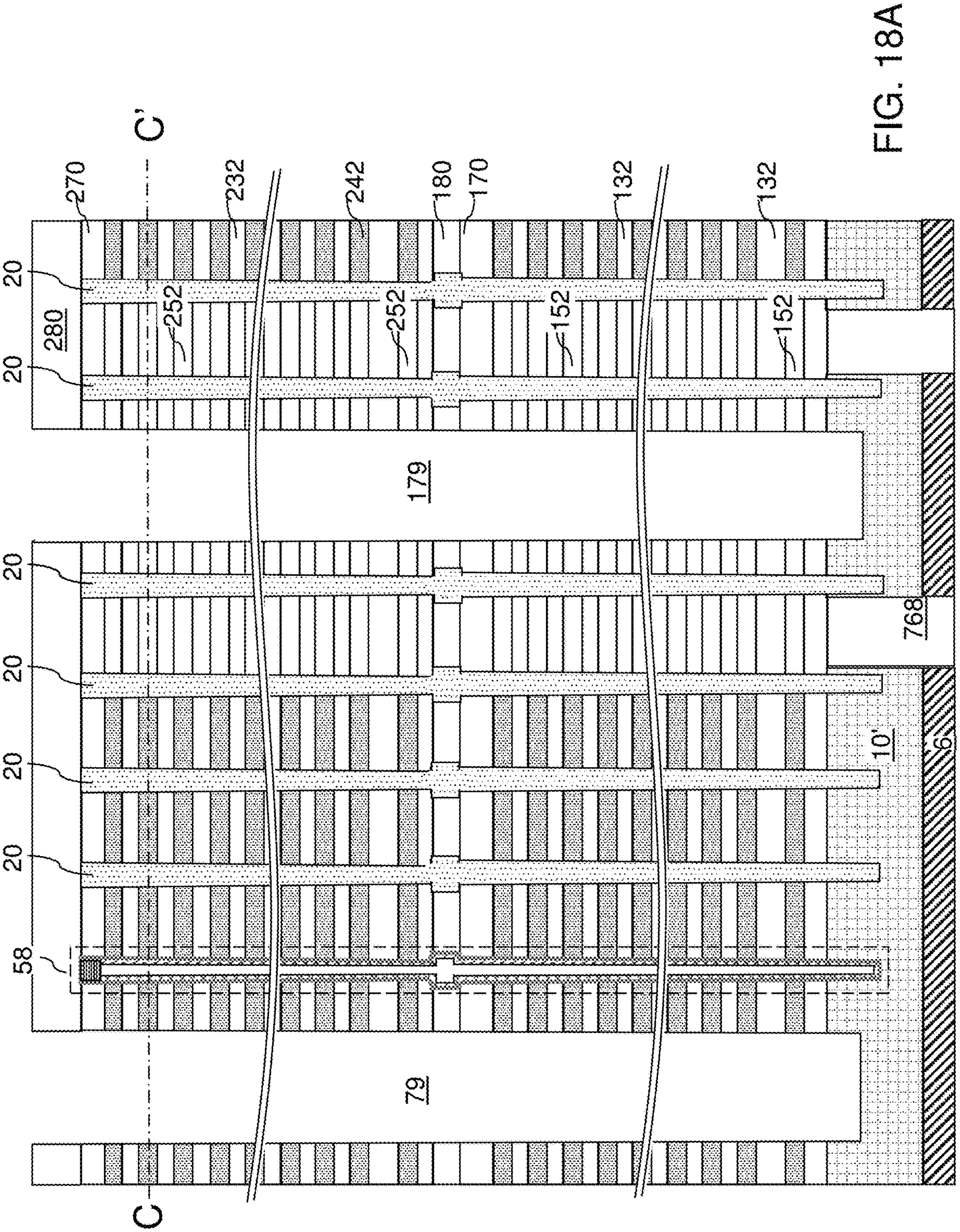
FIG. 18A is a vertical cross-sectional view of the first exemplary structure after formation of dielectric oxide plates according to the first embodiment of the present disclosure.
Figure 18B:
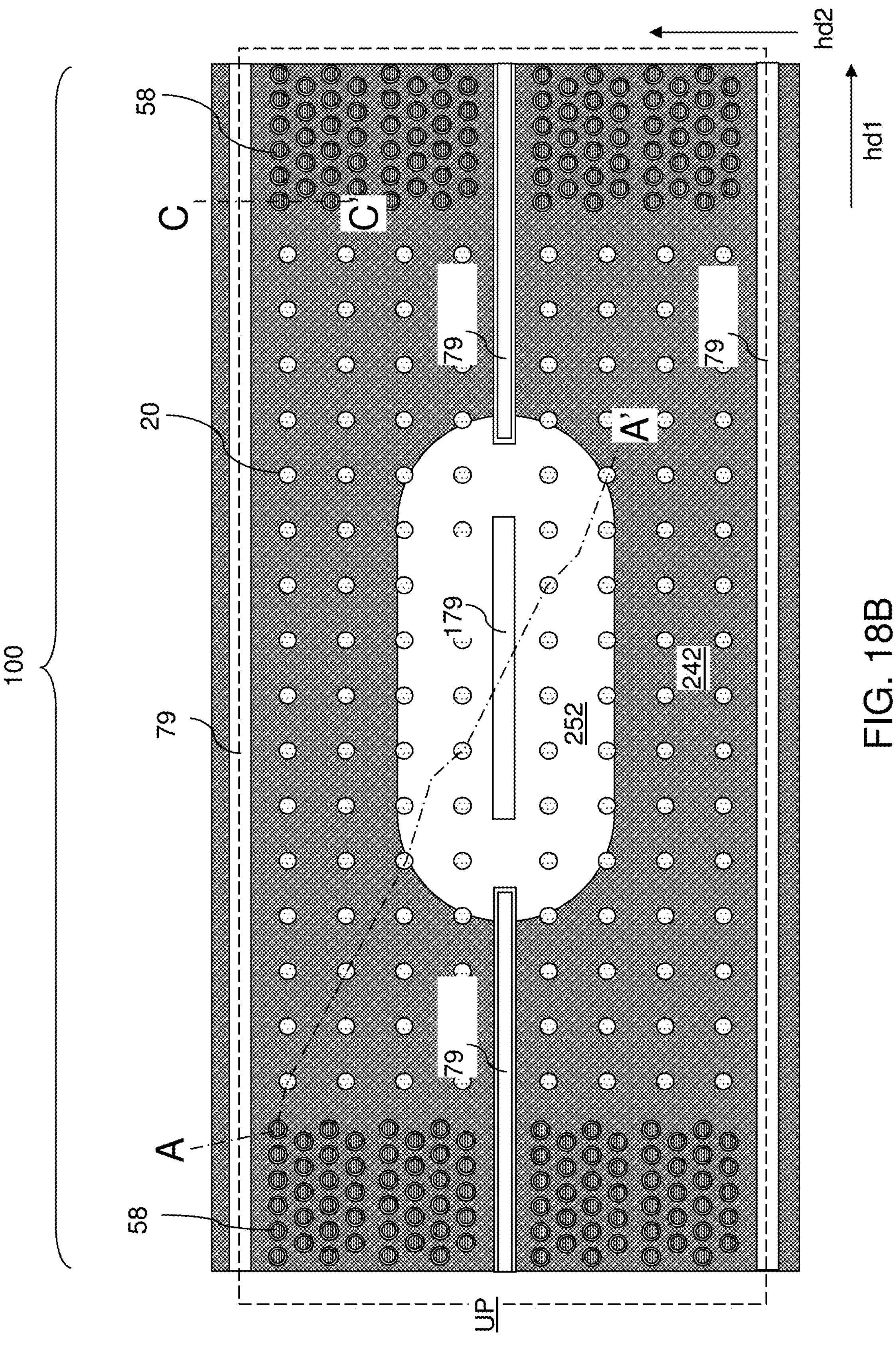
FIG. 18B is a horizontal cross-sectional view of the first exemplary structure along the horizontal plane B-B' of FIG. 18A. The hinged vertical plane A-A' corresponds to the plane of the vertical cross-sectional view of FIG. 18A.
Figure 18C:
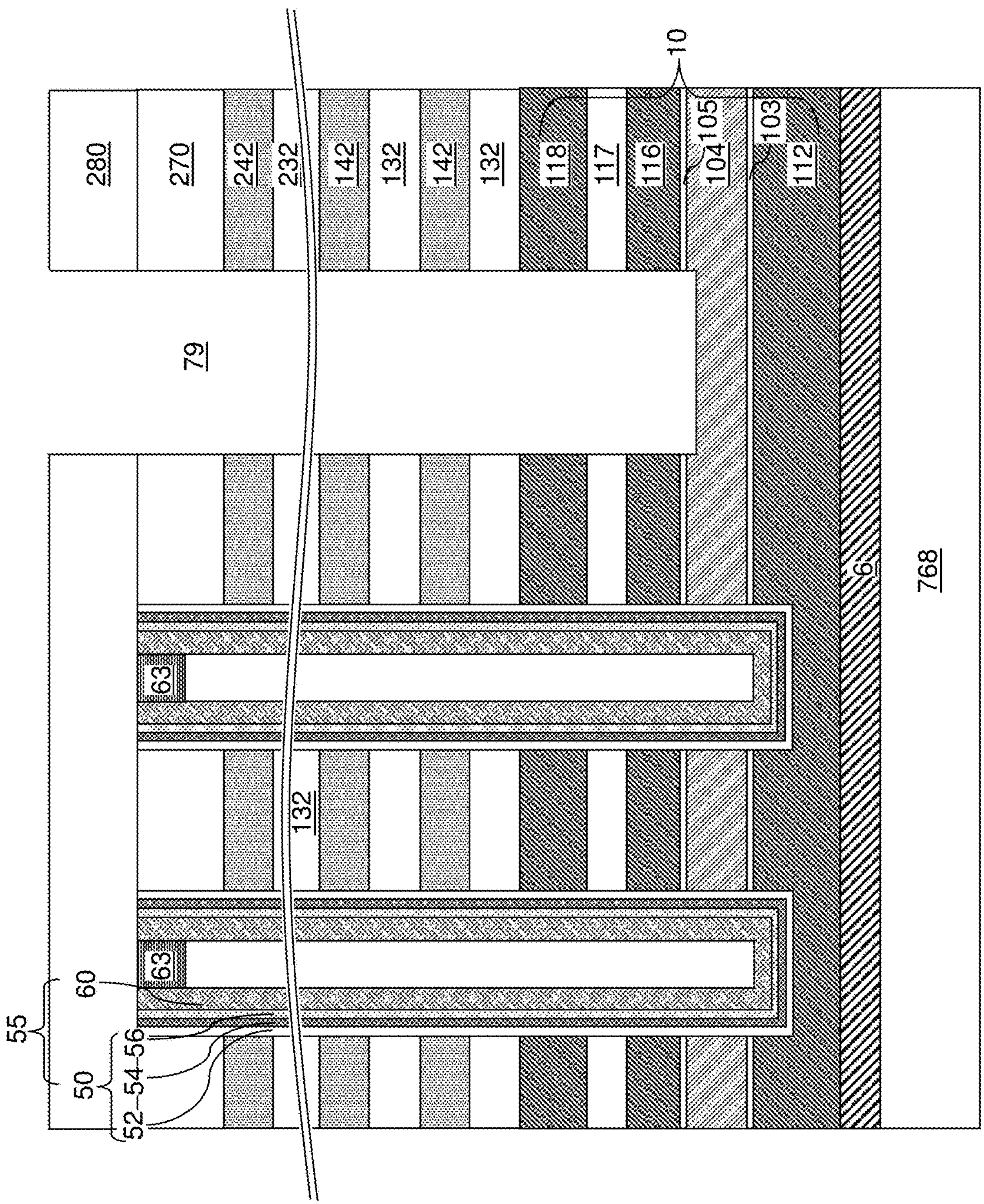
FIG. 18C is a vertical cross-sectional view of the first exemplary structure along the vertical plane C-C' of FIG. 18B.

Referring to FIGS. 18A-18C, a dielectric fill material can be deposited in the fin cavities (153, 253) by a conformal deposition process such as a low pressure chemical vapor deposition (LPCVD) process. In one embodiment, the dielectric fill material may include a dielectric oxide material, such as undoped silicate glass (e.g., silicon oxide) or a doped silicate glass. For example, the dielectric fill material may include undoped silicate glass. An etch back process can be performed to remove the portions of the dielectric fill material located in the access trenches 179, in the backside trenches 79, or above the first contact-level dielectric layer 280. The etch back process may include an isotropic etch process or an anisotropic etch process. For example, if the dielectric fill material includes silicon oxide, a timed wet etch process employing hydrofluoric acid may be employed to etch back portions of the dielectric fill material from inside the access trenches 179 and the backside trenches 79, and from above the first contact-level dielectric layer 280. The silicon oxide etch barrier liner 71 may also be removed from the backside trenches 79 during the wet etch.

Remaining portions of the dielectric fill material that fills the fin cavities (153, 253) include dielectric oxide plates (152, 252). The dielectric oxide plates (152, 252) include first dielectric oxide plates 152 that fill the first fin cavities 153 and second dielectric oxide plates 252 that fill the second fin cavities 253. Thus, portions of the sacrificial material layers (142, 242) that are proximal to the access trenches 179 are replaced with the dielectric oxide plates (152, 252). A vertical stack of dielectric oxide plates (152, 252) is provided around each access trench 179. The vertical stack of dielectric oxide plates (152, 252) is interlaced with laterally extending portions of the insulating layers (132, 232) of the at least one alternating stack {(132, 142), (232, 242)}. Each dielectric oxide plate (152, 252) is located between a respective vertically neighboring pair of insulating layers (132, 232) of the at least one alternating stack {(132, 142), (232, 242)}.

Each outer sidewall of the dielectric oxide plate (152, 252) can contact a sidewall of a respective remaining portion of the sacrificial material layer (142, 242). In one embodiment, each dielectric oxide plate (152, 252) can comprise straight outer sidewall segments that laterally extend along the first horizontal direction hd1 and curved outer sidewall segments having a respective convex horizontal cross-sectional profile. Specifically, each dielectric oxide plate (152, 252) can have at least one outer convex sidewall segment that contacts a concave sidewall segment of a respective one of the insulating layers (132, 232).

FIGS. 19A-19D illustrate sequential vertical cross-sectional views of memory opening fill structures 58 and a backside trench 79 during formation of source-level material layers 10 according to the first embodiment of the present disclosure.

Figure 19A:
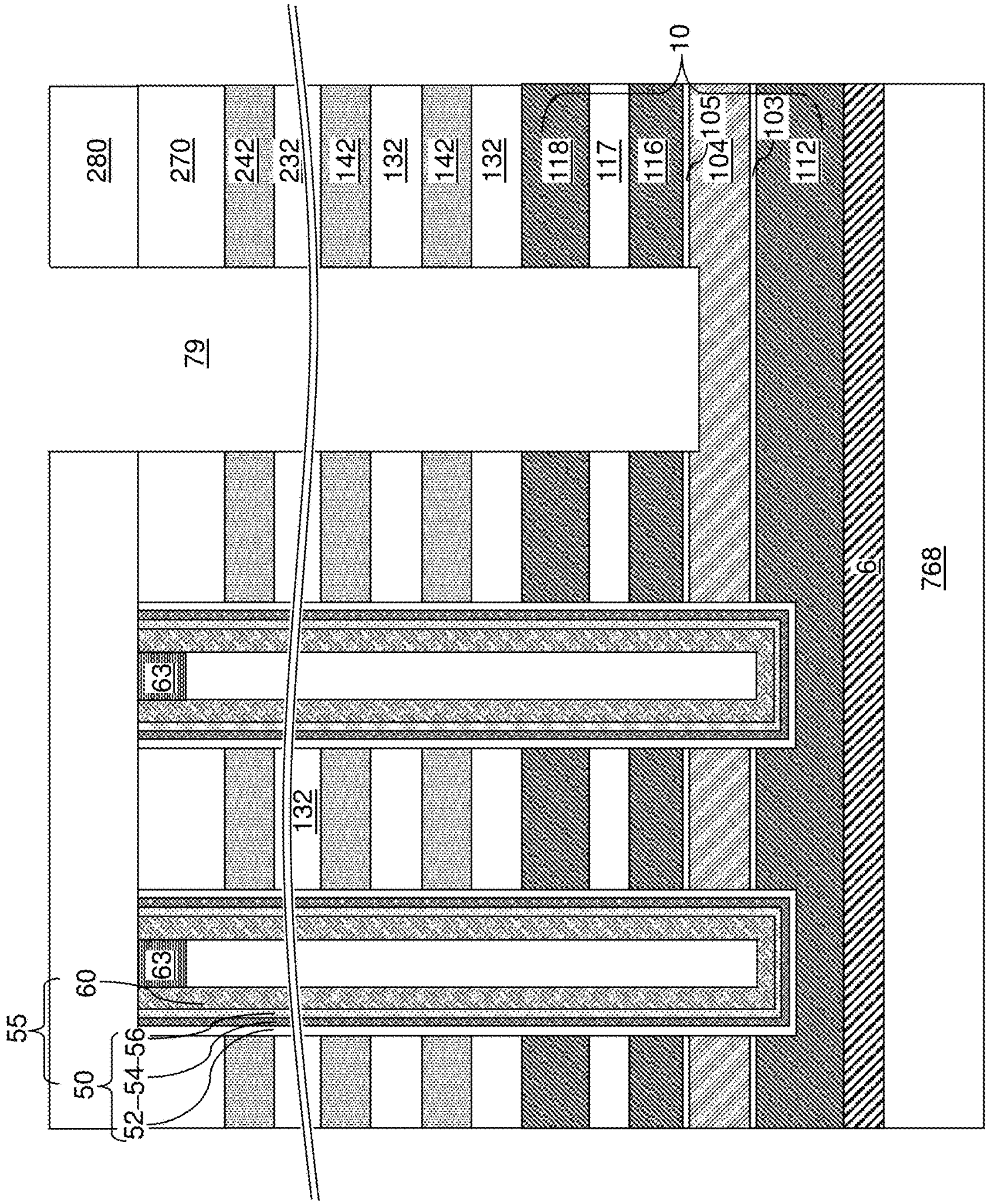
FIGS. 19A-19D illustrate sequential vertical cross-sectional views of memory opening fill structures and a backside trench during formation of source-level material layers according to the first embodiment of the present disclosure.

Referring to FIG. 19A, the etch barrier liner 71 can be removed by performing an isotropic etch process. For example, if the etch barrier liner 71 includes silicon oxide, a wet etch process employing dilute hydrofluoric acid can be performed to remove the etch barrier liner 71.

Figure 19B:
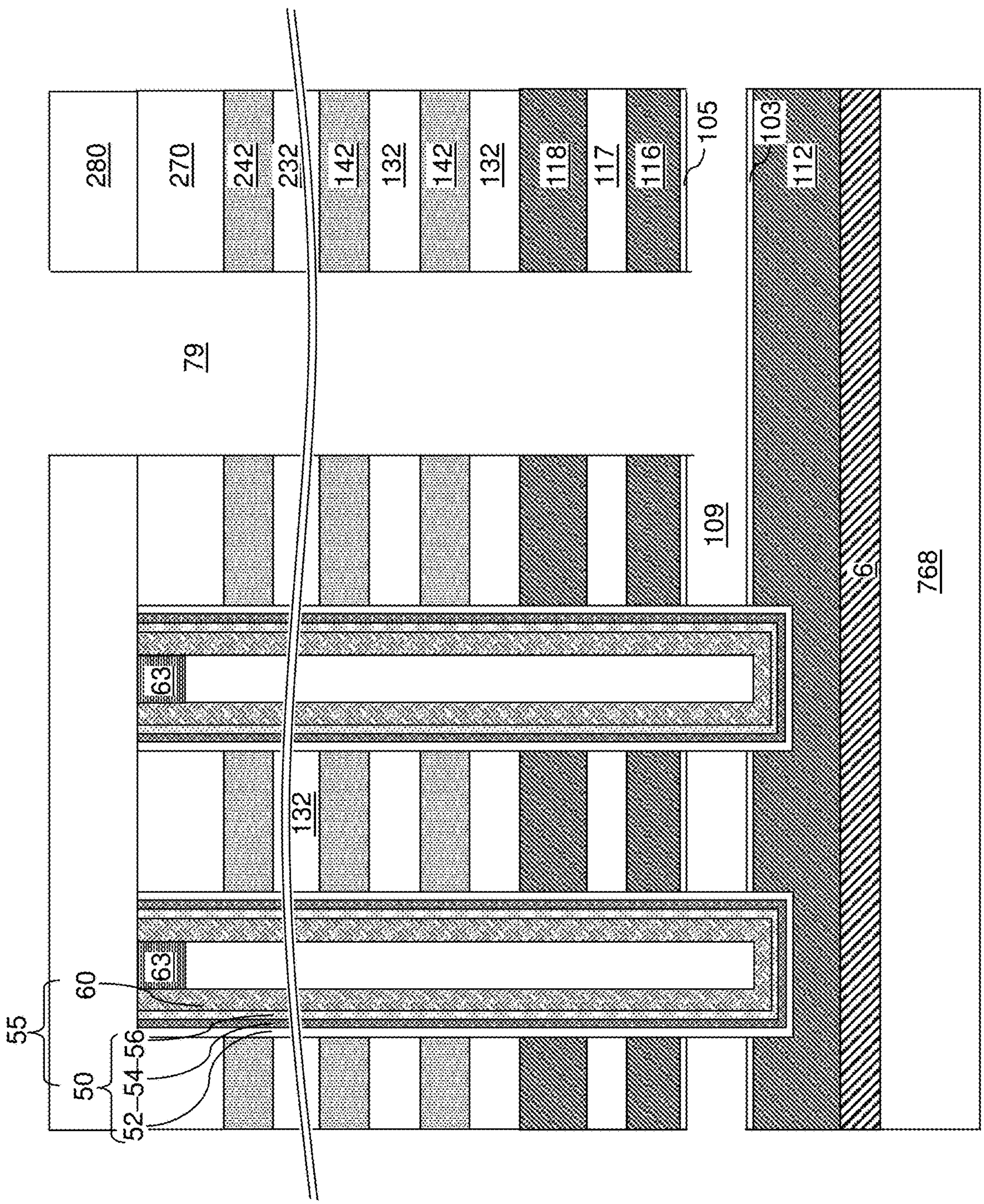

Referring to FIG. 19B, an etchant that etches the material of the source-level sacrificial layer 104 selective to the materials of the first-tier alternating stack (132, 142), the second-tier alternating stack (232, 242), the first and second insulating cap layers (170, 270), the first contact-level dielectric layer 280, the upper sacrificial liner 105, and the lower sacrificial liner 103 may be introduced into the backside trenches in an isotropic etch process. For example, if the source-level sacrificial layer 104 includes undoped amorphous silicon or an undoped amorphous silicon-germanium alloy and if the upper and lower sacrificial liners (105, 103) include silicon oxide, a wet etch process using hot trimethyl-2 hydroxyethyl ammonium hydroxide ("hot TMY") or tetramethyl ammonium hydroxide (TMAH) may be used to remove the source-level sacrificial layer 104 selective to the upper and lower sacrificial liners (105, 103). A source cavity 109 may be formed in the volume from which the source-level sacrificial layer 104 is removed.

Wet etch chemicals such as hot TMY and TMAH are selective to the doped semiconductor materials of the upper source-level semiconductor layer 116 and the lower source-level semiconductor layer 112. Thus, use of selective wet etch chemicals such as hot TMY and TMAH for the wet etch process that forms the source cavity 109 provides a large process window against etch depth variation during formation of the backside trenches 79. Specifically, in embodiments in which sidewalls of the upper source-level semiconductor layer 116 are physically exposed or in other embodiments in which a surface of the lower source-level semiconductor layer 112 is physically exposed upon formation of the source cavity 109, collateral etching of the upper source-level semiconductor layer 116 and/or the lower source-level semiconductor layer 112 is minimal, and the structural change to the first exemplary structure caused by accidental physical exposure of the surfaces of the upper source-level semiconductor layer 116 and/or the lower source-level semiconductor layer 112 during manufacturing steps do not result in device failures. Each of the memory opening fill structures 58 may be physically exposed to the source cavity 109. Specifically, each of the memory opening fill structures 58 may include a sidewall and a bottom surface that are physically exposed to the source cavity 109.

Figure 19C:
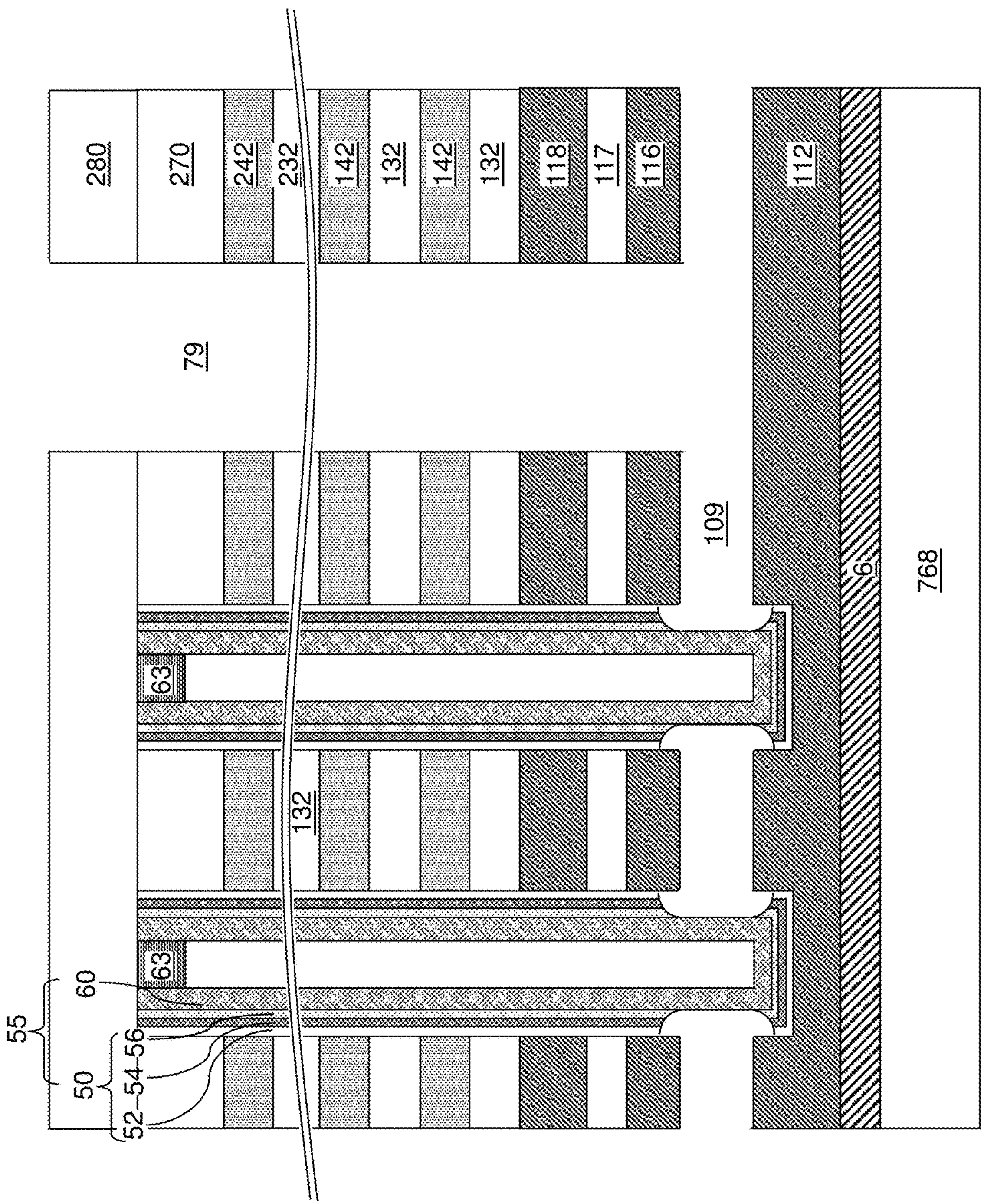

Referring to FIG. 19C, a sequence of isotropic etchants, such as wet etchants, may be applied to the physically exposed portions of the memory films 50 to sequentially etch the various component layers of the memory films 50 from outside to inside, and to physically expose cylindrical surfaces of the vertical semiconductor channels 60 at the level of the source cavity 109. The upper and lower sacrificial liners (105, 103) may be collaterally etched during removal of the portions of the memory films 50 located at the level of the source cavity 109. The source cavity 109 may be expanded in volume by removal of the portions of the memory films 50 at the level of the source cavity 109 and the upper and lower sacrificial liners (105, 103). A top surface of the lower source-level semiconductor layer 112 and a bottom surface of the upper source-level semiconductor layer 116 may be physically exposed to the source cavity 109. The source cavity 109 may be formed by isotropically etching the source-level sacrificial layer 104 and a bottom portion of each of the memory films 50 selective to at least one source-level semiconductor layer (such as the lower source-level semiconductor layer 112 and the upper source-level semiconductor layer 116) and the vertical semiconductor channels 60.

Figure 19D:
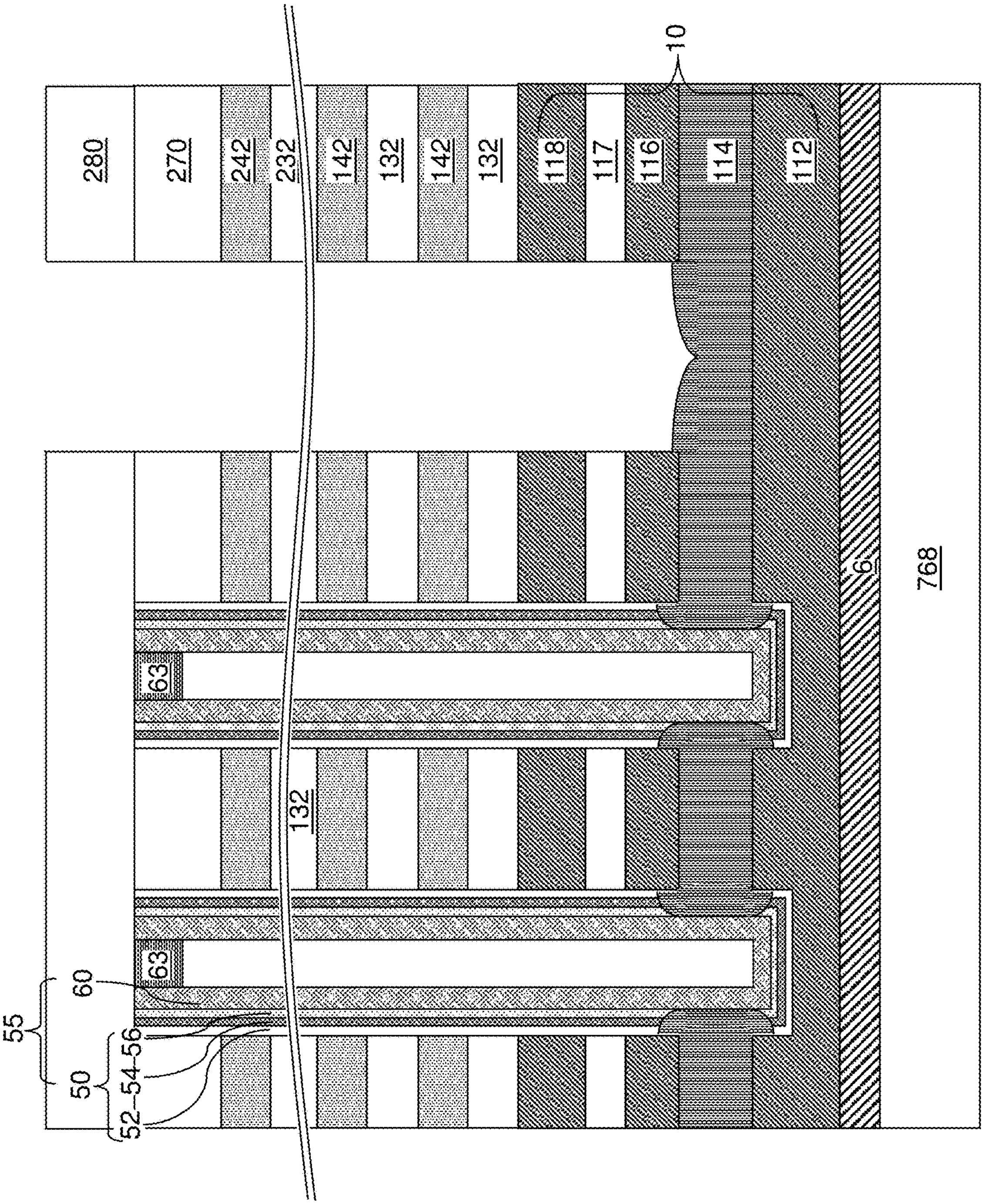

Referring to FIG. 19D, a doped semiconductor material having a doping of the second conductivity type may be deposited on the physically exposed semiconductor surfaces around the source cavity 109. The second conductivity type is the opposite of the first conductivity type, which is the conductivity type of the doping of the vertical semiconductor channels 60. The physically exposed semiconductor surfaces include bottom portions of outer sidewalls of the vertical semiconductor channels 60 and horizontal surfaces of the at least one source-level semiconductor layer (112, 116). For example, the physically exposed semiconductor surfaces may include the bottom portions of outer sidewalls of the vertical semiconductor channels 60, the top horizontal surface of the lower source-level semiconductor layer 112, and the bottom surface of the upper source-level semiconductor layer 116.

In one embodiment, the doped semiconductor material of the second conductivity type may be deposited on the physically exposed semiconductor surfaces around the source cavity 109 by a selective semiconductor deposition process. A semiconductor precursor gas, an etchant, and an n-type dopant precursor gas may flow concurrently into a process chamber including the first exemplary structure during the selective semiconductor deposition process. For example, the semiconductor precursor gas may include silane, disilane, or dichlorosilane, the etchant gas may include gaseous hydrogen chloride, and the n-type dopant precursor gas such as phosphine, arsine, or stibine. In this case, the selective semiconductor deposition process grows an in-situ doped semiconductor material from physically exposed semiconductor surfaces around the source cavity 109. The deposited doped semiconductor material forms a source contact layer 114, which may contact sidewalls of the vertical semiconductor channels 60. The atomic concentration of the dopants of the second conductivity type in the deposited semiconductor material may be in a range from $1.0\times10^{20}/cm^3$ to $2.0\times10^{21}/cm^3$, such as from $2.0\times10^{20}/cm^3$ to $8.0\times10^{20}/cm^3$. The source contact layer 114 as initially formed may consist essentially of semiconductor atoms and the dopant atoms of the second conductivity type. Alternatively, at least one non-selective doped semiconductor material deposition process may be used to form the source contact layer 114. Optionally, one or more etch back processes may be used in combination with a plurality of selective or non-selective deposition processes to provide a seamless and/or voidless source contact layer 114.

The duration of the selective semiconductor deposition process may be selected such that the source cavity 109 is filled with the source contact layer 114. In one embodiment, the source contact layer 114 may be formed by selectively depositing a doped semiconductor material from semiconductor surfaces around the source cavity 109. In one embodiment, the doped semiconductor material may include doped polysilicon. Thus, the source-level sacrificial layer 104 may be replaced with the source contact layer 114.

The layer stack including the lower source-level semiconductor layer 112, the source contact layer 114, and the upper source-level semiconductor layer 116 constitutes a source region (112, 114, 116). The source region (112, 114, 116) is electrically connected to a first end (such as a bottom end) of each of the vertical semiconductor channels 60. The set of layers including the source region (112, 114, 116), the source-level insulating layer 117, and the source-select-level conductive layer 118 constitutes source-level material layers 10, which replaces the in-process source-level material layers 10'.

Figure 20A:
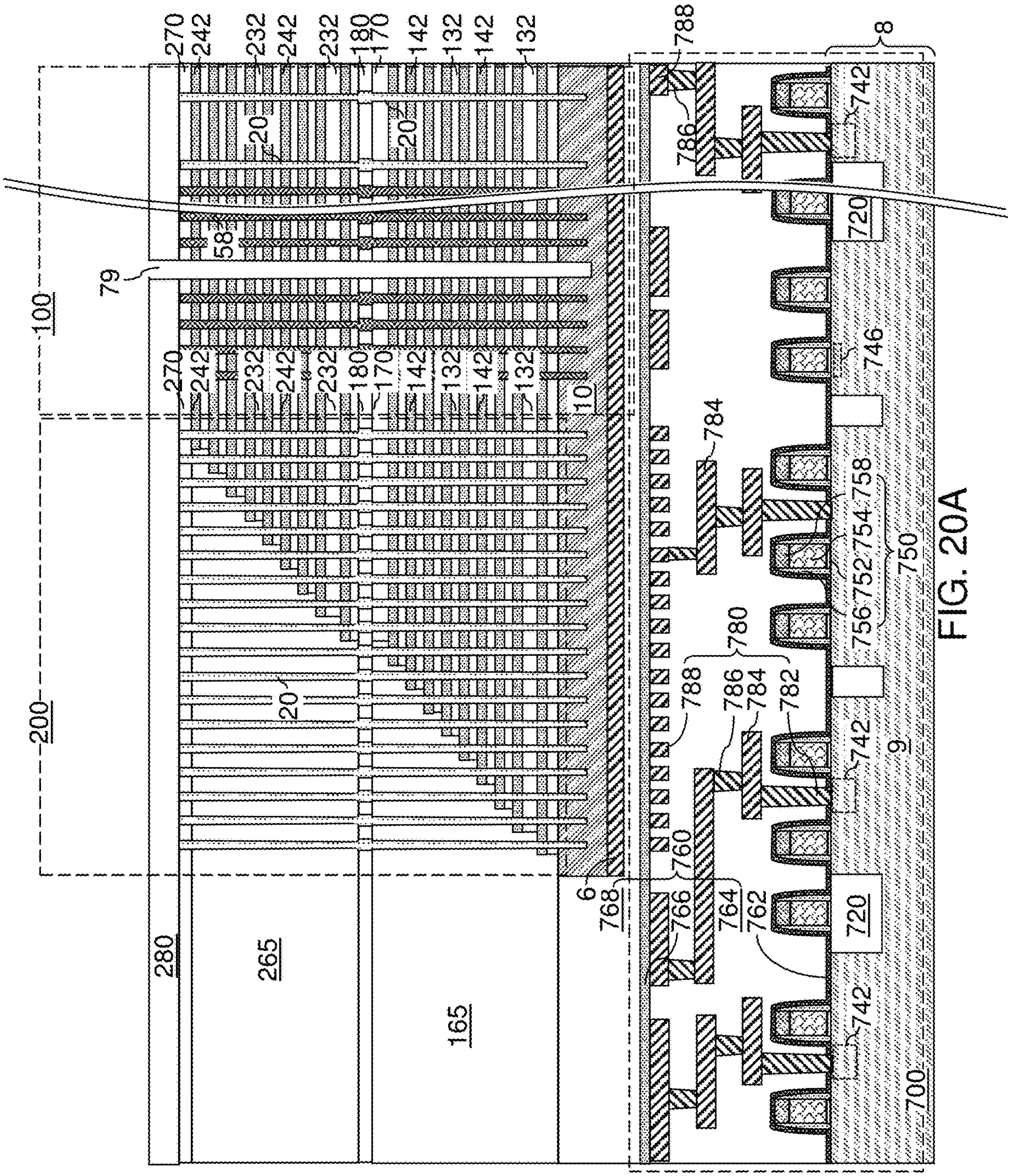
FIG. 20A is a vertical cross-sectional view of the first exemplary structure after formation of dielectric semiconductor oxide material portions according to the first embodiment of the present disclosure.
Figure 20B:
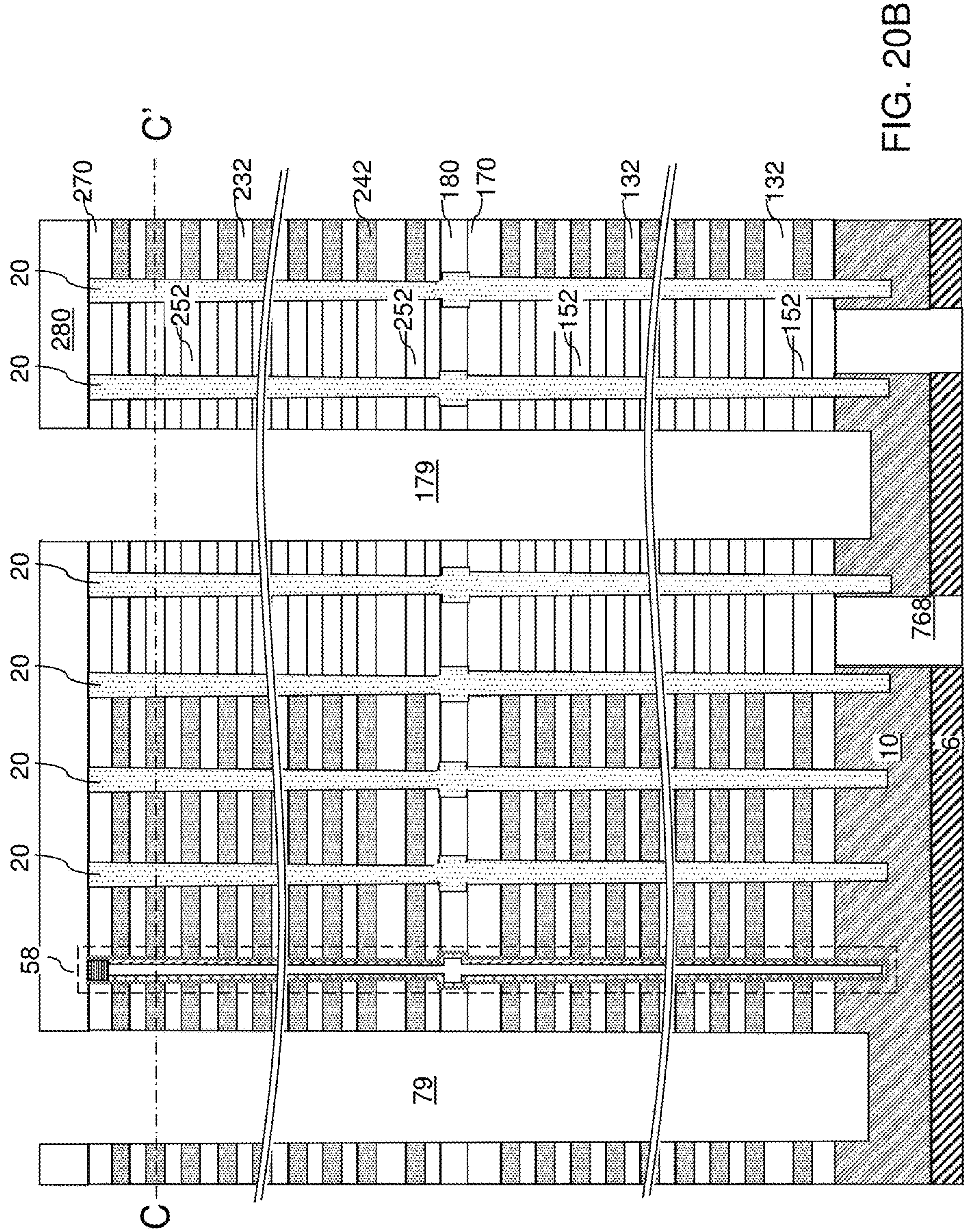
FIG. 20B is another vertical cross-sectional view of the first exemplary structure of FIG. 20A.
Figure 20C:
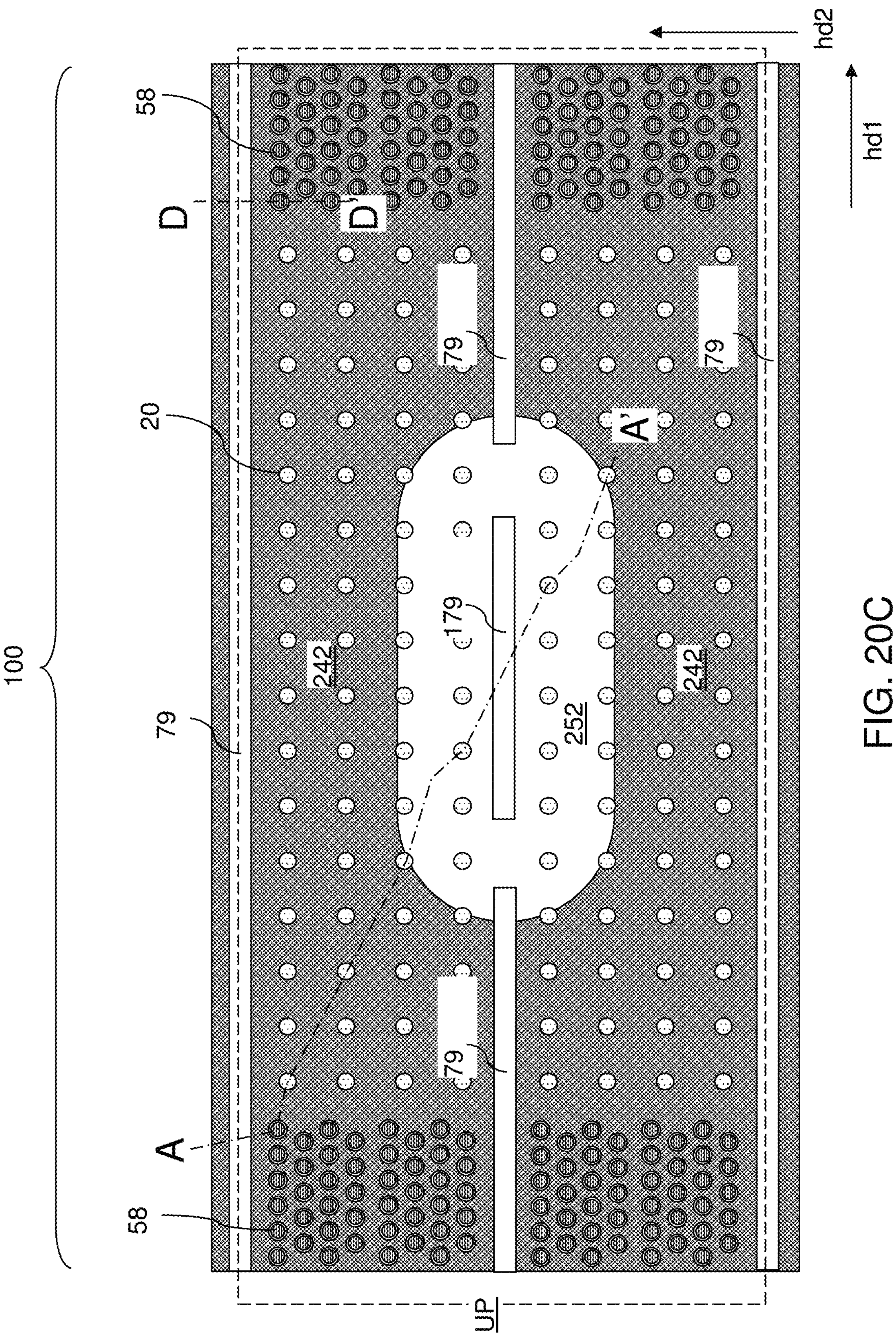
FIG. 20C is a horizontal cross-sectional view of the first exemplary structure along the horizontal plane C-C' of FIG. 20B. The hinged vertical plane B-B' corresponds to the plane of the vertical cross-sectional view of FIG. 20B.
Figure 20D:
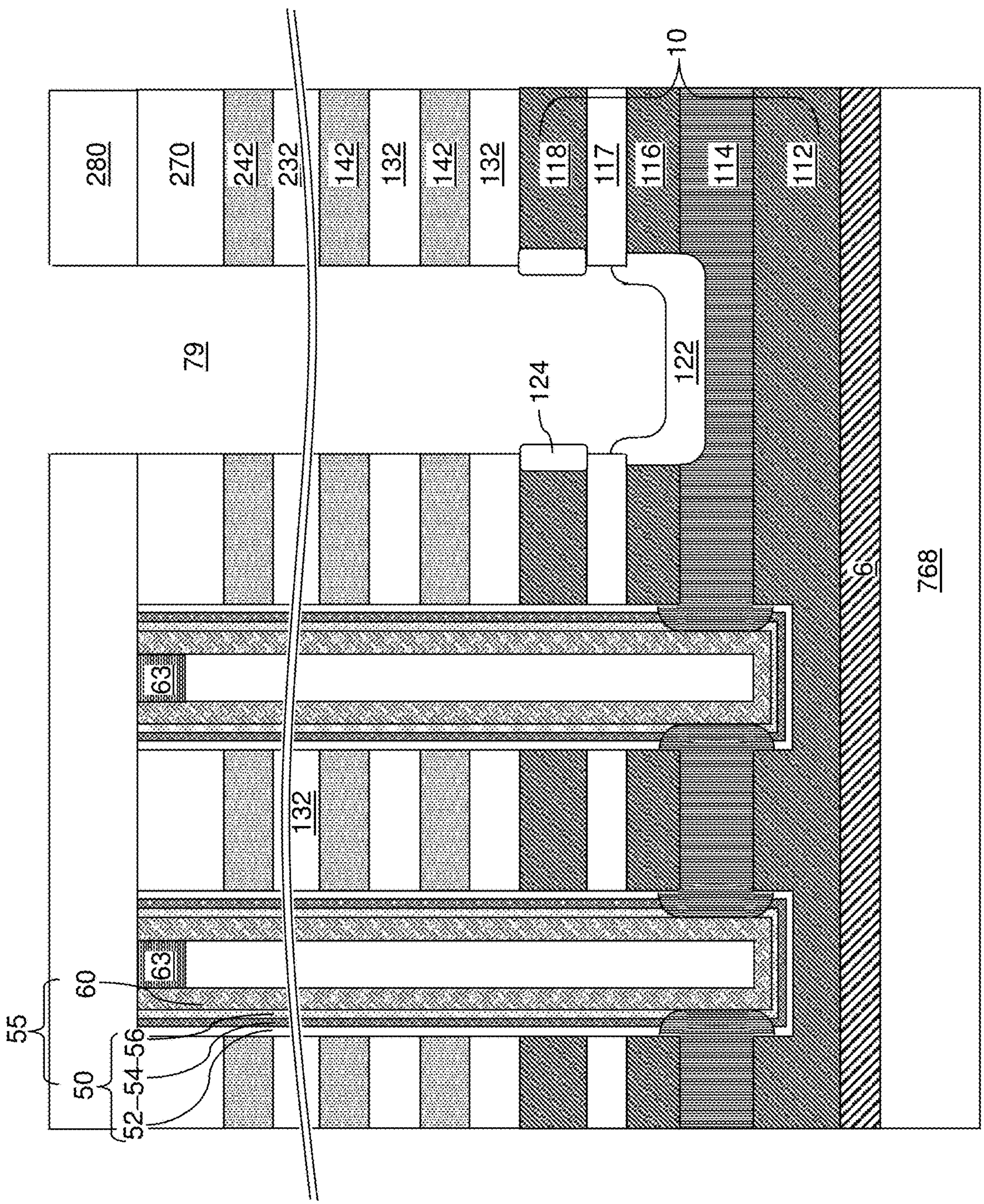
FIG. 20D is a vertical cross-sectional view of the first exemplary structure along the vertical plane D-D' of FIG. 20C.
Figure 21A:
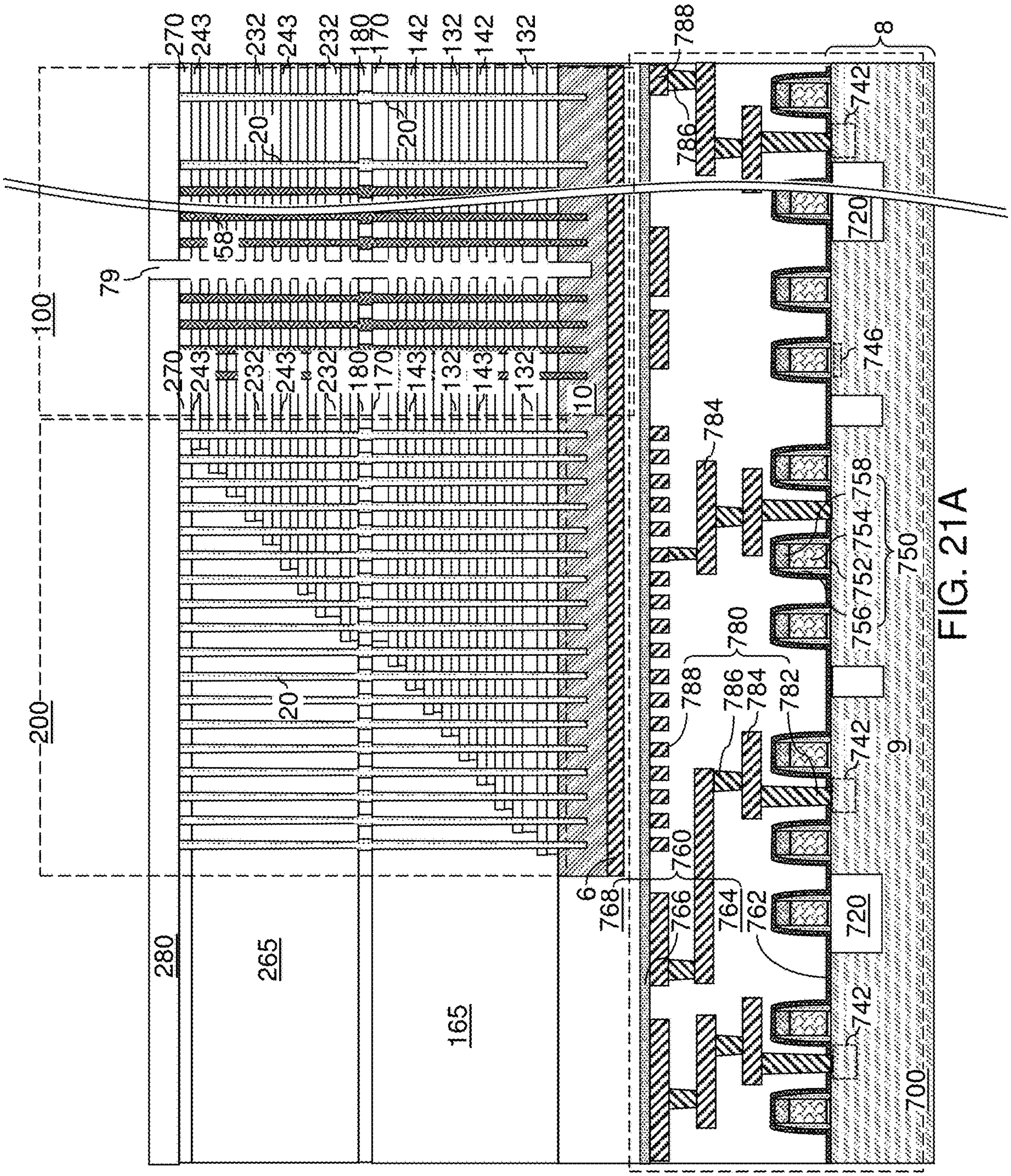
FIG. 21A is a vertical cross-sectional view of the first exemplary structure after formation of backside recesses according to the first embodiment of the present disclosure.
Figure 21B:
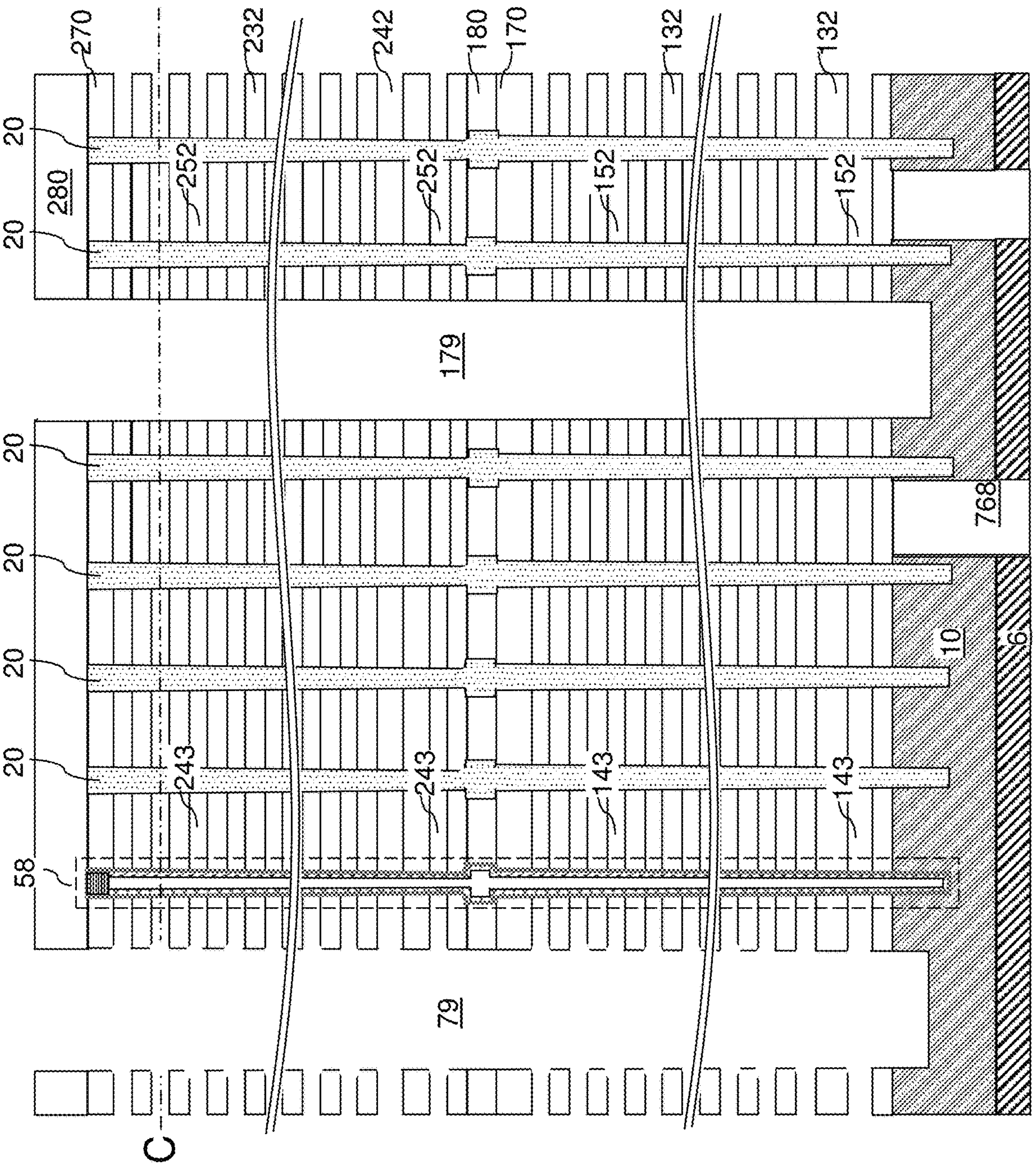
FIG. 21B is another vertical cross-sectional view of the first exemplary structure of FIG. 21A.
Figure 21C:
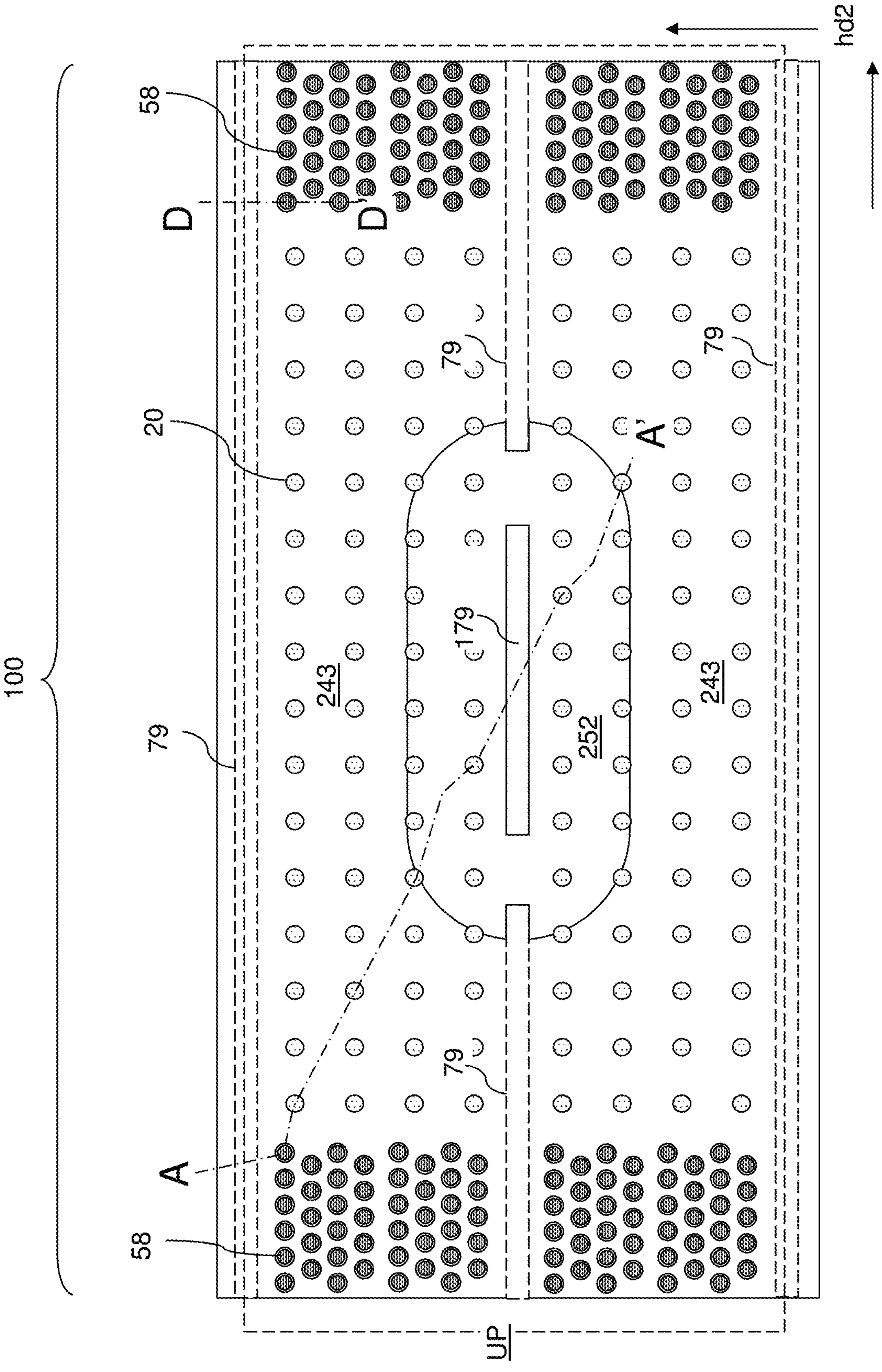
FIG. 21C is a horizontal cross-sectional view of the first exemplary structure along the horizontal plane C-C' of FIG. 21B. The hinged vertical plane B-B' corresponds to the plane of the vertical cross-sectional view of FIG. 21B.
Figure 21D:
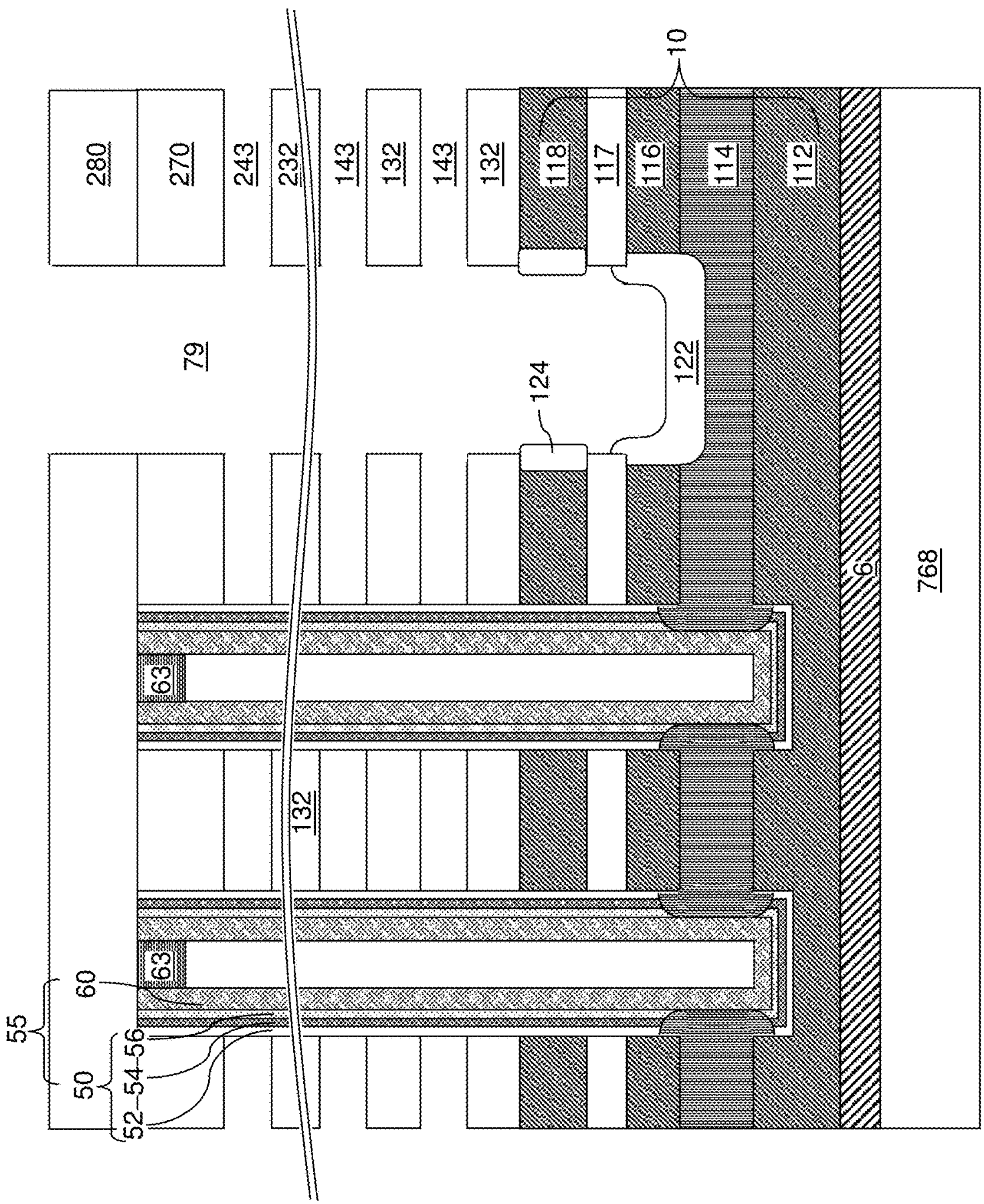
FIG. 21D is a vertical cross-sectional view of the first exemplary structure along the vertical plane D-D' of FIG. 21C.
Figure 22A:
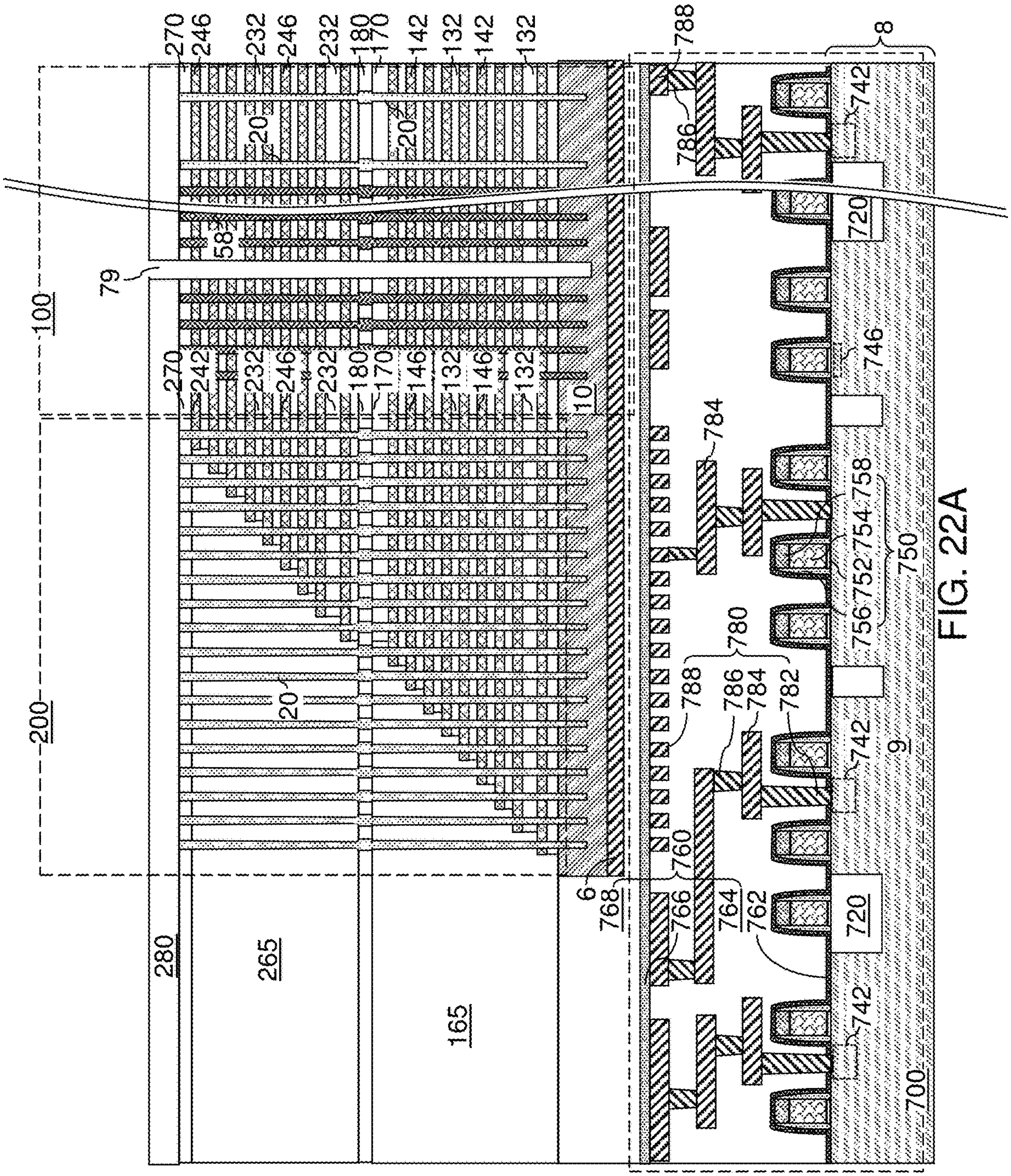
FIG. 22A is a vertical cross-sectional view of the first exemplary structure after formation of electrically conductive layers according to the first embodiment of the present disclosure.
Figure 22B:
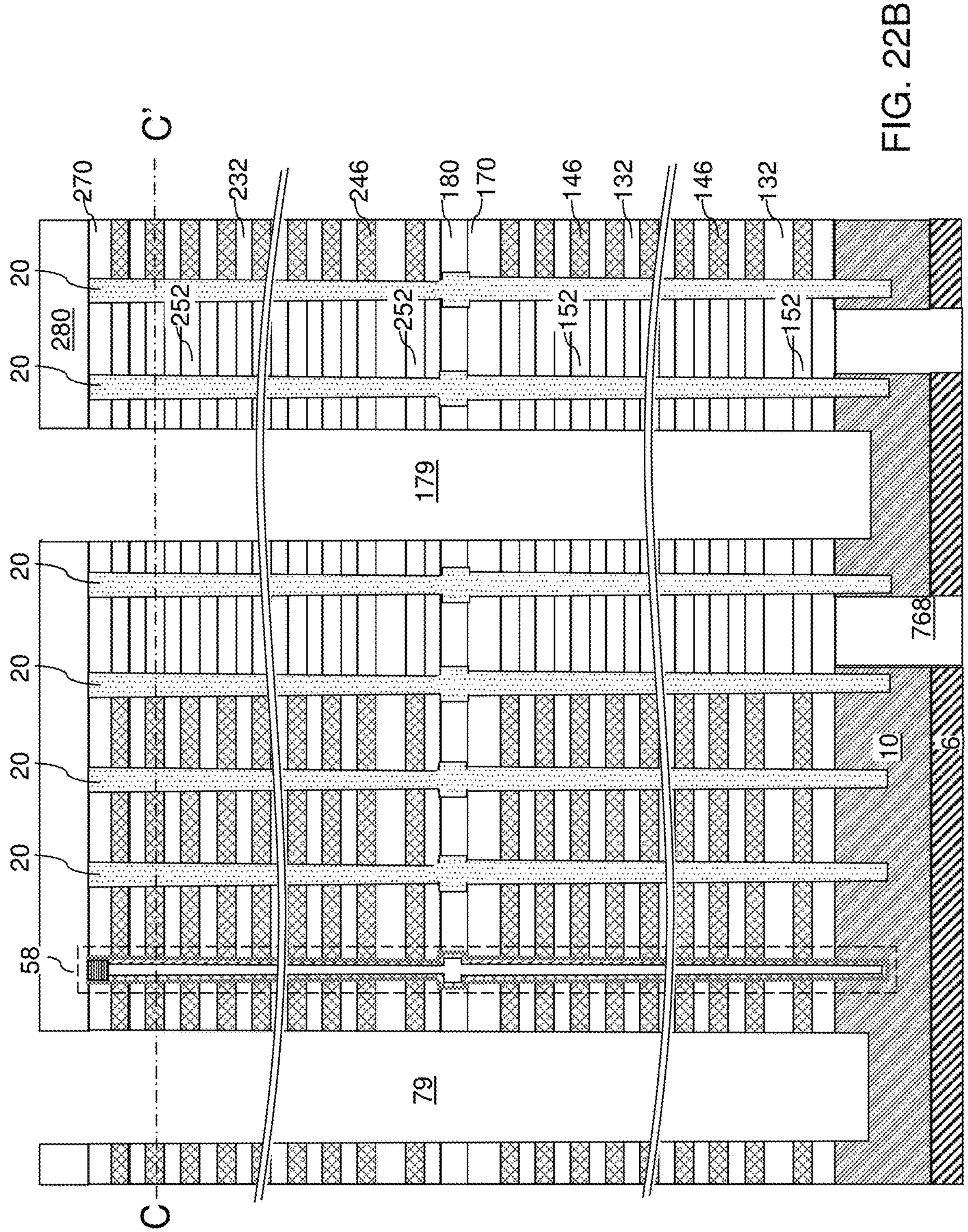
FIG. 22B is another vertical cross-sectional view of the first exemplary structure of FIG. 22A.
Figure 22C:
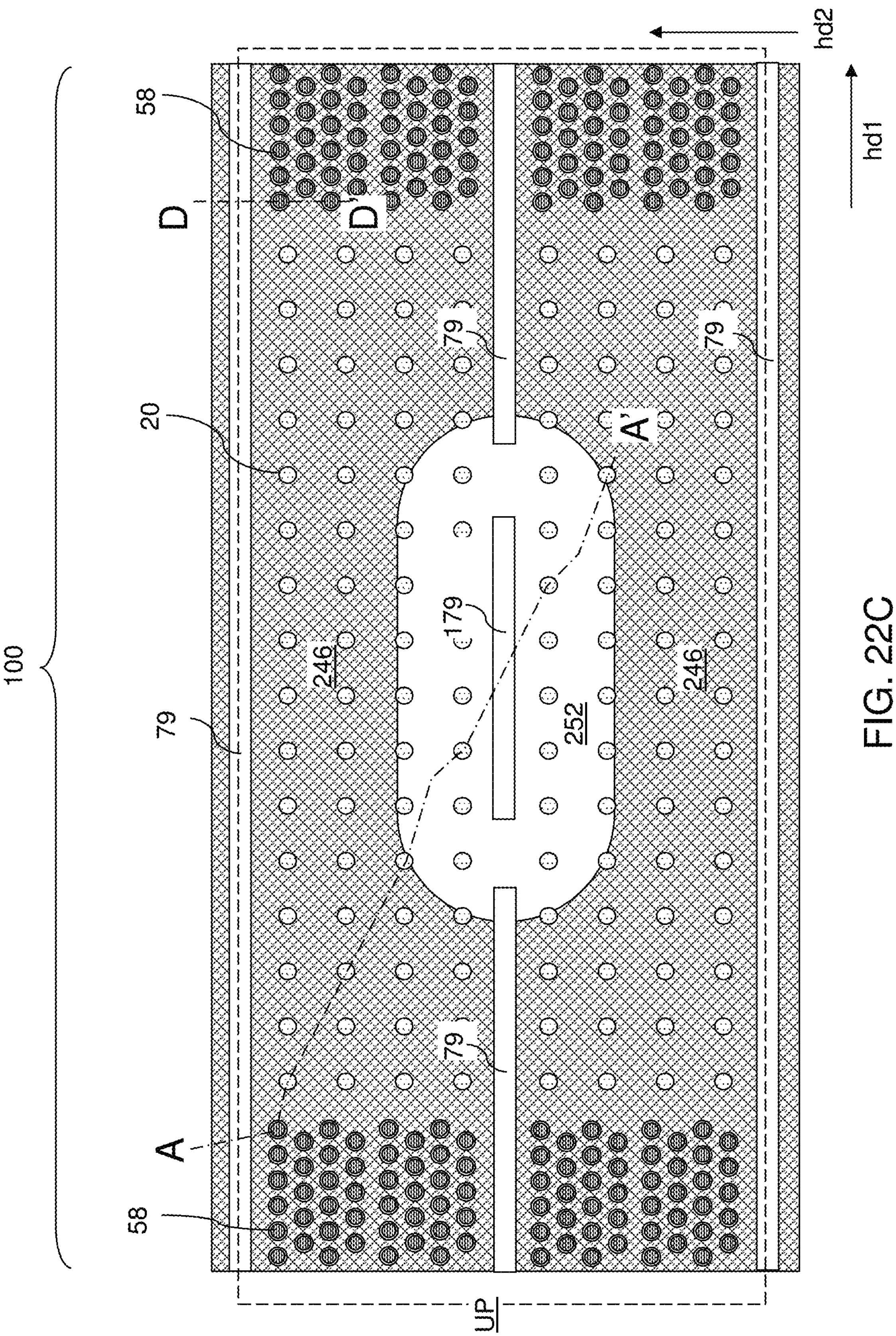
FIG. 22C is a horizontal cross-sectional view of the first exemplary structure along the horizontal plane C-C' of FIG. 22B. The hinged vertical plane B-B' corresponds to the plane of the vertical cross-sectional view of FIG. 22B.
Figure 22D:
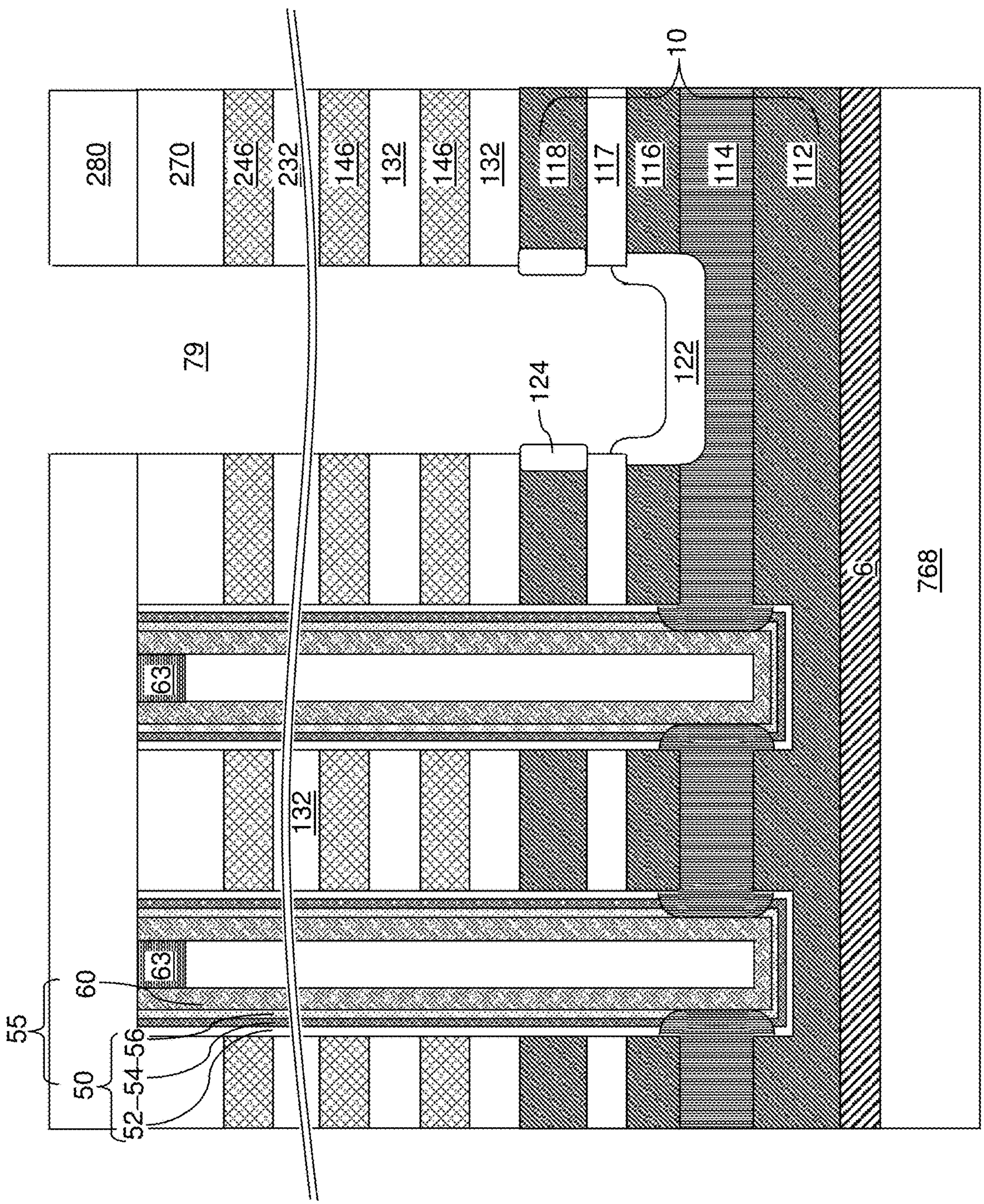
FIG. 22D is a vertical cross-sectional view of the first exemplary structure along the vertical plane D-D' of FIG. 22C.
Figure 23A:
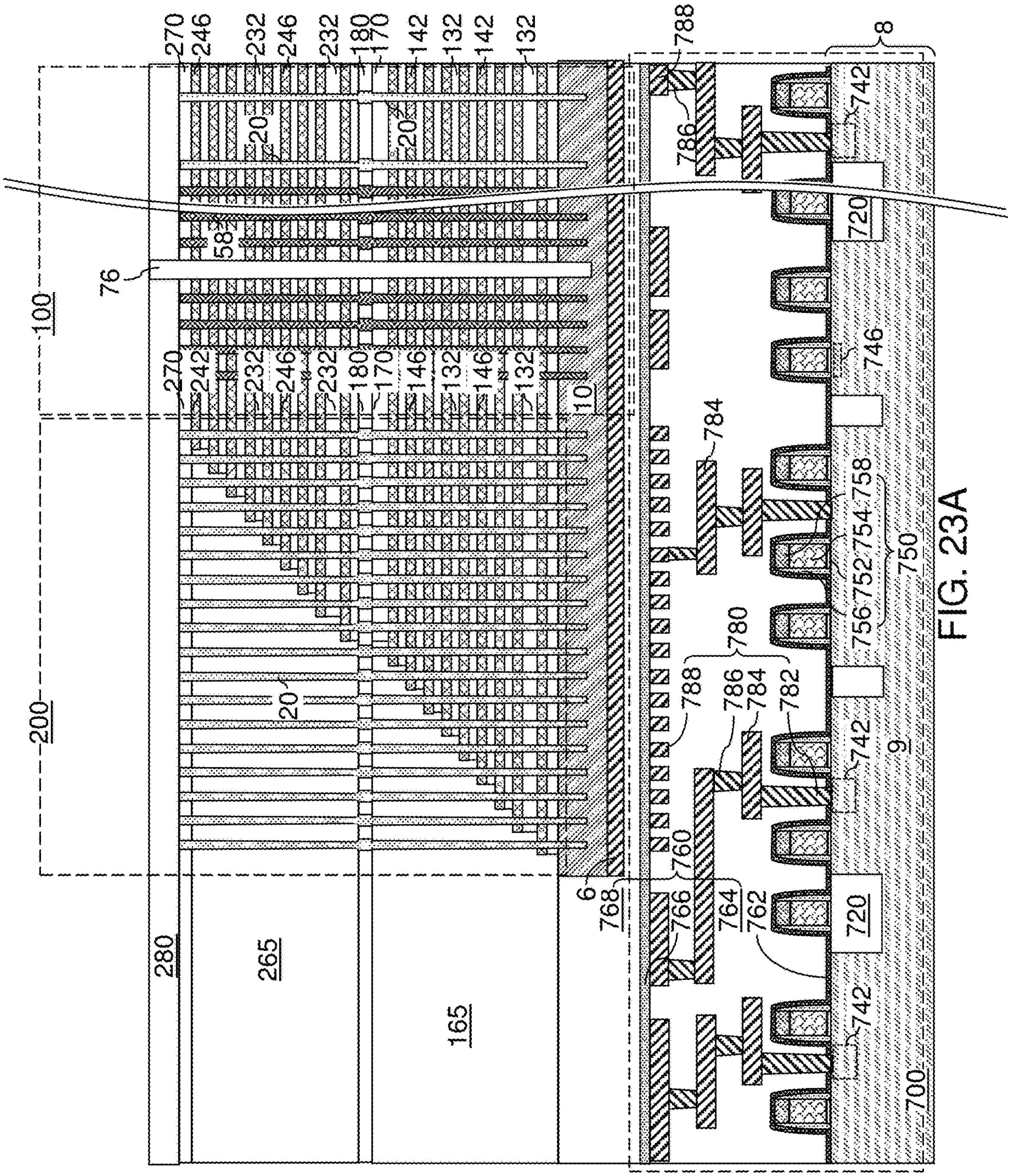
FIG. 23A is a vertical cross-sectional view of the first exemplary structure after formation of backside trench fill structures and wall structures according to the first embodiment of the present disclosure.
Figure 23B:
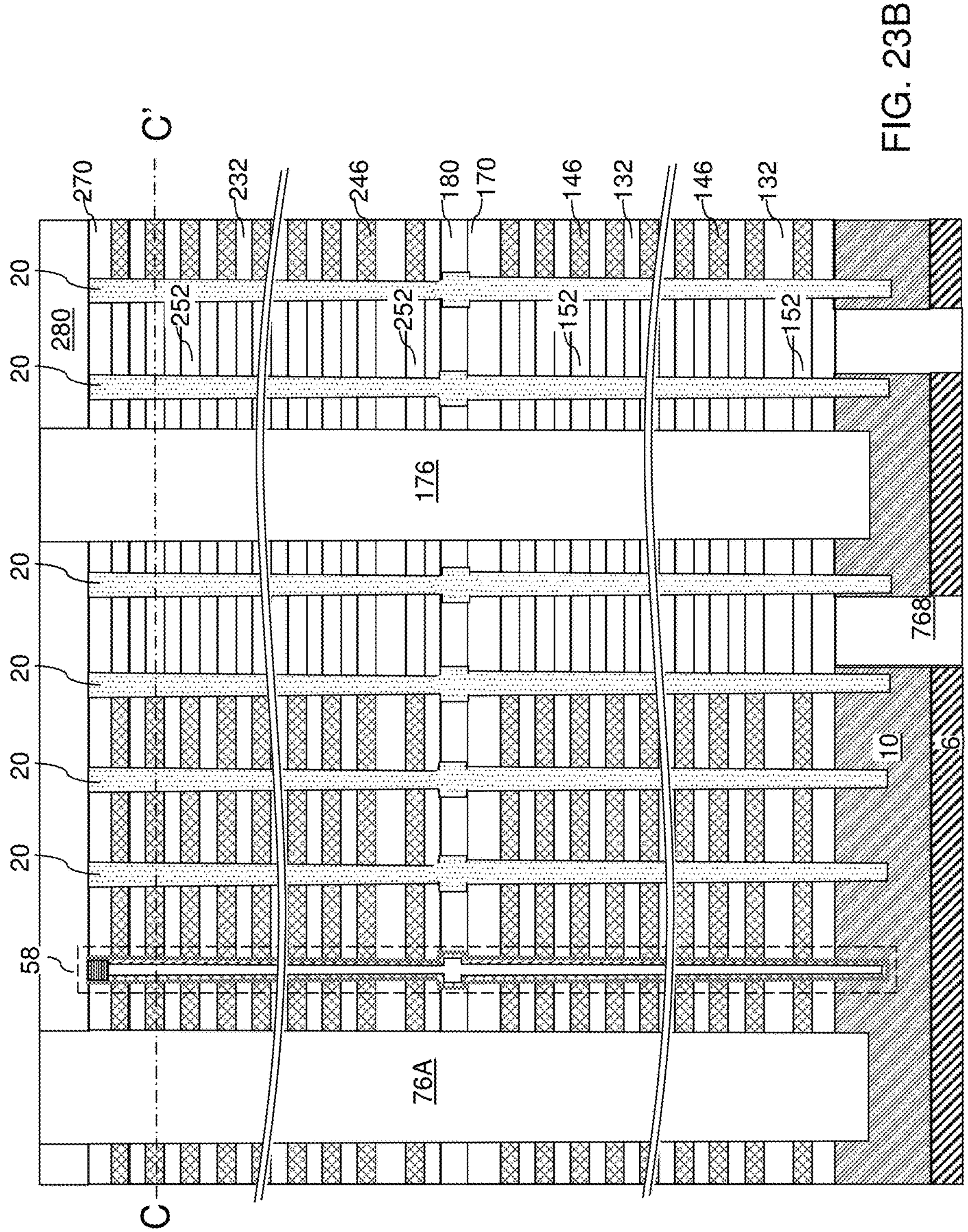
FIG. 23B is another vertical cross-sectional view of the first exemplary structure of FIG. 23A.
Figure 23C:
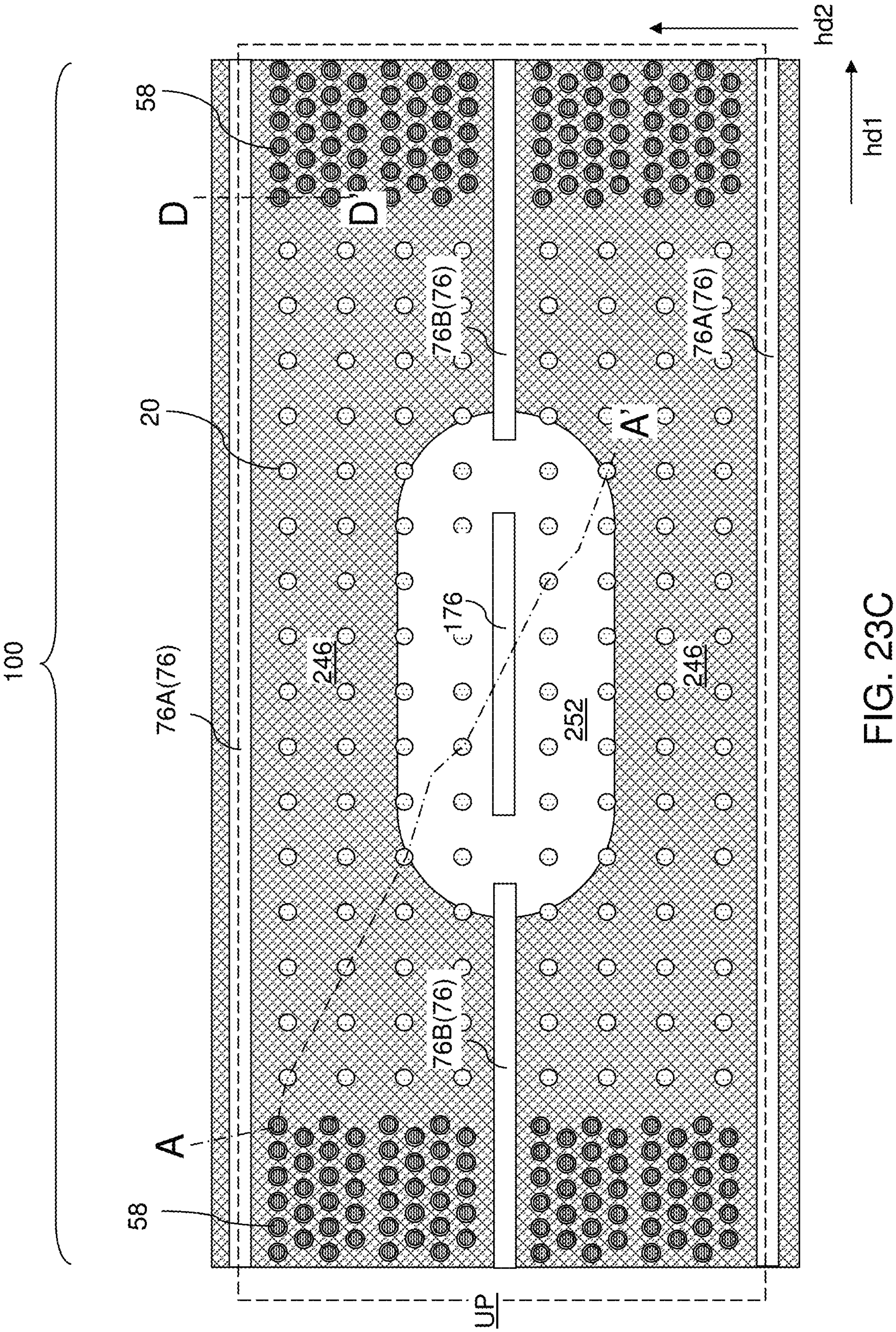
FIG. 23C is a horizontal cross-sectional view of the first exemplary structure along the horizontal plane C-C' of FIG. 23B. The hinged vertical plane B-B' corresponds to the plane of the vertical cross-sectional view of FIG. 23B.
Figure 23D:
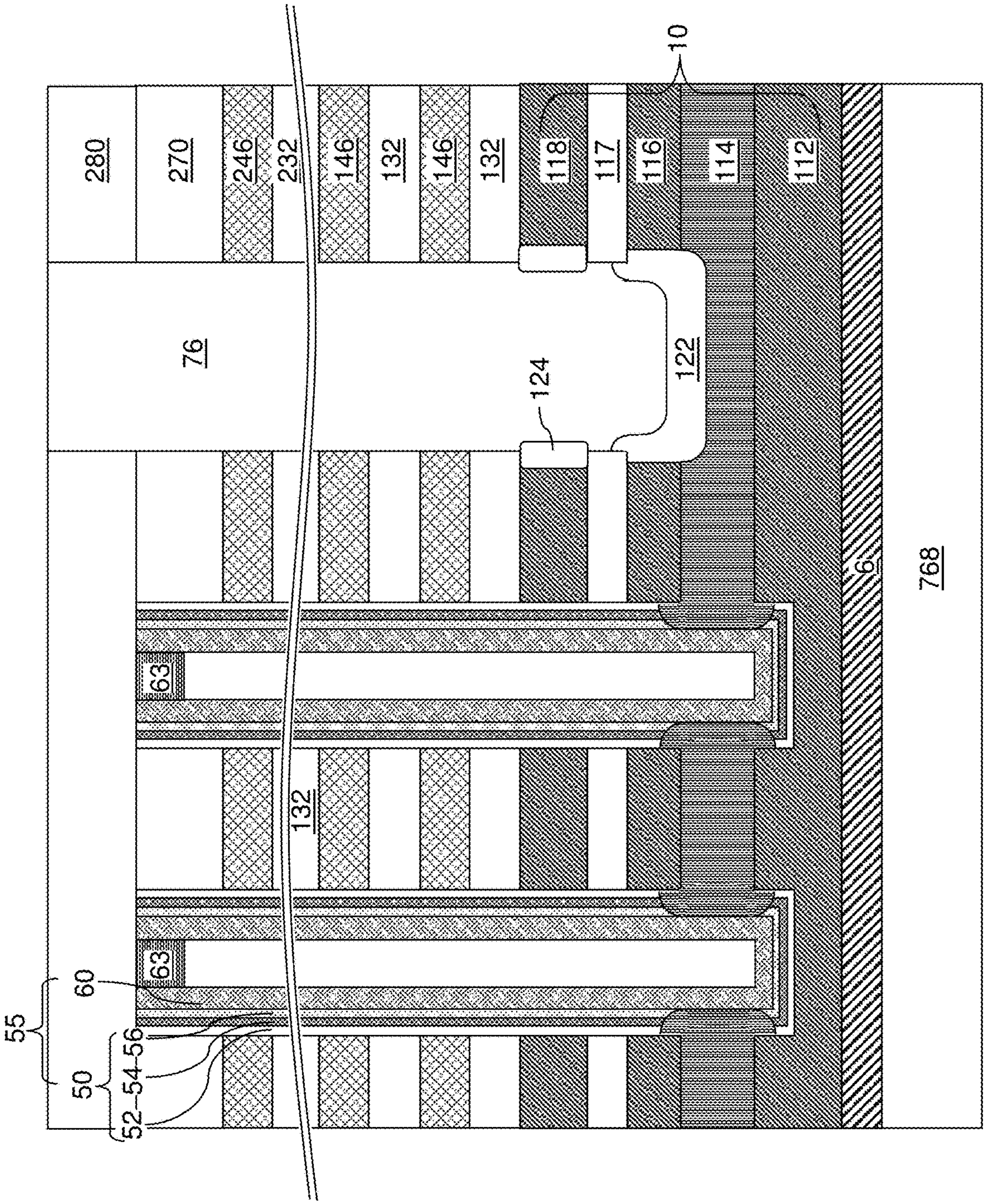
FIG. 23D is a vertical cross-sectional view of the first exemplary structure along the vertical plane D-D' of FIG. 23C.
Figure 24A:
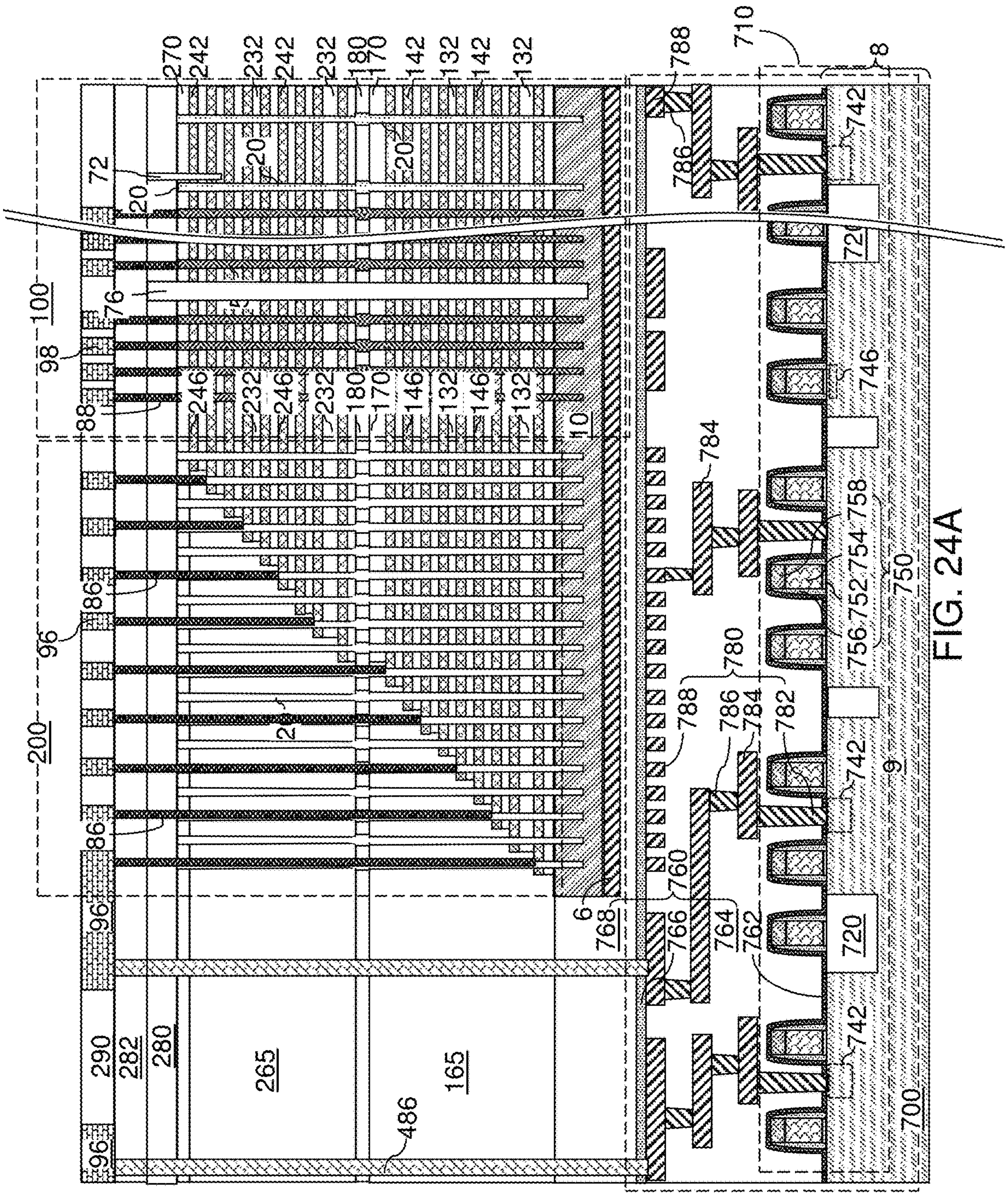
FIG. 24A is a vertical cross-sectional view of the first exemplary structure after formation of contact via structures and upper-level metal interconnect structures according to the first embodiment of the present disclosure.
Figure 24B:
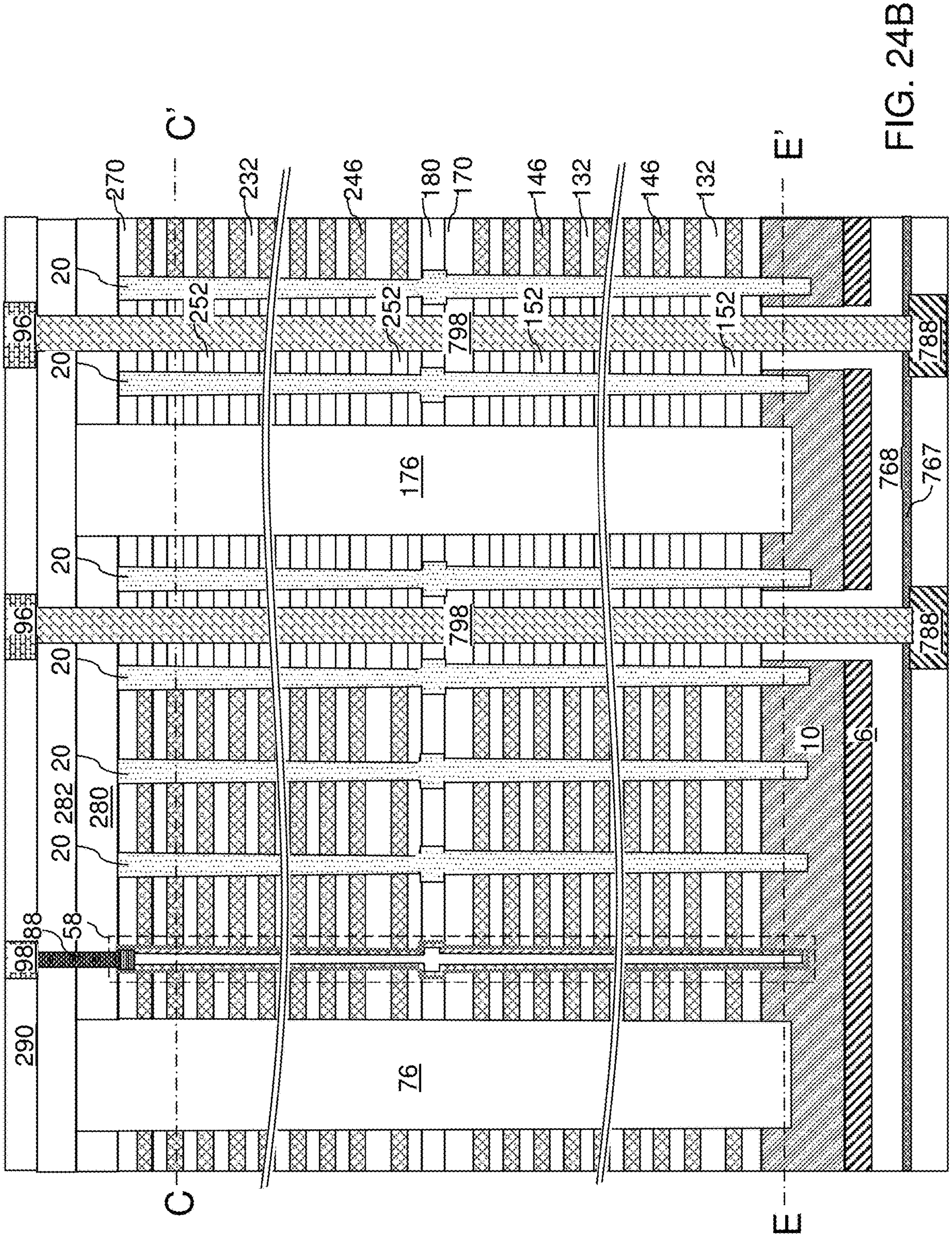
FIG. 24B is another vertical cross-sectional view of the first exemplary structure of FIG. 24A.
Figure 24C:
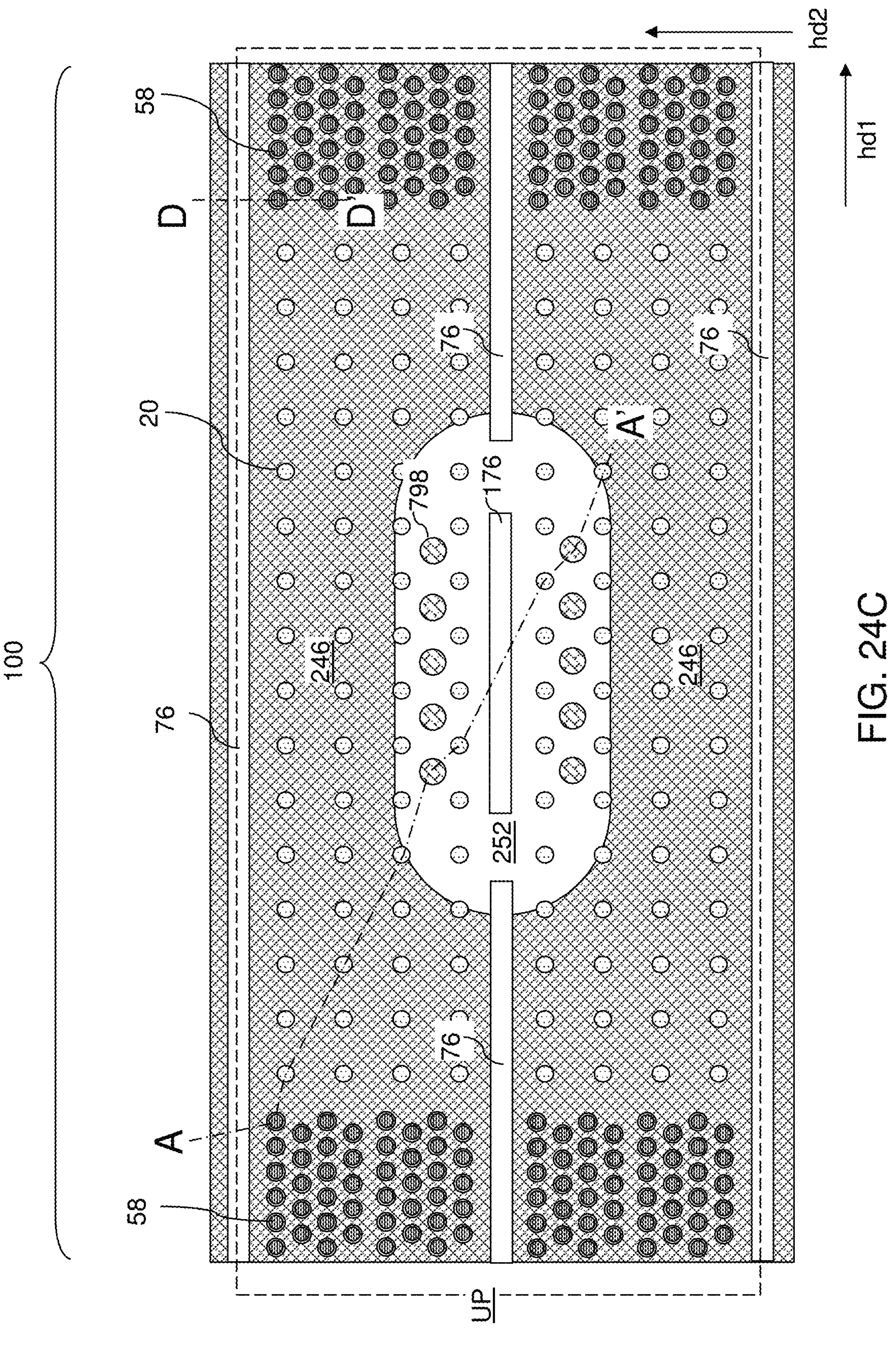
FIG. 24C is a horizontal cross-sectional view of the first exemplary structure along the horizontal plane C-C' of FIG. 24B. The hinged vertical plane B-B' corresponds to the plane of the vertical cross-sectional view of FIG. 24B.
Figure 24D:
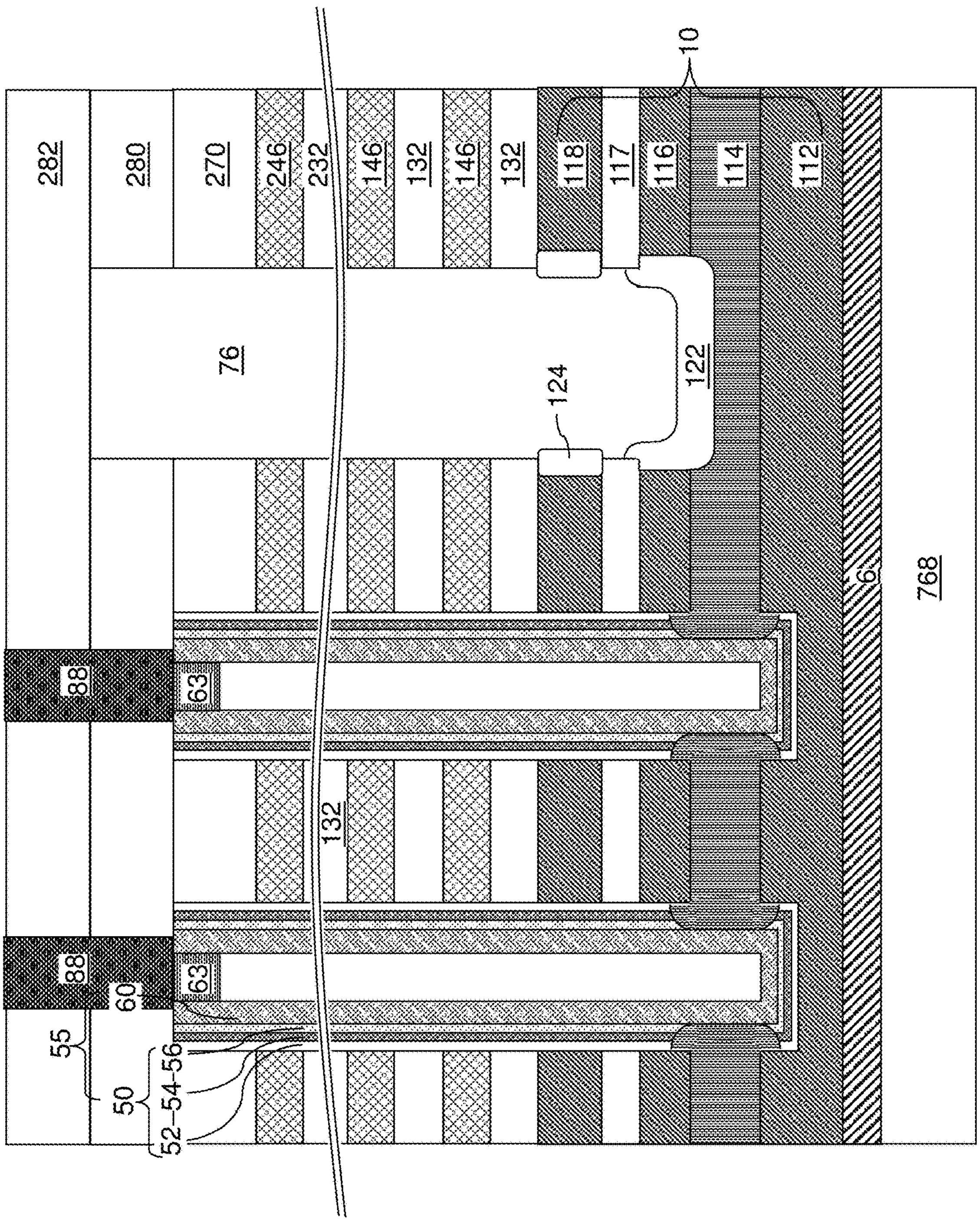
FIG. 24D is a vertical cross-sectional view of the first exemplary structure along the vertical plane D-D' of FIG. 24C.
Figure 24E:
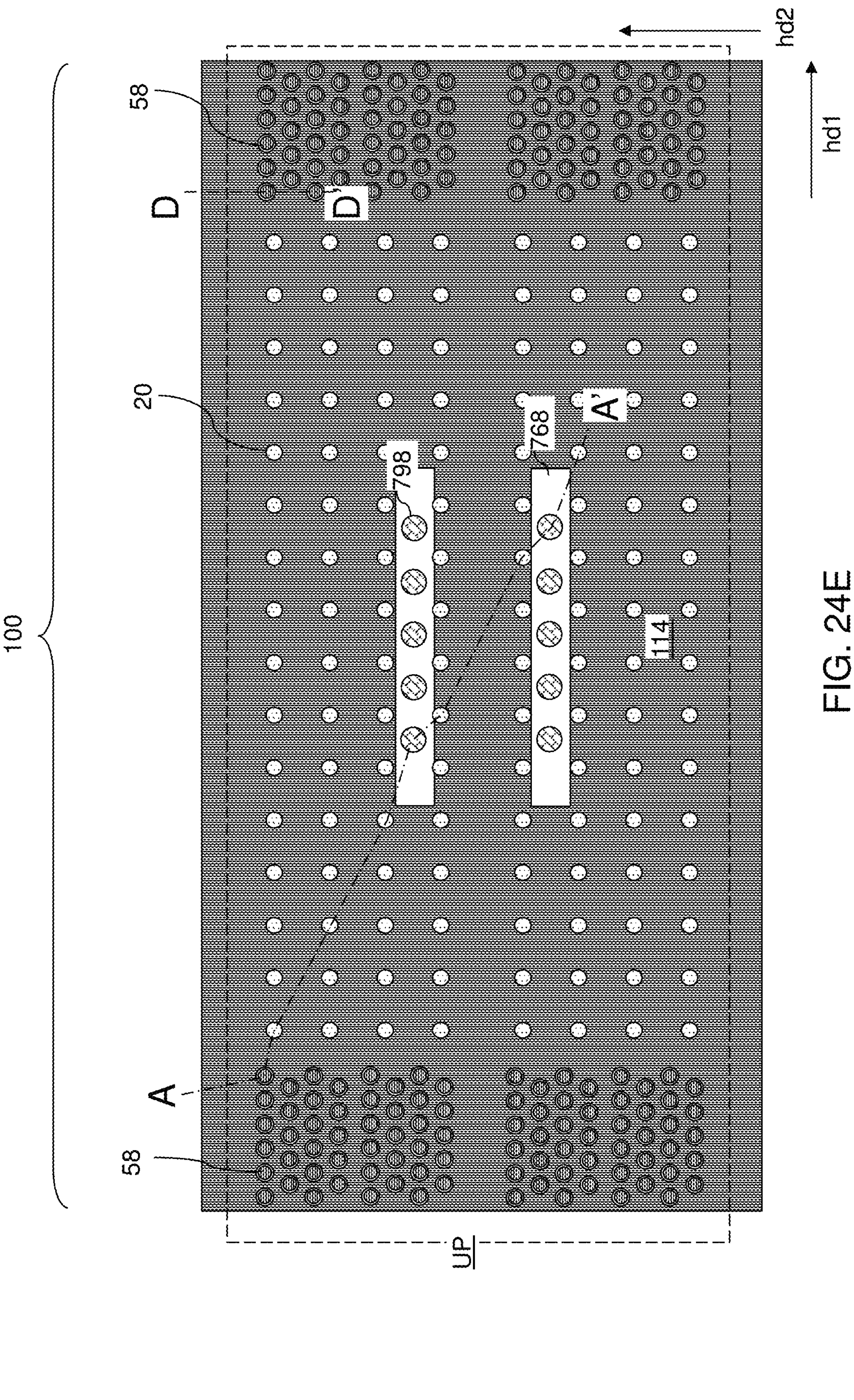
FIG. 24E is a horizontal cross-sectional view of the first exemplary structure of FIGS. 24A-24D at the level of the semiconductor material layer along the vertical plane E-E' of FIG. 24B.

Referring to FIG. 20A-20D, an oxidation process may be performed to convert physically exposed surface portions of semiconductor materials into dielectric semiconductor oxide portions. For example, surfaces portions of the source contact layer 114 and the upper source-level semiconductor layer 116 may be converted into dielectric semiconductor oxide plates 122, and surface portions of the source-select-level conductive layer 118 may be converted into annular dielectric semiconductor oxide spacers 124. A dielectric semiconductor oxide plate 122 and an annular dielectric semiconductor oxide spacer 124 is illustrated in FIG. 20D. The dielectric semiconductor oxide plates 122 and the annular dielectric semiconductor oxide spacers 124 are omitted in FIGS. 20A-20C for clarity.

Referring to FIGS. 21A-21D, the sacrificial material layers (142, 242) can be removed selective to the insulating layers (132, 232), the first and second insulating cap layers (170, 270), the first contact-level dielectric layer 280, and the source contact layer 114, the dielectric semiconductor oxide plates 122, and the annular dielectric semiconductor oxide spacers 124. An isotropic etchant that selectively etches the materials of the sacrificial material layers (142, 242) with respect to the materials of the insulating layers (132, 232), the first and second insulating cap layers (170, 270), the retro-stepped dielectric material portions (165, 265), and the material of the outermost layer of the memory films 50 may be introduced into the backside trenches 79, for example, using an isotropic etch process.

The isotropic etch process may be a wet etch process using a wet etch solution, or may be a gas phase (dry) etch process in which the etchant is introduced in a vapor phase into the backside trench 79. For example, if the sacrificial material layers (142, 242) include silicon nitride, the etch process may be a wet etch process in which the first exemplary structure is immersed within a wet etch tank including phosphoric acid, which etches silicon nitride selective to silicon oxide, silicon, and various other materials used in the art. The duration of the isotropic etch process may be selected such that the entirety of the sacrificial material layers (142, 242) is removed by the isotropic etch process.

Backside recesses (143, 243) may be formed in volumes from which the sacrificial material layers (142, 242) are removed. The backside recesses (143, 243) include first backside recesses 143 that may be formed in volumes from which the first sacrificial material layers 142 are removed and second backside recesses 243 that may be formed in volumes from which the second sacrificial material layers 242 are removed. Each of the backside recesses (143, 243) may be a laterally extending cavity having a lateral dimension that is greater than the vertical extent of the cavity. In other words, the lateral dimension of each of the backside recesses (143, 243) may be greater than the height of the respective backside recess (143, 243). A plurality of backside recesses (143, 243) may be formed in the volumes from which the material of the sacrificial material layers (142, 242) is removed. Each of the backside recesses (143, 243) may extend substantially parallel to the top surface of the substrate semiconductor layer 9. A backside recess (143, 243) may be vertically bounded by a top surface of an underlying insulating layer (132, 232) and a bottom surface of an overlying insulating layer (132, 232). In one embodiment, each of the backside recesses (143, 243) may have a uniform height throughout.

Referring to FIGS. 22A-22D, a backside blocking dielectric layer (not shown) may be optionally deposited in the backside recesses (143, 243) and the backside trenches 79 and over the first contact-level dielectric layer 280. The backside blocking dielectric layer includes a dielectric material such as a dielectric metal oxide, silicon oxide, or a combination thereof. For example, the backside blocking dielectric layer may include aluminum oxide. The backside blocking dielectric layer may be formed by a conformal deposition process such as atomic layer deposition or chemical vapor deposition. The thickness of the backside blocking dielectric layer may be in a range from 1 nm to 20 nm, such as from 2 nm to 10 nm, although lesser and greater thicknesses may also be used.

At least one conductive material may be deposited in the plurality of backside recesses (243, 243), on the sidewalls of the backside trenches 79, and over the first contact-level dielectric layer 280. The at least one conductive material may be deposited by a conformal deposition method, which may be, for example, chemical vapor deposition (CVD), atomic layer deposition (ALD), electroless plating, electroplating, or a combination thereof. The at least one conductive material may include an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof.

In one embodiment, the at least one conductive material may include at least one metallic material, i.e., an electrically conductive material that includes at least one metallic element. Non-limiting exemplary metallic materials that may be deposited in the backside recesses (143, 243) include tungsten, tungsten nitride, titanium, titanium nitride, tantalum, tantalum nitride, cobalt, and ruthenium. For example, the at least one conductive material may include a conductive metallic nitride liner that includes a conductive metallic nitride material such as TiN, TaN, WN, or a combination thereof, and a conductive fill material such as W, Co, Ru, Mo, Cu, or combinations thereof. In one embodiment, the at least one conductive material for filling the backside recesses (143, 243) may be a combination of titanium nitride layer and a tungsten fill material.

Electrically conductive layers (146, 246) may be formed in the backside recesses (143, 243) by deposition of the at least one conductive material. A plurality of first electrically conductive layers 146 may be formed in the plurality of first backside recesses 143, a plurality of second electrically conductive layers 246 may be formed in the plurality of second backside recesses 243, and a continuous metallic material layer (not shown) may be formed on the sidewalls of each backside trench 79 and over the first contact-level dielectric layer 280. Each of the first electrically conductive layers 146 and the second electrically conductive layers 246 may include a respective conductive metallic nitride liner and a respective conductive fill material. Thus, the first and second sacrificial material layers (142, 242) may be replaced with the first and second electrically conductive layers (146, 246), respectively. Specifically, each first sacrificial material layer 142 may be replaced with an optional portion of the backside blocking dielectric layer and a first electrically conductive layer 146, and each second sacrificial material layer 242 may be replaced with an optional portion of the backside blocking dielectric layer and a second electrically conductive layer 246. A backside cavity is present in the portion of each backside trench 79 that is not filled with the continuous metallic material layer.

Residual conductive material may be removed from inside the backside trenches 79. Specifically, the deposited metallic material of the continuous metallic material layer may be etched back from the sidewalls of each backside trench 79 and from above the first contact-level dielectric layer 280, for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246. Sidewalls of the first electrically conductive layers 146 and the second electrically conductive layers may be physically exposed to a respective backside trench 79.

Each electrically conductive layer (146, 246) may be a conductive sheet including openings therein. A first subset of the openings through each electrically conductive layer (146, 246) may be filled with memory opening fill structures 58. A second subset of the openings through each electrically conductive layer (146, 246) may be filled with the support pillar structures 20. Each of the memory stack structures 55 comprises a vertical stack of memory elements located at each level of the electrically conductive layers (146, 246). A subset of the electrically conductive layers (146, 246) may comprise word lines for the memory elements. The semiconductor devices in the underlying peripheral device region 700 may comprise word line switch devices configured to control a bias voltage to respective word lines. The memory-level assembly is located over the substrate semiconductor layer 9. The memory-level assembly includes at least one alternating stack {(132, 146), (232, 246)} and memory stack structures 55 vertically extending through the at least one alternating stack (132, 146, 232, 246).

Referring to FIGS. 23A-23D, a dielectric fill material can be deposited in the backside trenches 79 and the access trenches 179. The dielectric fill material can include a silicon oxide-based fill material such as undoped silicate glass or a doped silicate glass. Excess portions of the dielectric material may be optionally removed from above the top surface of the first contact-level dielectric layer 280 by a planarization process, which may employ a recess etch process or a chemical mechanical planarization process. In one embodiment, each remaining portion of the dielectric fill material filling a backside trench 79 constitutes a backside trench fill structure 76, which is a dielectric fill material structure. Each remaining portion of the dielectric fill material filling an access trench constitutes a wall structure 176. The backside trench fill structures 76 and the wall structures 176 can laterally extend along the first horizontal direction hd1.

In another embodiment, the dielectric fill material does not completely fill the backside trenches 79 and the access trenches 179. Instead, after an etch back process, the dielectric fill material forms insulating spacers on the sidewalls of the backside trenches 79 and the access trenches 179. A conductive material, such as a metal (e.g., tungsten) and/or a conductive metallic nitride (e.g., TiN or WN) is deposited into the backside trenches 79 and the access trenches 179 on the insulating spacers. The conductive material is then planarized by etch back of chemical mechanical planarization to form a local interconnect, such as a source local interconnect, which contacts the source contact layer 114 which functions as a combination of a buried source line and source electrode. In this alternative embodiment, the backside trench fill structures 76 and the wall structures 176 include a conductive local interconnect bounded on the sides by insulating spacers instead of being entirely dielectric fill material structures.

In one embodiment, each wall structure 176 can be laterally surrounded, and can be contacted, by a respective vertical stack of dielectric oxide plates (152, 252) that fill a respective vertical stack of fin cavities (153, 253) and the insulating layers (132, 232) which may also comprise a dielectric oxide, such as silicon oxide. Thus, each wall structures may be surrounded by alternating stacks of first and second silicon oxide layers. First backside trench fill structures 76A can laterally extend through the entirety of the memory array region 100 along the first horizontal direction hd1 and through the staircase region 200, and can be laterally spaced from dielectric oxide plates (152, 252). Second backside trench fill structures 76B can contact a respective vertical stack of dielectric oxide plates (152, 252). The wall structures 176 can be laterally spaced from the first backside trench fill structures 76A along the second horizontal direction hd2, and can be laterally spaced from a pair of second backside trench fill structures 76B along the first horizontal direction hd1. Each backside trench fill structure 76 (i.e., 76A, 76B) can contact sidewalls of the at least one alternating stack of insulating layers (132, 232) and electrically conductive layers (146, 246). In one embodiment, a vertical stack of dielectric oxide plates (152, 252) laterally surrounding a wall structure 176 may optionally contact a pair of second backside trench fill structures 76B depending on the duration of the isotropic etch which forms the fin cavities (153, 253).

Referring to FIGS. 24A-24E, drain-select-level isolation structures 72 may be optionally formed through a subset of the second electrically conductive layers 246. A second contact-level dielectric layer 282 can be formed over the first contact-level dielectric layer 280 by deposition of a dielectric material such as silicon oxide. Alternatively, the second contact-level dielectric layer 282 can be formed by not removing the dielectric fill material from above the top surface of the first contact-level dielectric layer 280 after formation of the backside trench fill structures 76 and the wall structures 176. The thickness of the second contact-level dielectric layer 282 may be in a range from 200 nm to 600 nm, although lesser and greater thicknesses can also be employed.

Various via cavities can be formed through the second contact-level dielectric layer 282 and underlying dielectric material layers and can be subsequently filled with at least one conductive material to form various contact via structures (88, 86, 486, 798). The various via cavities may be formed employing a single patterned photoresist layer as an etch mask layer and employing a single anisotropic etch process, or may be formed employing a plurality of patterned photoresist layers as etch mask layers and employing a plurality of anisotropic etch processes.

In case a single patterned photoresist layer and a single anisotropic etch process are employed to form the various via cavities, the openings in the patterned photoresist layer can include openings that overlie the drain regions 63 of the memory opening fill structures 58, openings that overlie horizontal surfaces of the first stepped surfaces of a first alternating stack of the first insulating layers 132 and the first electrically conductive layers 146 or of the second stepped surfaces of a second alternating stack of the second insulating layers 232 and the second electrically conductive layers 246, openings that overlie a respective vertical stack of dielectric oxide plates (152, 252) and a respective opening in the source-level material layers 10, and optionally openings located over portions of the retro-stepped dielectric material portions (165, 265) that do not overlie the source-level material layers 10. In this case, the anisotropic etch process can have an etch chemistry that is etches silicon oxide selective to the materials of the drain regions 63, the materials of the first electrically conductive layers 146 and the second electrically conductive layers 246, and the materials of the lower-level metal interconnect structures 780.

In case a plurality of patterned photoresist layers and a plurality of anisotropic etch processes are employed to form the various via cavities, the openings in each patterned photoresist layer includes a respective subset of the openings that overlie the drain regions 63 of the memory opening fill structures 58, the openings that overlie horizontal surfaces of the first stepped surfaces of a first alternating stack of the first insulating layers 132 and the first electrically conductive layers 146 or of the second stepped surfaces of a second alternating stack of the second insulating layers 232 and the second electrically conductive layers 246, the openings that overlie a respective vertical stack of dielectric oxide plates (152, 252) and a respective opening in the source-level material layers 10, and optionally the openings located over portions of the retro-stepped dielectric material portions (165, 265) that do not overlie the source-level material layers 10. In this case, each anisotropic etch process can have an etch chemistry that selectively etches silicon oxide compared to a respective subset of the materials of the drain regions 63, the materials of the first electrically conductive layers 146 and the second electrically conductive layers 246, and the materials of the lower-level metal interconnect structures 780. The various via cavities can include drain contact via cavities that are formed above the drain regions 63, layer contact via cavities that are formed on the electrically conductive layers (146, 246), peripheral through-memory-level via cavities that are formed through the retro-stepped dielectric material portions (165, 265) on a respective one of the lower-level metal interconnect structures 780 (such as a landing-pad-level metal interconnect structure 788), and array-region through-memory-level via cavities that are formed through a respective vertical stack of dielectric oxide plates (152, 252) and the insulating layers (132, 232) on a respective one of the lower-level metal interconnect structures 780 (such as a landing-pad-level metal interconnect structure 788).

After formation of the various via cavities and removal of the patterned photoresist layer(s), at least one conductive material can be deposited in the various via cavities, for example, by chemical vapor deposition, physical vapor deposition, electroplating, and/or electroless plating. Excess portions of the at least one conductive material can be removed from above the horizontal plane including the top surface of the second contact-level dielectric layer 282. Contact via structures (88, 86, 486, 798) can be formed in the various via cavities. In one embodiment, the at least one conductive material can be deposited into all of the above via cavities during the same deposition step.

The contact via structures (88, 86, 486, 798) include drain contact via structures 88 that contact a respective one of the drain regions 63, layer contact via structures 86 (e.g., word line and select gate contact via structures) that contact a respective one of the electrically conductive layers (146, 246), peripheral through-memory-level via structures 486 that extend through the retro-stepped dielectric material portions (165, 265) and contact a respective one of the lower-level metal interconnect structures 780, and array-region through-memory-level via structures 798 that extend through a respective vertical stack of dielectric oxide plates (152, 252) and through the insulating layers (132, 232) and contact a respective one of the lower-level metal interconnect structures 780. Each peripheral through-memory-level via structures 486 is a contact via structure that is formed outside the areas of the memory array region 100 and the staircase region 200, and vertically extends through the memory level, i.e., the level located between the horizontal plane including the bottom surface of the source-level material layers 10 and the horizontal plane including the top surfaces of the memory opening fill structures 58. Each array-region through-memory-level via structures 798 is a contact via structure that is formed within the area of the memory array region 100, and vertically extends through the memory level.

In one embodiment, each array-region through-memory-level via structure 798 can vertically extend through a respective opening in the source-level material layers 10 and can contact a portion of the lower-level dielectric material layers 760 (such as the at least one second dielectric layer 768) that fill the opening in the source-level material layer 10. In one embodiment, each array-region through-memory-level via structure 798 can be formed in regions located between support pillar structures 20, and can be laterally spaced from the electrically conductive layers (146, 246) by surrounding portions of the dielectric oxide plates (152, 252). Further, each array-region through-memory-level via structure 798 can be laterally spaced from the source-level material layers 10 by portions of the lower-level dielectric material layers 760 that fill the openings in the source-level material layers 10. In one embodiment shown in FIG. 24B, the lower-level dielectric material layers 760 may include an etch stop dielectric layer 767 that contacts top surfaces of the landing-pad-level metal interconnect structure 788. In this case, each array-region through-memory-level via structure

798 can extend through, and contact, the etch stop dielectric layer 767, which may include a silicon nitride layer or a dielectric metal oxide layer.

Subsequently, upper-level dielectric material layers and upper-level metal interconnect structures can be formed. For example, upper-level dielectric material layers can include a line-level dielectric layer 290 and metal line structures (96, 98) embedded therein. The metal line structures (96, 98) can include bit lines 98 that contact a respective subset of the drain contact via structures 88, and interconnection metal lines 96 that contact at least one of the layer contact via structures 86, the peripheral through-memory-level via structures 486, and the array-region through-memory-level via structures 798.

Figure 25A:
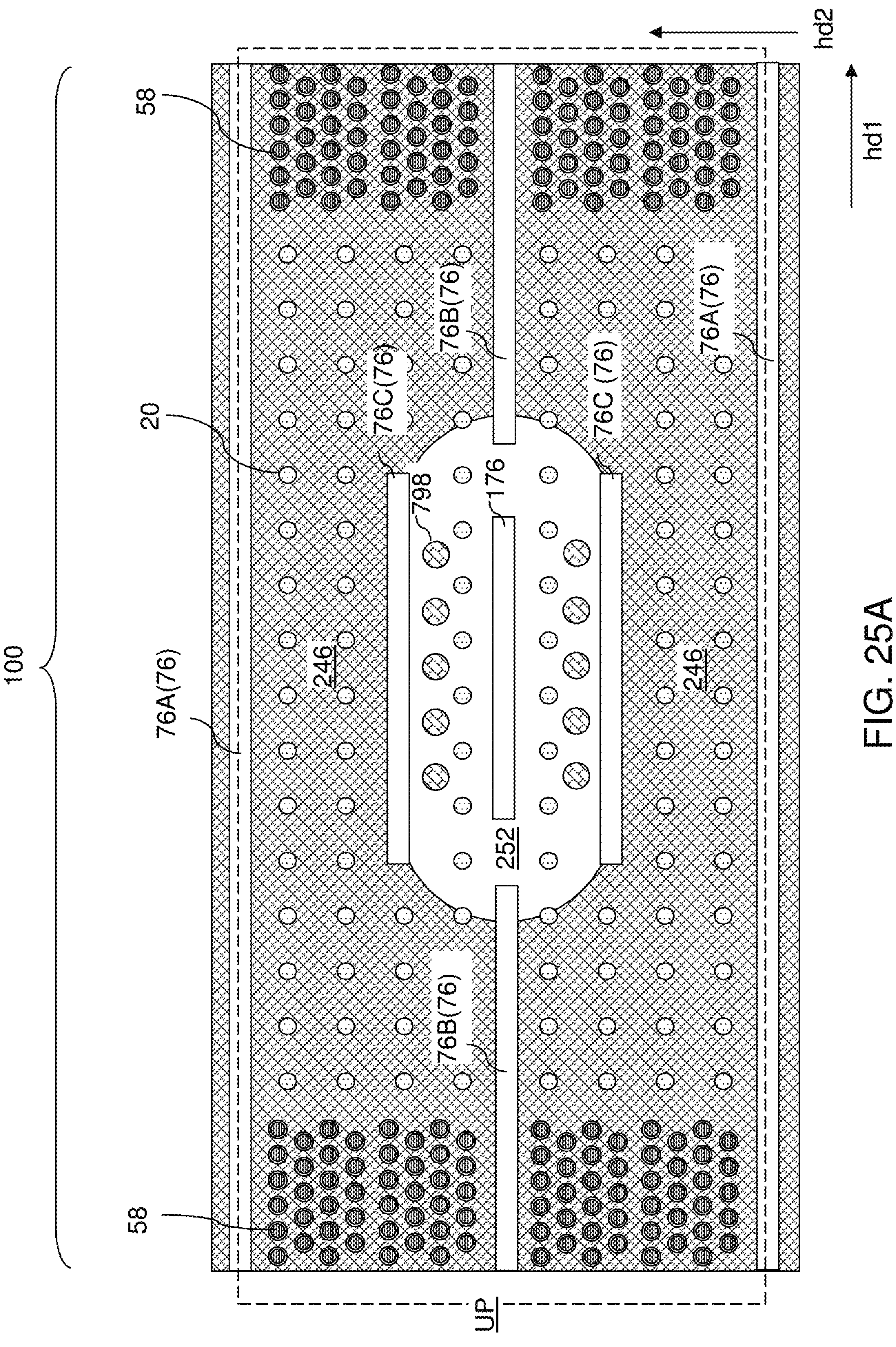
FIGS. 25A-25C are horizontal cross-sectional views of alternative configurations of the first exemplary structure of FIGS. 24A-24E.
Figure 25B:
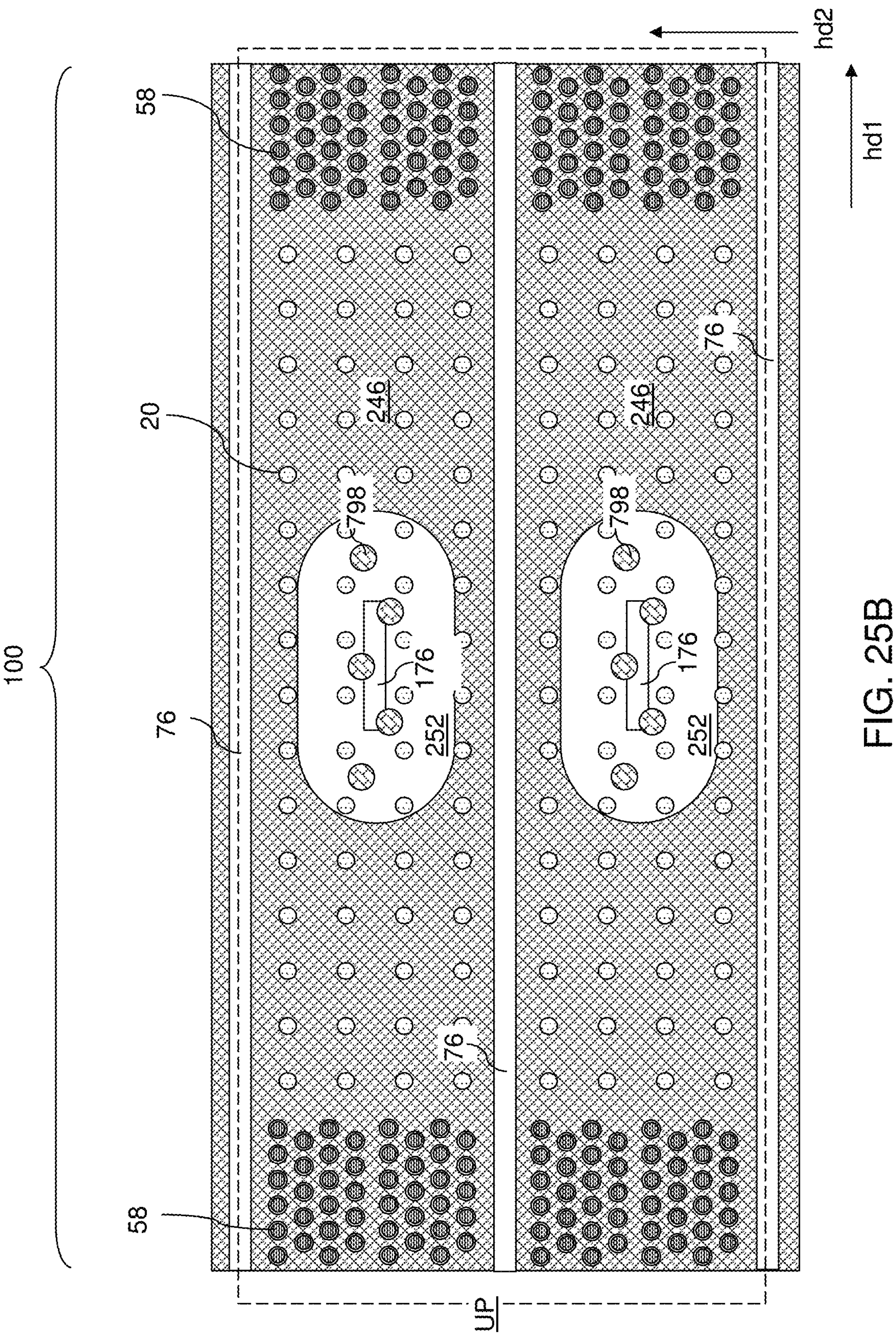
Figure 25C:
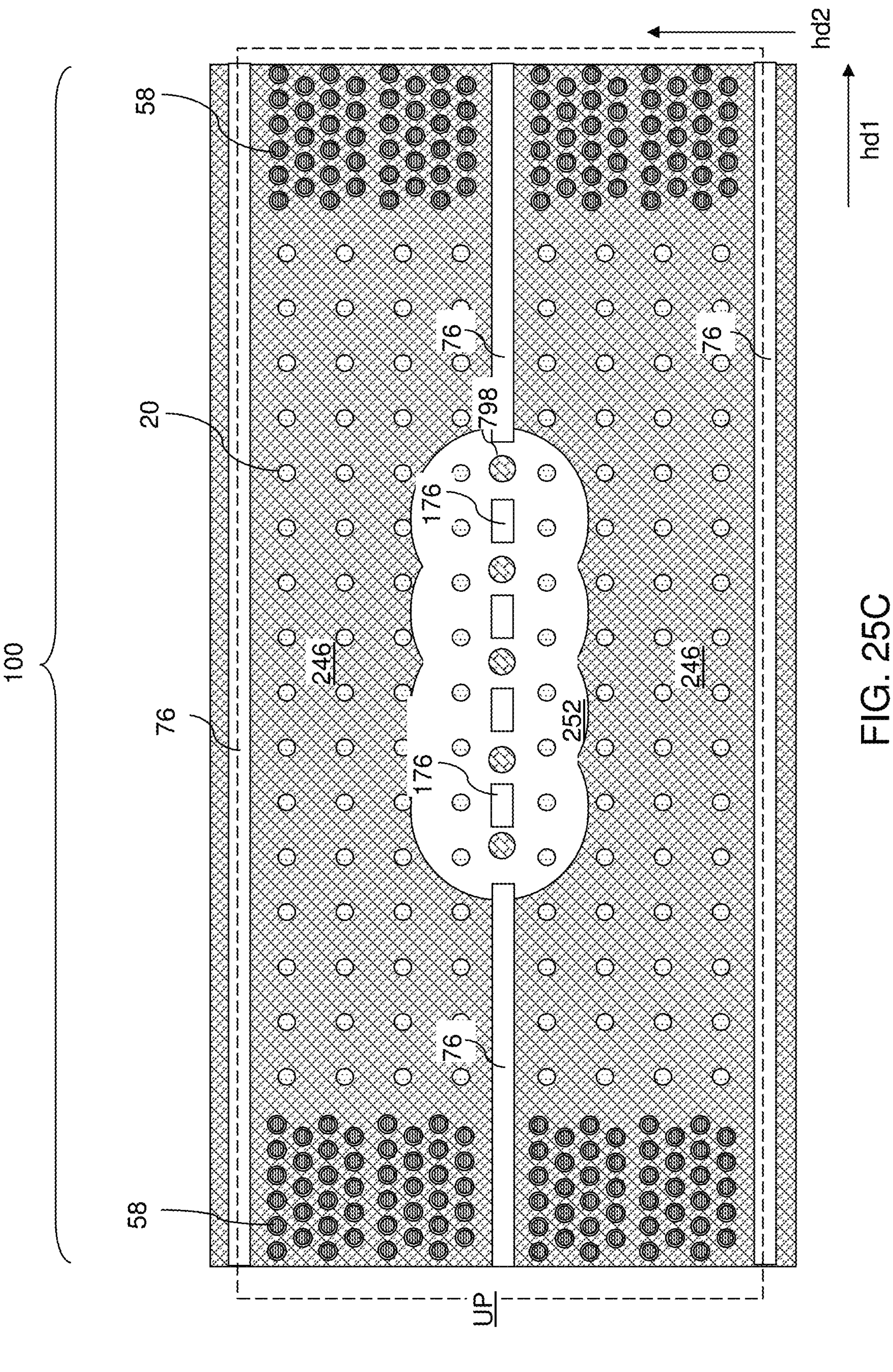
Figure 26A:
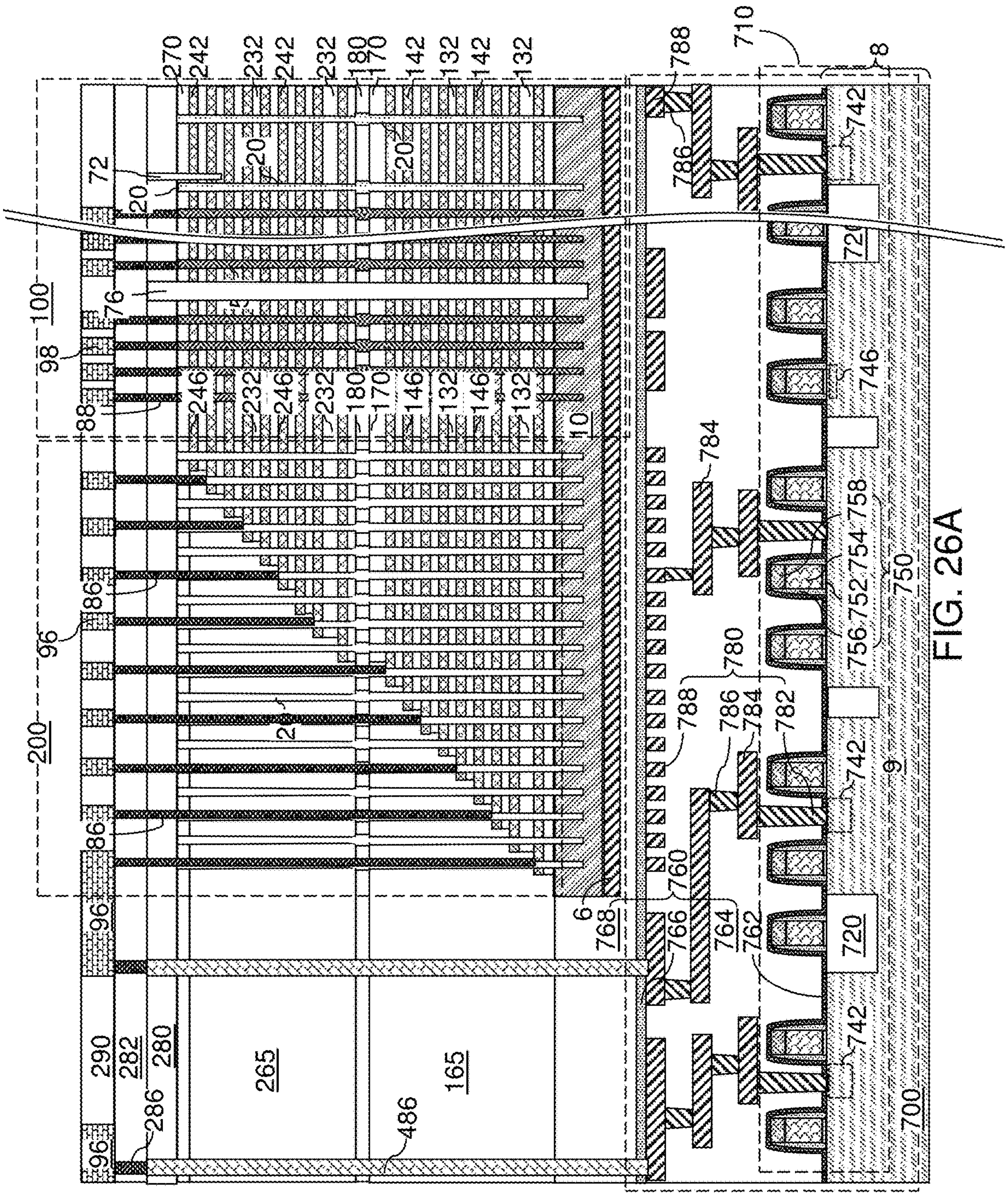
FIG. 26A is a vertical cross-sectional view of a second exemplary structure after formation of contact via structures and upper-level metal interconnect structures according to a second embodiment of the present disclosure.
Figure 26B:
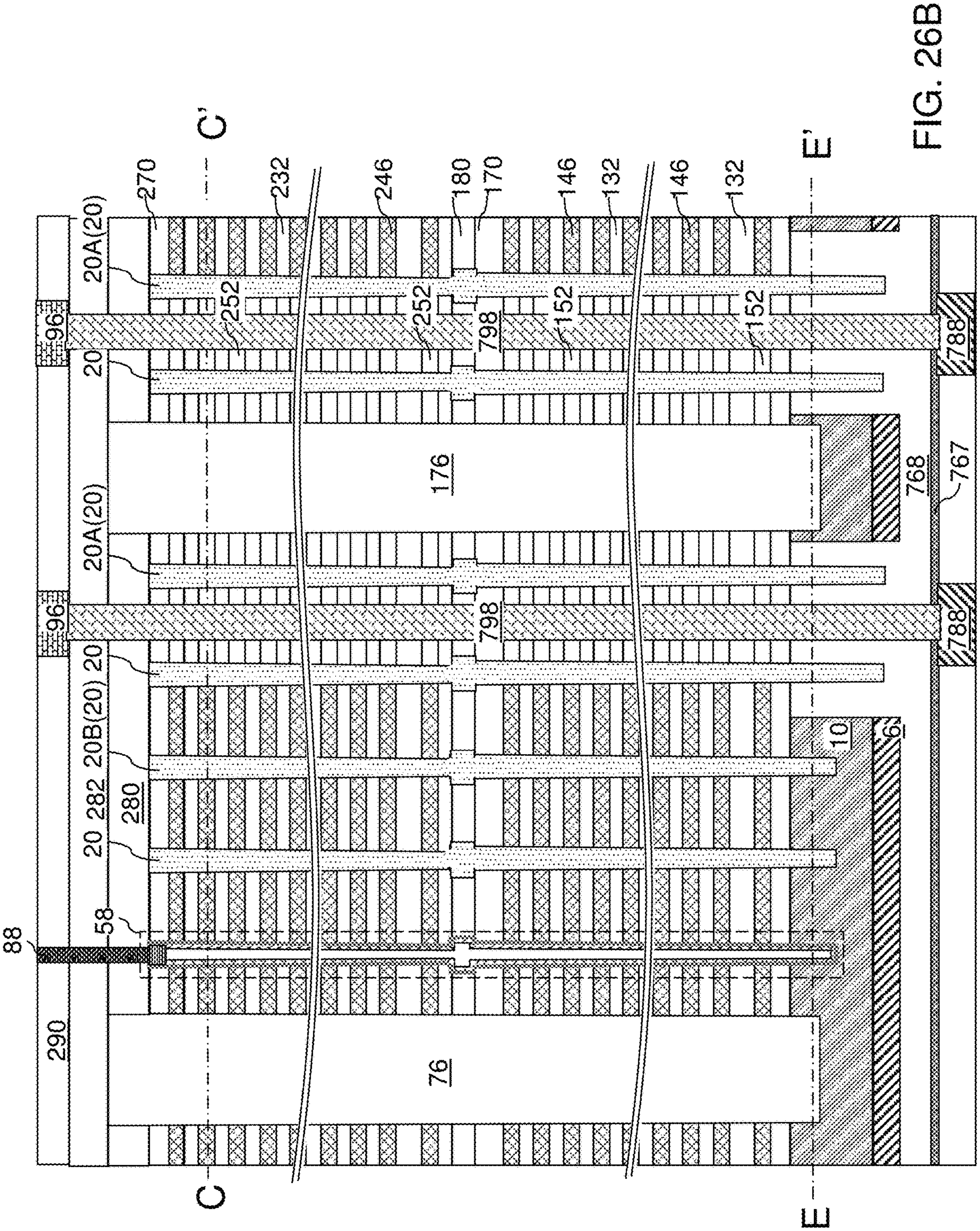
FIG. 26B is another vertical cross-sectional view of the second exemplary structure of FIG. 26A.
Figure 26C:
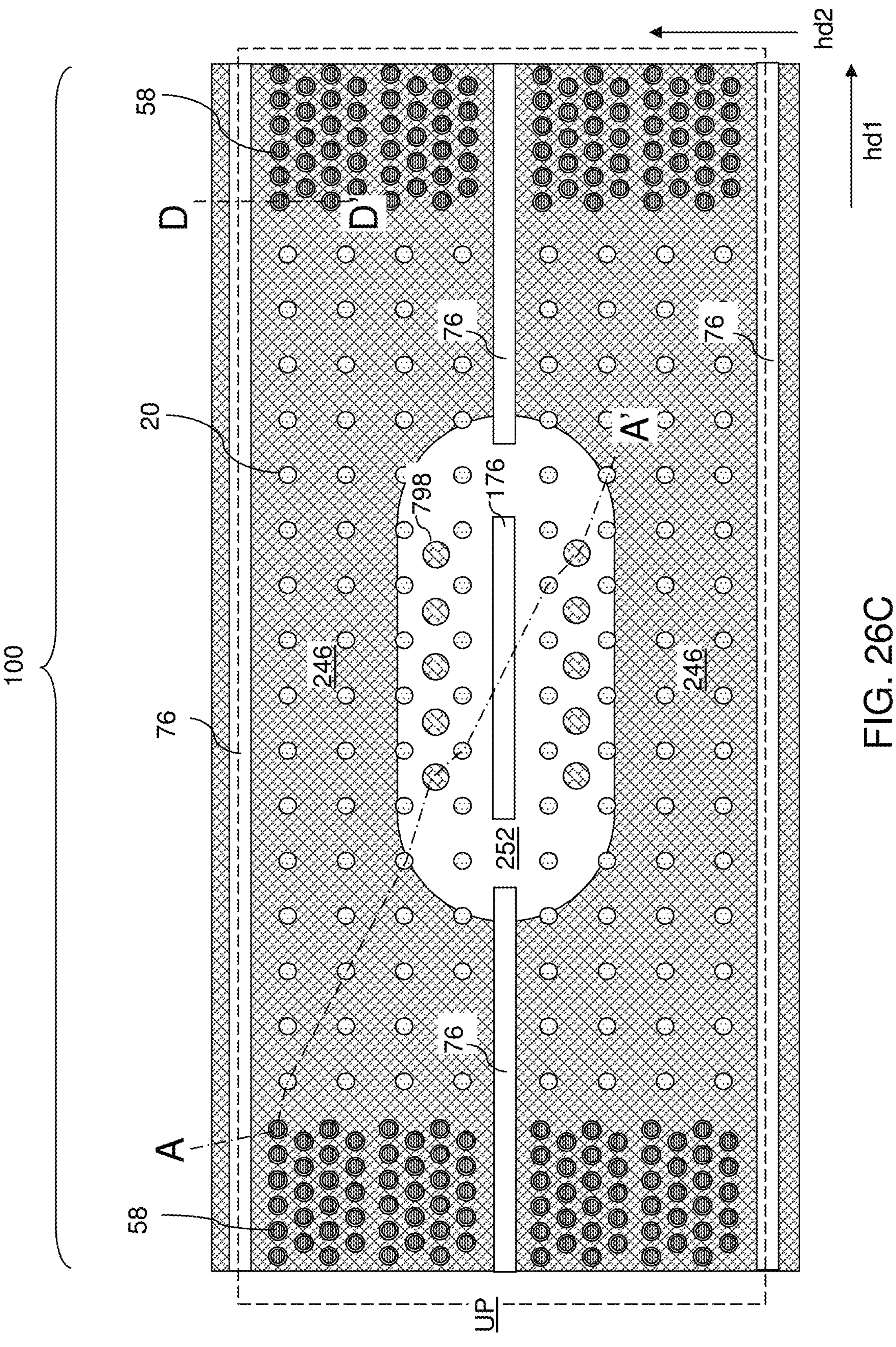
FIG. 26C is a horizontal cross-sectional view of the second exemplary structure along the horizontal plane C-C' of FIG. 26B. The hinged vertical plane B-B' corresponds to the plane of the vertical cross-sectional view of FIG. 26B.
Figure 26D:
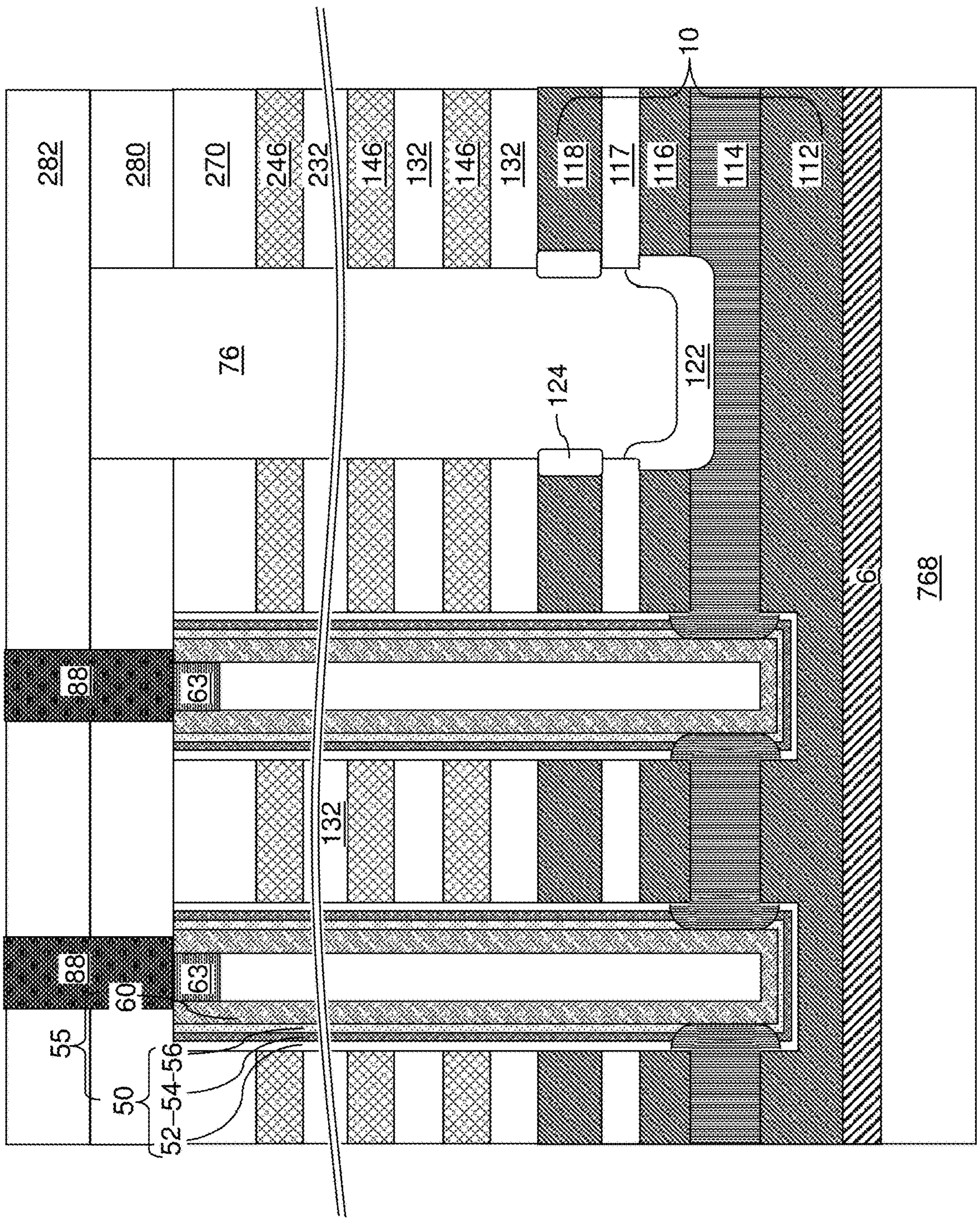
FIG. 26D is a vertical cross-sectional view of the second exemplary structure along the vertical plane D-D' of FIG. 26C.
Figure 26E:
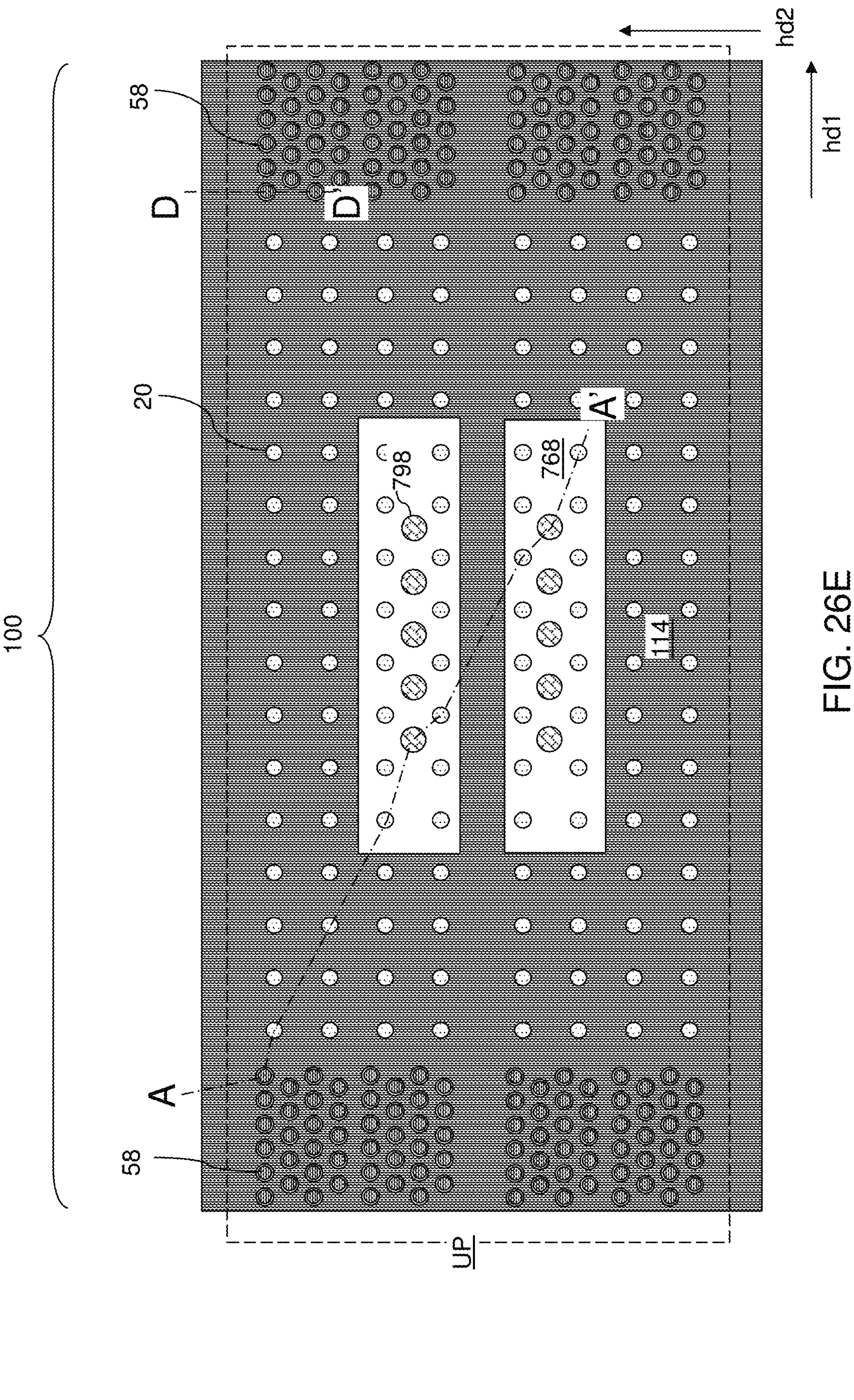
FIG. 26E is a horizontal cross-sectional view of the second exemplary structure of FIGS. 26A-26D at the level of the semiconductor material layer.

FIGS. 25A-25C are horizontal cross-sectional views of alternative configurations of the first exemplary structure of FIGS. 24A-24E.

Referring to FIG. 25A, a first alternative configuration of the first exemplary structure can be derived from the first exemplary structure by forming additional backside trenches 79 filled with additional backside trench fill structures 76, which are herein referred to as third backside trench fill structures 76C. The third backside trench fill structures 76C can be formed along a same direction as a wall structure 176, and can be laterally offset from the wall structure 176 along the second horizontal direction hd2. The third backside trench fill structures 76C may be employed to limit the lateral extent of each vertical stack of dielectric oxide plates (152, 252) by limiting the lateral extent of fin cavities (153, 253).

Referring to FIG. 25B, a second alternative configuration of the first exemplary structure can be derived from the first exemplary structure by forming access trenches 179 with a lateral offset from the backside trenches 79B along the second horizontal direction hd2. In this case, each of the backside trenches 79 can continuously extend through the entire length of the memory array region 100 along the first horizontal direction hd1, and each access trench 179 can be formed midway between a neighboring pair of backside trenches 79. Accordingly, the wall structures 176 can be formed between a laterally neighboring pair of backside trench fill structures 76. The width of each vertical stack of dielectric oxide plates (152, 252) along the second horizontal direction hd2 between a pair of backside trench fill structures 76 may be less than the width of an alternating stack of insulating layers (132, 232) and electrically conductive layers (146, 246) along the second horizontal direction hd2 between the pair of backside trench fill structures 76. In this case, electrical connection between a portion of each electrically conductive layer (146, 246) located on one side of the vertical stack of dielectric oxide plates (152, 252) along the first horizontal direction hd1 and a portion of each electrically conductive layer (146, 246) located on another side of the vertical stack of dielectric oxide plates (152, 252) can be provided by at least one strip portion of the respective electrically conductive layer (146, 246) located adjacent to the vertical stack of dielectric oxide plates (152, 252). One or more of the array-region through-memory-level via structures 798 may be formed through a respective vertical stack of dielectric oxide plates (152, 252) and the insulating layers (132, 32). Further, one or more of the array-region through-memory-level via structures 798 may be formed through, and may contact, a wall structure 176.

Referring to FIG. 25C, a third alternative configuration of the first exemplary structure can be derived from the first exemplary structure by forming a plurality of access trenches 179 in proximity to each other. Each access trench 179 may have a horizontal cross-sectional shape of a rectangle, a circle, a rounded polygon, or any other closed two-dimensional generally curvilinear shape. One or more of the array-region through-memory-level via structures 798 may be formed through a respective vertical stack of dielectric oxide plates (152, 252) and the insulating layers (132, 232). Further, one or more of the array-region through-memory-level via structures 798 may be formed through, and may contact, a wall structure 176.

Referring to FIGS. 1A-25C and according to the first embodiment of the present disclosure, a three-dimensional memory device is provided, which comprises: at least one alternating stack of insulating layers (132, 232) and electrically conductive layers (146, 246) located over an underlying metal interconnect structure (e.g., 788); memory stack structures 55 (located within a respective memory opening fill structure 58) vertically extending through the at least one alternating stack {(132, 146), (232, 246)}; a vertical stack of dielectric oxide plates (152, 252) interlaced with laterally extending portions of the insulating layers (132, 232) of the at least one alternating stack {(132, 146), (232, 246)}, wherein each dielectric oxide plate (152, 252) is located between a respective vertically neighboring pair of insulating layers (132, 232) of the at least one alternating stack {(132, 146), (232, 246)}; and a conductive via structure (such as a memory-region through-memory-level via structure 798) vertically extending through each dielectric oxide plate within the vertical stack and each laterally extending portion of the insulating layers of the at least one alternating stack, and contacting the underlying metal interconnect structure (such as a landing-pad-level metal interconnect structure 788).

In one embodiment, the three-dimensional memory device comprises: a first backside trench fill structure 76A laterally extending along a first horizontal direction hd1 and contacting sidewalls of the at least one alternating stack {(132, 146), (232, 246)}; and a second backside trench fill structure 76B laterally extending along the first horizontal direction hd1 and contacting additional sidewalls of the at least one alternating stack {(132, 146), (232, 246)}. In one embodiment, a wall structure 176 can contact each dielectric oxide plate (152, 252) within the vertical stack of dielectric oxide plates (152, 252). The first and second backside trench fill structures (76A, 76B) and the wall structure 176 may each comprise one of a dielectric fill structure or a local interconnect surrounded by an insulating spacer.

In one embodiment, each dielectric oxide plate (152, 252) within the vertical stack of dielectric oxide plates (152, 252) laterally surrounds the wall structure 176. In one embodiment, each dielectric oxide plate (152, 252) has inner sidewalls contacting the wall structure 176 and outer sidewalls that are laterally offset from a most proximal one of the inner sidewalls by a uniform lateral offset distance, which may be about the same as the lateral etch distance of the etch process that form the fin cavities (153, 253).

In one embodiment, the dielectric oxide plates (152, 252) comprise straight outer sidewall segments that laterally extend along the first horizontal direction hd1 and curved outer sidewall segments having a respective convex horizontal cross-sectional profile. In one embodiment, the dielectric oxide plates (152, 252) contact the second backside trench fill structure 76B; the wall structure 176 is laterally spaced from the first backside trench fill structure 76A along a second horizontal direction hd2 that is perpendicular to the first horizontal direction hd1; and the wall structure 176 is laterally spaced from the second backside trench fill structure 76B along the first horizontal direction hd1.

In one embodiment, the conductive via structure (such as the memory-region through-memory-level via structure 798) contacts each insulating layer (132, 232) within the at least one alternating stack {(132, 146), (232, 246)} and each dielectric oxide plate (152, 252) within the vertical stack of dielectric oxide plates (152, 252).

In one embodiment, the three-dimensional memory device comprises: first support pillar structures 20 vertically extending through the at least one alternating stack {(132, 146), (232, 246)}; and second support pillar structures 20 vertically extending through the vertical stack of dielectric oxide plates (152, 252) and the laterally extending portions of the insulating layers (132, 232) of the at least one alternating stack {(132, 146), (232, 246)} and contacting a semiconductor material layer (such as a lower source-level material layer 112, a source contact layer 114, and/or an upper source-level semiconductor layer 116).

In one embodiment, the semiconductor material layer (such as a lower source-level material layer 112, a source contact layer 114, and/or an upper source-level semiconductor layer 116) comprises an opening therethrough; and the contact via structure (such as the memory-region through-memory-level via structure 798) extends through the opening in the semiconductor material layer and is laterally spaced from a periphery of the opening through the semiconductor material layer.

In one embodiment, each of the memory stack structures 55 comprises: a vertical semiconductor channel 60 that vertically extends through each electrically conductive layer (146, 246) within the at least one alternating stack {(132, 146), (232, 246)}; and a vertical stack of memory elements (comprising portions of the charge storage layer 54) located at levels of the electrically conductive layers (146, 246) within the at least one alternating stack {(132, 146), (232, 246)}.

In one embodiment, the at least one alternating stack {(132, 146), (232, 246)} comprises: a first-tier alternating stack of first insulating layers 132 and first electrically conductive layers 146 having first stepped surfaces that contacts a first retro-stepped dielectric material portion 165; and a second-tier alternating stack of second insulating layers 232 and second electrically conductive layers 246 having second stepped surfaces that contact a second retro-stepped dielectric material portion 265.

In one embodiment, the three-dimensional memory device comprises: a substrate 8 located below the underlying interconnect structure 788, a semiconductor material layer (such as a lower source-level material layer 112, a source contact layer 114, and/or an upper source-level semiconductor layer 116) located between the alternating stack and the underlying interconnect structure 788; lower-level dielectric material layers 760 embedding lower-level metal interconnect structures 780 therein and located between the substrate 8 and the semiconductor material layer; and upper-level dielectric material layers (such as the line-level dielectric layer 290) embedding upper-level metal interconnect structures (such as the metal line structures (96, 98)) and located above the at least one alternating stack {(132, 146), (232, 246)}. The underlying metal interconnect structure is one of the lower-level metal interconnect structures 780; and the contact via structure can contact one of the upper-level metal interconnect structures (such as the metal line structures (96, 98)).

In one embodiment, the substrate 8 comprises a semiconductor substrate; driver circuit semiconductor devices 710 are located on a top surface of the semiconductor substrate; and a subset of the lower-level metal interconnect structures 780 is electrically connected to a respective node of the semiconductor devices.

Referring to FIGS. 26A-26E, a second exemplary structure can be derived from any configuration of the first exemplary structure illustrated in FIGS. 24A-24E and 25A-25C by modifying the shapes of openings through the in-process source-level material layers 10' at the processing steps of FIGS. 1A-1C and subsequently performing the rest of the processing steps of the first embodiment. The shapes of the semiconductor material layer (such as a lower source-level material layer 112, a source contact layer 114, and/or an upper source-level semiconductor layer 116) are modified such that each support pillar structure 20 located within an outer periphery of a vertical stack of dielectric oxide plates (152, 252) extends into the lower-level dielectric material layers 760, such as the at least one second dielectric layer 768. Each such opening is filled with a respective portion of the lower-level dielectric material layers 760 prior to formation of the first-tier alternating stack of (132, 142) of the first insulating layers 132 and the first sacrificial material layers 142.

A subset of the first-tier support openings 119 formed at the processing steps of FIGS. 4A-4C is formed through the first-tier alternating stack (132, 142) and through the portions of the lower-level dielectric material layers 760 filling the openings in the in-process source-level material layers 10'. The chemistry of the anisotropic etch process at the processing steps of FIGS. 4A-4C can be selected such that the terminal portion of the anisotropic etch process that forms the first-tier support openings 119 etches the dielectric material of the lower-level dielectric material layers 760 located within the openings through the in-process source-level material layers 10' at a higher etch rate than the materials of the in-process source-level material layers 10'. A first subset of the first-tier support openings 119 formed through openings in the in-process source-level material layer 10' can be formed with a greater depth than a second subset of the first-tier support openings 119 formed into the in-process source-level material layer 10'.

Subsequently, the processing steps of FIGS. 5-9B can be performed to form support openings 19 having different depths. Generally, a first subset of the support openings 19 can be formed through the at least one alternating stack {(132, 142), (232, 242)} and into a portion of the lower-level dielectric material layers 760 located in the opening in the at least one semiconductor material layer within the in-process source-level material layer 10'. A second subset of the support openings 19 can be formed into the at least one semiconductor material layer within the in-process source-level material layer 10'. Bottom surfaces of the first subset of the support openings 19 are located below a first horizontal plane including bottom surfaces of the second subset of the support openings 19.

Subsequently, first support pillar structures 20A (which are a first subset of the support pillar structures 20) can be formed in the first subset of the support openings 19, and second support pillar structures 20B (which are a second subset of the support pillar structures 20) can be formed in the second subset of the support openings 19. Thus, the first support pillar structures 20A can be formed over the opening in the at least one semiconductor material layer within the in-process source-level material layer 10' directly on the lower-level dielectric material layers 760, and the second support pillar structures 20 contact the at least one semiconductor material layer within the in-process source-level material layer 10' and do not contact the lower-level dielectric material layers 760. Bottom surfaces of the first support pillar structures 20A are located below the first horizontal plane including bottom surfaces of the second support pillar structures 20B. Top surfaces of the first support pillar structures 20A can be located within a second horizontal plane including top surfaces of the second support pillar structures 20B.

The processing steps of FIGS. 10A-18C can be subsequently performed. A vertical stack of dielectric oxide plates (152, 252) can be formed over an opening in the at least one semiconductor material layer within the in-process source-level material layer 10' by patterning replacing portions of the sacrificial material layers (142, 242) that with dielectric oxide plates (152, 252), which are dielectric material portions.

Subsequently, the processing steps of FIGS. 19A-22D can be performed to replace remaining portions of the sacrificial material layers (142, 242) with electrically conductive layers (146, 246). The processing steps of FIGS. 23A-25C can be subsequently performed. Various contact via structures (88, 86, 486, 798) can be formed, which include array-region through-memory-level contact via structures 798 that vertically extend through a respective vertical stack of dielectric oxide plates (152, 252) and through a respective opening in the at least one semiconductor material layer in the source-level material layers 10 and directly on one of the lower-level metal interconnect structures 780. In one embodiment, the bottom surfaces of the first support pillar structures 20A can be located between a horizontal plane including a bottom surface of the semiconductor material layer (which can be one of the layers within the source-level material layers 10) and another horizontal plane including a top surface of the semiconductor material layer.

Figure 27A:
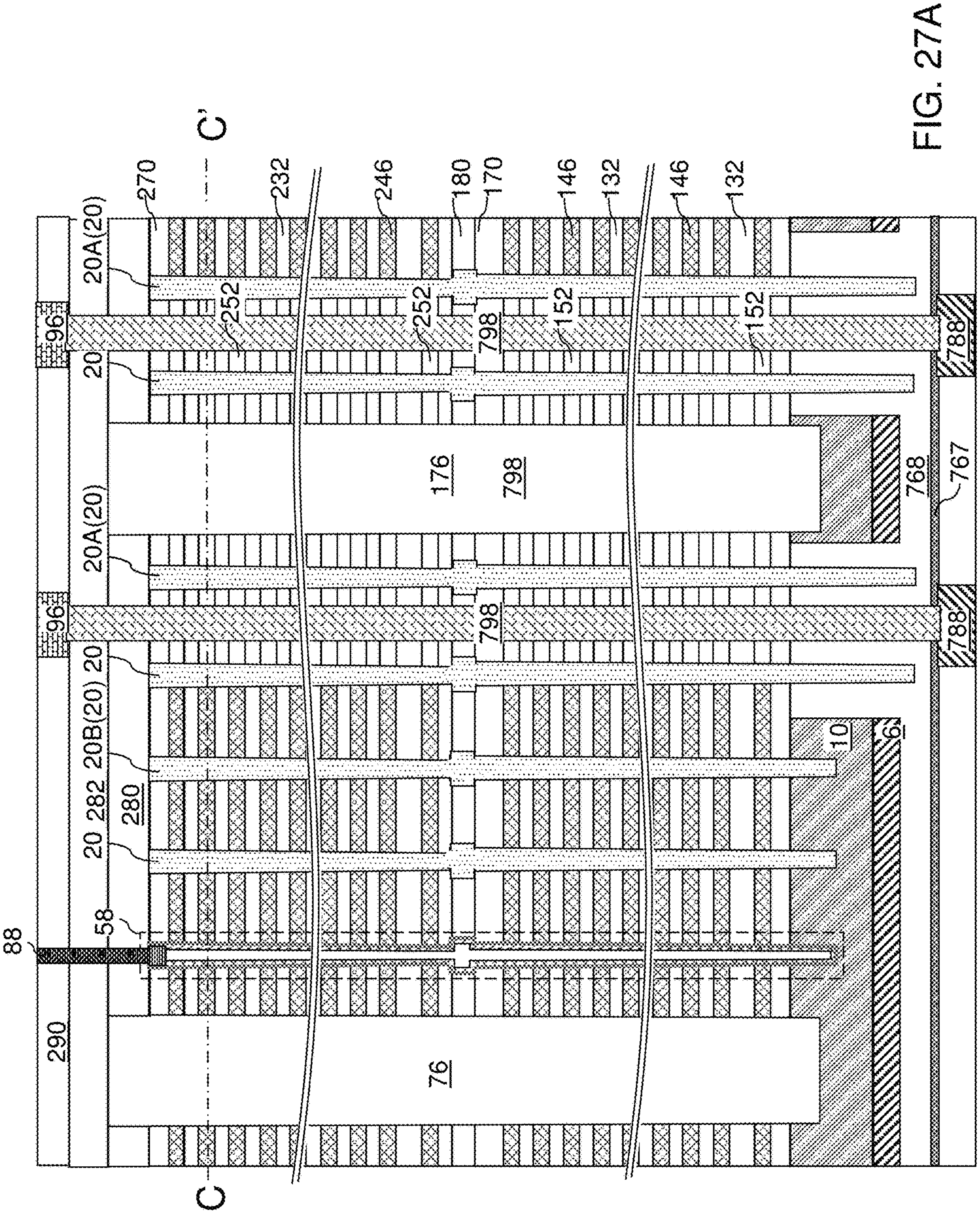
FIGS. 27A-27D are vertical cross-sectional views of alternative configurations of the second exemplary structure after formation of contact via structures and upper-level metal interconnect structures according to the second embodiment of the present disclosure.

Referring to FIG. 27A, a first alternative configuration of the second exemplary structure can be derived from the second exemplary structure of FIGS. 26A-26E by extending the depth of a first subset of the first-tier support openings 119 such that bottom surfaces of first subset of the first-tier support openings 119 vertically extend below the horizontal plane including the bottom surface of the in-process source-level material layers 10'. In one embodiment, the bottom surfaces of the first support pillar structures 20A can be located below a horizontal plane including a bottom surface of a semiconductor material layer within the source-level material layer 10, which may be any of the lower source-level material layer 112, the source contact layer 114, and the upper source-level semiconductor layer 116.

Figure 27B:
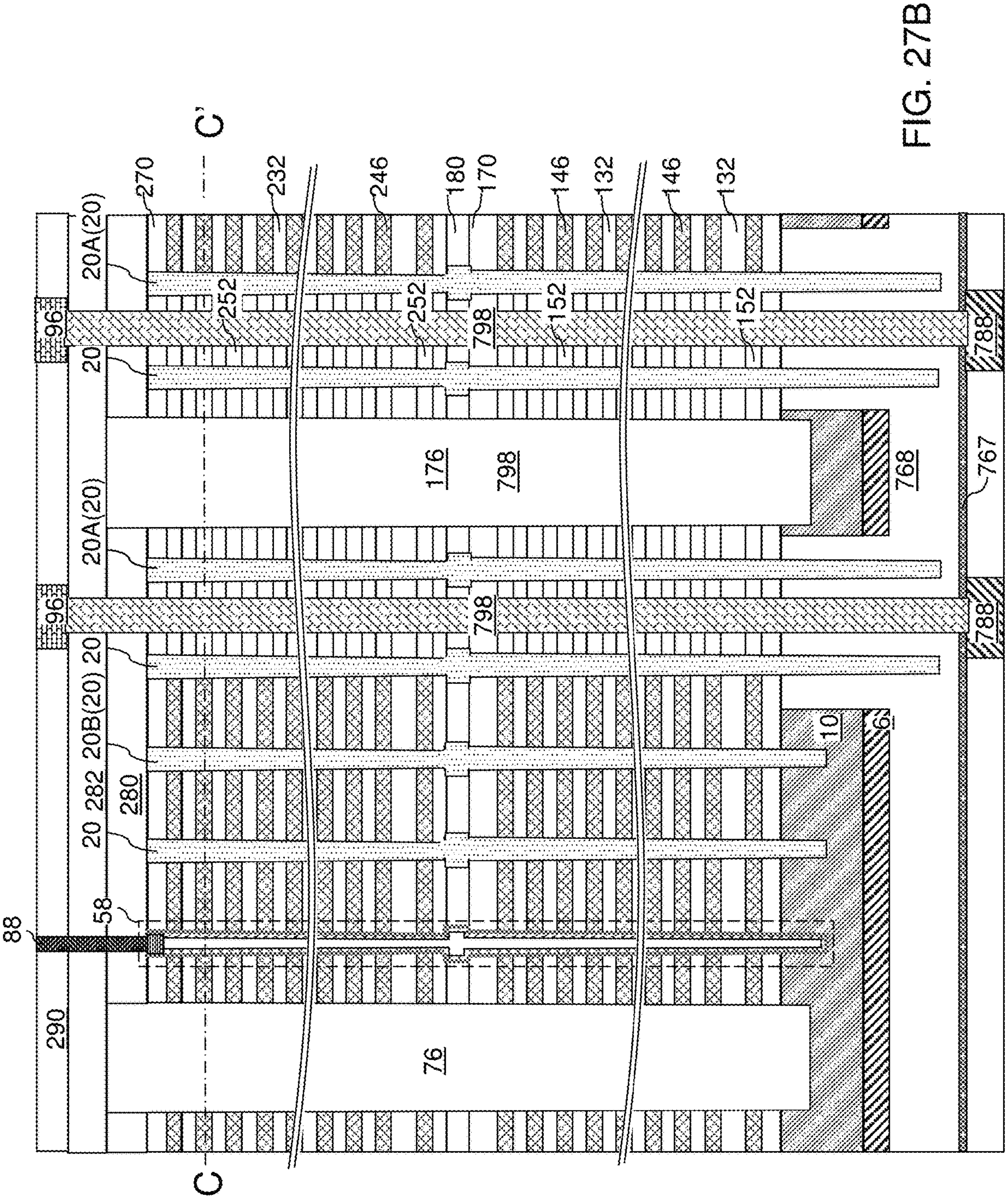

Referring to FIG. 27B, a second alternative configuration of the second exemplary structure can be derived from first alternative configuration of the second exemplary structure of FIG. 27A by increasing the thickness of a dielectric material layer within the at least one second dielectric layer 768. For example, the thickness of a dielectric material layer contacting a top surface of the etch stop dielectric layer 767 and contacting a bottom surface of the optional conductive plate layer 6 or a bottom surface of the source-level material layers 10 (in case the optional conductive plate layer 6 is not present) may be in a range from 200 nm to 1,000 nm, although lesser and greater thicknesses may also be employed.

Figure 27C:
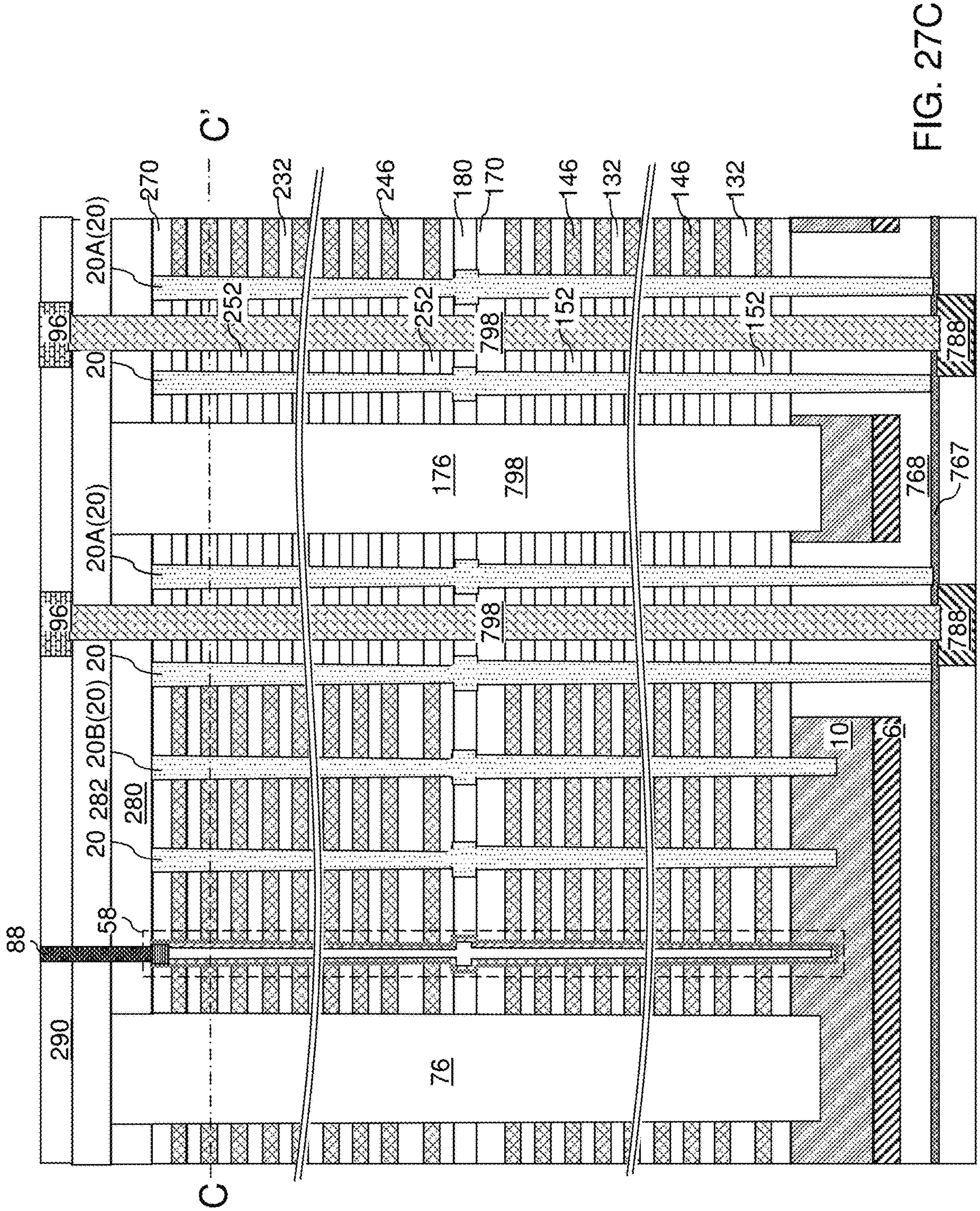

Referring to FIG. 27C, a third configuration of the second exemplary structure can be derived from the first alternative configuration of the second exemplary structure of FIG. 27A by vertically extending the depth of the first support pillar structures 20A such that first support pillar structures 20A contacts the etch stop dielectric layer 767. In one embodiment, the etch stop dielectric layer 767 may function as an etch stop structure during formation of the first-tier support openings 119, and the first support pillar structures 20A may be vertically spaced from the horizontal plane including the top surfaces of the landing-pad-level metal interconnect structures 788 by the etch stop dielectric layer 767.

Figure 27D:
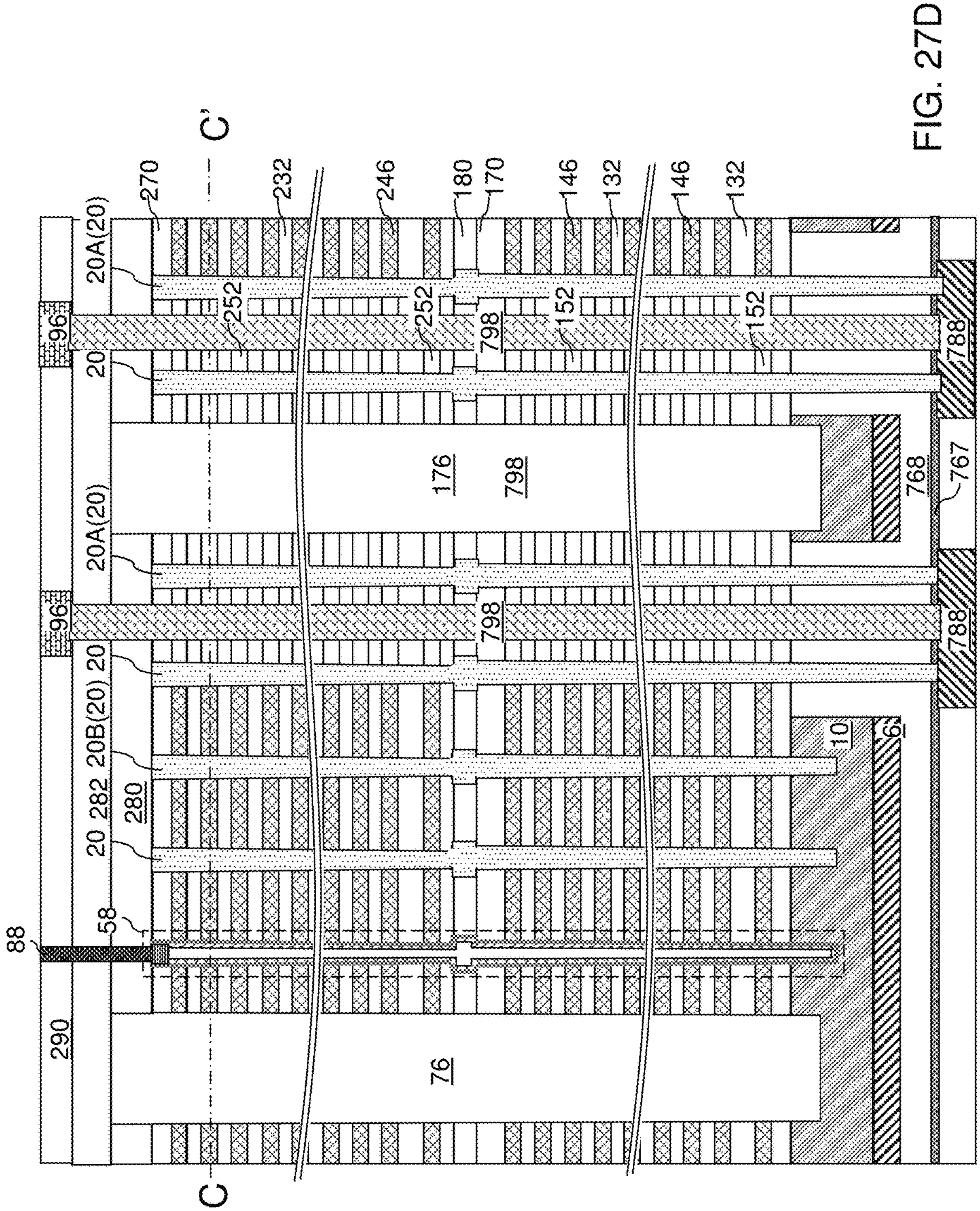

Referring to FIG. 27D, a fourth configuration of the second exemplary structure can be derived from the first alternative configuration of the second exemplary structure of FIG. 27A by vertically extending the first support pillar structures 20A through the etch stop dielectric layer 767. In one embodiment, the first support pillar structures 20A may contact top surfaces of the landing-pad-level metal interconnect structures 788.

The various configurations of the second exemplary structure provide first support pillar structures 20A in proximity to the array-region through-memory-level via structures 798. By forming the first support pillar structures 20A in proximity to a volume through which an array-region through-memory-level via structures 798 is subsequently formed, the lateral separation distance among the first support pillar structures 20A can be reduced, and the mechanical strength of the second exemplary structure increases during formation of the fin cavities (153, 253) and formation of the dielectric oxide plates (152, 252) therein. Thus, buckling or deformation of the second exemplary structure during formation of the dielectric oxide plates (152, 252) can be reduced or prevented, and the process yield for manufacture of the second exemplary structure can increase.

Figure 28A:
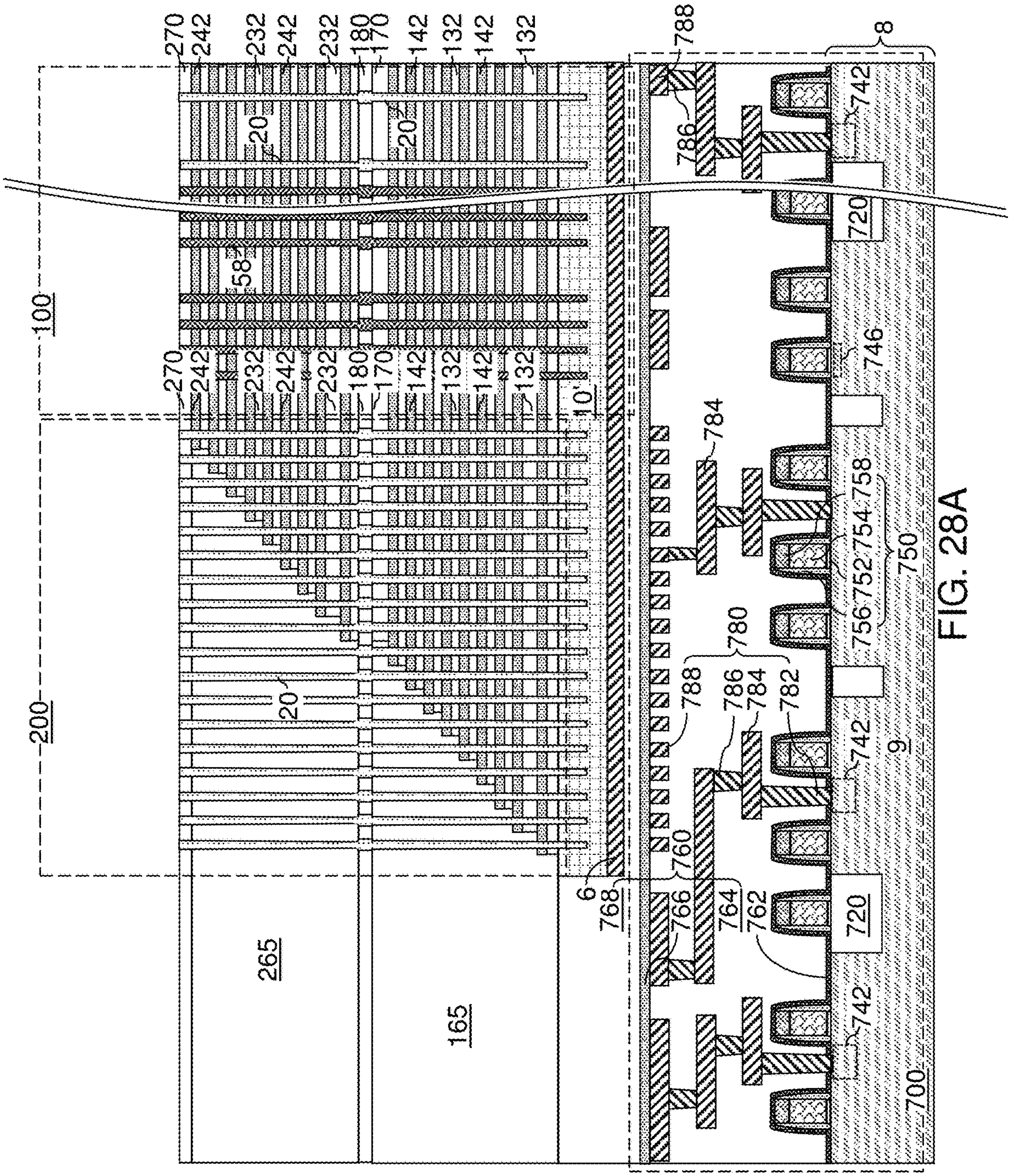
FIG. 28A is a vertical cross-sectional view of a third exemplary structure after formation of support pillar structures and memory opening fill structures according to a third embodiment of the present disclosure.
Figure 28B:
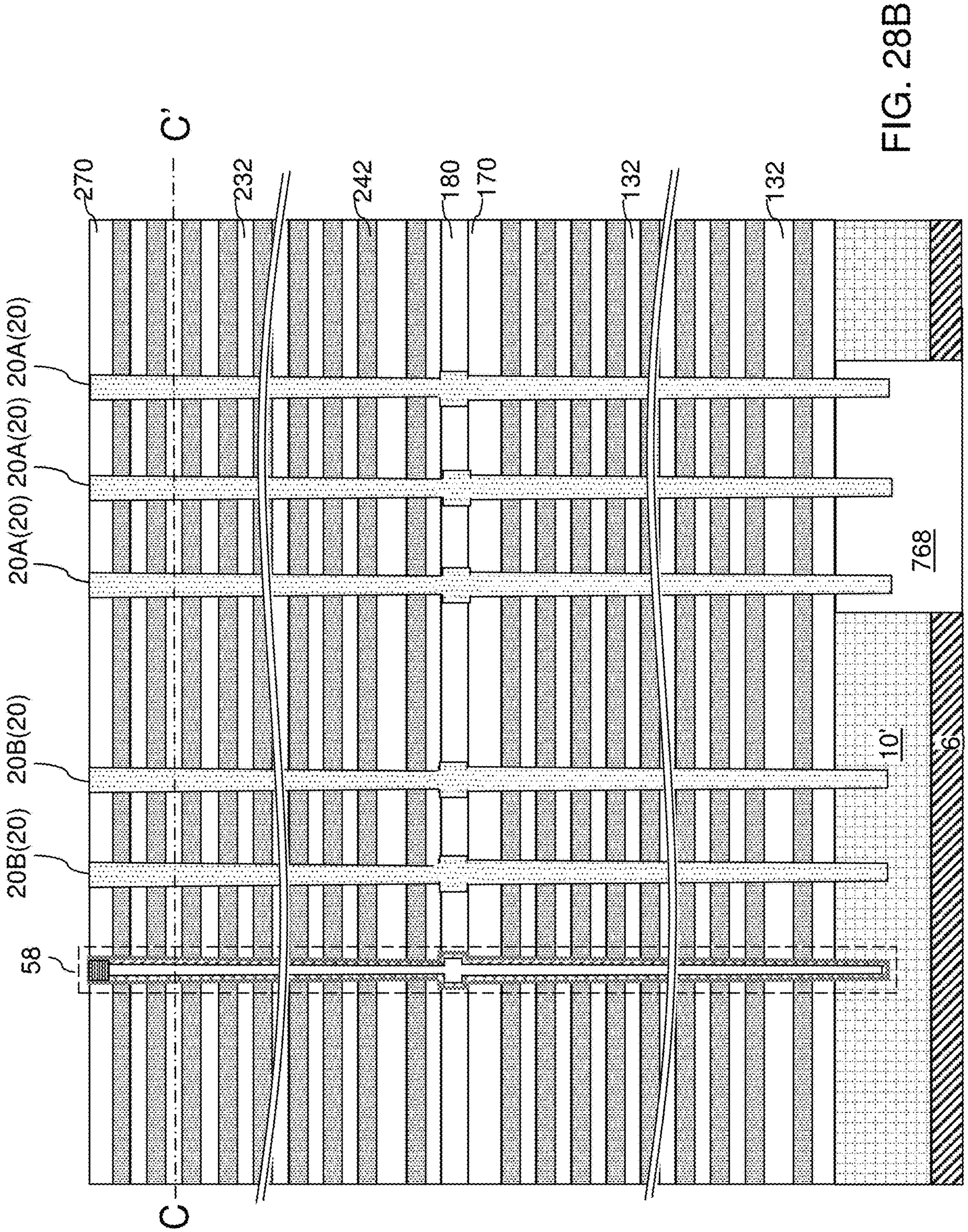
FIG. 28B is another vertical cross-sectional view of the third exemplary structure of FIG. 28A.
Figure 28C:
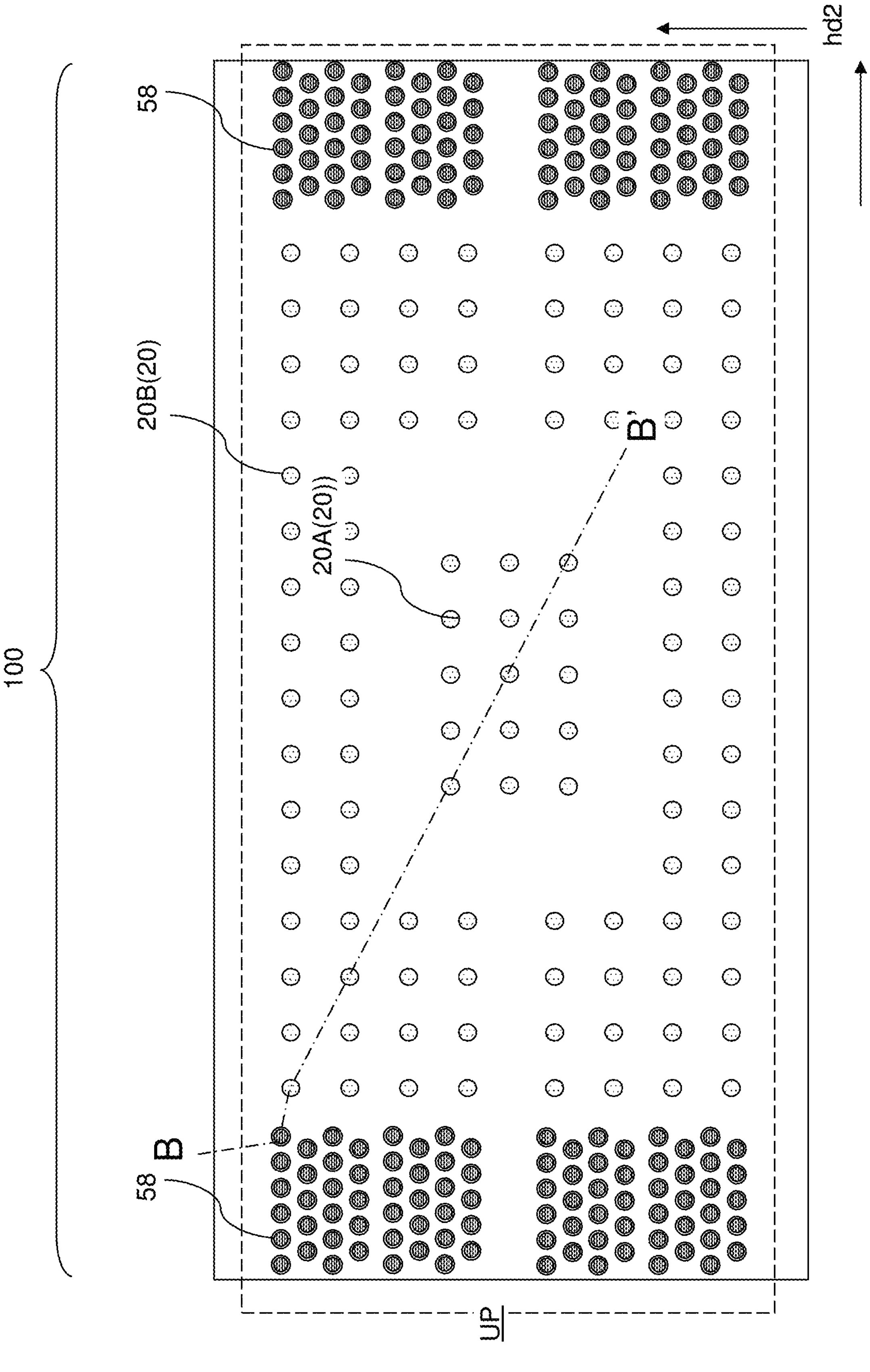
FIG. 28C is a horizontal cross-sectional view of the third exemplary structure along the horizontal plane C-C' of FIG. 28B. The hinged vertical plane B-B' corresponds to the plane of the vertical cross-sectional view of FIG. 28B.

Referring to FIGS. 28A-28C, a third exemplary structure according to a third embodiment of the present disclosure can be derived from the first exemplary structure of FIGS. 4A-4C by modifying the pattern of first-tier support openings 119. Specifically, the pattern of the first-tier support openings 119 can be modified such that a first subset of the first-tier support openings is formed within the area of an opening through the in-process source-level material layers 10'. Further, an annular area that laterally surrounds the area of the opening through the in-process source-level material layers 10' can be free of first-tier support openings 119. Thus, the first subset of the first-tier support openings 119 can vertically extend into a portion of the lower-level dielectric material layers 760 that fill the opening in the in-process source-level material layers 10', and an annular area free of the first-tier support openings 119 can laterally surround the area of the opening through the in-process source-level material layers 10'.

Subsequently, the processing steps of FIGS. 5-13C can be performed to form support pillar structures 20 and memory opening fill structures 58. The support pillar structures 20 include first support pillar structures 20A that contact the lower-level dielectric material layers 760 and second support pillar structures 20B that contact the in-process source-level material layers 10'.

Figure 29A:
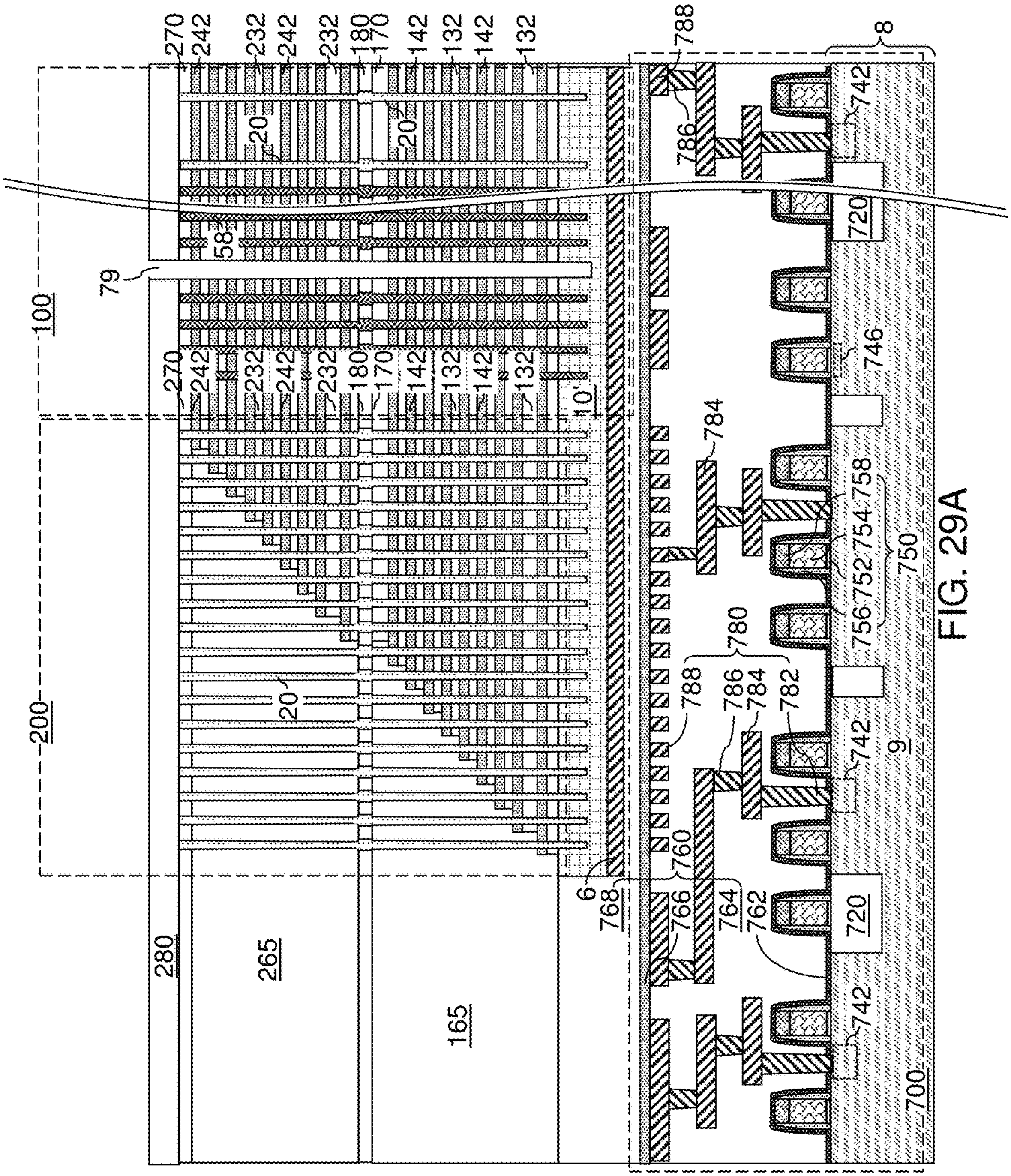
FIG. 29A is a vertical cross-sectional view of the third exemplary structure after formation of backside trenches and moat trenches according to the third embodiment of the present disclosure.
Figure 29B:
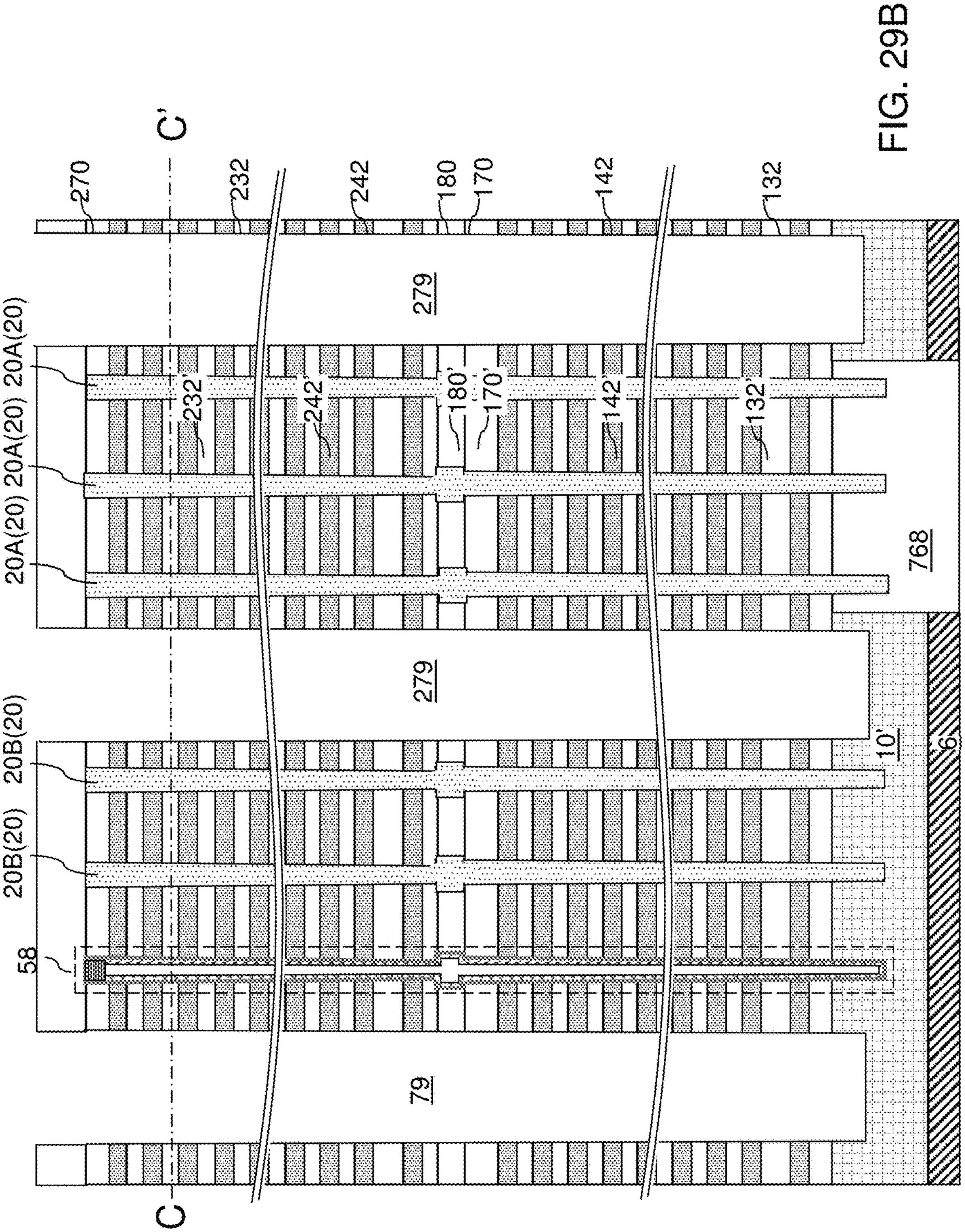
FIG. 29B is another vertical cross-sectional view of the third exemplary structure of FIG. 29A.
Figure 29C:
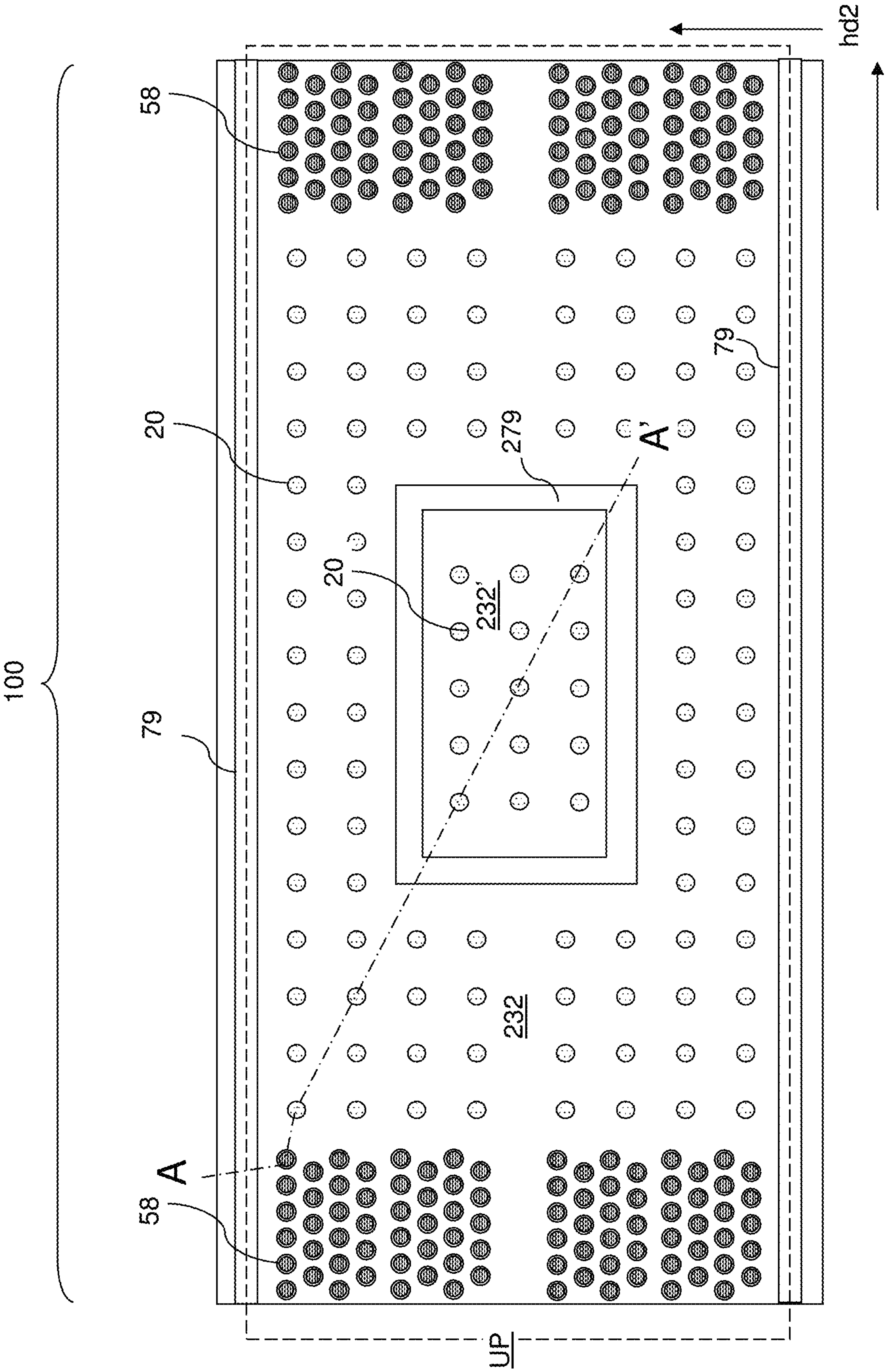
FIG. 29C is a horizontal cross-sectional view of the third exemplary structure along the horizontal plane C-C' of FIG. 29B. The hinged vertical plane B-B' corresponds to the plane of the vertical cross-sectional view of FIG. 29B.

Referring to FIGS. 29A-29C, a first contact-level dielectric layer 280 may be formed over the second-tier structure (232, 242, 270, 265). The first contact-level dielectric layer 280 includes a dielectric material such as silicon oxide, and may be formed by a conformal or non-conformal deposition process. For example, the first contact-level dielectric layer 280 may include undoped silicate glass and may have a thickness in a range from 100 nm to 600 nm, although lesser and greater thicknesses may also be used.

A photoresist layer (not shown) may be applied over the first contact-level dielectric layer 280, and may be lithographically patterned to form various openings in the memory array region 100 and the staircase region 200. The openings in the photoresist layer include first openings that laterally extend along the first horizontal direction hd1 through at least one staircase region 200 and at least a portion of the memory array region 100. The first openings laterally extend between groups of memory opening fill structures 58 and support pillar structures 20 that are laterally spaced along the second horizontal direction hd2.

Further, the openings in the photoresist layer may include second openings having a generally annular shape and laterally surrounding a respective array of first support pillar structures 20A and laterally surrounded by a respective set of second support pillar structures 20B. The entire area of each second opening may be located within the area of the in-process source-level material layers 10'.

An anisotropic etch may be performed to transfer the pattern in the photoresist layer through underlying material portions including the alternating stacks {(132, 142), (232, 242)} and an upper portion of the in-process source-level material layers 10'. Backside trenches 79 may be formed underneath the first openings in the photoresist layer through the first contact-level dielectric layer 280, the second-tier structure (232, 242, 270, 265), and the first-tier structure (132, 142, 170, 165), and into the in-process source-level material layers 10'. Portions of the first contact-level dielectric layer 280, the second-tier structure (232, 242, 270, 265), the first-tier structure (132, 142, 170, 165), and the in-process source-level material layers 10' that underlie the first openings in the photoresist layer may be removed to form the backside trenches 79. In one embodiment, the backside trenches 79 may be formed between groups of memory stack structures 55 that are laterally spaced apart along the second horizontal direction. A top surface of a source-level sacrificial layer 104 may be physically exposed at the bottom of each backside trench 79. The alternating stack {(132, 232), (142, 242)} may be divided into a plurality of alternating stacks {(132, 232), (142, 242)} of respective insulating layers (132, 232) and respective sacrificial material layers (142, 242) by the backside trenches 79.

Moat trenches 279 may be formed underneath the second openings in the photoresist layer through the first contact-level dielectric layer 280, the second-tier structure (232, 242, 270, 265), and the first-tier structure (132, 142, 170, 165), and into the in-process source-level material layers 10'. Portions of the first contact-level dielectric layer 280, the second-tier structure (232, 242, 270, 265), the first-tier structure (132, 142, 170, 165), and the in-process source-level material layers 10' that underlie the second openings in the photoresist layer may be removed to form the moat trenches 279. Each moat trench 279 laterally surrounds a respective subset of the first support pillar structures 20A, and is laterally surrounded by a respective subset of the second support pillar structures 20B. Each moat trench 279 may be located between a neighboring pair of backside trenches 79. The backside trenches 79 and the moat trenches 279 are concurrently formed by a same anisotropic etch process.

The sacrificial material layers (142, 242) comprise a dielectric material such as silicon nitride. Patterned portions of the insulating layers (132, 232) laterally surrounded by a moat trench 279 comprise insulating plates (132',232'). The insulating plates (132',232') include first insulating plates 132' that are patterned portions of the first insulating layers 132, and second insulating plates 232' that are patterned portions of the second insulating layers 232. Patterned portions of the sacrificial material layers (142, 242) laterally surrounded by a moat trench 279 comprise dielectric plates (142',242'). The dielectric plates (142',242') include first dielectric plates 142' (e.g., first silicon nitride plates) that are patterned portions of the first sacrificial material layers 142, and second dielectric plates 242' (e.g., second silicon nitride plates) that are patterned portions of the second sacrificial material layers 242. A patterned portion of the first insulating cap layer 170 laterally surrounded by a moat trench 279 comprises a first insulating cap plate 170'. A patterned portion of the inter-tier dielectric layer 180 laterally surrounded by a moat trench 279 comprises an inter-tier dielectric plate 180'. Patterned portions of the insulating layers (132, 232) and the sacrificial material layers (142, 242) within each moat trench 279 comprise a vertically alternating sequence of insulating plates (132',232') and dielectric plates (142',242').

In one embodiment, each moat trench 279 can have a horizontal cross-sectional shape of a rectangular frame. In this case, the outer sidewalls of each moat trench 279 can include a pair of lengthwise sidewalls that laterally extend along the first horizontal direction hd1 and a pair of widthwise sidewalls that laterally extend along the second horizontal direction hd2. The inner sidewalls of each moat trench 279 can include a pair of lengthwise sidewalls that laterally extend along the first horizontal direction hd1 and a pair of widthwise sidewalls that laterally extend along the second horizontal direction hd2.

Each of the insulating plates (132',232') can be vertically spaced from the top surface of the in-process source-level material layers 10' by a same vertical distance as a respective insulating layer (132, 232) outside a moat trench 279 is from the top surface of the in-process source-level material layers 10'. Each of the dielectric plates (142',242') can be vertically spaced from the top surface of the in-process source-level material layers 10' by a same vertical distance as a respective sacrificial material layer (142, 242) outside a moat trench 279 is from the top surface of the in-process source-level material layers 10'.

Figure 30A:
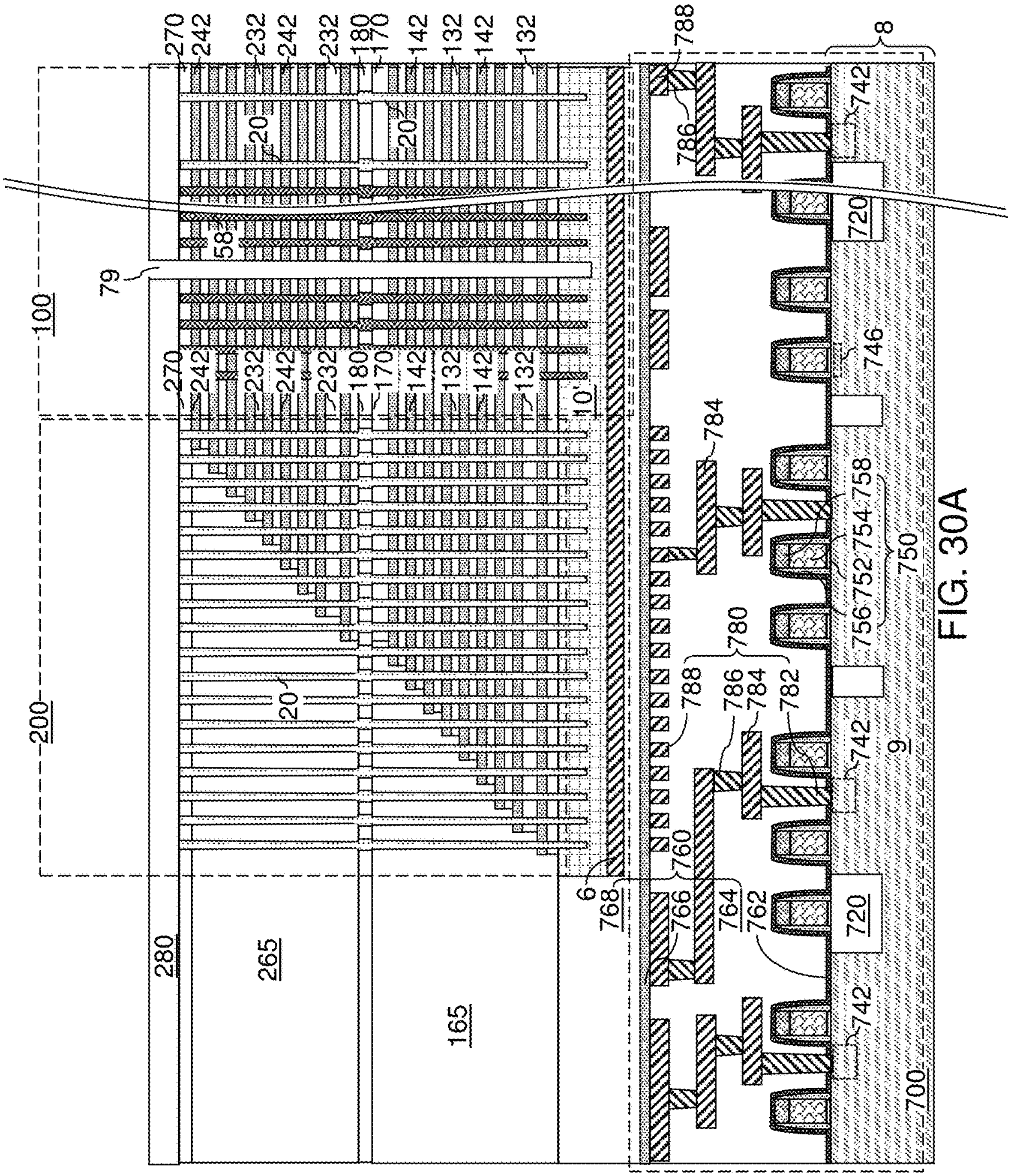
FIG. 30A is a vertical cross-sectional view of the third exemplary structure after formation of a patterned etch barrier liner according to the third embodiment of the present disclosure.
Figure 30B:
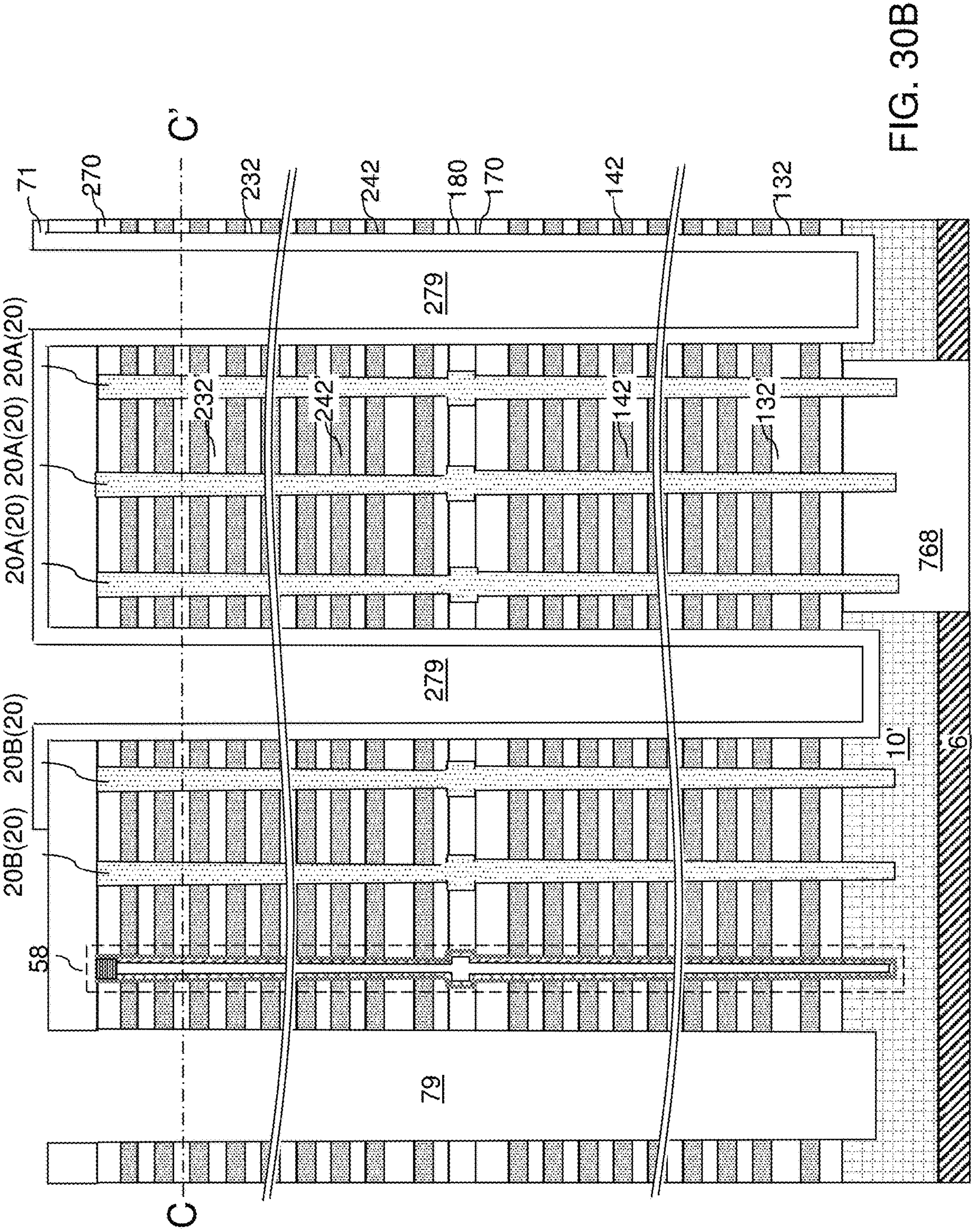
FIG. 30B is another vertical cross-sectional view of the third exemplary structure of FIG. 30A.
Figure 30C:
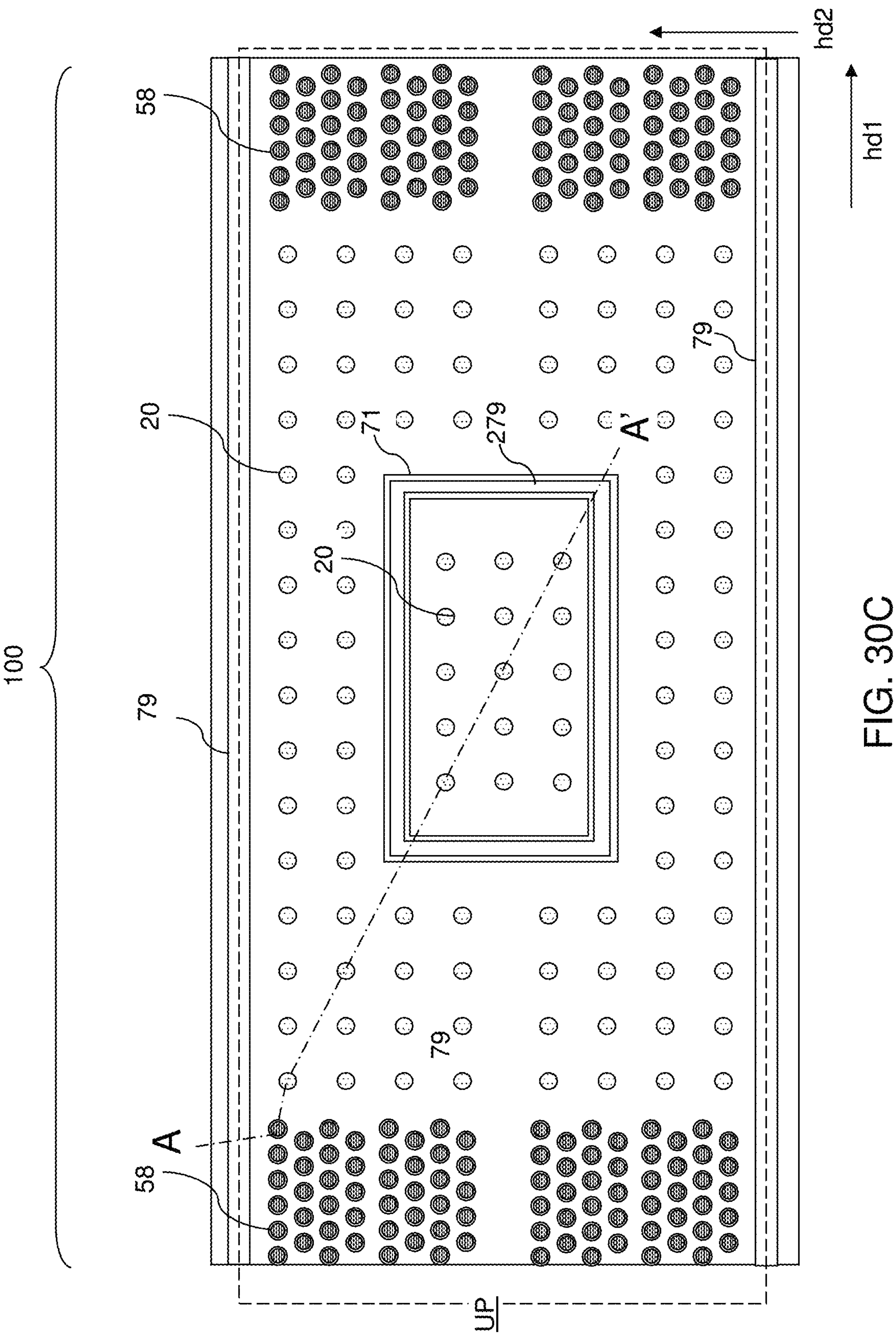
FIG. 30C is a horizontal cross-sectional view of the third exemplary structure along the horizontal plane C-C' of FIG. 30B. The hinged vertical plane B-B' corresponds to the plane of the vertical cross-sectional view of FIG. 30B.

Referring to FIGS. 30A-30C, an etch barrier liner 71 can be conformally deposited in the backside trenches 79 and the moat trenches 279 and over the first contact-level dielectric layer 280 by a conformal deposition process. The etch barrier liner 71 includes a dielectric material that is different from the materials of the first sacrificial material layers 142 and the second sacrificial material layers 242. For example, the etch barrier liner 71 can include silicon oxide. The thickness of the etch barrier liner 71 can be in a range from 5 nm to 100 nm, such as from 10 nm to 50 nm, although lesser and greater thicknesses can also be employed.

A photoresist layer (not shown) can be applied over the third exemplary structure, and can be lithographically patterned to cover the moat trenches 279 without covering the backside trenches 79. Unmasked portions of the etch barrier liner 71 can be removed by performing an isotropic etch process. For example, if the etch barrier liner 71 includes silicon oxide, a wet etch process employing hydrofluoric acid can be performed to remove unmasked portions of the etch barrier liner 71. The photoresist layer can be subsequently removed, for example, by ashing. Sidewalls of the backside trenches 79 are physically exposed, and sidewalls of the moat trenches 279 are covered by the etch barrier liner 71. Thus, sidewalls of the moat trenches 279 can be masked with the etch barrier liner 71 without covering sidewalls of the backside trenches 79.

Figure 31:
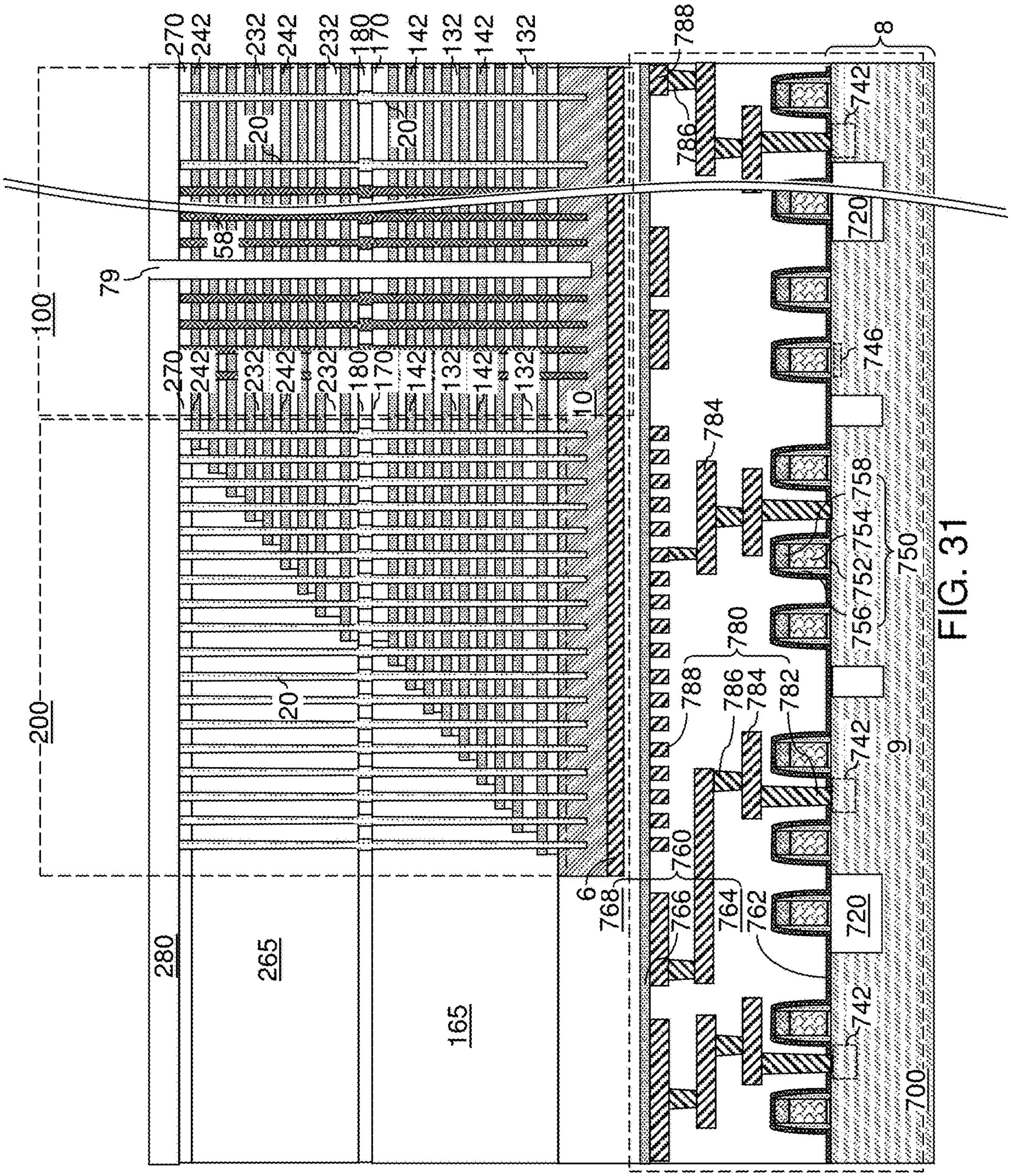
FIG. 31 is a vertical cross-sectional view of the third exemplary structure after replacement of in-process source-level material layers with source-level material layers according to the third embodiment of the present disclosure.
Figure 32A:
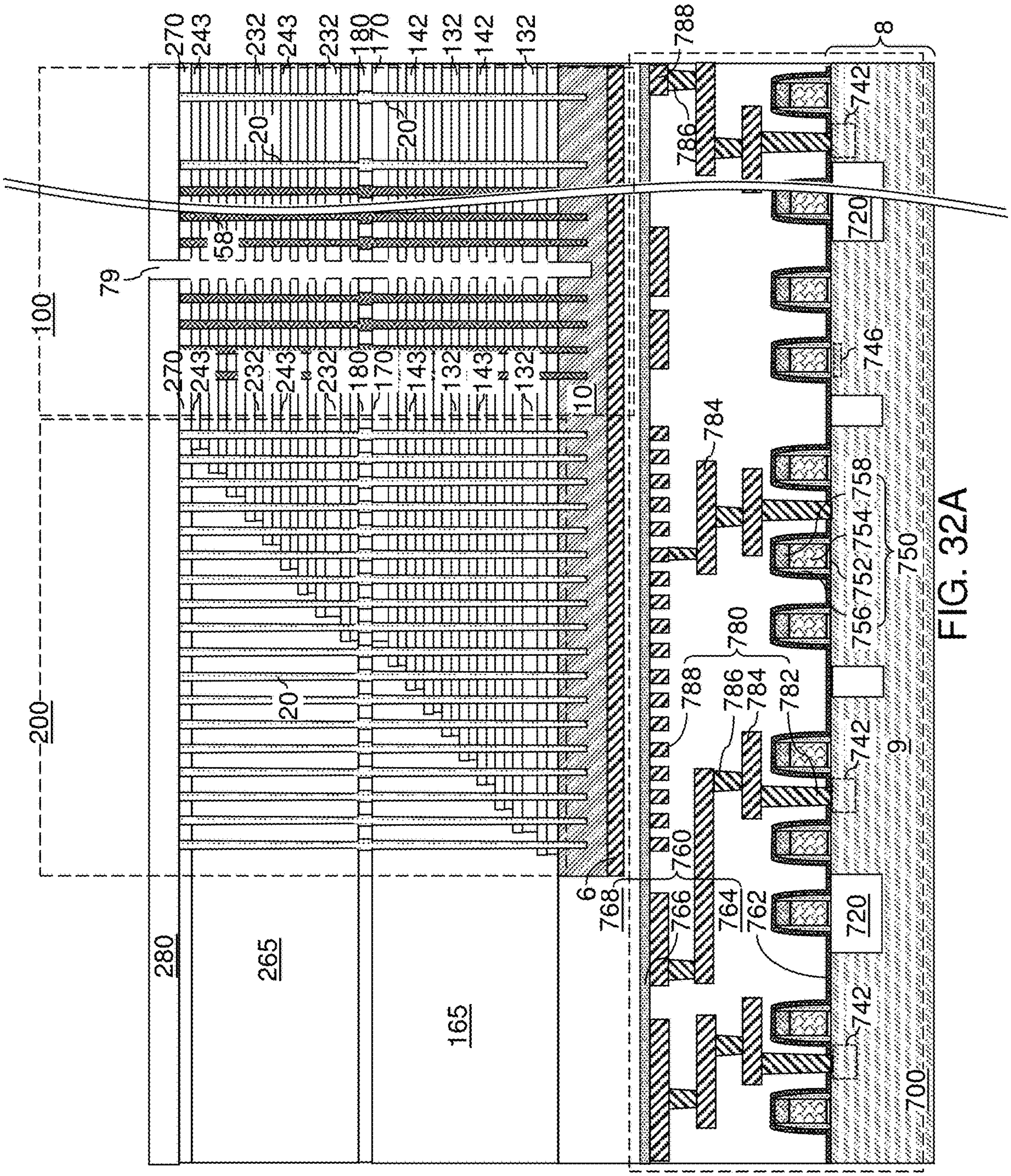
FIG. 32A is a vertical cross-sectional view of the third exemplary structure after formation of backside recesses according to the third embodiment of the present disclosure.
Figure 32B:
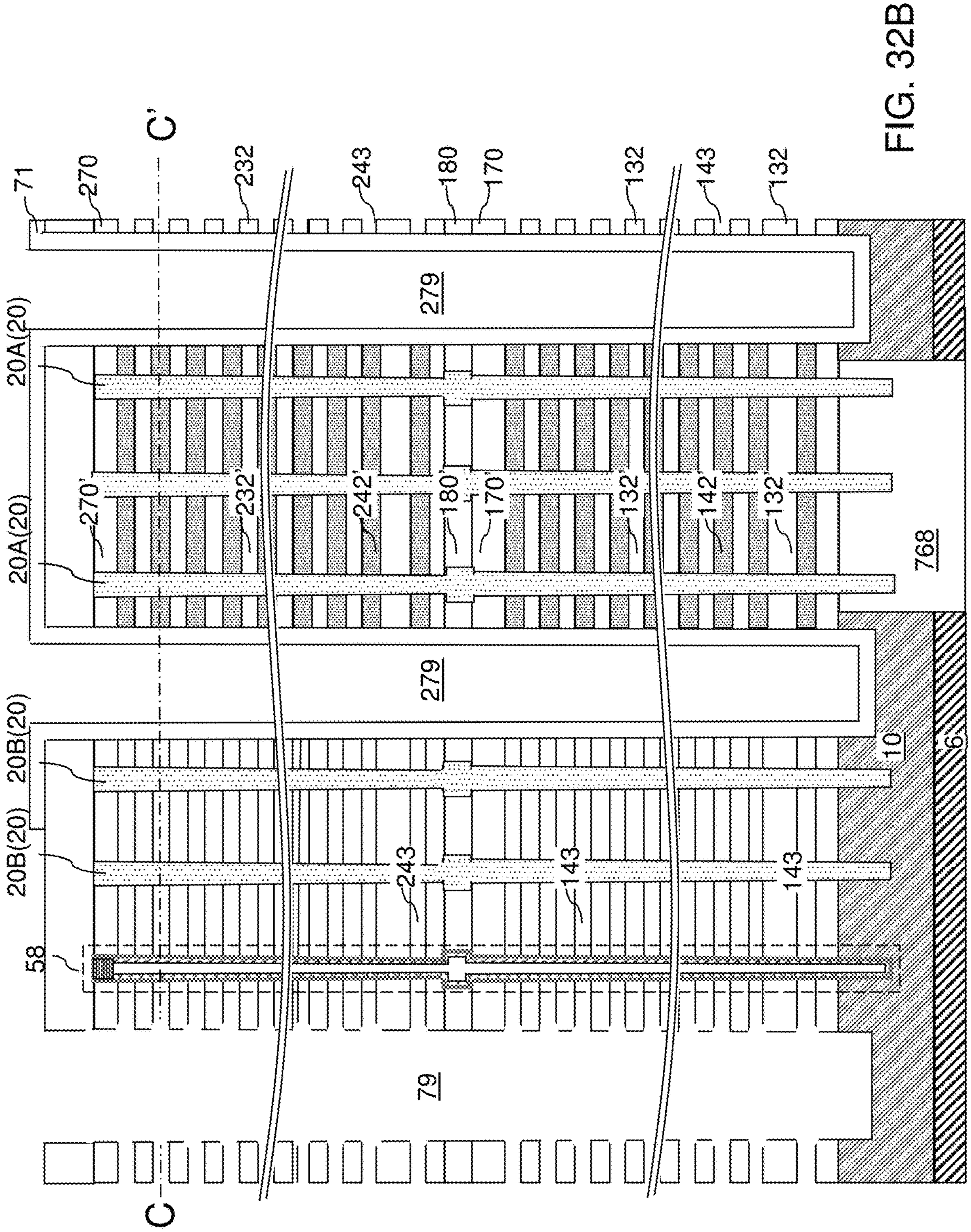
FIG. 32B is another vertical cross-sectional view of the third exemplary structure of FIG. 32A.
Figure 32C:
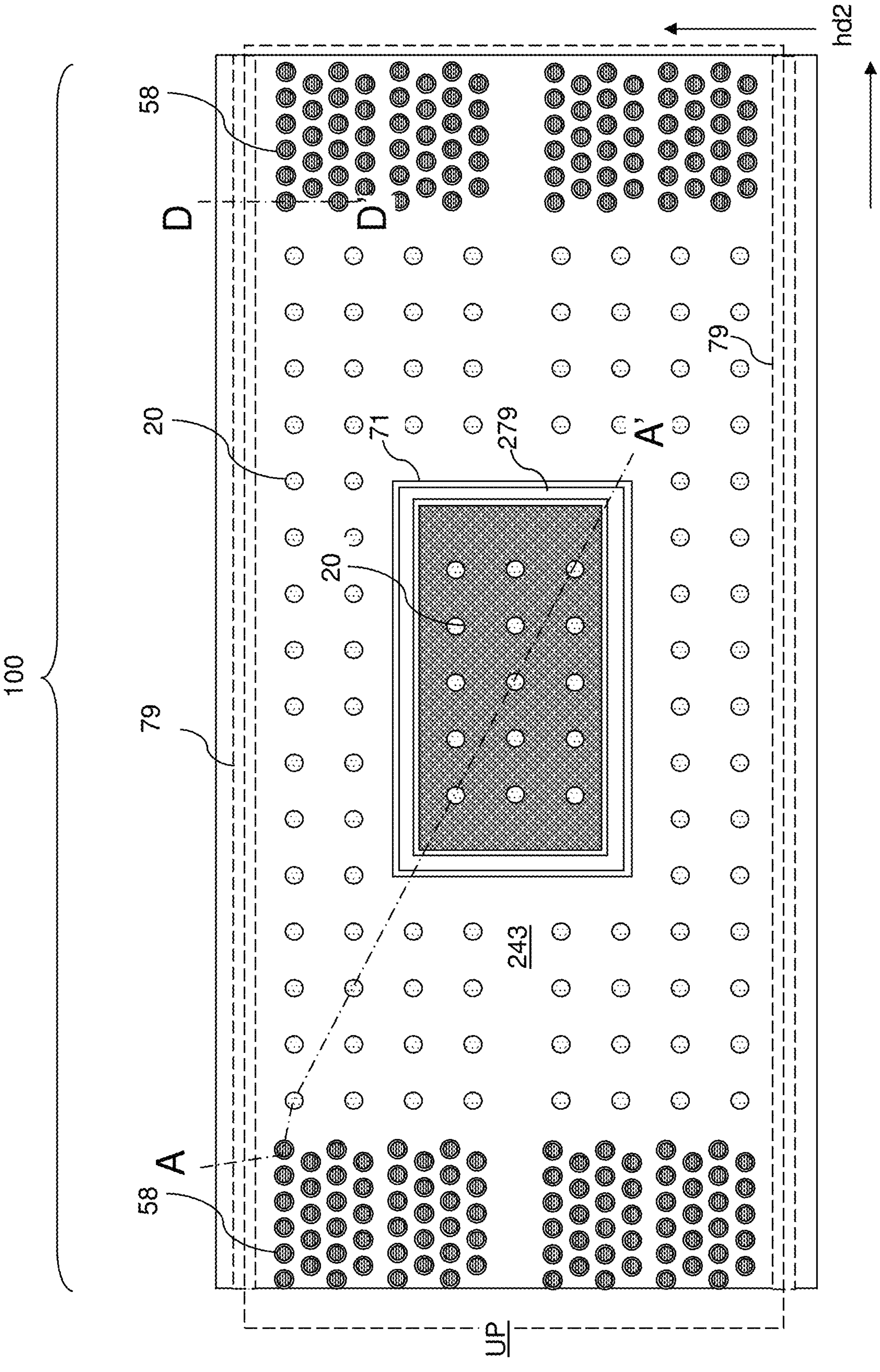
FIG. 32C is a horizontal cross-sectional view of the third exemplary structure along the horizontal plane C-C' of FIG. 32B. The hinged vertical plane B-B' corresponds to the plane of the vertical cross-sectional view of FIG. 32B.
Figure 32D:
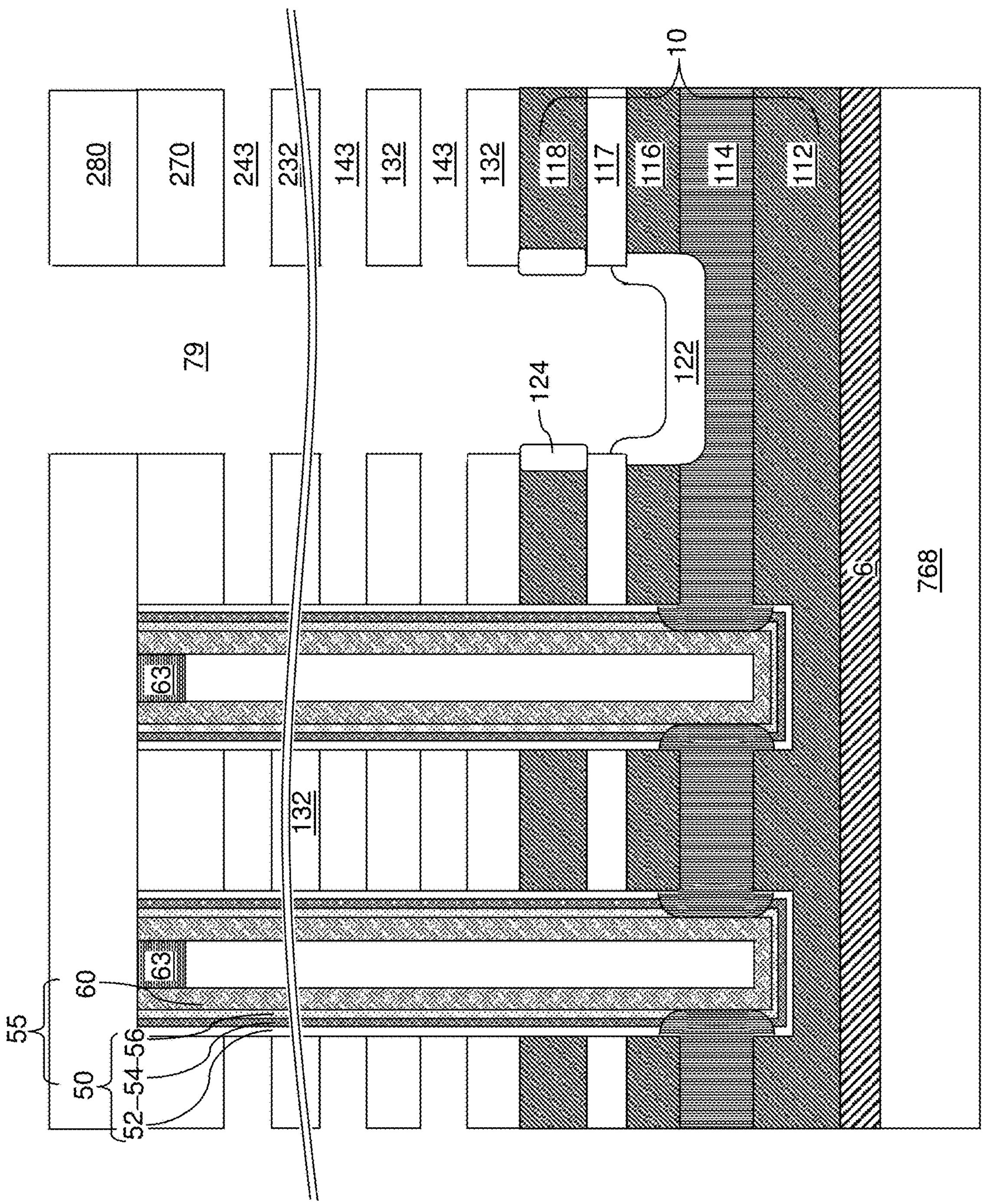
FIG. 32D is a vertical cross-sectional view of the third exemplary structure along the vertical plane D-D' of FIG. 32C.
Figure 33A:
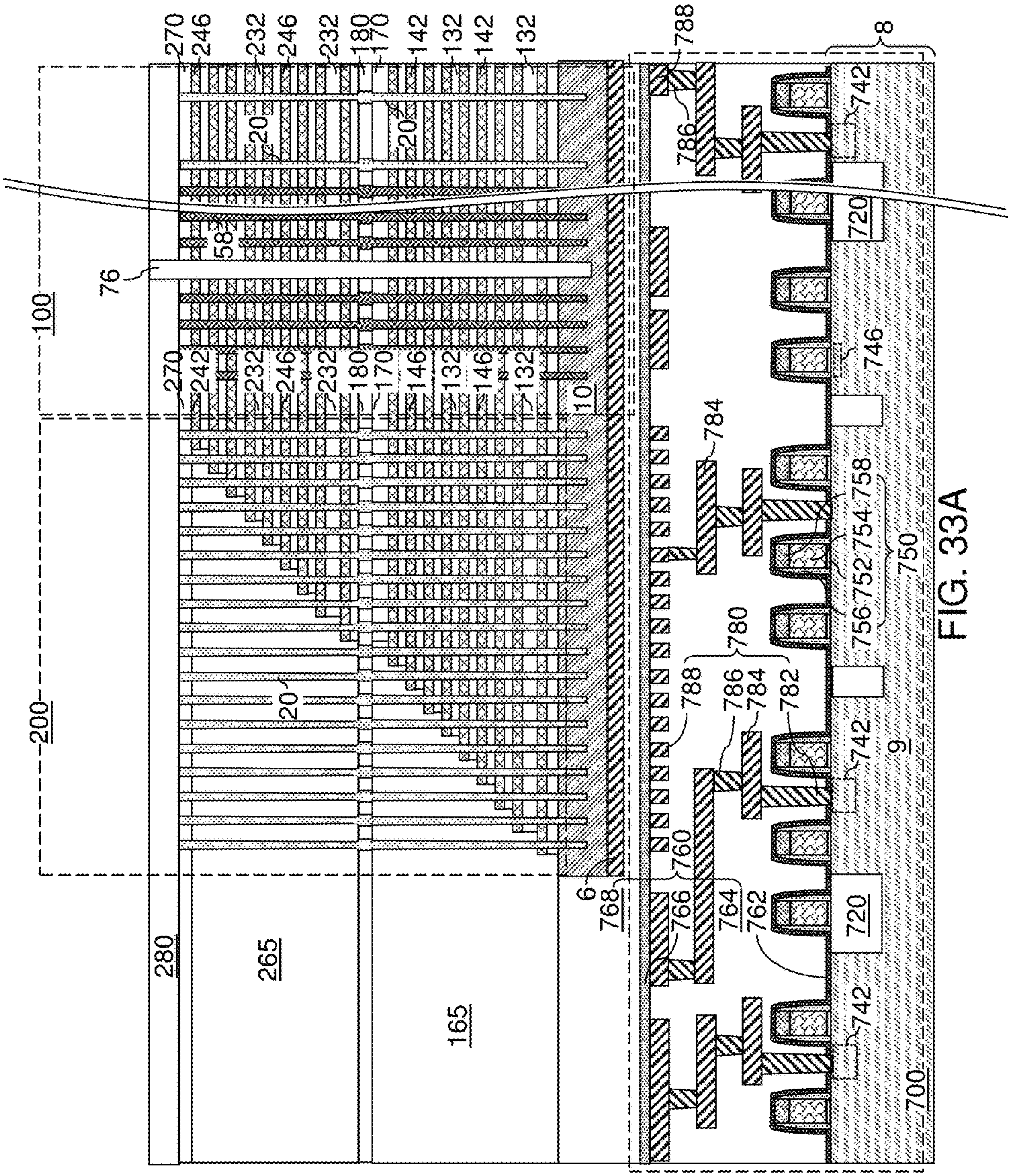
FIG. 33A is a vertical cross-sectional view of the third exemplary structure after formation of electrically conductive layers, backside trench fill structures, and dielectric moat fill structures according to the third embodiment of the present disclosure.
Figure 33B:
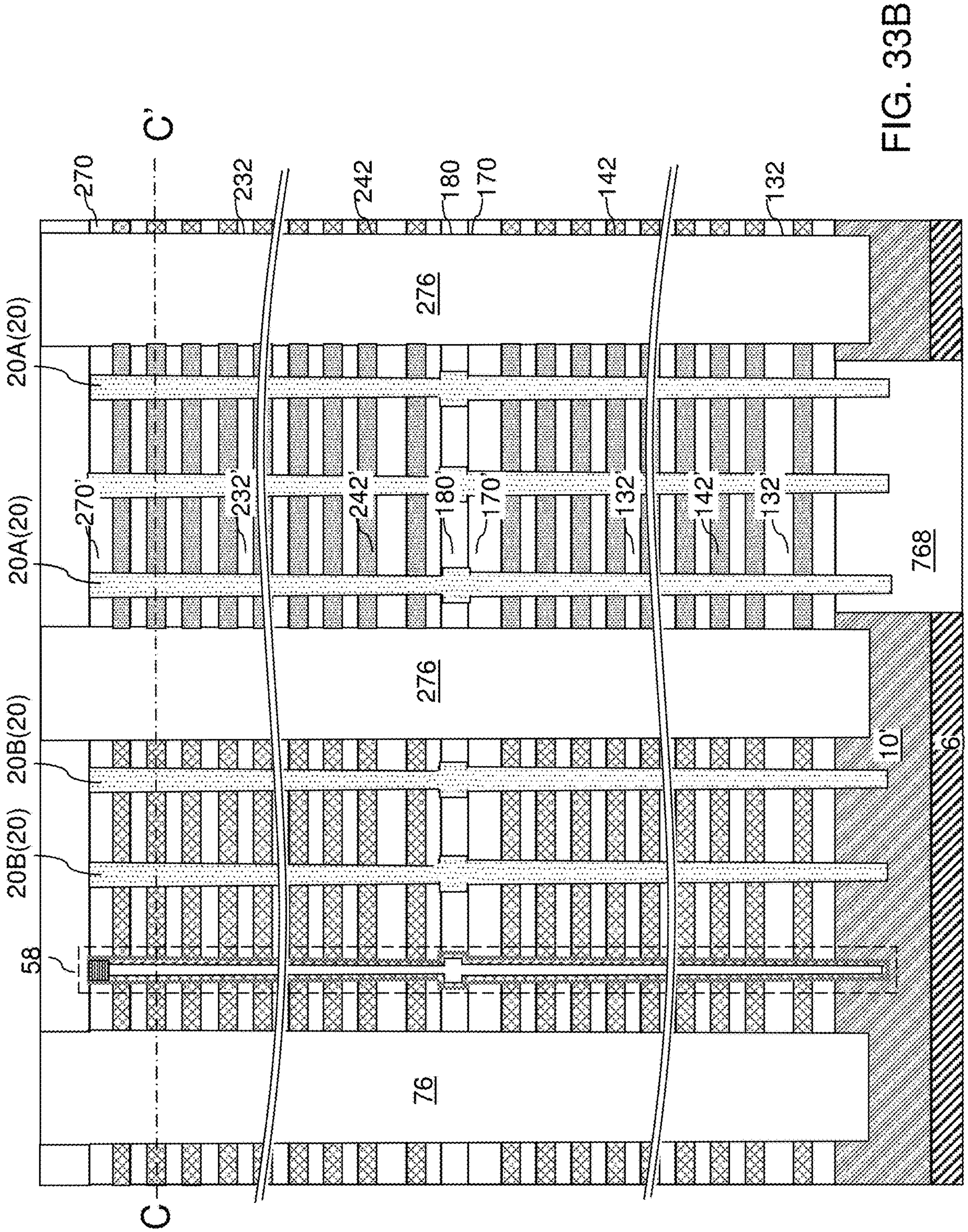
FIG. 33B is another vertical cross-sectional view of the third exemplary structure of FIG. 33A.
Figure 33C:
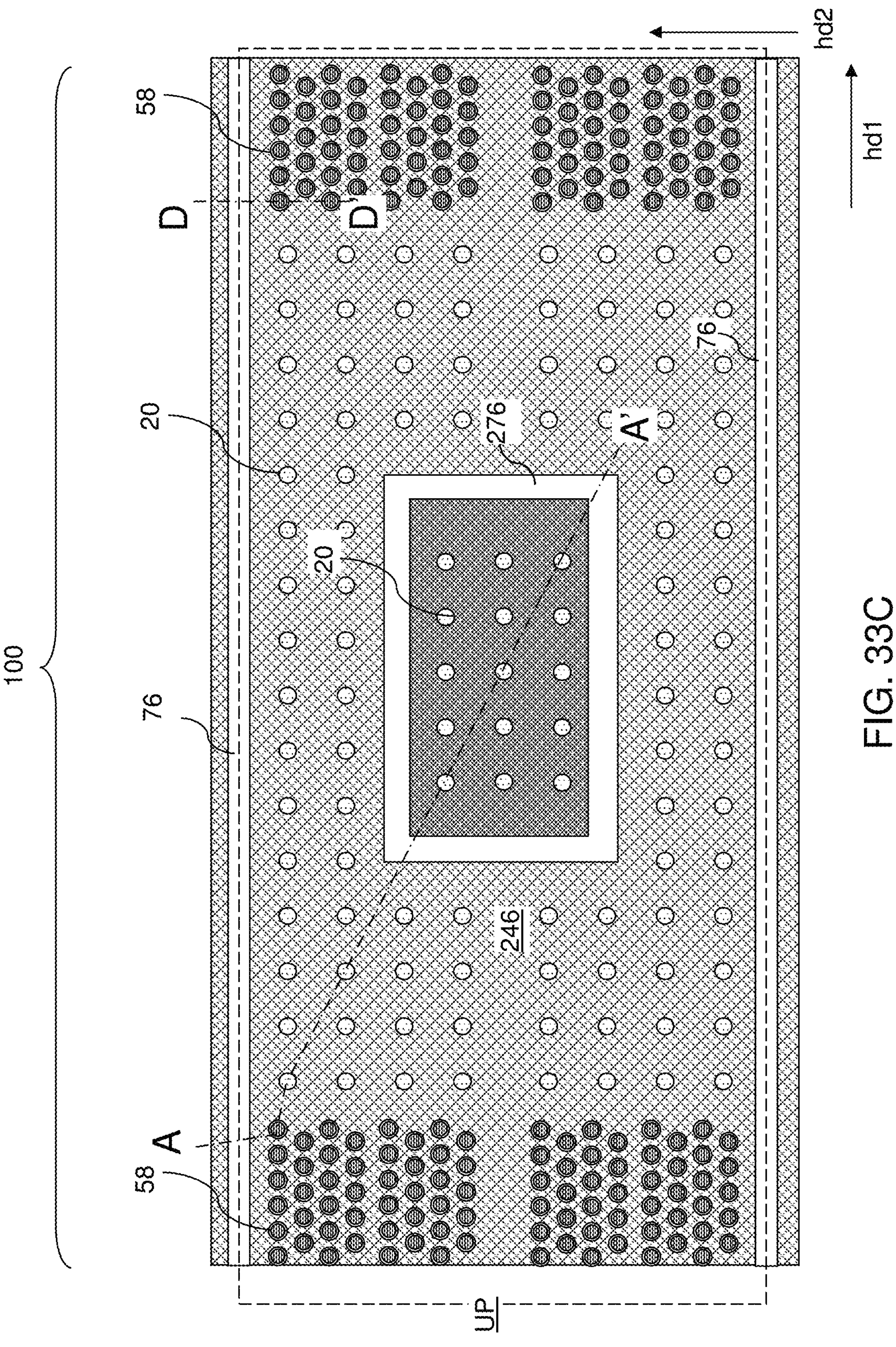
FIG. 33C is a horizontal cross-sectional view of the third exemplary structure along the horizontal plane C-C' of FIG. 33B. The hinged vertical plane B-B' corresponds to the plane of the vertical cross-sectional view of FIG. 33B.
Figure 33D:
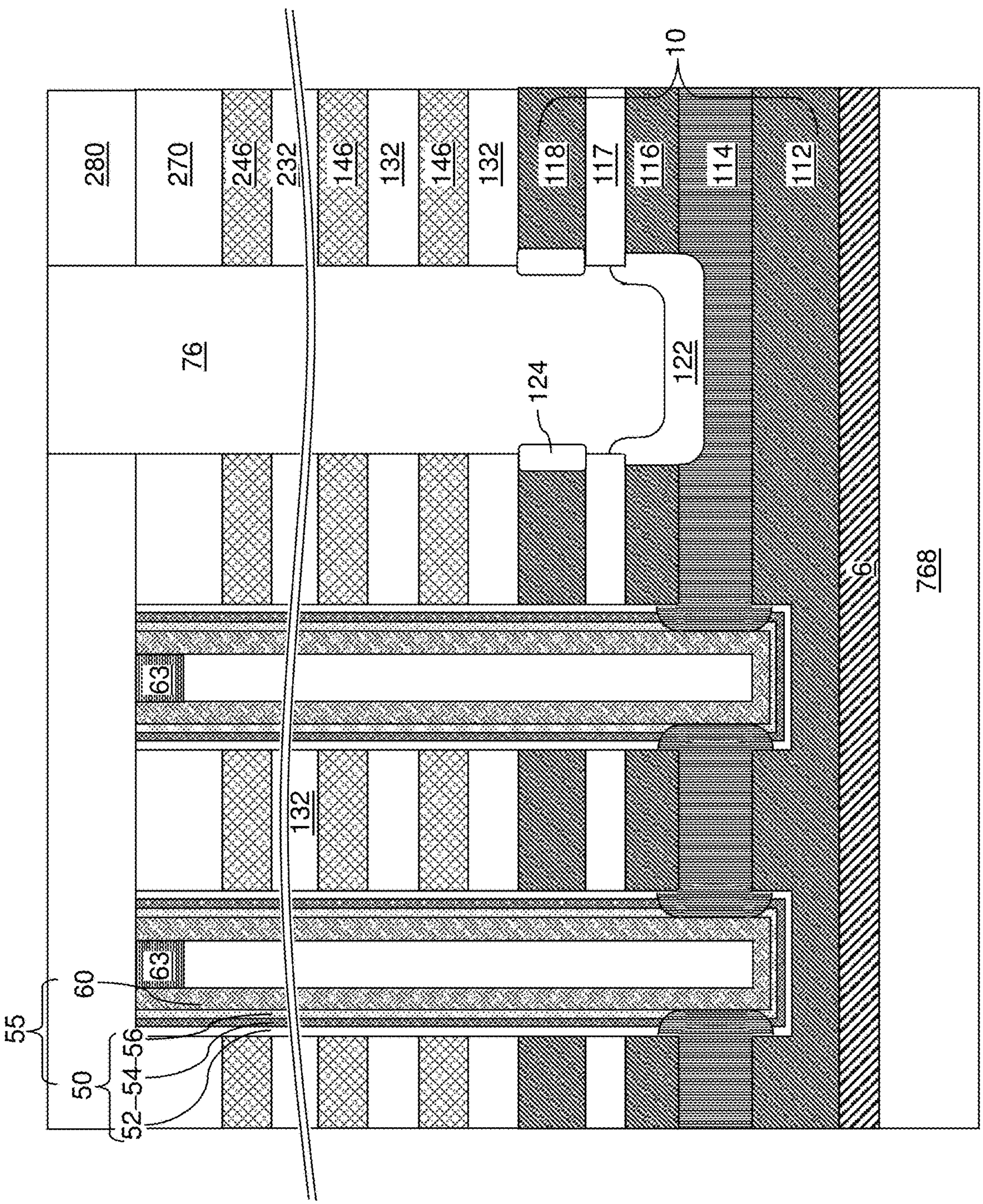
FIG. 33D is a vertical cross-sectional view of the third exemplary structure along the vertical plane D-D' of FIG. 33C.
Figure 34A:
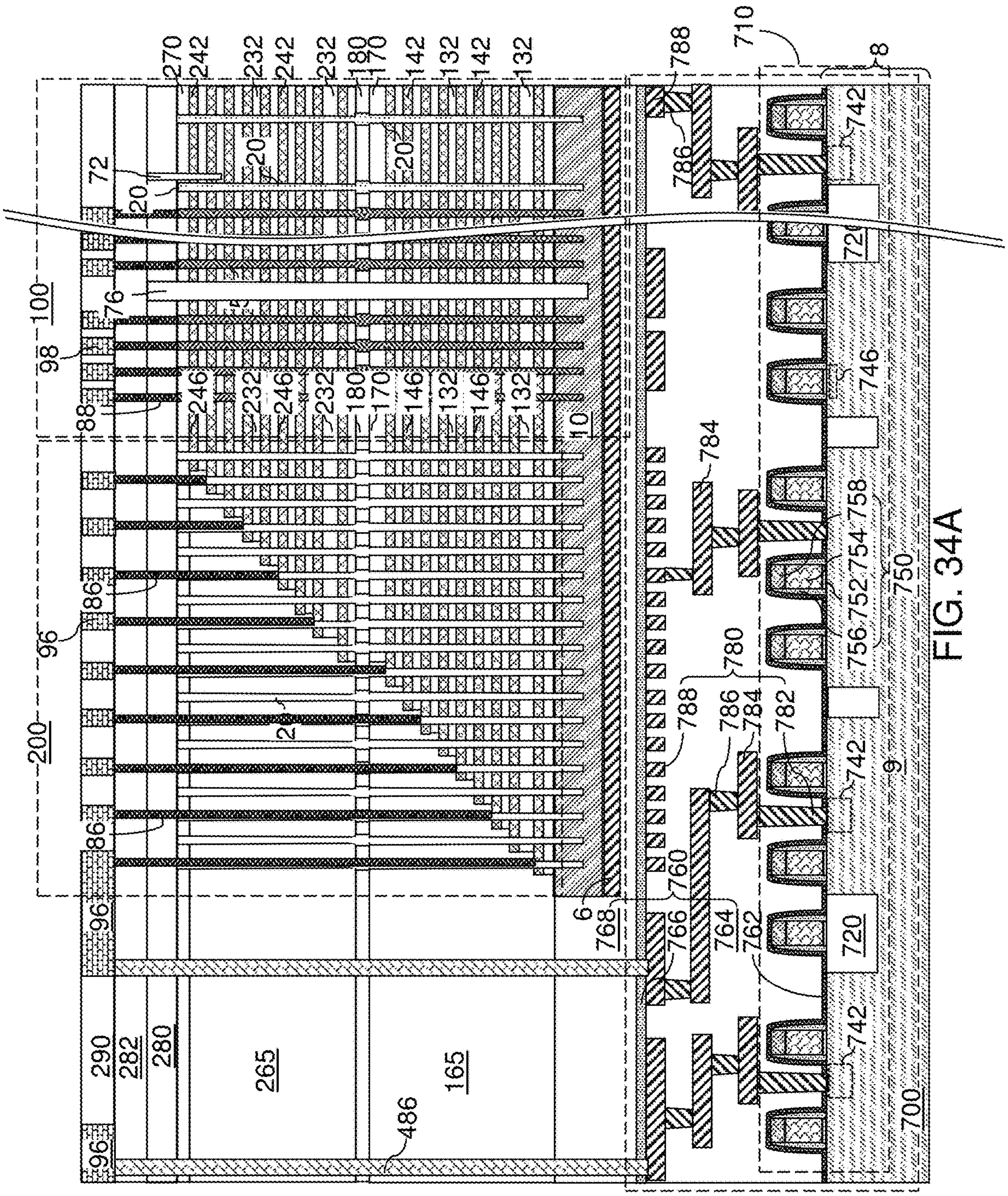
FIG. 34A is a vertical cross-sectional view of the third exemplary structure after formation of contact via structures and upper-level metal interconnect structures according to the third embodiment of the present disclosure.
Figure 34B:
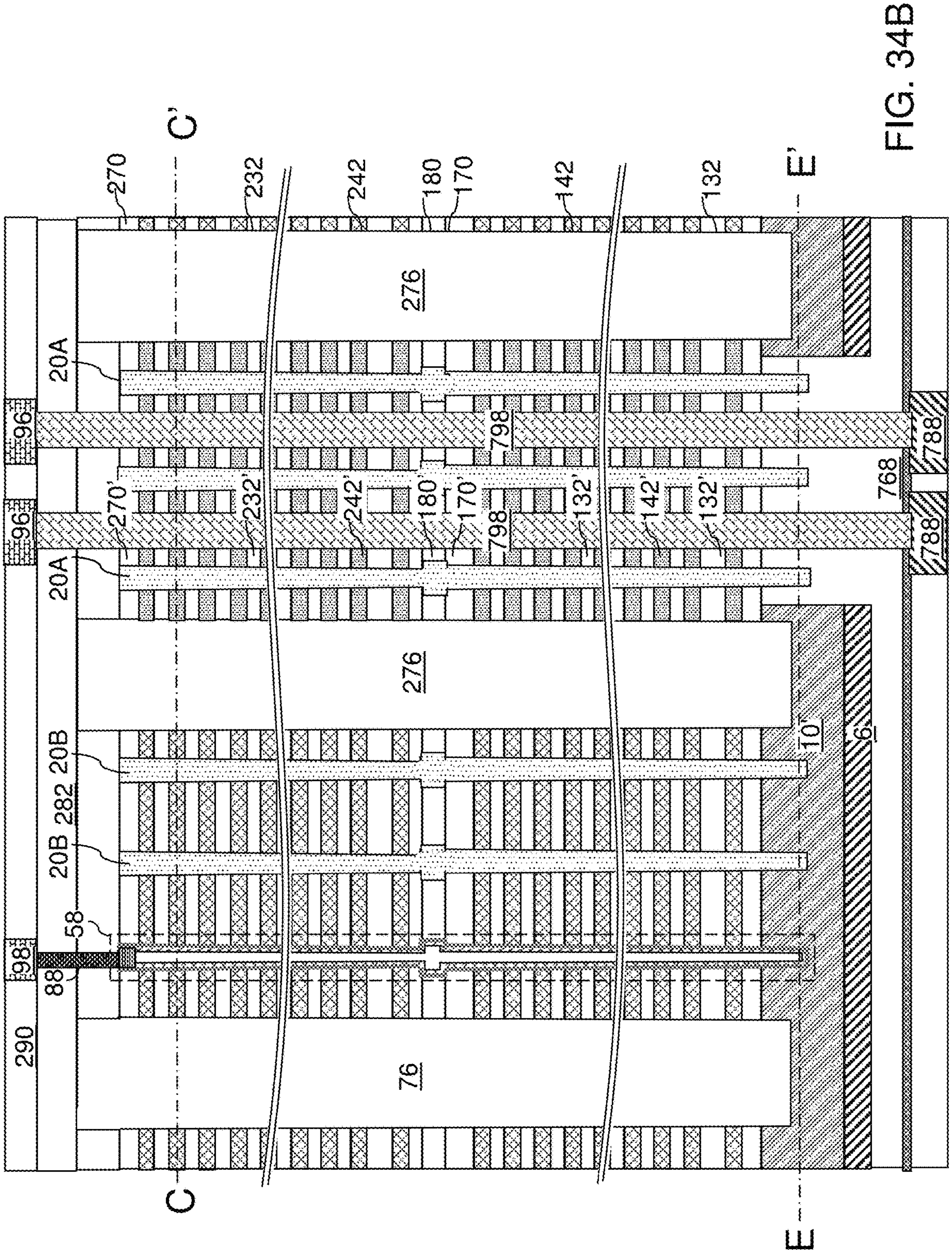
FIG. 34B is another vertical cross-sectional view of the third exemplary structure of FIG. 34A.
Figure 34C:
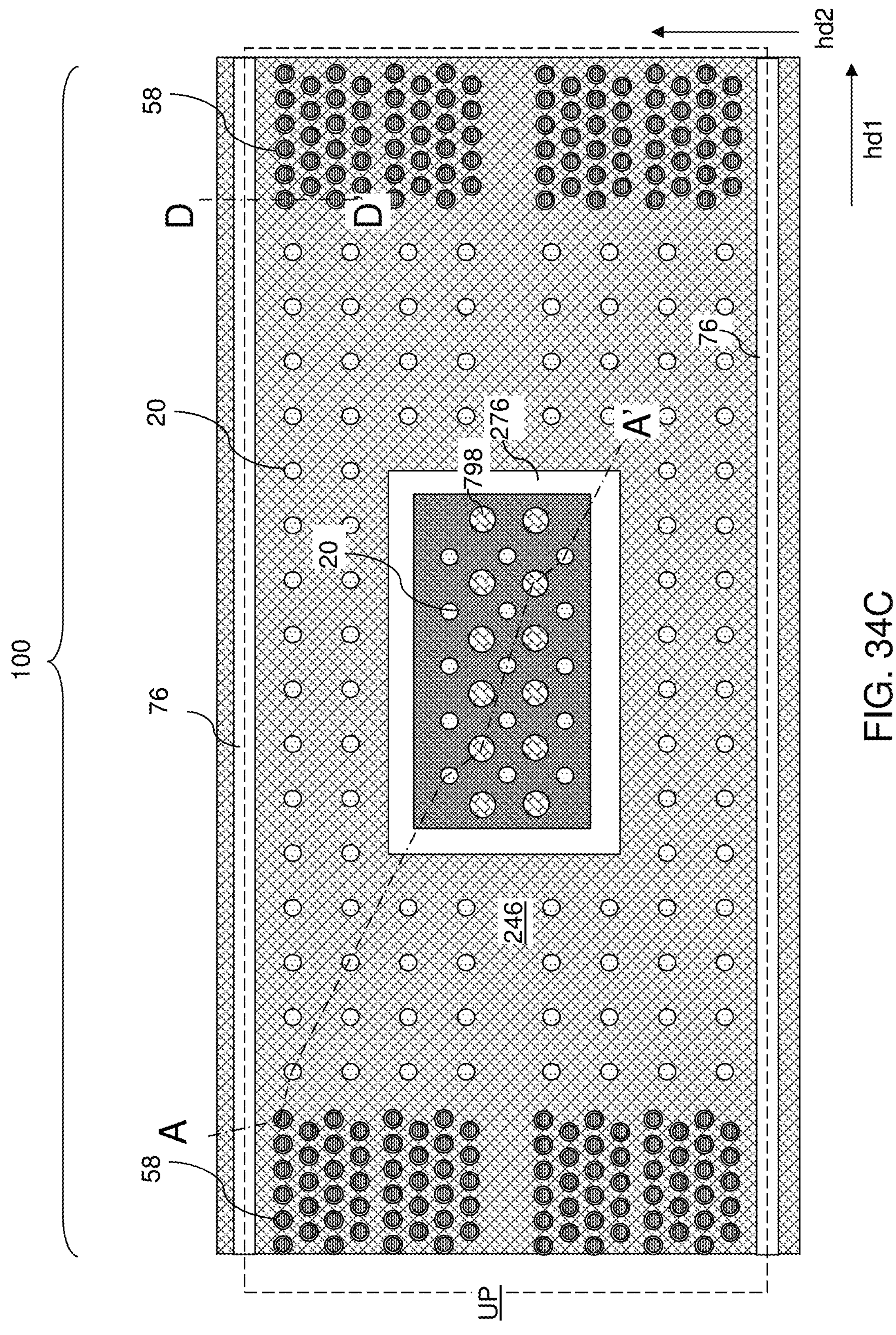
FIG. 34C is a horizontal cross-sectional view of the third exemplary structure along the horizontal plane C-C' of FIG. 34B. The hinged vertical plane B-B' corresponds to the plane of the vertical cross-sectional view of FIG. 34B.
Figure 34D:
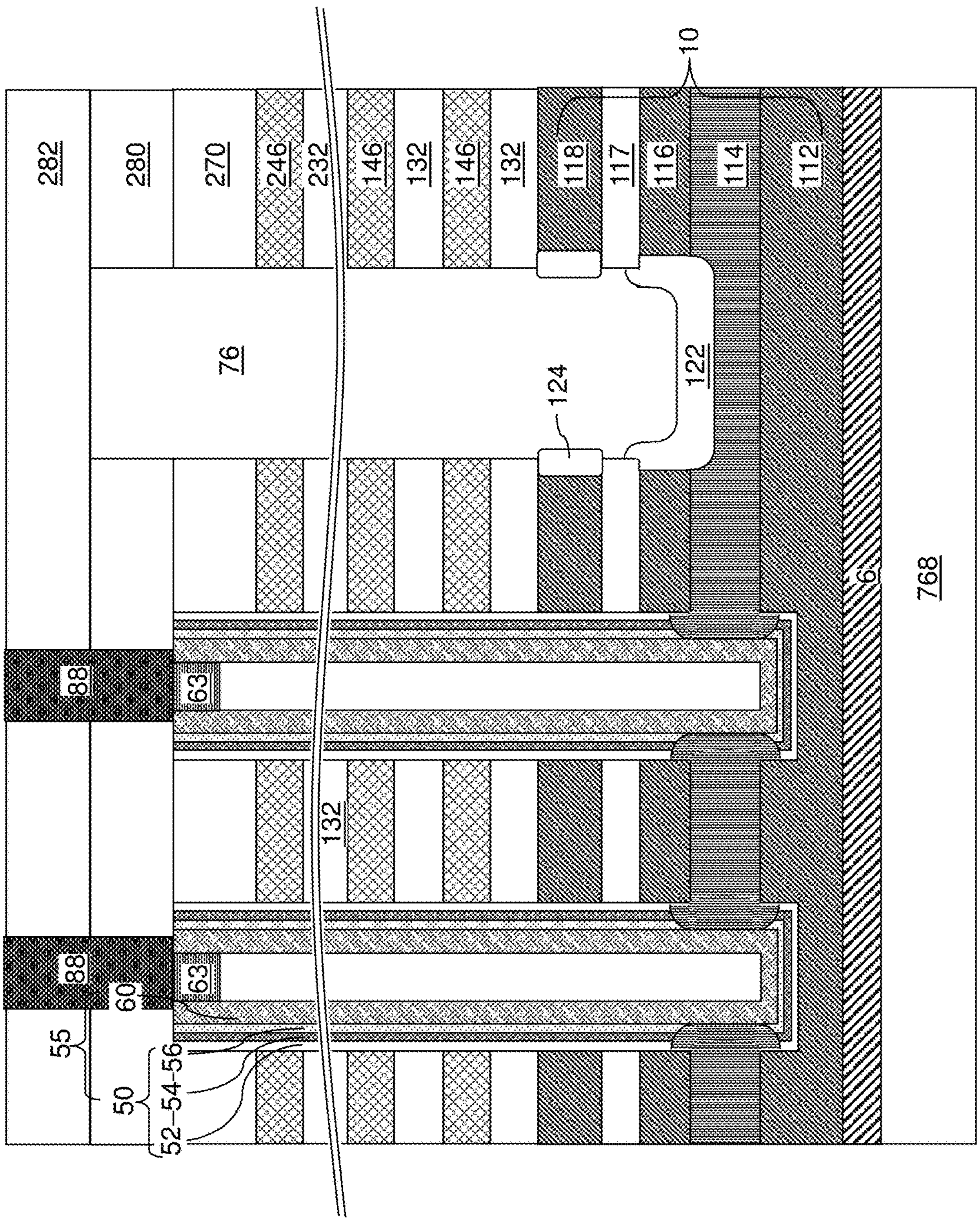
FIG. 34D is a vertical cross-sectional view of the third exemplary structure along the vertical plane D-D' of FIG. 34C.
Figure 34E:
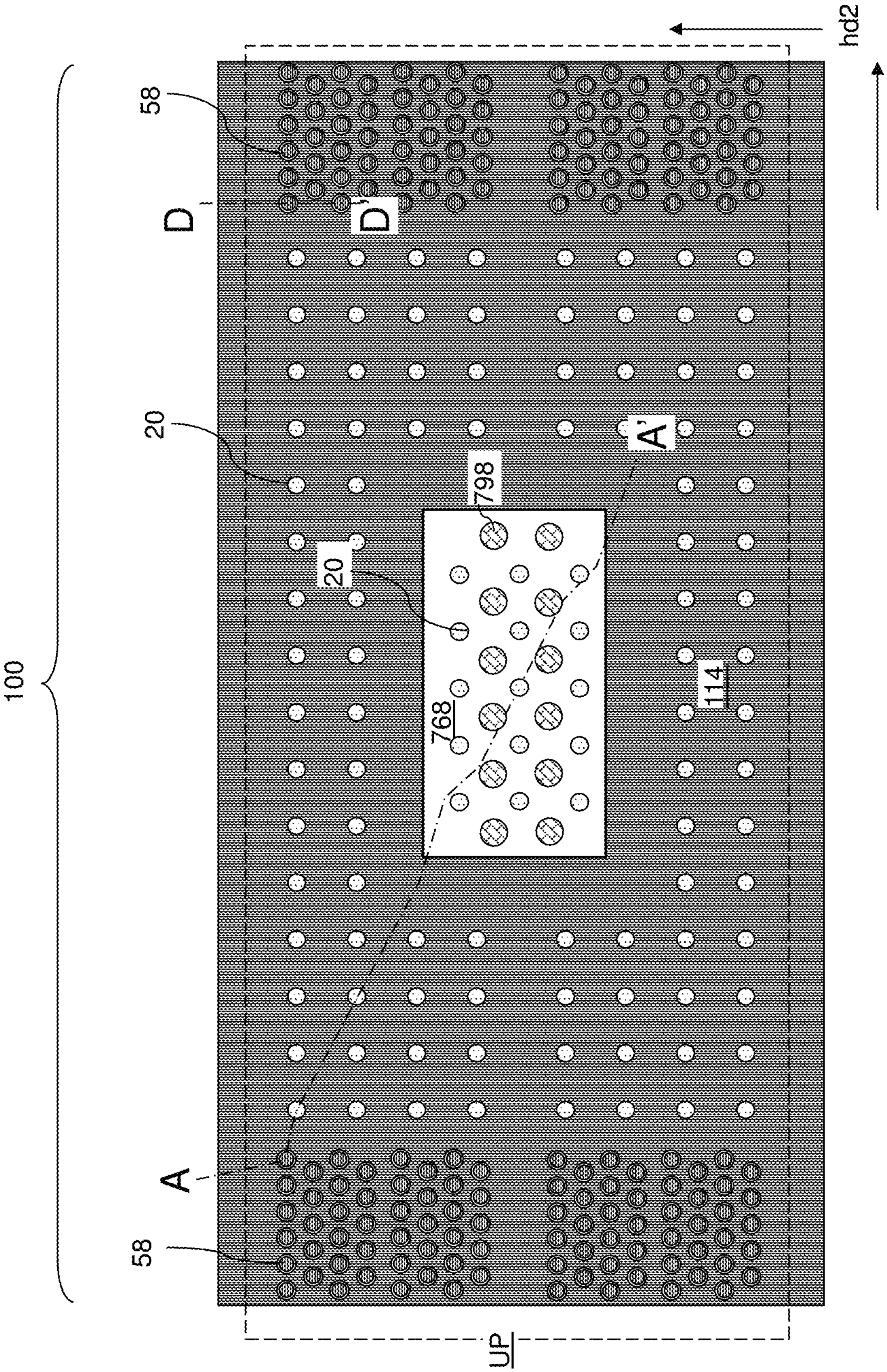
FIG. 34E is a horizontal cross-sectional view of the third exemplary structure of FIGS. 34A-34D along at the level of the semiconductor material layer.

Referring to FIG. 31, the processing steps of FIGS. 19A-19D can be performed to replace the in-process source-level material layers 10' with source-level material layers 10.

Referring to FIGS. 32A-32D, the processing steps of FIGS. 21A-21D can be performed to remove the sacrificial material layers (142, 242) selective to the insulating layers (132, 232), the etch barrier liner 71, the first and second insulating cap layers (170, 270), the first contact-level dielectric layer 280, and the source contact layer 114, the dielectric semiconductor oxide plates 122, and the annular dielectric semiconductor oxide spacers 124. An isotropic etchant that selectively etches the materials of the sacrificial material layers (142, 242) with respect to the materials of the insulating layers (132, 232), the first and second insulating cap layers (170, 270), the retro-stepped dielectric material portions (165, 265), and the material of the outermost layer of the memory films 50 may be introduced into the backside trenches 79, for example, using an isotropic etch process.

Referring to FIGS. 33A-33D, the processing steps of FIGS. 22A-22D can be performed to form electrically conductive layers (146, 246) in the backside recesses (143, 243). The electrically conductive layers (146, 246) comprise first electrically conductive layers 146 that are formed in the first backside recesses 143 and second electrically conductive layers 246 that are formed in the second backside recesses 243.

Subsequently, the processing steps of FIGS. 23A-23E can be performed to deposit a dielectric fill material or a combination of insulating spacer and local interconnect in the backside trenches 79 and in the moat trenches 279. Each portion of the dielectric fill material that fills a backside trench 79 comprises a backside trench fill structure 76. Each portion of the dielectric fill material that fills a moat trench 279 comprises a dielectric moat fill structure 276. The backside trench fill structures 76 and the dielectric moat fill structures 276 comprise, and/or consist essentially of, the same material or materials. Each dielectric moat fill structure 276 laterally surrounds a vertical stack of dielectric plates (142',242') and a vertical stack of insulating plates (132', 232') and contacts the at least one alternating stack of insulating layers (132, 232) and electrically conductive layers (146, 246).

Referring to FIGS. 34A-34E, a second contact-level dielectric layer 282 can be formed over the first contact-level dielectric layer 280 by deposition of a dielectric material such as silicon oxide. Alternatively, the second contact-level dielectric layer 282 can be formed by not removing the dielectric fill material from above the top surface of the first contact-level dielectric layer 280 after formation of the backside trench fill structures 76 and the dielectric moat fill structure 276. The thickness of the second contact-level dielectric layer 282 may be in a range from 200 nm to 600 nm, although lesser and greater thicknesses can also be employed.

Various via cavities can be formed through the second contact-level dielectric layer 282 and underlying dielectric material layers and can be subsequently filled with at least one conductive material to form various contact via structures (88, 86, 486, 798). The various via cavities may be formed employing a single patterned photoresist layer as an etch mask layer and employing a single anisotropic etch process, or may be formed employing a plurality of patterned photoresist layers as etch mask layers and employing a plurality of anisotropic etch processes.

In case a single patterned photoresist layer and a single anisotropic etch process are employed to form the various via cavities, the openings in the patterned photoresist layer can include openings that overlie the drain regions 63 of the memory opening fill structures 58, openings that overlie horizontal surfaces of the first stepped surfaces of a first alternating stack of the first insulating layers 132 and the first electrically conductive layers 146 or of the second stepped surfaces of a second alternating stack of the second insulating layers 232 and the second electrically conductive layers 246, openings that overlie a respective vertical stack of dielectric plates (142', 242'), a respective vertical stack of insulating plates (132', 232'), and a respective opening in the source-level material layers 10, and optionally openings located over portions of the retro-stepped dielectric material portions (165, 265) that do not overlie the source-level material layers 10. In this case, the anisotropic etch process can have an etch chemistry that is selective to the materials of the drain regions 63, the materials of the first electrically conductive layers 146 and the second electrically conductive layers 246, and the materials of the lower-level metal interconnect structures 780.

In case a plurality of patterned photoresist layers and a plurality of anisotropic etch processes are employed to form the various via cavities, the openings in each patterned photoresist layer includes a respective subset of the openings that overlie the drain regions 63 of the memory opening fill structures 58, the openings that overlie horizontal surfaces of the first stepped surfaces of a first alternating stack of the first insulating layers 132 and the first electrically conductive layers 146 or of the second stepped surfaces of a second alternating stack of the second insulating layers 232 and the second electrically conductive layers 246, the openings that overlie a respective vertical stack of dielectric plates (142', 242'), a respective vertical stack of insulating plates (132', 232'), and a respective opening in the source-level material layers 10, and optionally the openings located over portions of the retro-stepped dielectric material portions (165, 265) that do not overlie the source-level material layers 10. In this case, each anisotropic etch process can have an etch chemistry that is selective to a respective subset of the materials of the drain regions 63, the materials of the first electrically conductive layers 146 and the second electrically conductive layers 246, and the materials of the lower-level metal interconnect structures 780. The various via cavities can include drain contact via cavities that are formed above the drain regions 63, layer contact via cavities that are formed on the electrically conductive layers (146, 246), peripheral through-memory-level via cavities that are formed through the retro-stepped dielectric material portions (165, 265) on a respective one of the lower-level metal interconnect structures 780 (such as a landing-pad-level metal interconnect structure 788), and array-region through-memory-level via cavities that are formed through a respective vertical stack of dielectric plates (142', 242'), a respective vertical stack of insulating plates (132', 232'), and a portion of lower-level dielectric material layers 760 (such as the at least one second dielectric layer 768) filling an opening in the source-level material layers 10 and directly on a respective one of the lower-level metal interconnect structures 780 (such as a landing-pad-level metal interconnect structure 788).

After formation of the various via cavities and removal of the patterned photoresist layer(s), at least one conductive material can be deposited in the various via cavities, for example, by chemical vapor deposition, physical vapor deposition, electroplating, and/or electroless plating. Excess portions of the at least one conductive material can be removed from above the horizontal plane including the top surface of the second contact-level dielectric layer 282. Contact via structures (88, 86, 486, 798) can be formed in the various via cavities.

The contact via structures (88, 86, 486, 798) include drain contact via structures 88 that contact a respective one of the drain regions 63, layer contact via structures 86 that contact a respective one of the electrically conductive layers (146, 246), peripheral through-memory-level via structures 486 that extend through the retro-stepped dielectric material portions (165, 265) and contact a respective one of the lower-level metal interconnect structures 780, and array-region through-memory-level via structures 798 that extend through a vertical stack of dielectric plates (142', 242'), a vertical stack of insulating plates (132', 232'), and a portion of the lower-level dielectric material layers 760, and contact a respective one of the lower-level metal interconnect structures 780. Each peripheral through-memory-level via structures 486 is a contact via structure that is formed outside the areas of the memory array region 100 and the staircase region 200, and vertically extends through the memory level, i.e., the level located between the horizontal plane including the bottom surface of the source-level material layers 10 and the horizontal plane including the top surfaces of the memory opening fill structures 58. Each array-region through-memory-level via structures 798 is a contact via structure that is formed within the area of the memory array region 100, and vertically extends through the memory level.

In one embodiment, each array-region through-memory-level via structure 798 can vertically extend through a respective opening in the source-level material layers 10 and can contact a portion of the lower-level dielectric material layers 760 (such as the at least one second dielectric layer 768) that fill the opening in the source-level material layer 10. In one embodiment, each array-region through-memory-level via structure 798 can contact a portion of the lower-level dielectric material layers 760 (such as the at least one second dielectric layer 768) that fill the opening in the source-level material layer 10. In one embodiment, each array-region through-memory-level via structure 798 can vertically extend through, and can contact, a vertically alternating sequence of insulating plates (132', 232') and dielectric plates (142', 242'). Further, each array-region through-memory-level via structure 798 can be laterally spaced from the source-level material layers 10 by portions of the lower-level dielectric material layers 760 that fill the openings in the source-level material layers 10. In one embodiment, the lower-level dielectric material layers 760 may include an etch stop dielectric layer 767 that contacts top surfaces of the landing-pad-level metal interconnect structure 788. In this case, each array-region through-memory-level via structure 798 can extend through, and contact, the etch stop dielectric layer 767, which may include a silicon nitride layer or a dielectric metal oxide layer.

Subsequently, upper-level dielectric material layers and upper-level metal interconnect structures can be formed. For example, upper-level dielectric material layers can include a line-level dielectric layer 290 and metal line structures (96, 98) embedded therein. The metal line structures (96, 98) can include bit lines 98 that contact a respective subset of the drain contact via structures 88, and interconnection metal lines 96 that contact at least one of the layer contact via structures 86, the peripheral through-memory-level via structures 486, and the array-region through-memory-level via structures 798.

FIGS. 35A-35D are vertical cross-sectional views of alternative embodiments of the third exemplary structure.

Figure 35A:
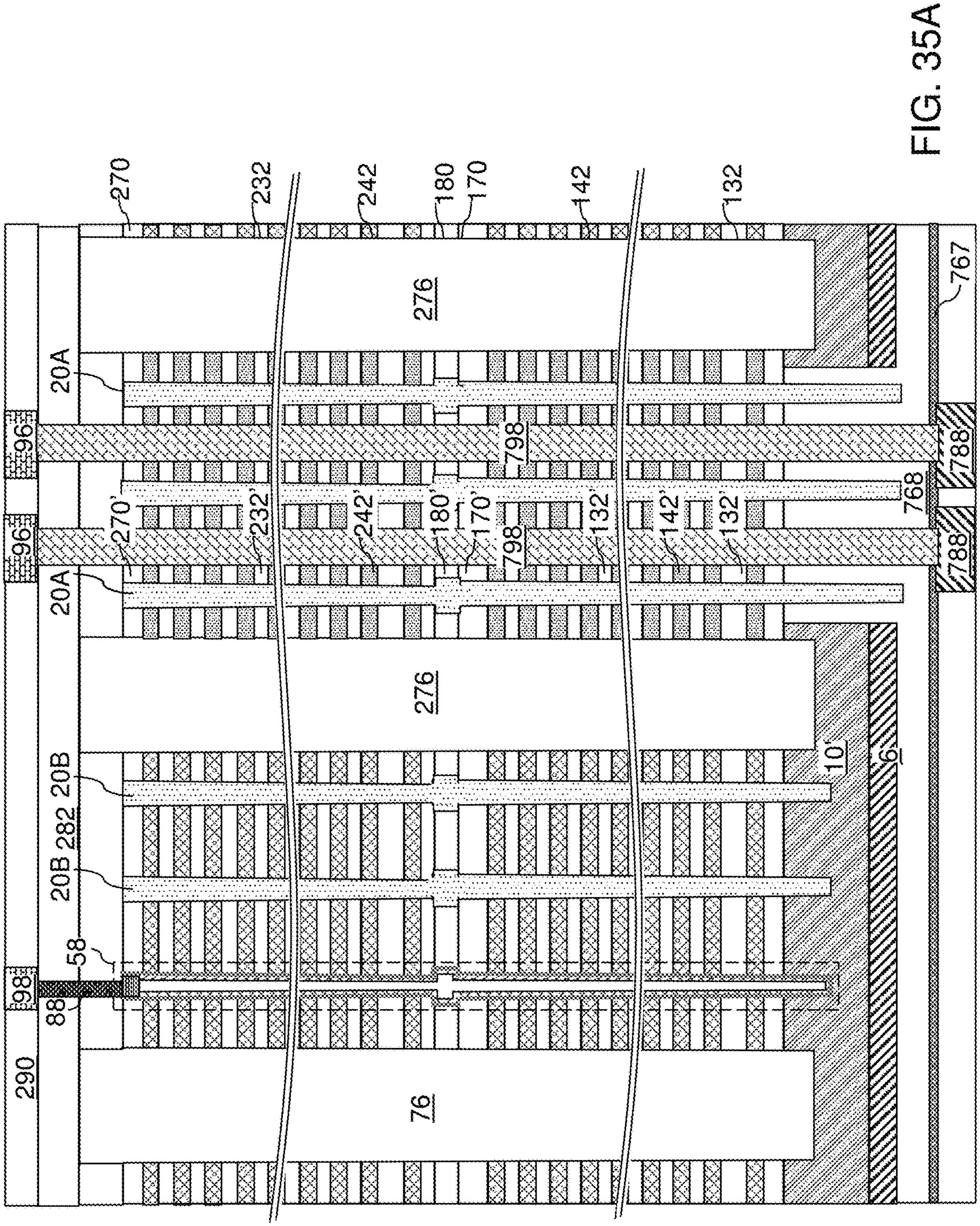
FIGS. 35A-35D are vertical cross-sectional views of alternative embodiments of the third exemplary structure.

Referring to FIG. 35A, a first alternative configuration of the third exemplary structure can be derived from the third exemplary structure of FIGS. 34A-34E by extending the depth of a first subset of the first-tier support openings 119 such that bottom surfaces of first subset of the first-tier support openings 119 vertically extend below the horizontal plane including the bottom surface of the in-process source-level material layers 10'. In one embodiment, the bottom surfaces of the first support pillar structures 20A can be located below a horizontal plane including a bottom surface of a semiconductor material layer within the source-level material layer 10, which may be any of the lower source-level material layer 112, the source contact layer 114, and the upper source-level semiconductor layer 116.

Figure 35B:
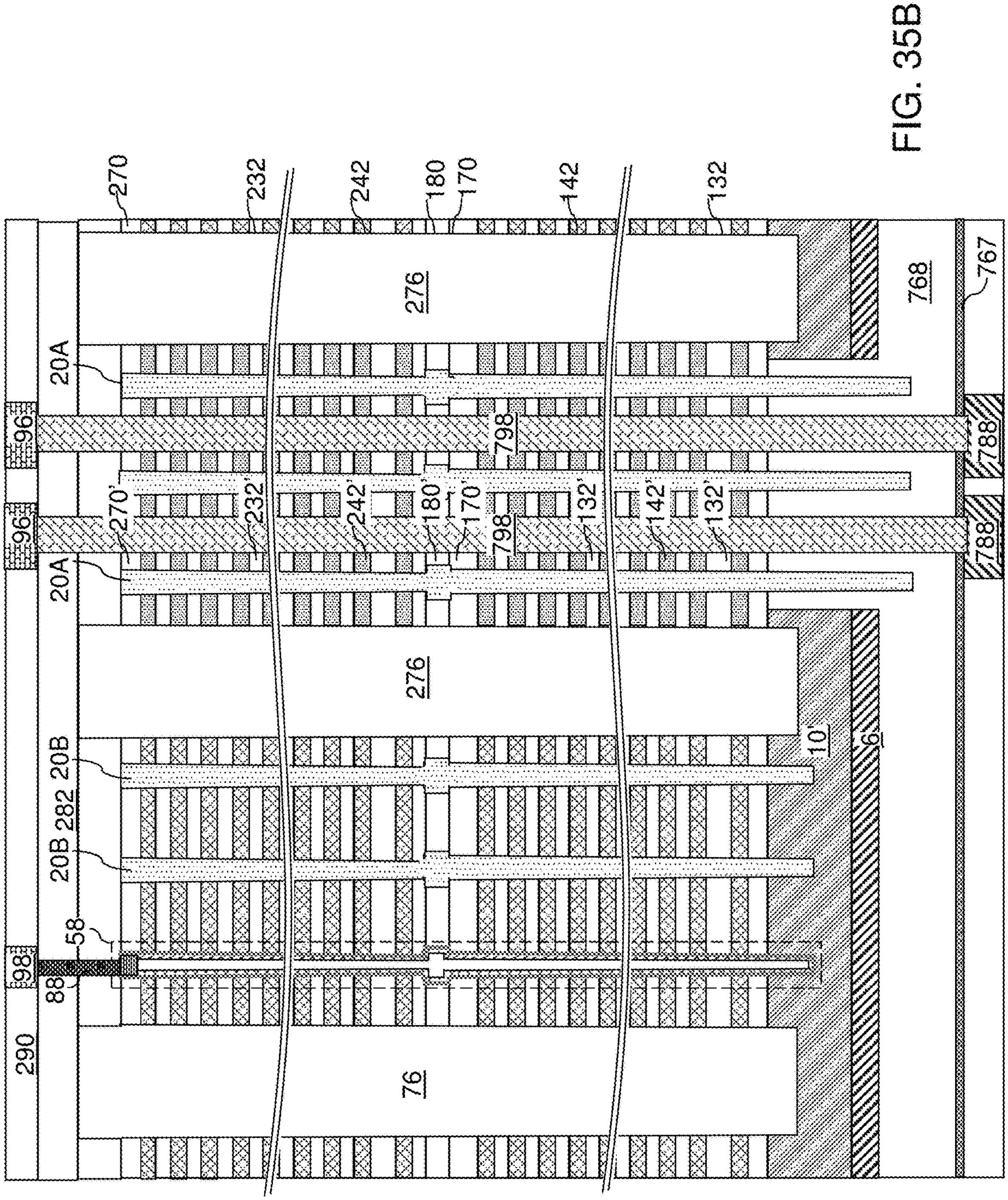

Referring to FIG. 35B, a second alternative configuration of the third exemplary structure can be derived from first alternative configuration of the third exemplary structure of FIG. 35A by increasing the thickness of a dielectric material layer within the at least one second dielectric layer 768. For example, the thickness of a dielectric material layer contacting a top surface of the etch stop dielectric layer 767 and contacting a bottom surface of the optional conductive plate layer 6 or a bottom surface of the source-level material layers 10 (in case the optional conductive plate layer is not present) may be in a range from 200 nm to 1,000 nm, although lesser and greater thicknesses may also be employed.

Figure 35C:
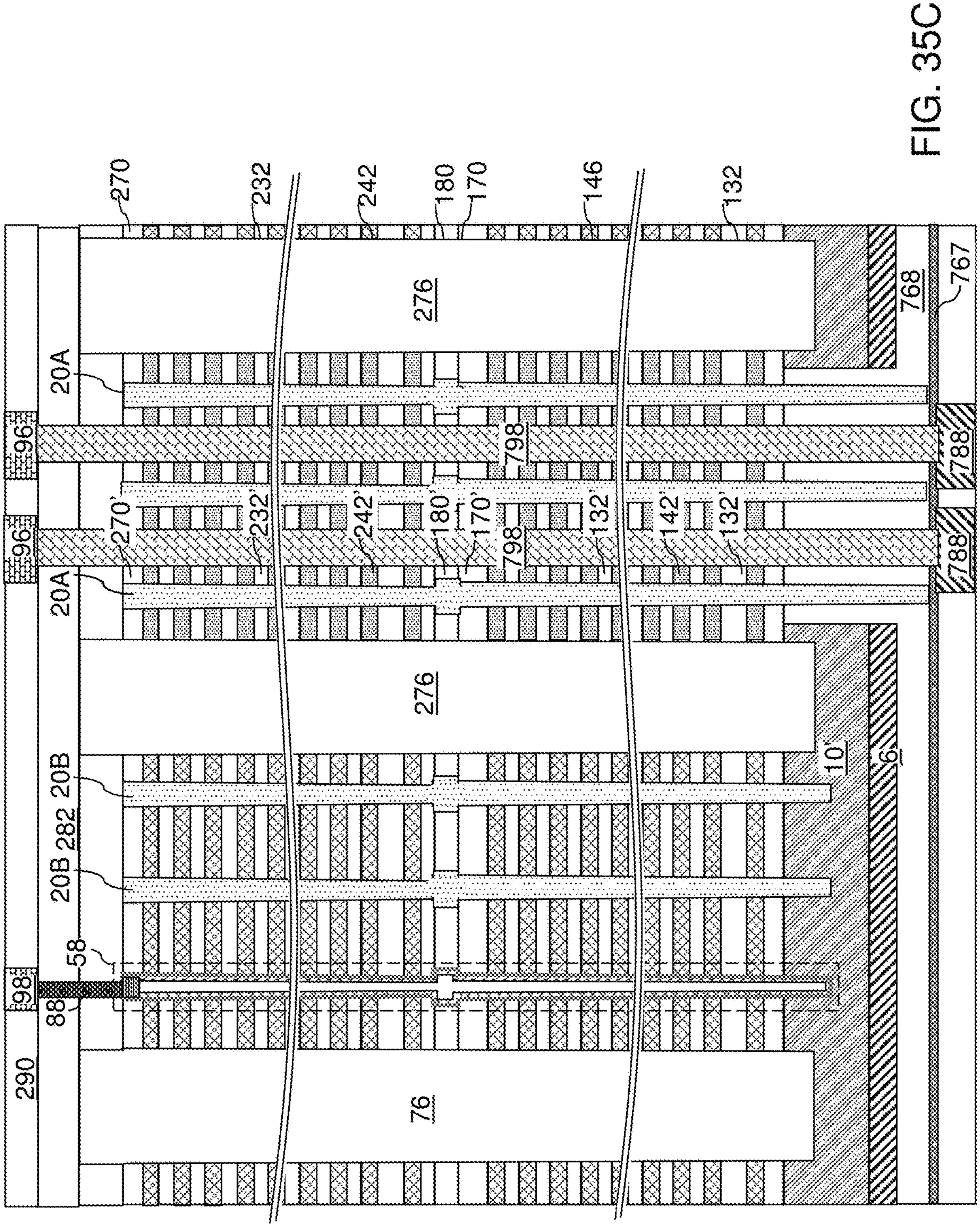

Referring to FIG. 35C, a third configuration of the third exemplary structure can be derived from the first alternative configuration of the third exemplary structure of FIG. 35A by vertically extending the depth of the first support pillar structures 20A such that first support pillar structures 20A contacts the etch stop dielectric layer 767. In one embodiment, the etch stop dielectric layer 767 may function as an etch stop structure during formation of the first-tier support openings 119, and the first support pillar structures 20A may be vertically spaced from the horizontal plane including the top surfaces of the landing-pad-level metal interconnect structures 788 by the etch stop dielectric layer 767.

Figure 35D:
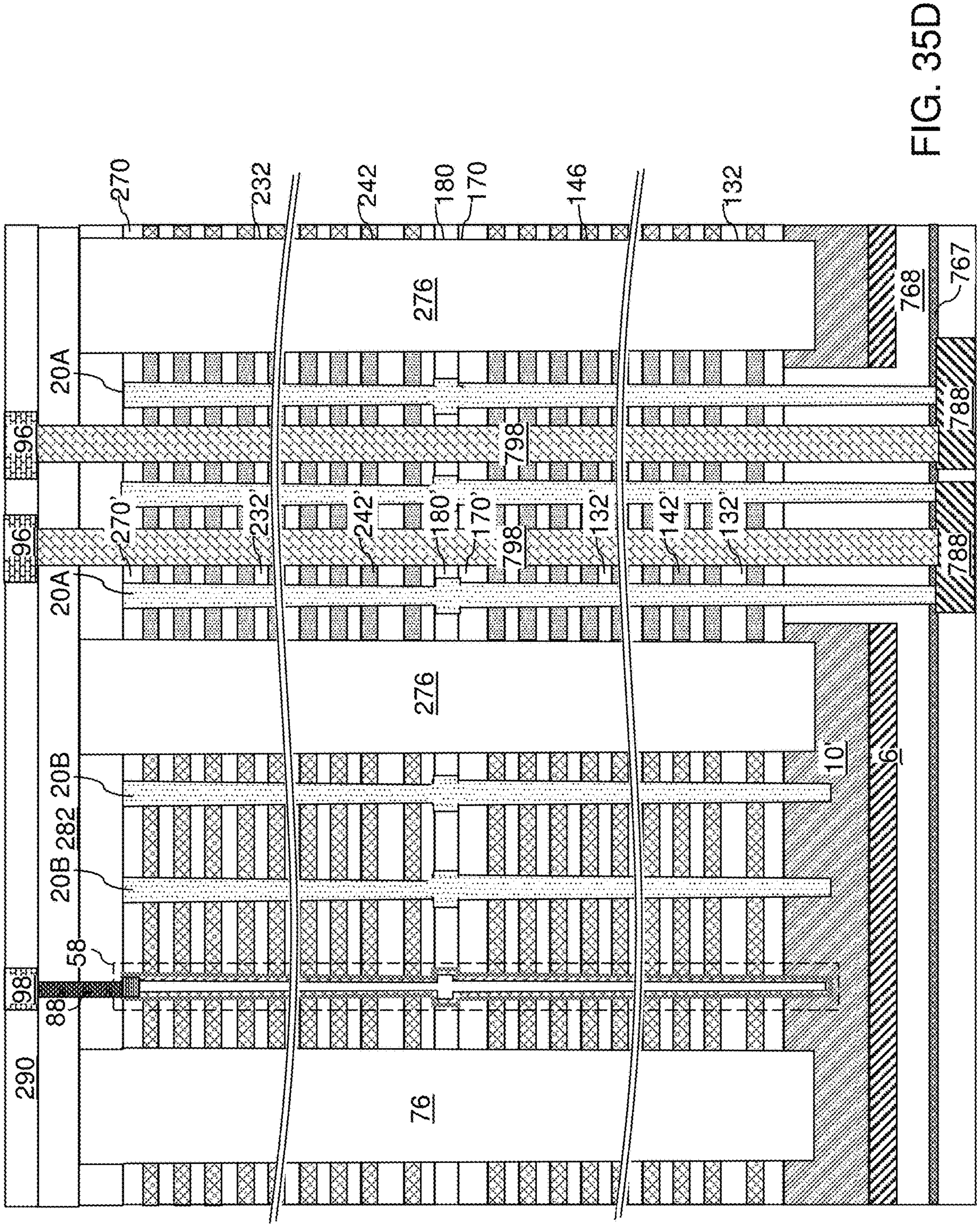
Figure 36A:
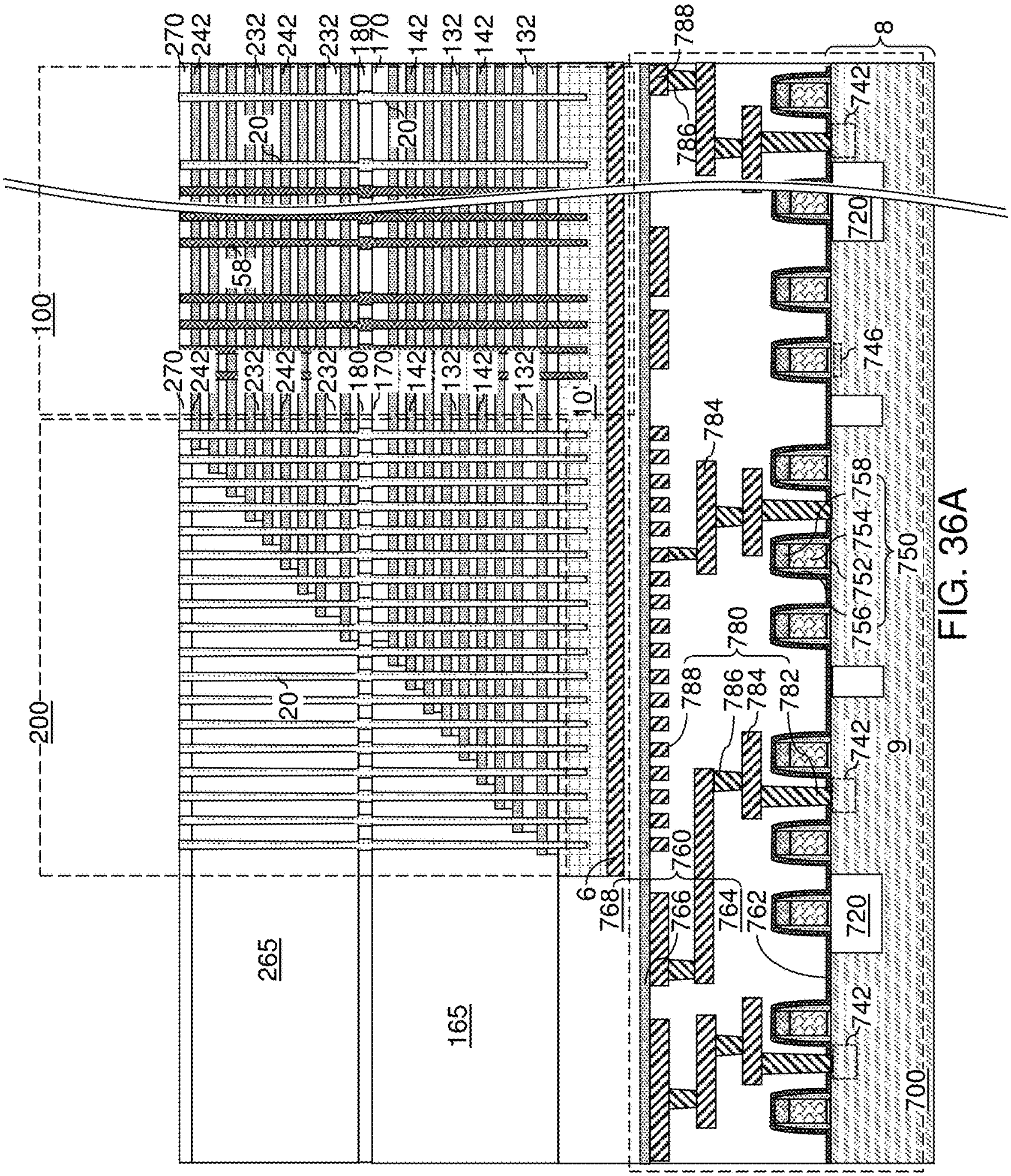
FIG. 36A is a vertical cross-sectional view of a fourth exemplary structure after formation of a contact-level dielectric material layer according to a fourth embodiment of the present disclosure.
Figure 36B:
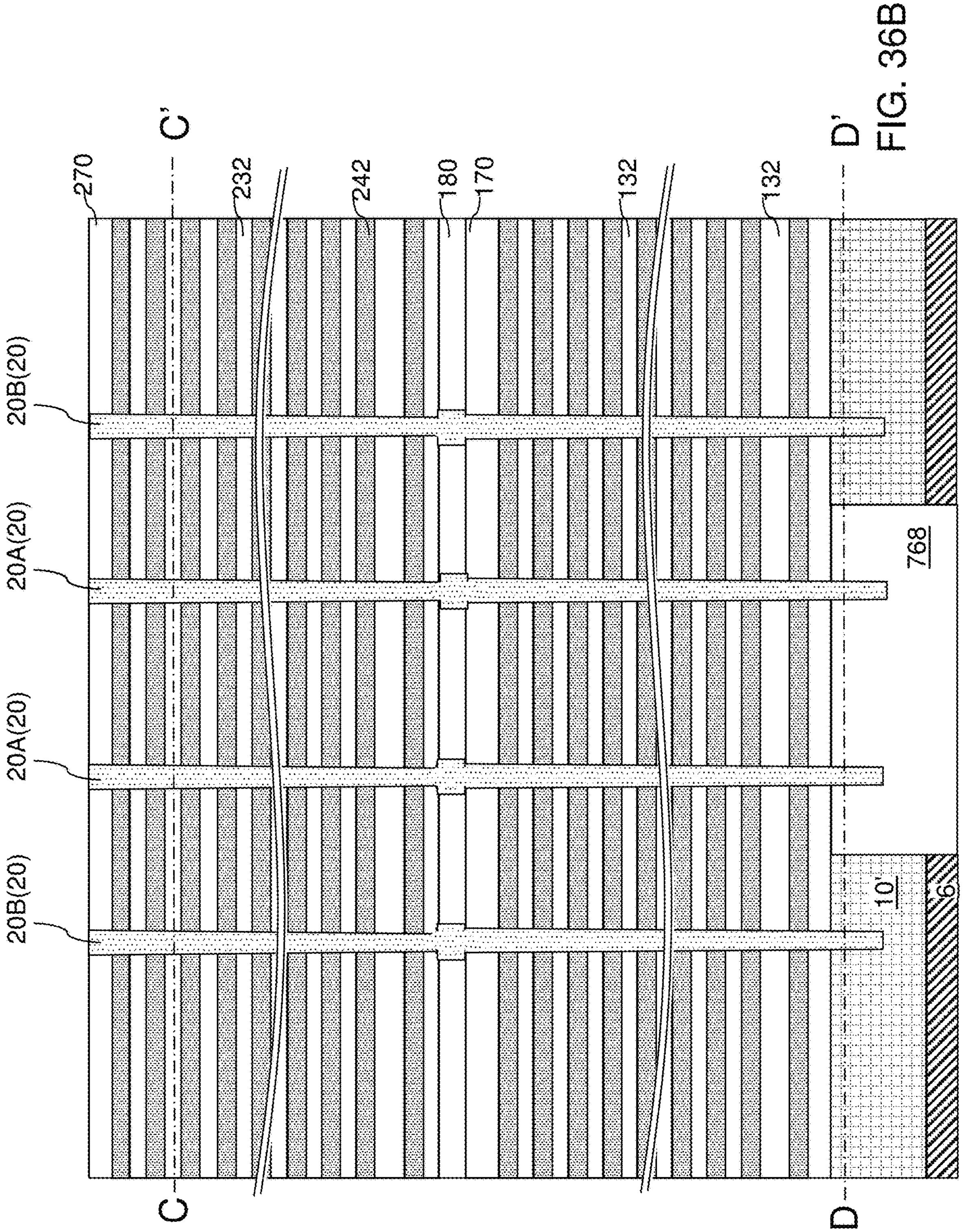
FIG. 36B is another vertical cross-sectional view of the fourth exemplary structure of FIG. 36A.
Figure 36C:
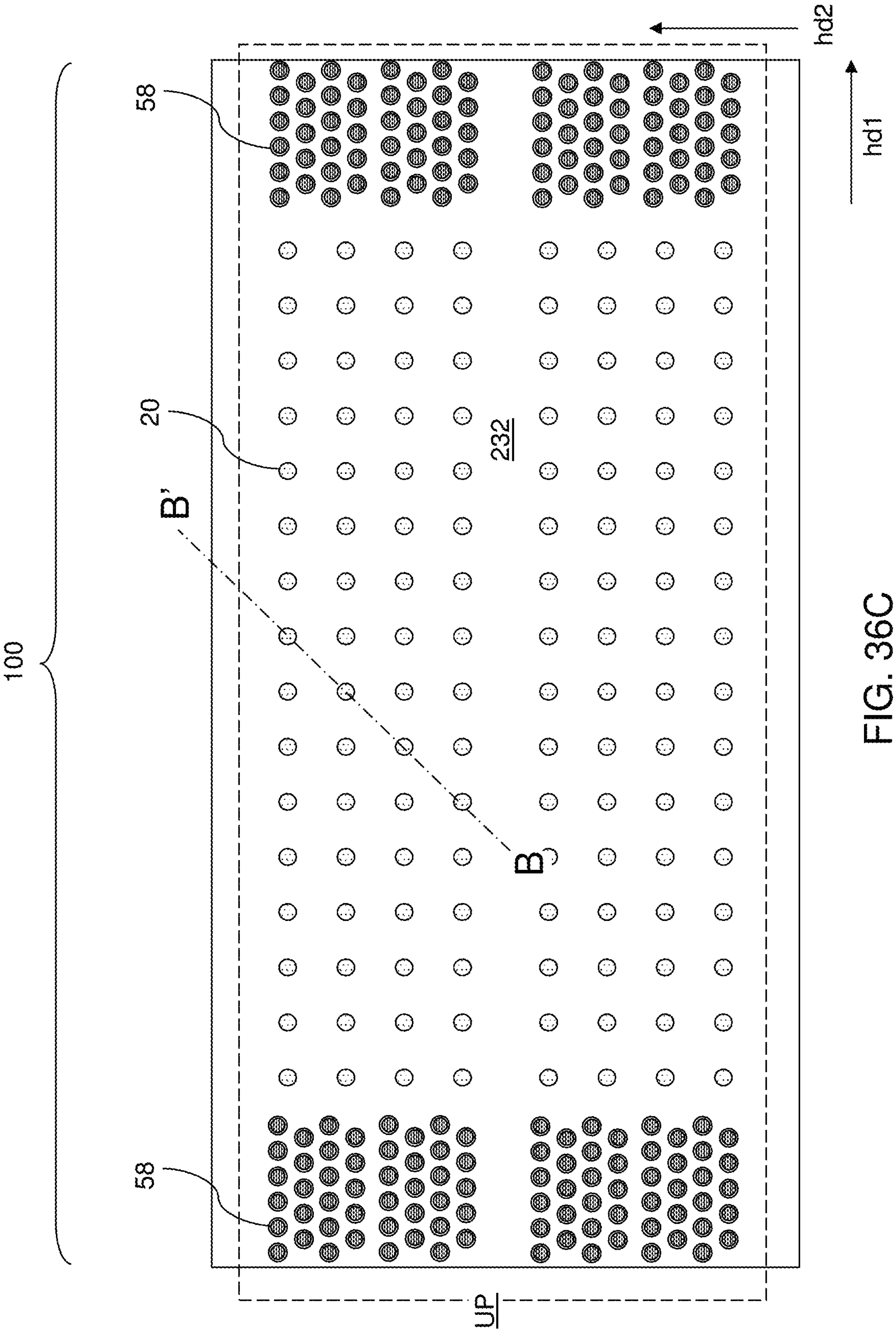
FIG. 36C is a horizontal cross-sectional view of the fourth exemplary structure along the plane C-C' of FIG. 36B. The vertical plane B-B' is the plane of the vertical cross-sectional view of FIG. 36B.
Figure 36D:
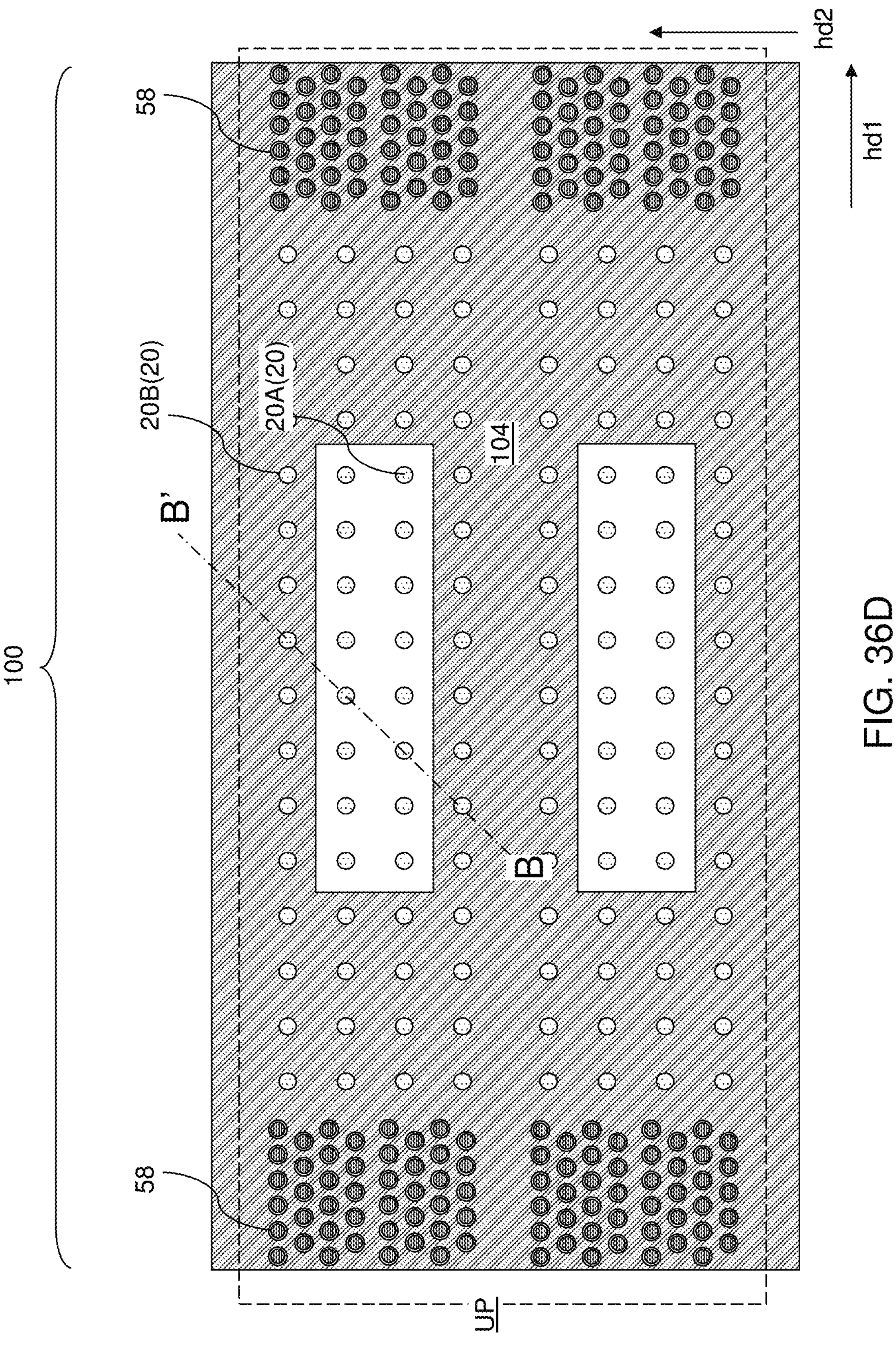
FIG. 36D is a horizontal cross-sectional view of the fourth exemplary structure along the plane D-D' of FIG. 36B. The vertical plane B-B' is the plane of the vertical cross-sectional view of FIG. 36B.

Referring to FIG. 35D, a fourth configuration of the third exemplary structure can be derived from the first alternative configuration of the third exemplary structure of FIG. 35A by vertically extending the first support pillar structures 20A through the etch stop dielectric layer 767. In one embodiment, the first support pillar structures 20A may contact top surfaces of the landing-pad-level metal interconnect structures 788.

The various configurations of the third exemplary structure provide first support pillar structures 20A in proximity to the array-region through-memory-level via structures 798. By forming the first support pillar structures 20A in proximity to a volume through which an array-region through-memory-level via structures 798 is subsequently formed, the lateral separation distance among the first support pillar structures 20A can be reduced, and the mechanical strength of the third exemplary structure increases during formation of the fin cavities (153, 253) and formation of the dielectric oxide plates (152, 252) therein. Thus, buckling or deformation of the third exemplary structure during formation of the dielectric oxide plates (152, 252) can be reduced or prevented, and the process yield for manufacture of the third exemplary structure can increase.

Referring to FIGS. 36A-36D, a fourth exemplary structure according to a fourth embodiment of the present disclosure can be derived from the first exemplary structure of FIGS. 13A-13C by modifying the pattern of openings through the in-process source-level material layers 10' and the pattern of the support pillar structures 20. Specifically, first support pillar structures 20A are formed within the areas of openings through the in-process source-level material layers 10', and second support pillar structures 20B are formed outside the areas of the openings through the in-process source-level material layers 10'. Each of the first support pillar structures 20A can contact a portion of the lower-level dielectric material layers 760 located within openings through the in-process source-level material layers 10'.

Figure 37A:
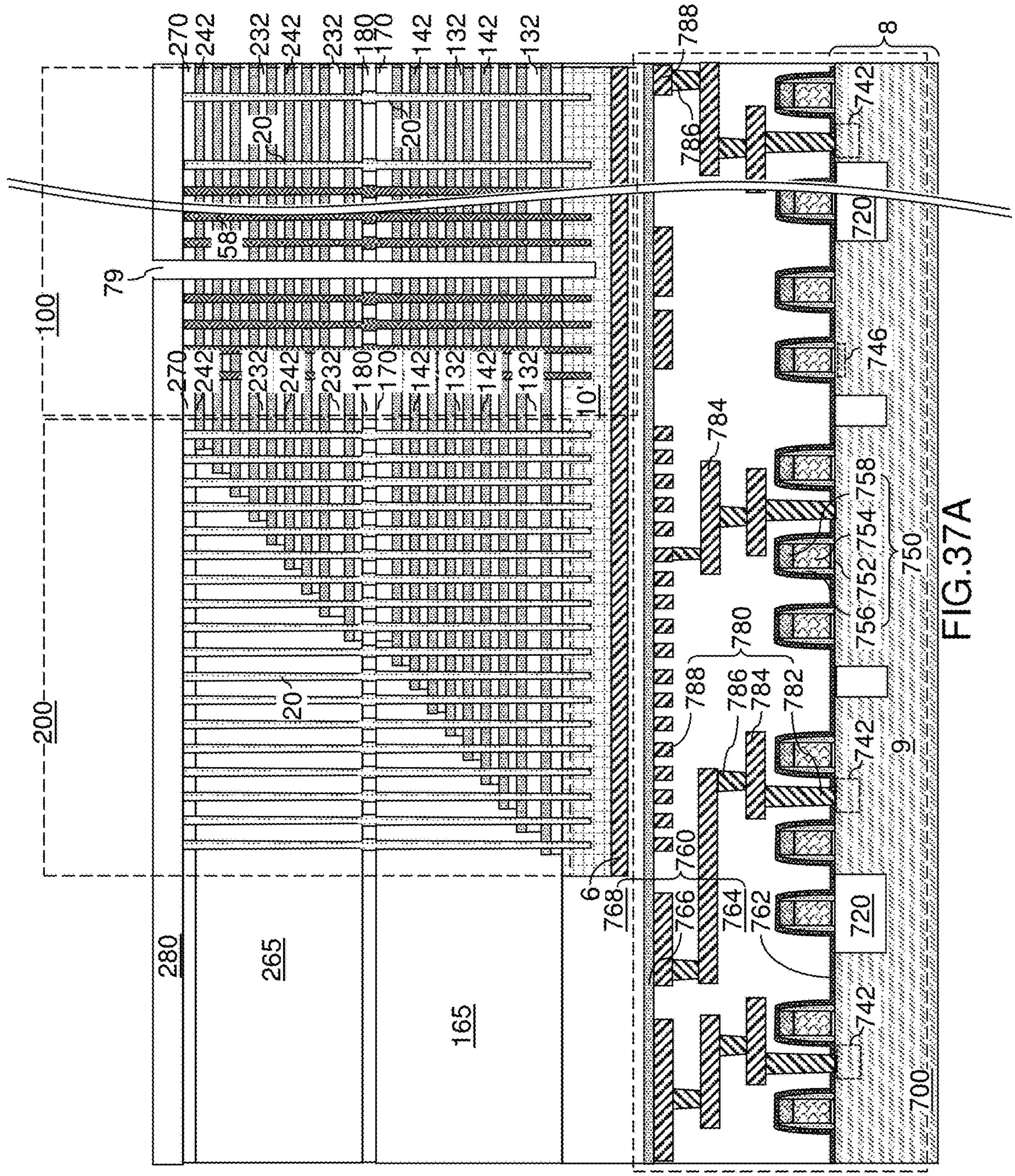
FIG. 37A is a vertical cross-sectional view of the fourth exemplary structure after formation of backside trenches and via openings according to the fourth embodiment of the present disclosure.
Figure 37B:
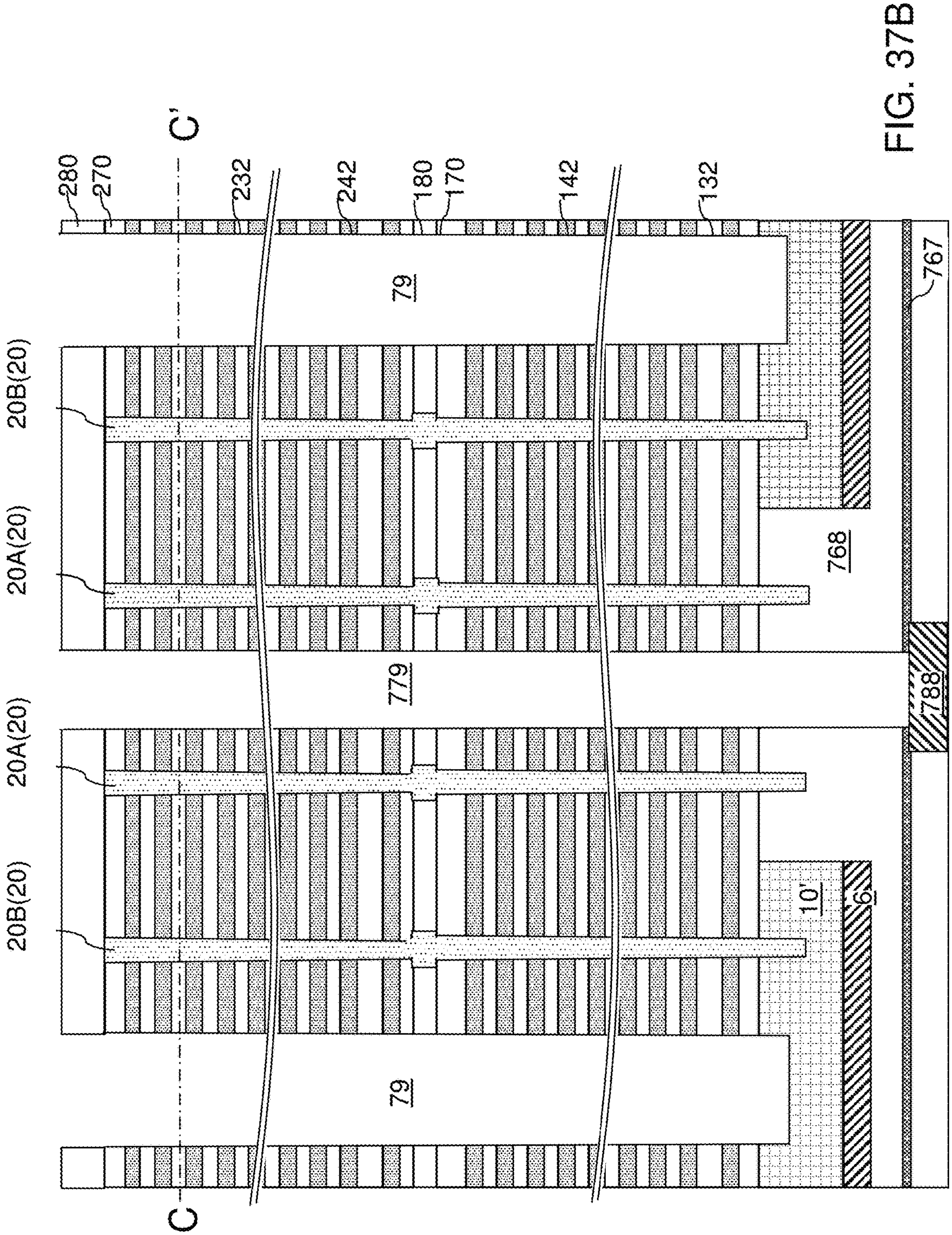
FIG. 37B is another vertical cross-sectional view of the fourth exemplary structure of FIG. 37A.
Figure 37C:
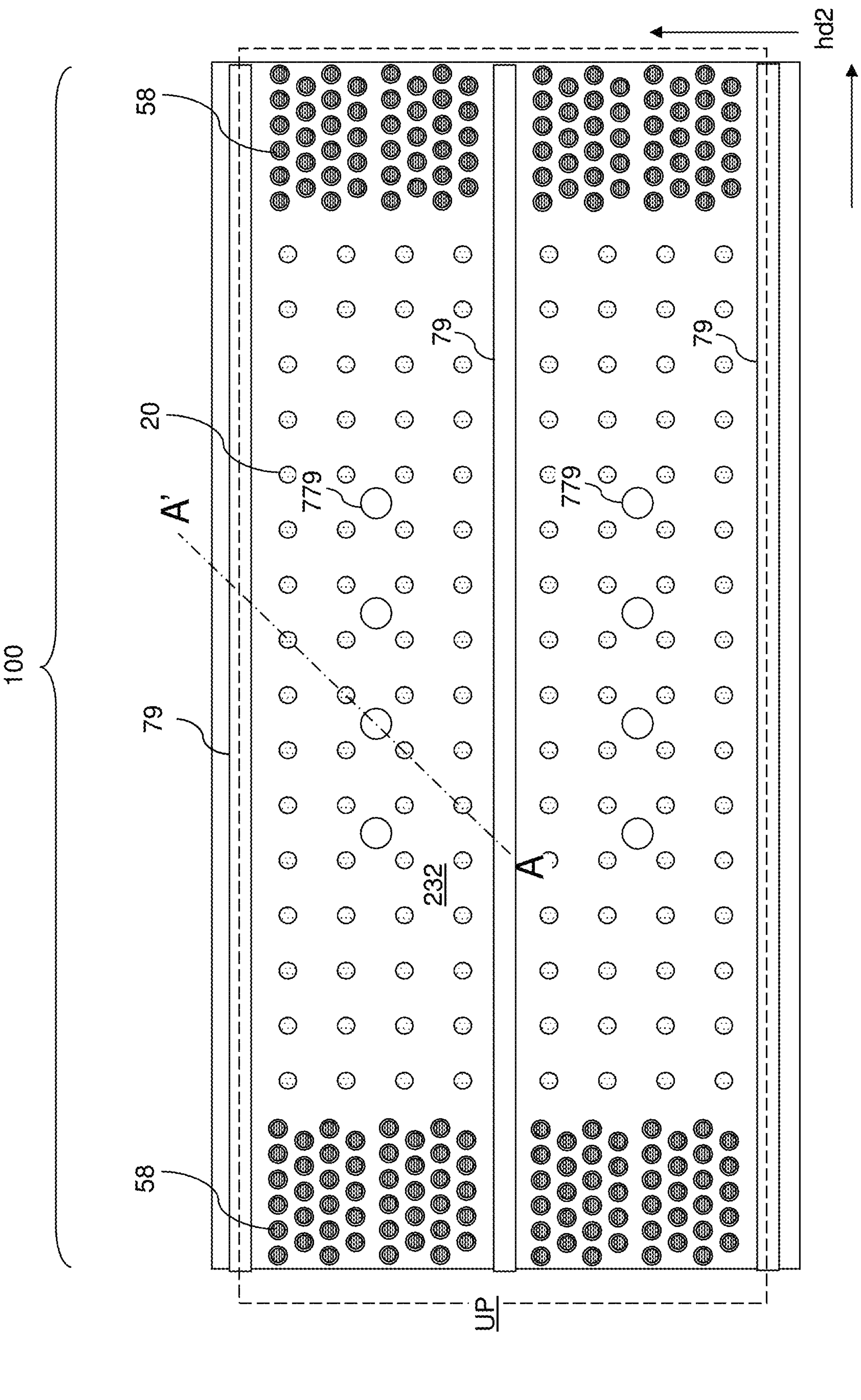
FIG. 37C is a horizontal cross-sectional view of the fourth exemplary structure along the plane C-C' of FIG. 37B. The vertical plane B-B' is the plane of the vertical cross-sectional view of FIG. 37B.

Referring to FIGS. 37A-37C, a first contact-level dielectric layer 280 may be formed over the second-tier structure (232, 242, 270, 265). The first contact-level dielectric layer 280 includes a dielectric material such as silicon oxide, and may be formed by a conformal or non-conformal deposition process. For example, the first contact-level dielectric layer 280 may include undoped silicate glass and may have a thickness in a range from 100 nm to 600 nm, although lesser and greater thicknesses may also be used.

A photoresist layer (not shown) may be applied over the first contact-level dielectric layer 280, and may be lithographically patterned to form various openings in the memory array region 100 and the staircase region 200. The openings in the photoresist layer include first openings that laterally extend along the first horizontal direction hd1 through at least one staircase region 200 and at least a portion of the memory array region 100. The first openings laterally extend between groups of memory opening fill structures 58 and support pillar structures 20 that are laterally spaced along the second horizontal direction hd2.

Further, the openings in the photoresist layer may include second openings overlying the areas of first support pillar structures 20A. Each second opening can be laterally surrounded by a respective subset of the first support pillar structures 20A, and can be formed entirely within the area of an underlying opening through the in-process source-level material layers 10', i.e., entirely within the area of a respective portion of the lower-level dielectric material layers 760 filling an opening through the in-process source-level material layers 10'.

An anisotropic etch may be performed to transfer the pattern in the photoresist layer through underlying material portions including the alternating stacks {(132, 142), (232, 242)}, an upper portion of the in-process source-level material layers 10', and portions of the lower-level dielectric material layers 760 that fill openings in the in-process source-level material layers 10'. Backside trenches 79 may be formed underneath the first openings in the photoresist layer through the first contact-level dielectric layer 280, the second-tier structure (232, 242, 270, 265), and the first-tier structure (132, 142, 170, 165), and into the in-process source-level material layers 10'. Portions of the first contact-level dielectric layer 280, the second-tier structure (232, 242, 270, 265), the first-tier structure (132, 142, 170, 165), and the in-process source-level material layers 10' that underlie the first openings in the photoresist layer may be removed to form the backside trenches 79. In one embodiment, the backside trenches 79 may be formed between groups of memory stack structures 55 that are laterally spaced apart along the second horizontal direction. A top surface of a source-level sacrificial layer 104 may be physically exposed at the bottom of each backside trench 79. The alternating stack {(132, 232), (142, 242)} may be divided into a plurality of alternating stacks {(132, 232), (142, 242)} of respective insulating layers (132, 232) and respective sacrificial material layers (142, 242) by the backside trenches 79.

Via cavities can be formed underneath the second openings in the photoresist layer through the first contact-level dielectric layer 280, the second-tier structure (232, 242, 270, 265), and the first-tier structure (132, 142, 170, 165), and into the in-process source-level material layers 10'. The via cavities are herein referred to as array-region through-memory-level via cavities 779. The array-region through-memory-level via cavities 779 can vertically extend through the portions of the lower-level dielectric material layers 760 overlying the top surface of the landing-pad-level metal interconnect structures 788. In one embodiment, a top surface of a landing-pad-level metal interconnect structure 788 can be physically exposed at the bottom of each array-region through-memory-level via cavity 779. Alternatively, the array-region through-memory-level via cavities 779 can vertically extend to a top surface of the etch stop dielectric layer 767. The backside trenches 79 and the array-region through-memory-level via cavities 779 are concurrently formed by a same anisotropic etch process.

Figure 38A:
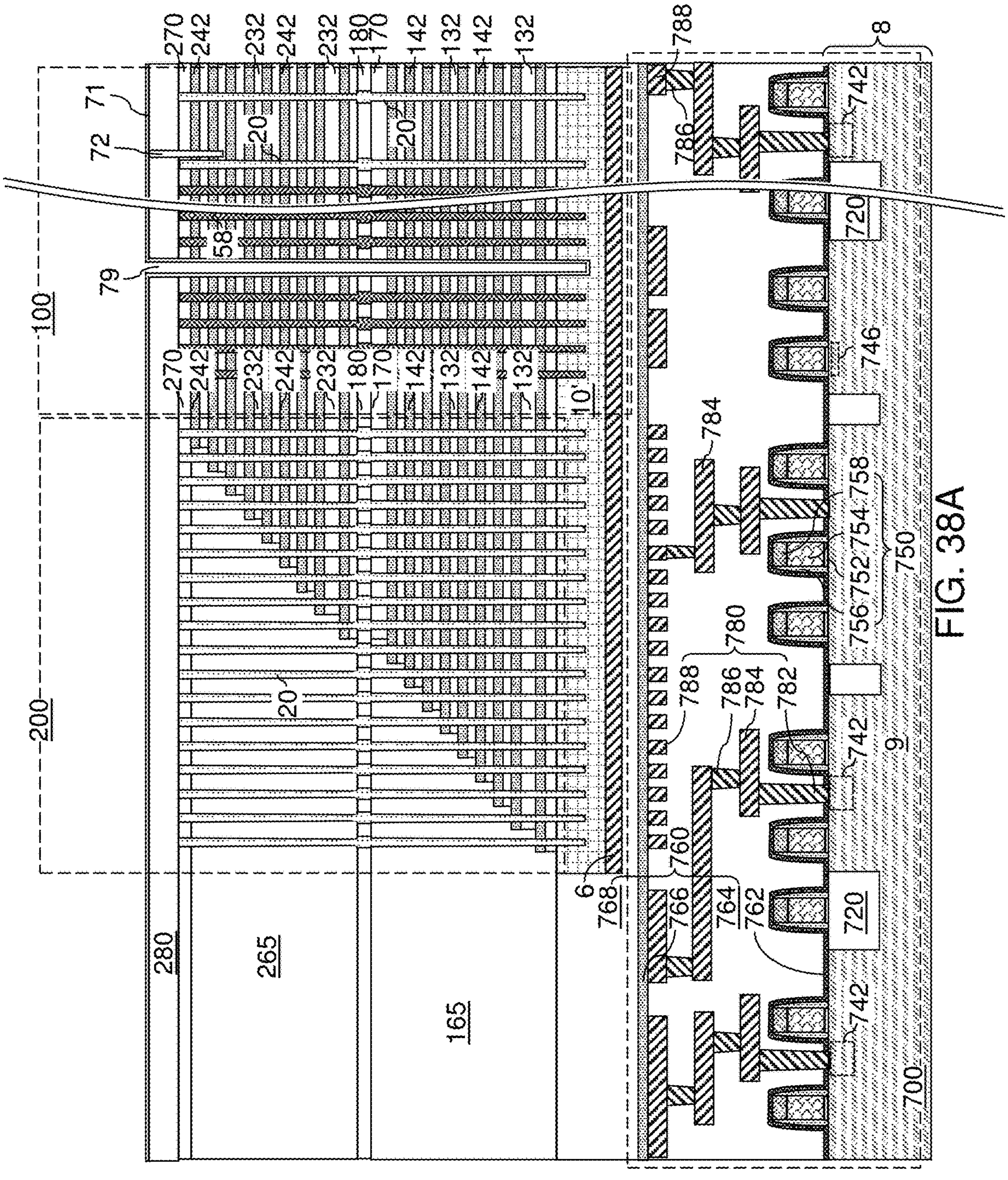
FIG. 38A is a vertical cross-sectional view of a fourth exemplary structure after formation of patterned etch barrier liner according to the fourth embodiment of the present disclosure.
Figure 38B:
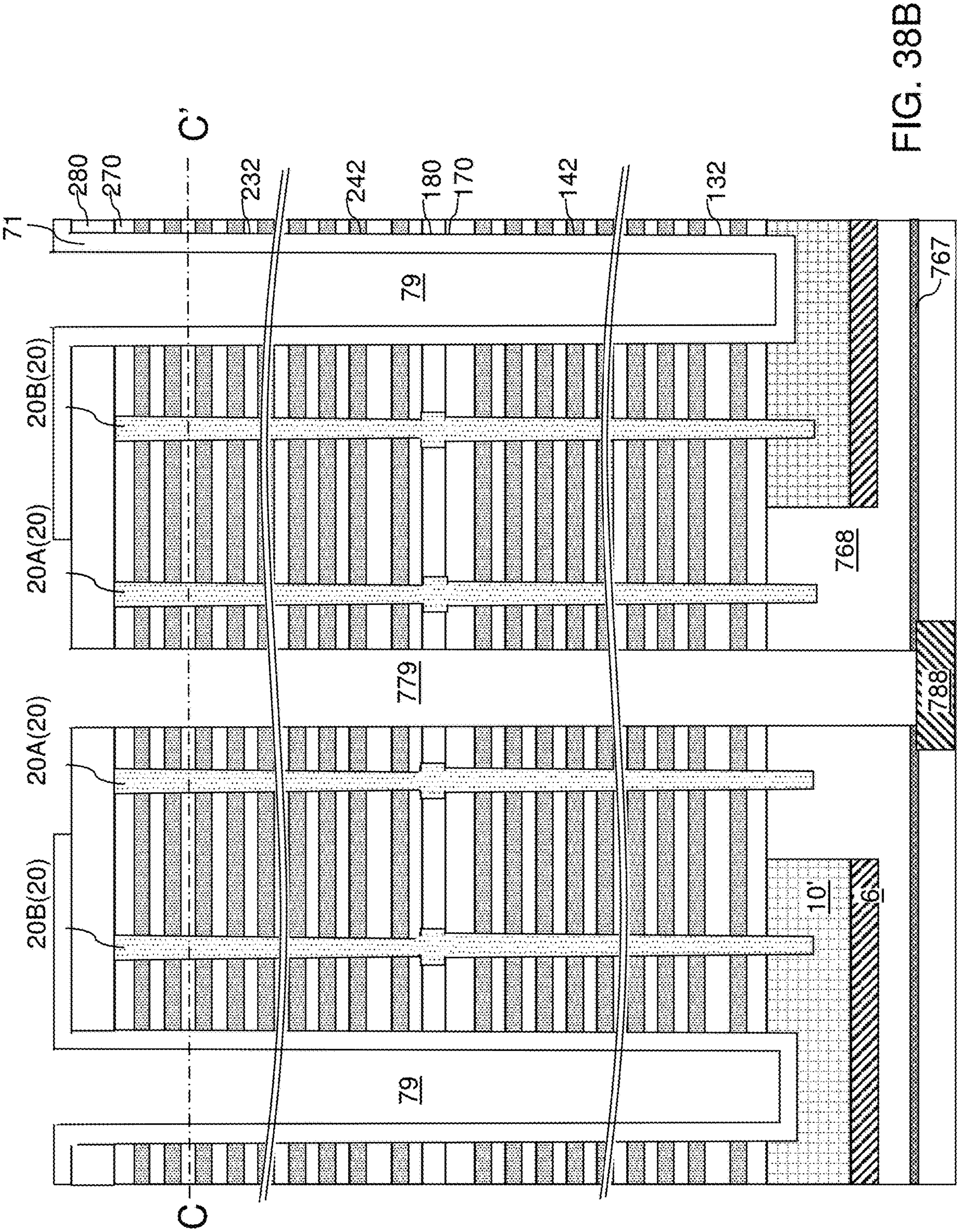
FIG. 38B is another vertical cross-sectional view of the fourth exemplary structure of FIG. 38A.
Figure 38C:
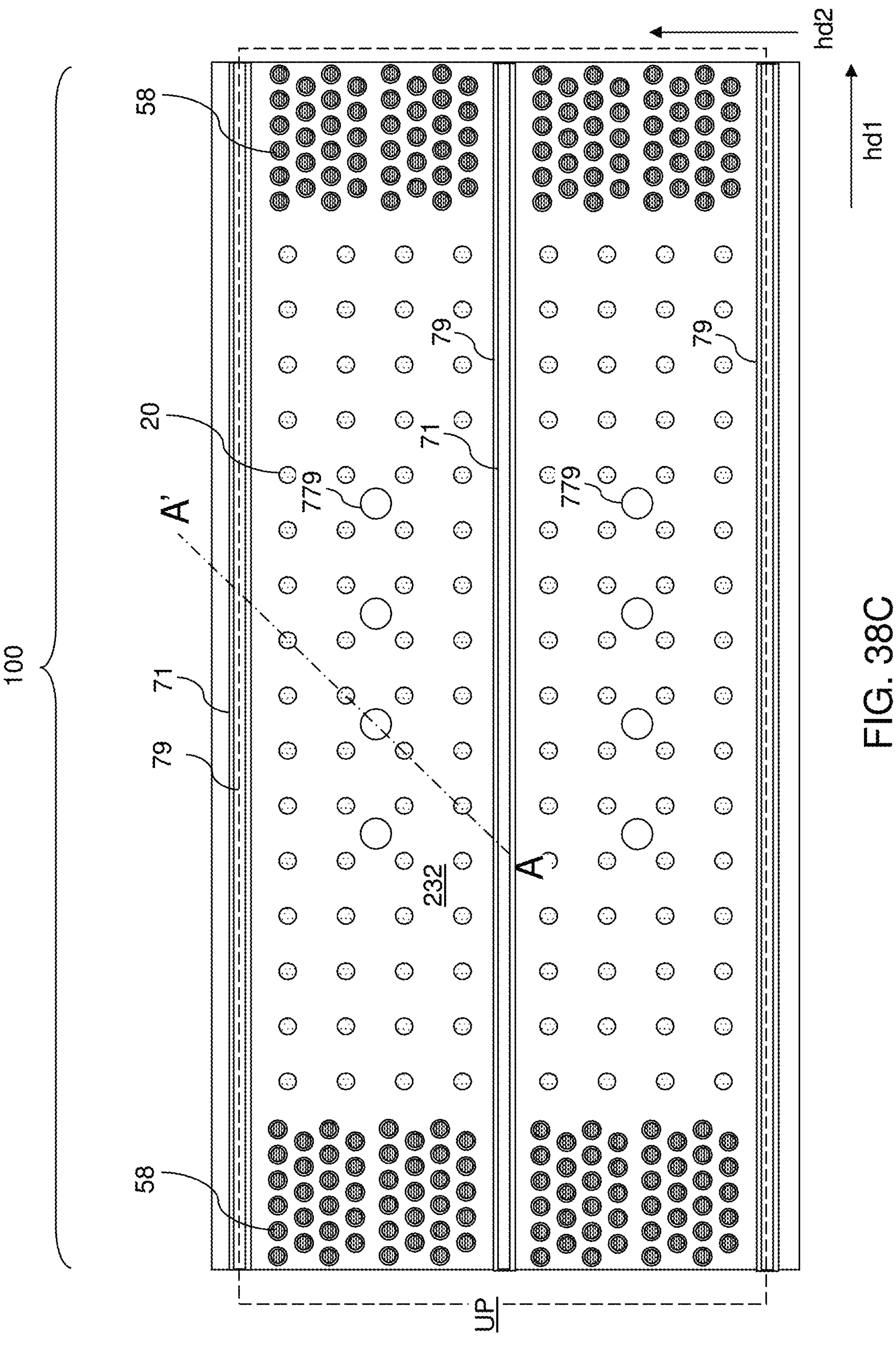
FIG. 38C is a horizontal cross-sectional view of the fourth exemplary structure along the plane C-C' of FIG. 38B. The vertical plane B-B' is the plane of the vertical cross-sectional view of FIG. 38B.

Referring to FIGS. 38A-38C, drain-select-level isolation structures 72 may be optionally formed through a subset of the second sacrificial material layers 242. an etch barrier liner 71 can be conformally deposited in the backside trenches 79 and the array-region through-memory-level via cavities 779 and over the first contact-level dielectric layer 280 by a conformal deposition process. The etch barrier liner 71 includes a dielectric material that is different from the materials of the first sacrificial material layers 142 and the second sacrificial material layers 242. For example, the etch barrier liner 71 can include silicon oxide. The thickness of the etch barrier liner 71 can be in a range from 5 nm to 100 nm, such as from 10 nm to 50 nm, although lesser and greater thicknesses can also be employed.

A photoresist layer (not shown) can be applied over the fourth exemplary structure, and can be lithographically patterned to cover the backside trenches 79 without covering the array-region through-memory-level via cavities 779. Unmasked portions of the etch barrier liner 71 can be removed by performing an isotropic etch process. For example, if the etch barrier liner 71 includes silicon oxide, a wet etch process employing hydrofluoric acid can be performed to remove unmasked portions of the etch barrier liner 71. The photoresist layer can be subsequently removed, for example, by ashing. Sidewalls of the array-region through-memory-level via cavities 779 are physically exposed, and sidewalls of the backside trenches 79 are covered by the etch barrier liner 71. Thus, sidewalls of the backside trenches 79 can be masked with the etch barrier liner 71 without covering sidewalls of the array-region through-memory-level via cavities 779.

Figure 39:
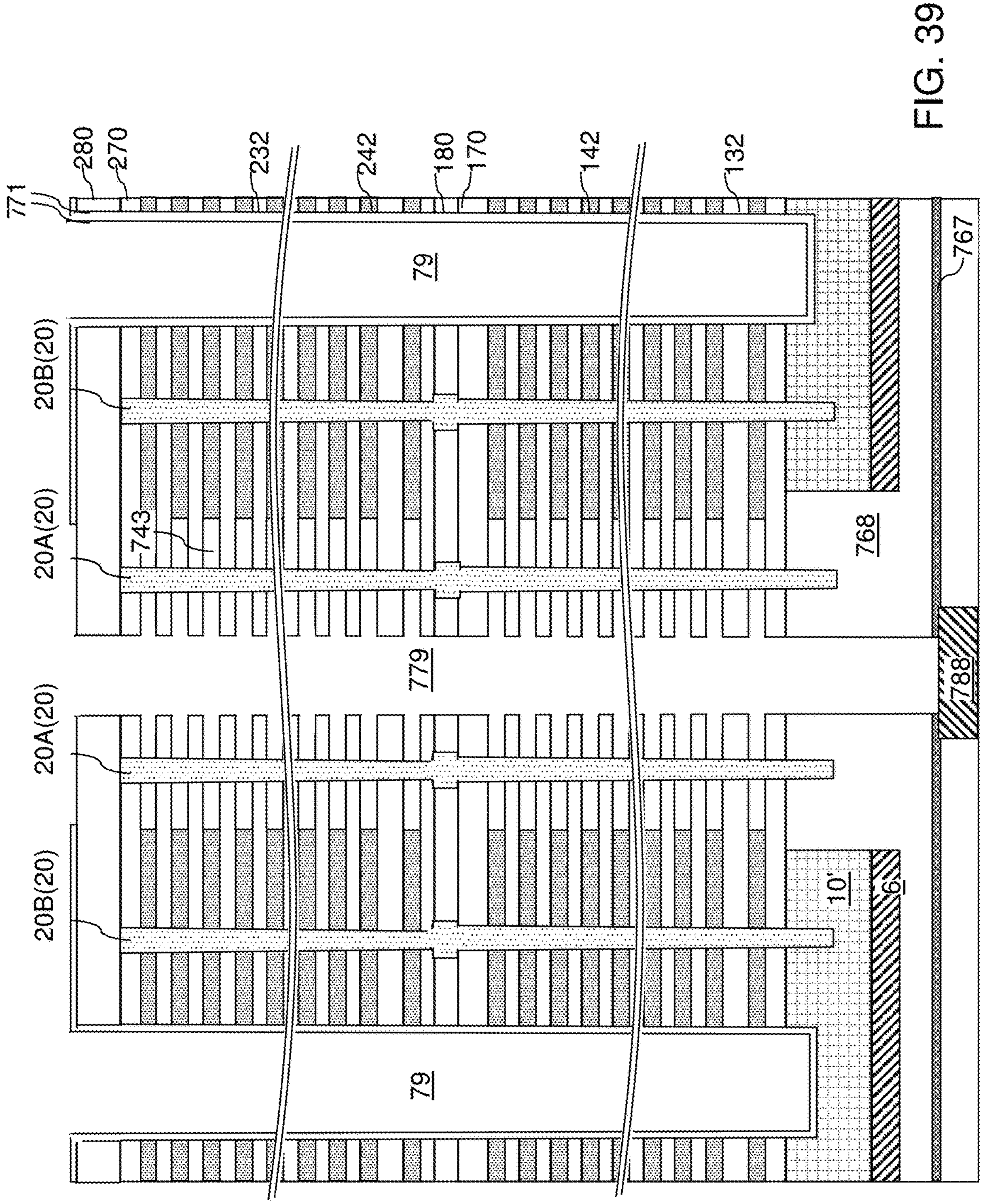
FIG. 39 is a vertical cross-sectional view of the fourth exemplary structure after formation of fin cavities around the via openings according to the fourth embodiment of the present disclosure.

Referring to FIG. 39, an isotropic etch process can be performed to laterally recess the first sacrificial material layers 142 and the second sacrificial material layers 242 selective to the first insulating layers 132 and the second insulating layers 232 around each array-region through-memory-level via cavity 779. For example, if the first sacrificial material layers 142 and the second sacrificial material layers 242 include silicon nitride and if the first insulating layers 132 and the second insulating layers 232 include silicon oxide, a wet etch process employing hot phosphoric acid can be performed to remove portions of the sacrificial material layers (142, 242) that are proximal to the access trenches 179 selective to the insulating layers (132, 232).

Fin-shaped lateral recesses are formed in volumes from which portions of the sacrificial material layers (142, 242) are removed. The fin-shaped lateral recesses are herein referred to as fin cavities 743. A vertical stack of fin cavities 743 can be formed around each array-region through-memory-level via cavity 779 according to the fourth embodiment of the present disclosure. The fin cavities 743 can have a uniform thickness, and can have outer boundaries that are equidistant from sidewalls of a respective array-region through-memory-level via cavity 779. The lateral extent of each fin cavity 743 can be selected such that the fin cavities 743 do not divide any alternating stack of insulating layers (132, 232) and sacrificial material layers (142, 242) into multiple disjoined stacks.

In one embodiment, at least one first support pillar structure 20A can be physically exposed to the fin cavities 743 around each array-region through-memory-level via cavity 779. In one embodiment, at least one first support pillar structure 20A can be laterally surrounded by each of the fin cavities 743 that are formed around an array-region through-memory-level via cavity 779. In one embodiment, a plurality of first support pillar structures 20A can be physically exposed to, and can be laterally surrounded by, a vertical stack of fin cavities 743 that laterally surrounds an array-region through-memory-level via cavity 779.

Generally, the fin cavities 743 can be formed around each array-region through-memory-level via cavity 779 by isotropically etching the portions of the sacrificial material layers (142, 242) that are proximal to the access trenches 179 selective to the insulating layers (132, 232). The duration of the isotropic etch process that forms the fin cavities 743 can be selected such that the first support pillar structures 20A are physically exposed to the fin cavities 743, while the second support pillar structures 20B are not physically exposed to fin cavities 743 upon formation of the fin cavities 743.

Figure 40:
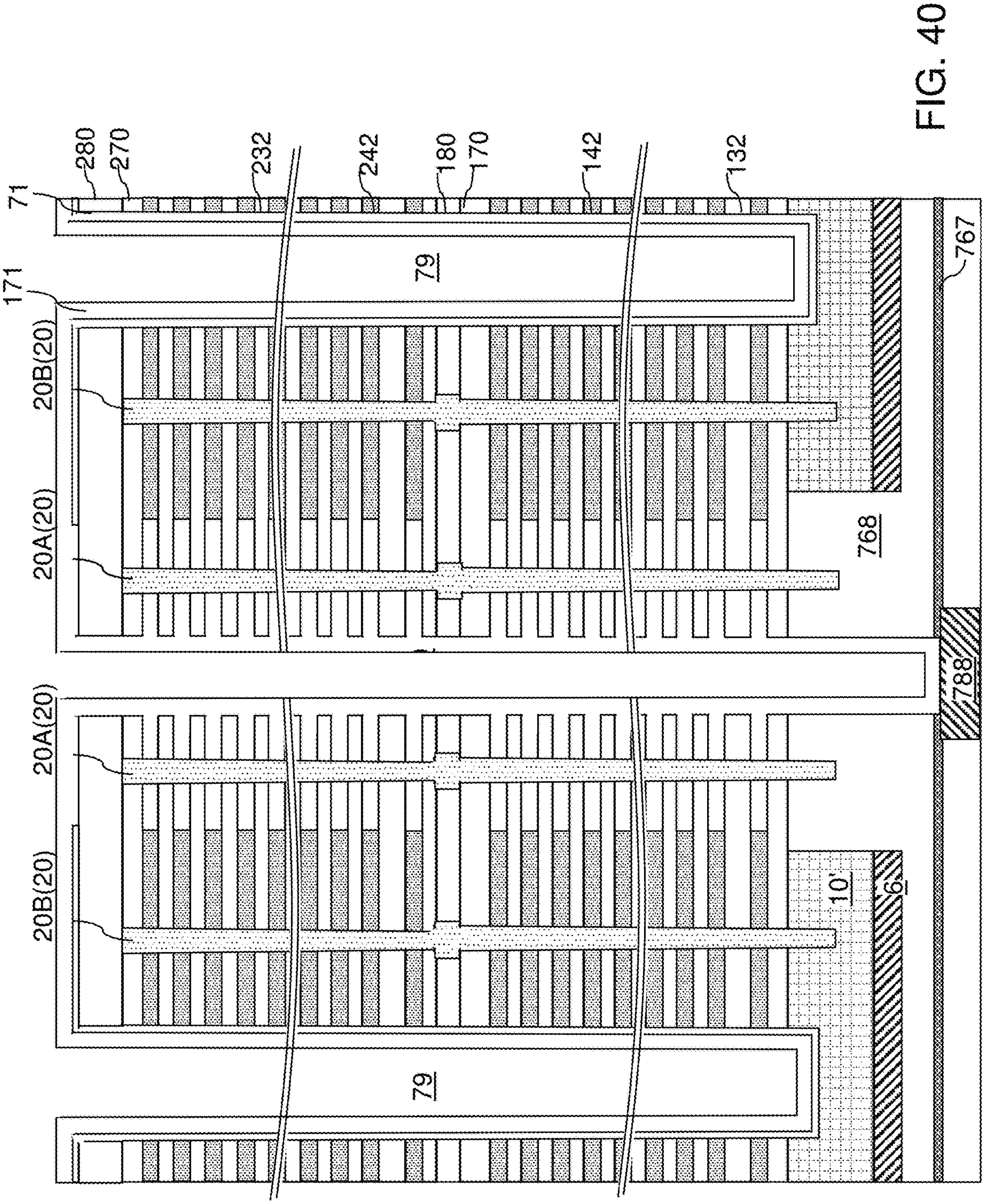
FIG. 40 is a vertical cross-sectional view of the fourth exemplary structure after formation of a dielectric material layer according to the fourth embodiment of the present disclosure.

Referring to FIG. 40, a dielectric fill material layer 171 can be deposited in the fin cavities 743 by a conformal deposition process such as a low pressure chemical vapor deposition (LPCVD) process. In one embodiment, the dielectric fill material layer 171 may include undoped silicate glass, a doped silicate glass, or a dielectric metal oxide material (such as aluminum oxide). For example, the dielectric fill material layer 171 may include undoped silicate glass.

Figure 41A:
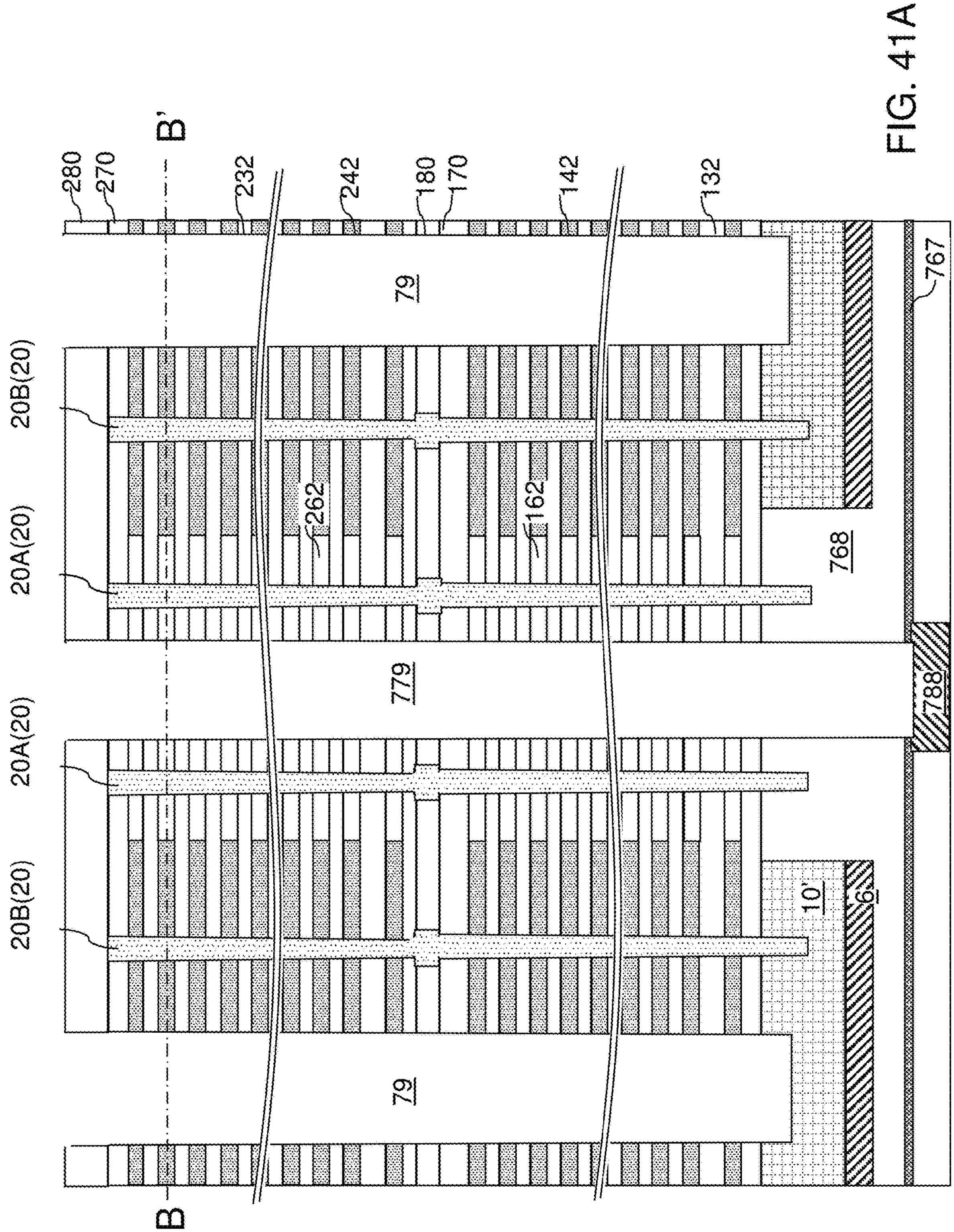
FIG. 41A is a vertical cross-sectional view of the fourth exemplary structure after formation of a vertical stack of dielectric oxide plates according to the fourth embodiment of the present disclosure.
Figure 41B:
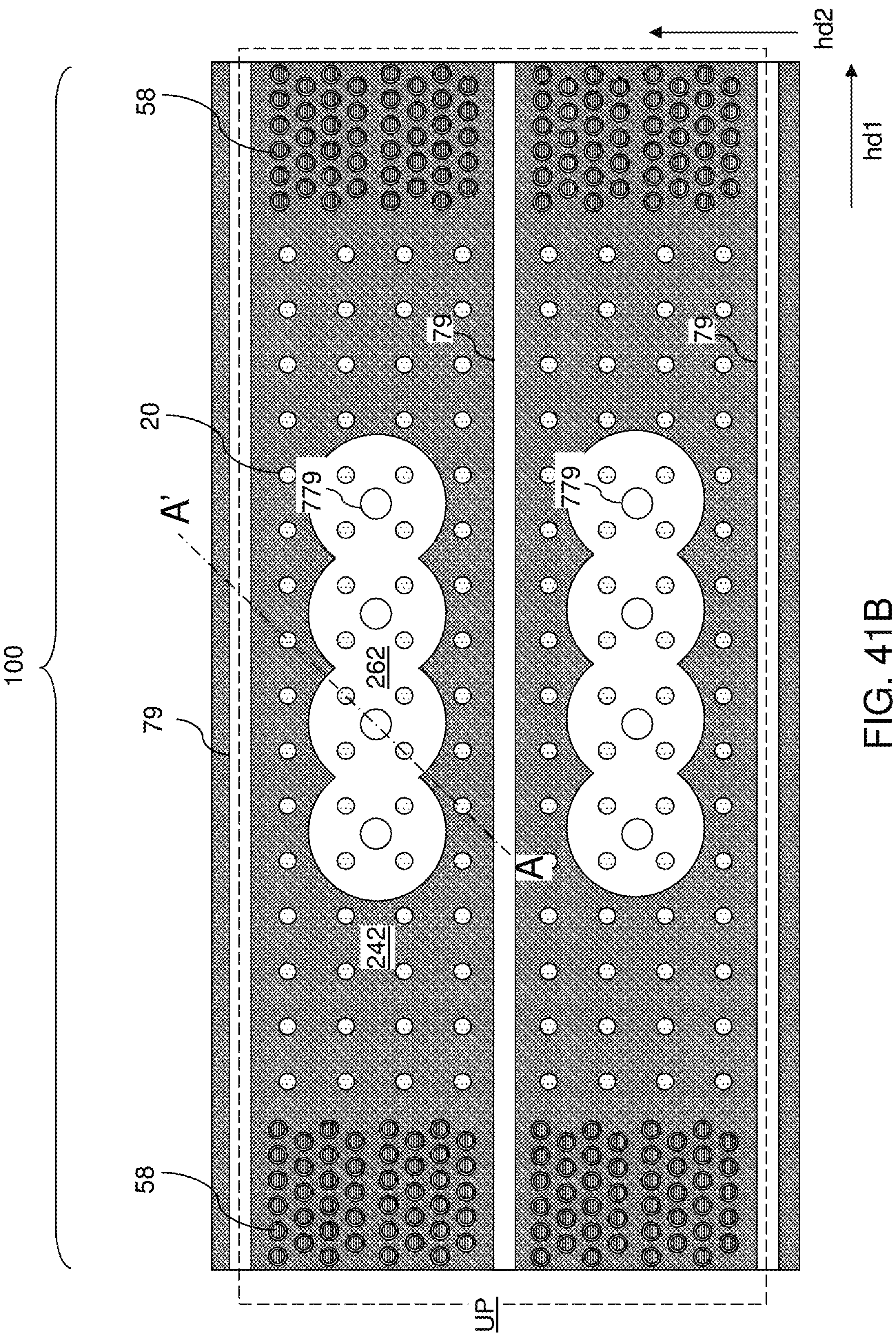
FIG. 41B is a horizontal cross-sectional view of the fourth exemplary structure along the plane B-B' of FIG. 41A. The vertical plane A-A' is the plane of the vertical cross-sectional view of FIG. 41A.

Referring to FIGS. 41A and 41B, an etch back process can be performed to remove the portions of the dielectric fill material layer 171 located in the access trenches 179, in the backside trenches 79, or above the first contact-level dielectric layer 280. The etch back process may include an isotropic etch process or an anisotropic etch process. For example, if the dielectric fill material includes silicon oxide, an isotropic etch process employing hydrofluoric acid may be employed to etch back portions of the dielectric fill material from inside the access trenches 179 and the backside trenches 79, and from above the first contact-level dielectric layer 280.

Remaining portions of the dielectric fill material layer 171 that fills the fin cavities 743 include dielectric oxide plates (162, 262). The dielectric oxide plates (162, 262) include first dielectric oxide plates 162 that contact the first sacrificial material layers 142 and second dielectric oxide plates 262 that contact the second sacrificial material layers 142. Thus, portions of the sacrificial material layers (142, 242) that are proximal to the array-region through-memory-level via cavities 779 are replaced with the dielectric oxide plates (162, 262). A vertical stack of dielectric oxide plates (162, 262) is provided around each array-region through-memory-level via cavity 779. The vertical stack of dielectric oxide plates (162, 262) is interlaced with laterally extending portions of the insulating layers (132, 232) of the at least one alternating stack {(132, 142), (232, 242)}. Each dielectric oxide plate (162, 262) is located between a respective vertically neighboring pair of insulating layers (132, 232) of the at least one alternating stack {(132, 142), (232, 242)}. Replacement of the portions of the sacrificial material layers (142, 242) that are proximal to the array-region through-memory-level via cavities 779 with the dielectric oxide plates (162, 262) can be performed while the etch barrier liner 71 covers the sidewalls of the backside trenches 79. Each outer sidewall of a dielectric oxide plate (162, 262) can contact a sidewall of a sacrificial material layer (142, 242). In one embodiment, each dielectric oxide plate (162, 262) can comprise a convex sidewall that is equidistant from a sidewall of an array-region through-memory-level via cavity 779. Subsequently, the etch barrier liner 71 can be removed by extension of the isotropic etch process.

In case a plurality of array-region through-memory-level via cavities 779 is formed over a portion of lower-level dielectric material layers 760 that fills an opening in the in-process source-level material layers 10', a set of fin cavities 743 may be adjoined among one another at each level of the sacrificial material layers (142, 242). In this case, a dielectric oxide plate (162, 262) may laterally surround the plurality of array-region through-memory-level via cavities 779 that is formed over the portion of the lower-level dielectric material layers 760 that fills the opening in the in-process source-level material layers 10'.

Figure 42:
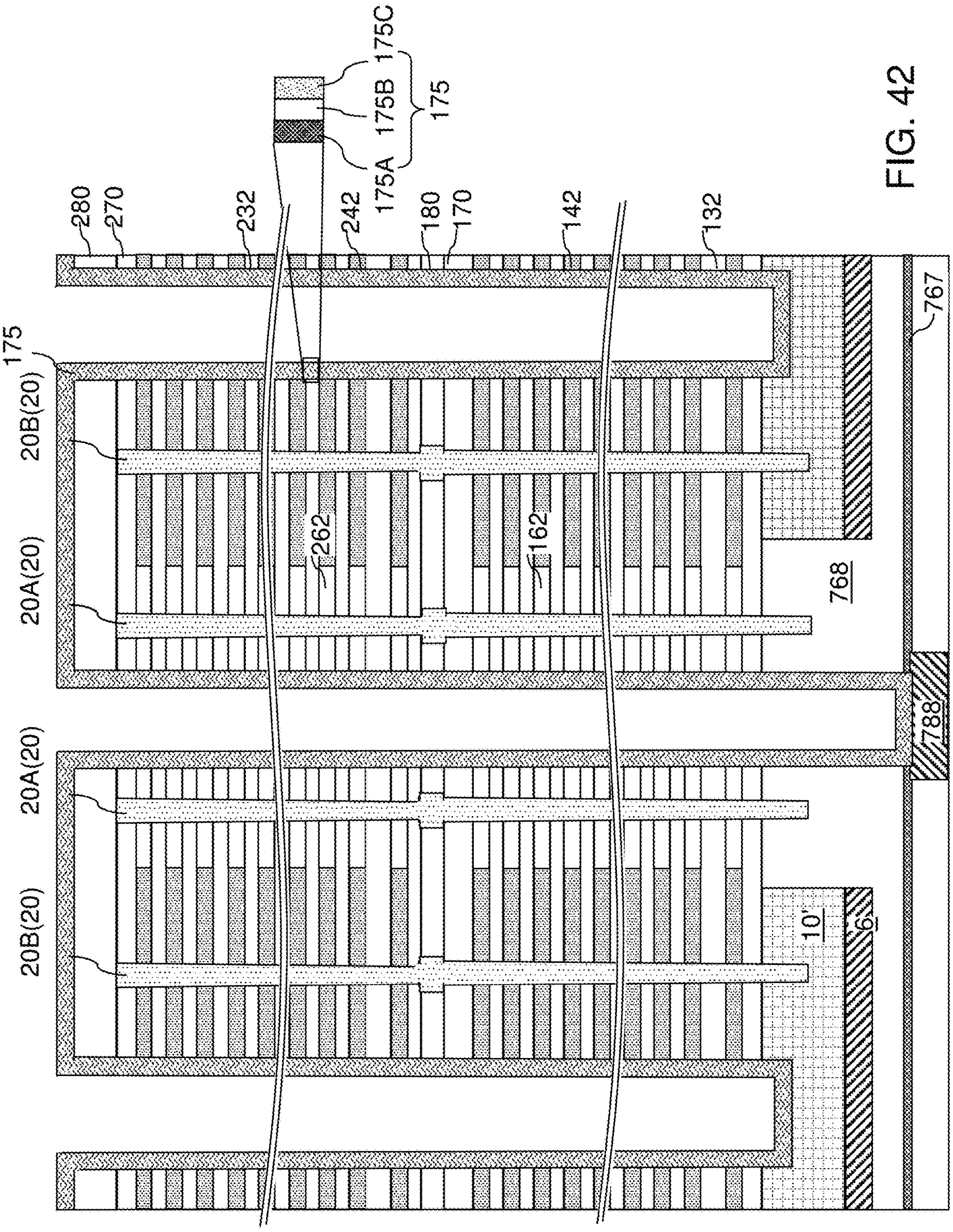
FIG. 42 is a vertical cross-sectional view of the fourth exemplary structure after formation of at least one sacrificial barrier layer according to the fourth embodiment of the present disclosure.

Referring to FIG. 42, a sacrificial etch barrier layer 175 can be optionally formed in the backside trenches 79 and the array-region through-memory-level via cavities 779 and over the first contact-level dielectric layer 280. For example, the sacrificial etch barrier layer 75 may include a layer stack including a first silicon oxide barrier layer 175A, a silicon nitride barrier layer 175B, and a second silicon oxide barrier layer 175C. Each of the silicon oxide barrier layer 175A, the silicon nitride barrier layer 175B, and the second silicon oxide barrier layer 175C may have a respective thickness in a range from 3 nm to 30 nm, although lesser and greater thicknesses may also be employed. Alternatively, the sacrificial etch barrier layer 75 may include a layer stack including a silicon nitride barrier layer 175A, a silicon oxide barrier layer 175B, and an amorphous silicon barrier layer 175C.

Figure 43:
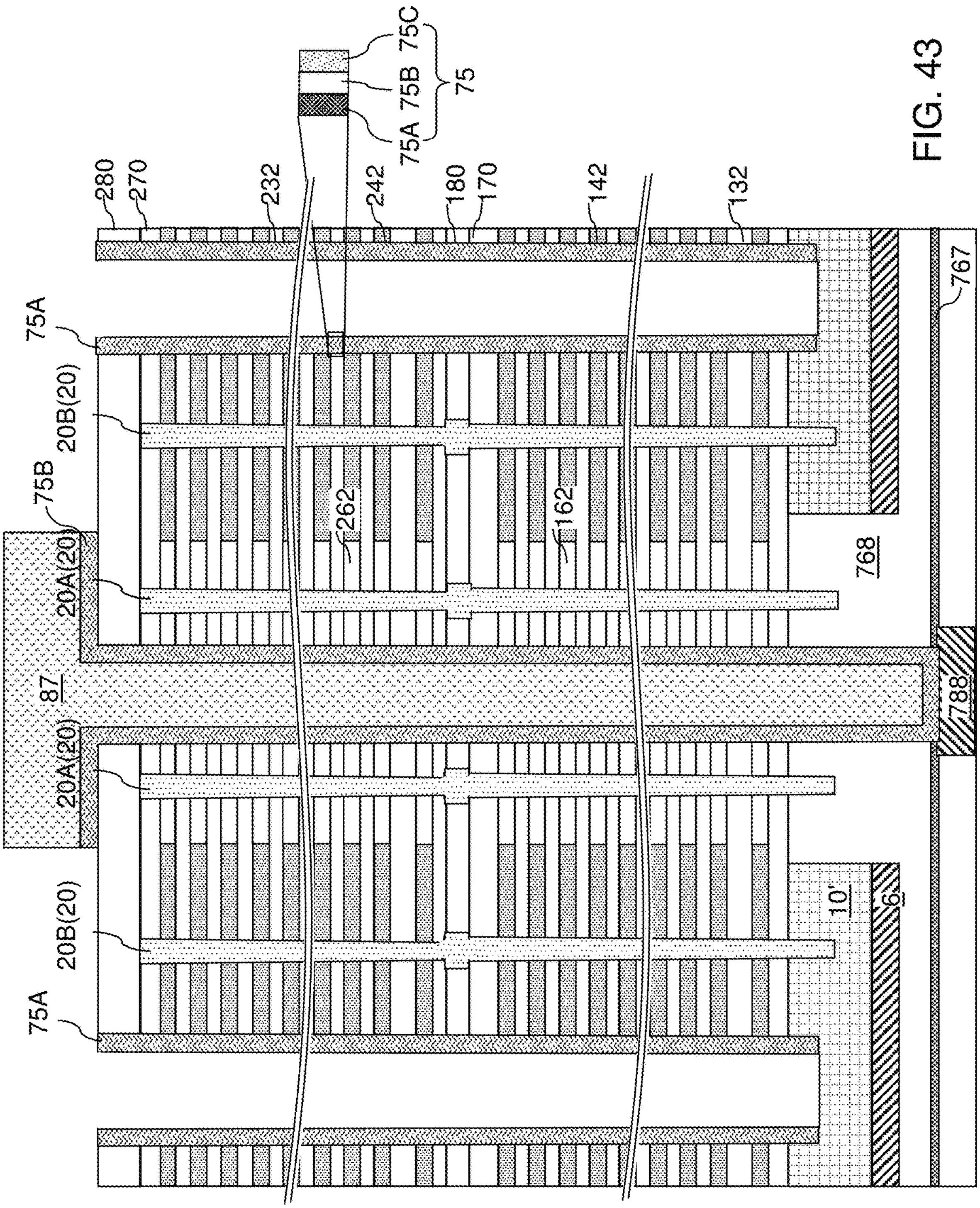
FIG. 43 is a vertical cross-sectional view of the fourth exemplary structure after patterning of the at least one sacrificial barrier layer according to the fourth embodiment of the present disclosure.

Referring to FIG. 43, the sacrificial etch barrier layer 175 can be patterned, for example, by applying and patterning a photoresist layer 87 over the sacrificial etch barrier layer 75 such that the patterned photoresist layer 87 covers each array-region through-memory-level via cavity 779. Unmasked horizontal portions of the sacrificial etch barrier layer 175 may be removed by performing an anisotropic etch process. Sacrificial etch barrier spacers 75A including remaining portions of the sacrificial etch barrier layer 175 can be formed on sidewalls of the backside trenches 79. A sacrificial etch barrier liner 75B including a remaining portion of the sacrificial etch barrier layer 175 can cover each array-region through-memory-level via cavity 779. The photoresist layer 87 can be subsequently removed, for example, by ashing.

Figure 44:
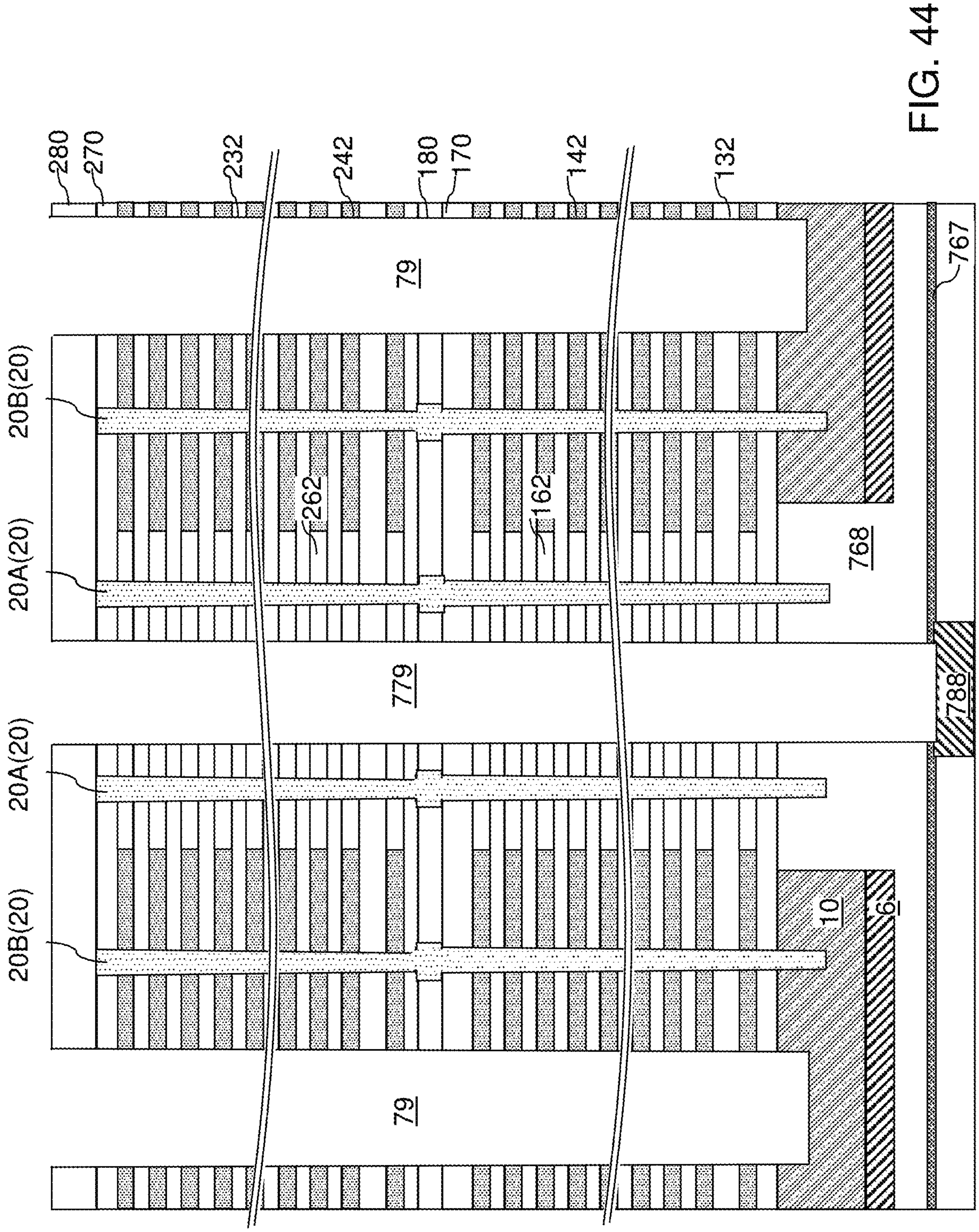
FIG. 44 is a vertical cross-sectional view of the fourth exemplary structure after replacement of in-process source-level material layers with source-level material layers according to the fourth embodiment of the present disclosure.

Referring to FIG. 44, the processing steps of FIGS. 19A-19D can be performed to replace the in-process source-level material layers 10' with source-level material layers 10. The sacrificial etch barrier spacers 75A and the sacrificial etch barrier liners 75B can be collaterally removed during replacement of the in-process source-level material layers 10' with the source-level material layers 10.

Figure 45A:
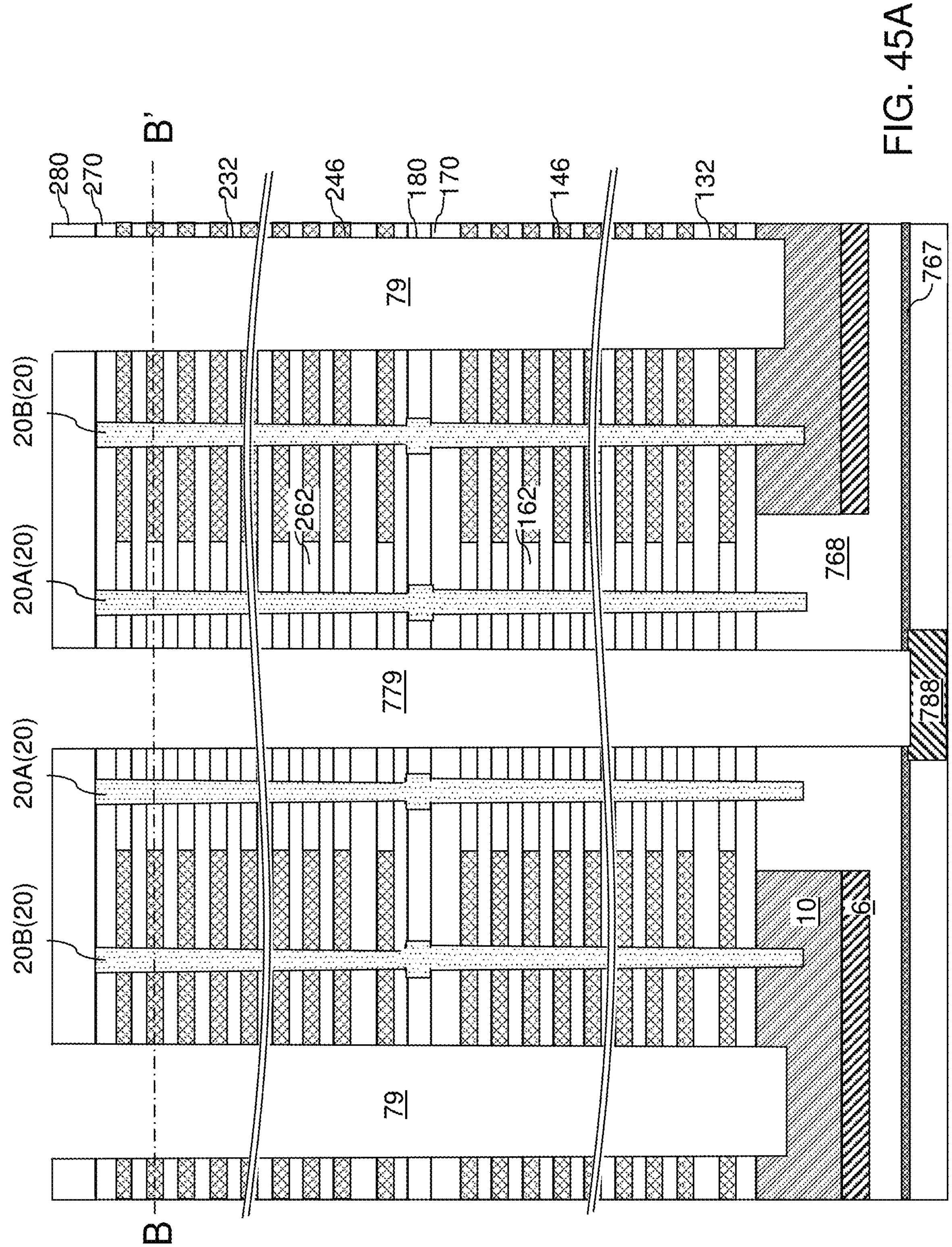
FIG. 45A is a vertical cross-sectional view of the fourth exemplary structure after formation of electrically conductive layers according to the fourth embodiment of the present disclosure.
Figure 45B:
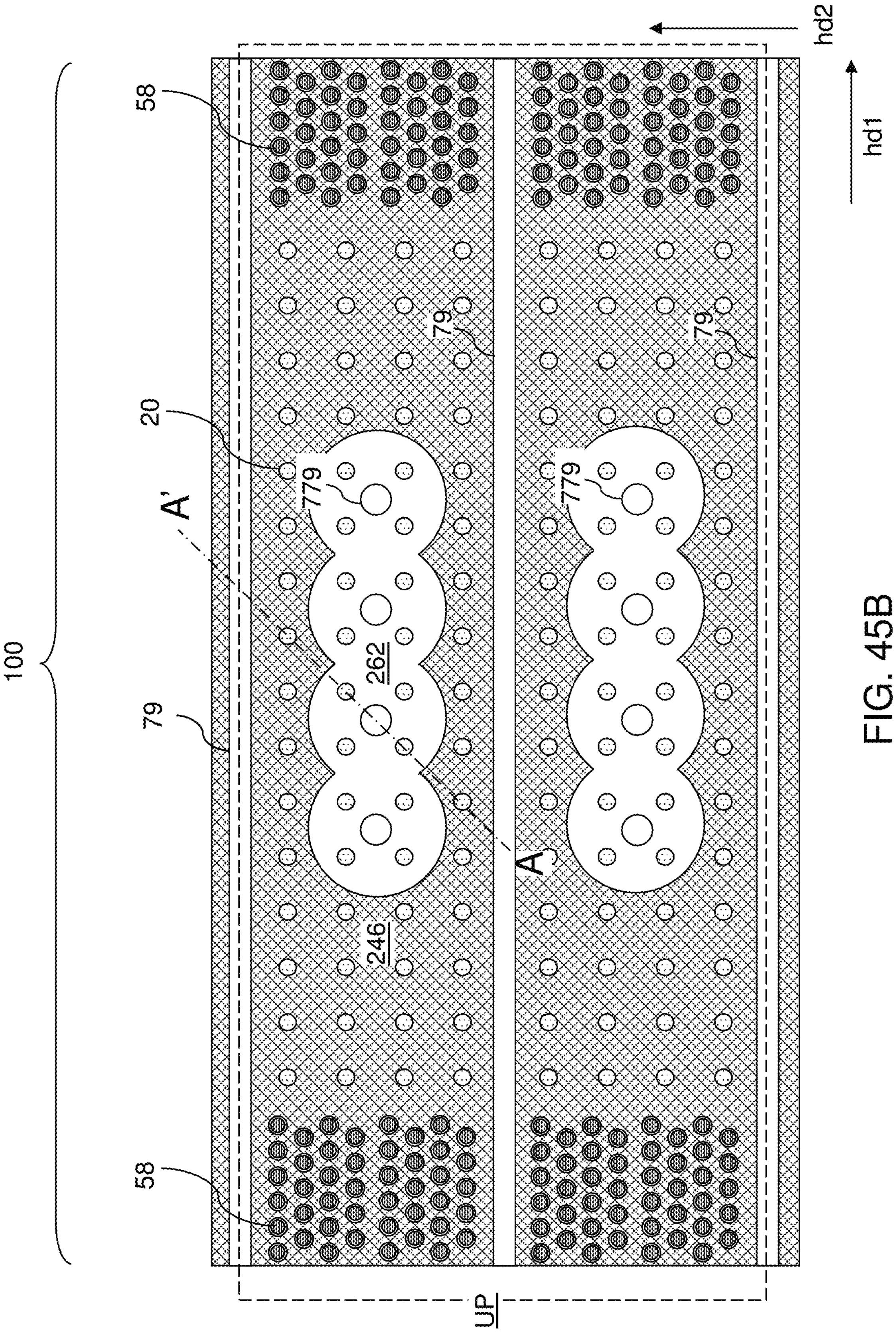
FIG. 45B is a horizontal cross-sectional view of the fourth exemplary structure along the plane B-B' of FIG. 45A. The vertical plane A-A' is the plane of the vertical cross-sectional view of FIG. 45A.

Referring to FIGS. 45A and 45B, the processing steps of FIGS. 21A-21D can be performed to remove the sacrificial material layers (142, 242) selective to the insulating layers (132, 232), the dielectric oxide plates (162, 262), the first and second insulating cap layers (170, 270), the first contact-level dielectric layer 280, and the source contact layer 114, the dielectric semiconductor oxide plates 122, and the annular dielectric semiconductor oxide spacers 124. An isotropic etchant that selectively etches the materials of the sacrificial material layers (142, 242) with respect to the materials of the insulating layers (132, 232), the first and second insulating cap layers (170, 270), the retro-stepped dielectric material portions (165, 265), and the material of the outermost layer of the memory films 50 may be introduced into the backside trenches 79, for example, using an isotropic etch process. Backside recesses are formed in volumes from which the sacrificial material layers (142, 242) are removed.

Subsequently, the processing steps of FIGS. 22A-22D can be performed to form electrically conductive layers (146, 246) in the backside recesses. The electrically conductive layers (146, 246) comprise first electrically conductive layers 146 that are formed in the first backside recesses 143 and second electrically conductive layers 246 that are formed in the second backside recesses 243.

Figure 46A:
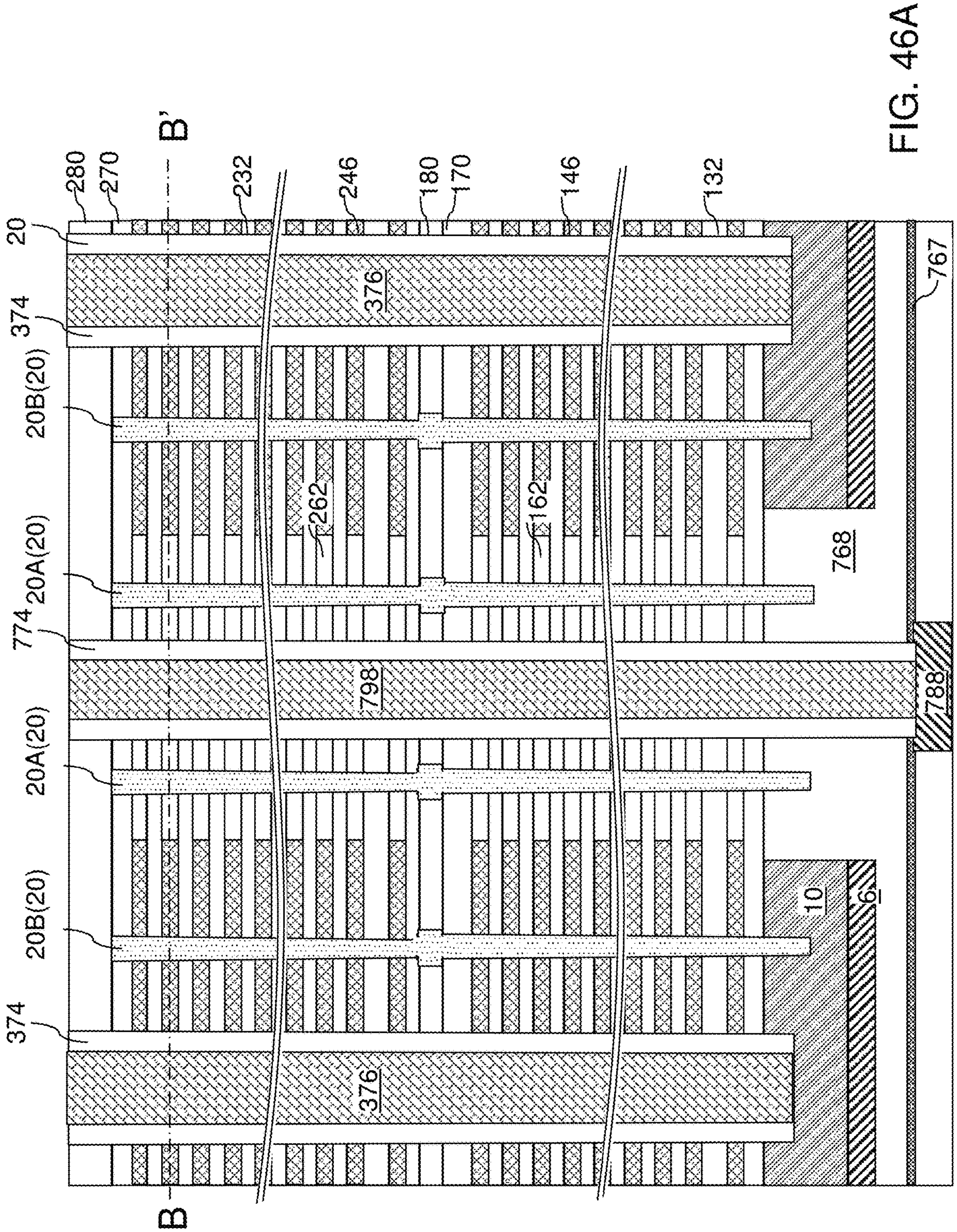
FIG. 46A is a vertical cross-sectional view of the fourth exemplary structure after formation of backside trench fill structures and t according to the fourth embodiment of the present disclosure.
Figure 46B:
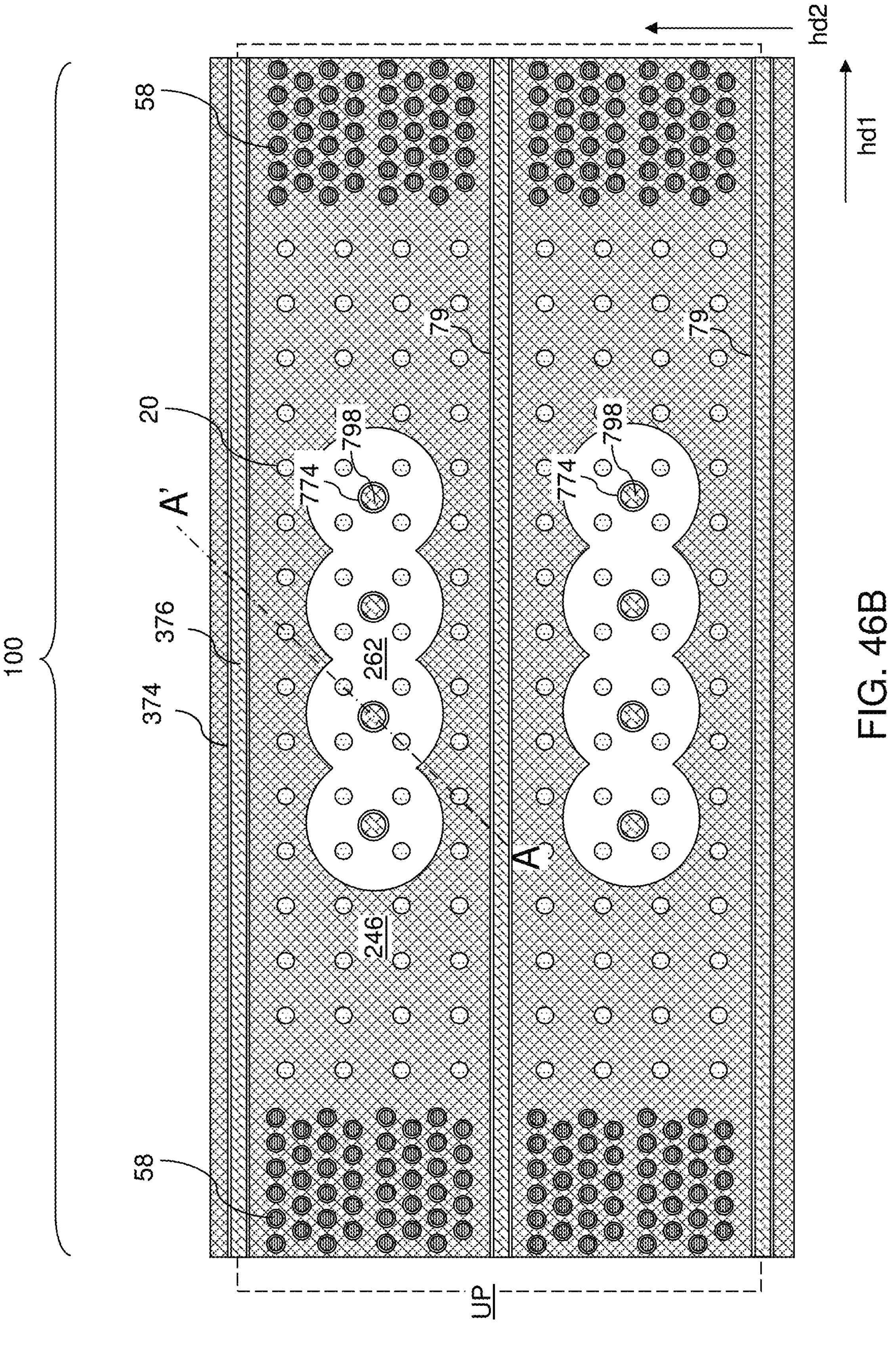
FIG. 46B is a horizontal cross-sectional view of the fourth exemplary structure along the plane B-B' of FIG. 46A. The vertical plane A-A' is the plane of the vertical cross-sectional view of FIG. 46A.
Figure 47A:
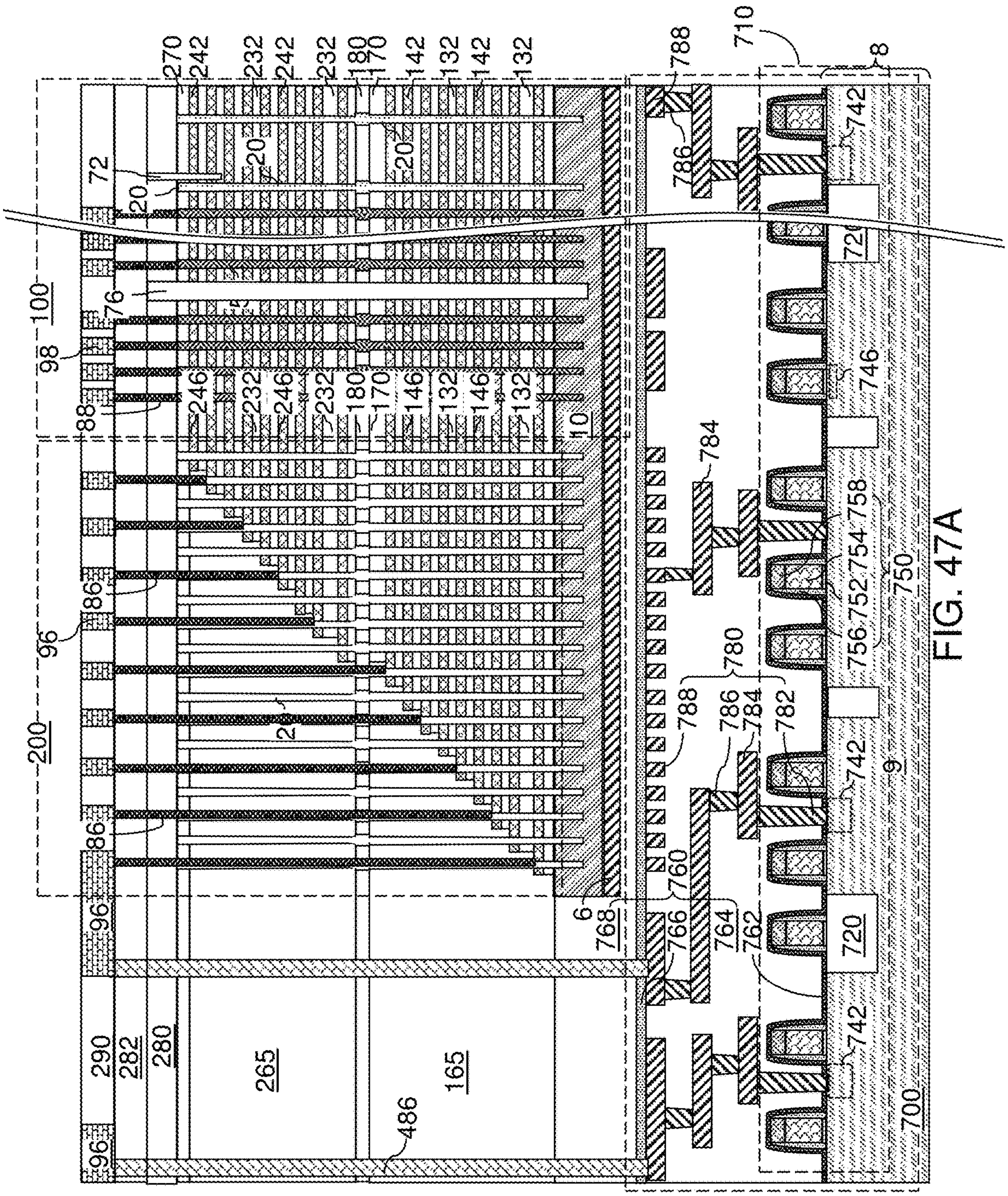
FIG. 47A is a vertical cross-sectional view of the fourth exemplary structure after formation of contact via structures and upper-level metal interconnect structures according to the fourth embodiment of the present disclosure.
Figure 47B:
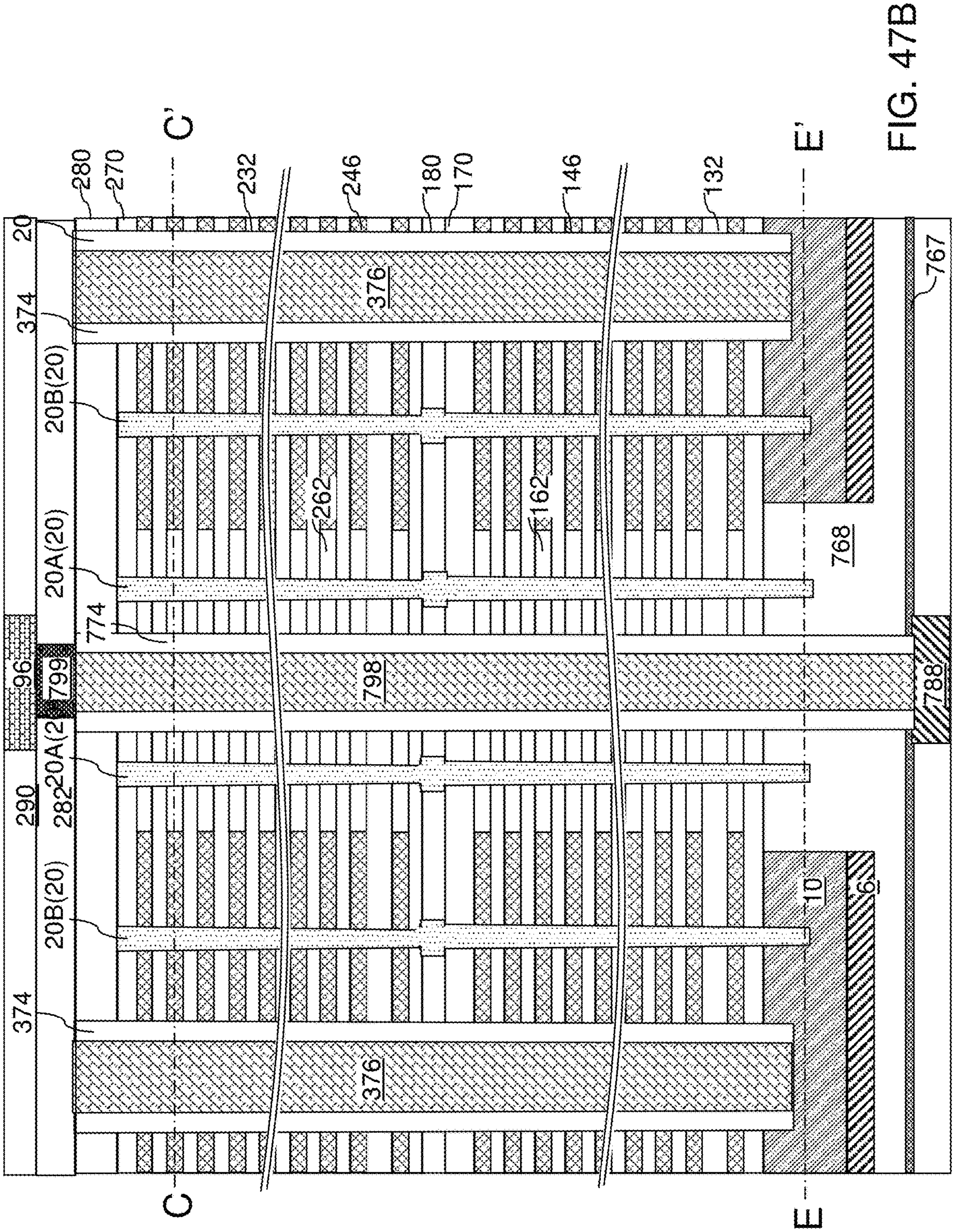
FIG. 47B is another vertical cross-sectional view of the fourth exemplary structure of FIG. 47A.
Figure 47C:
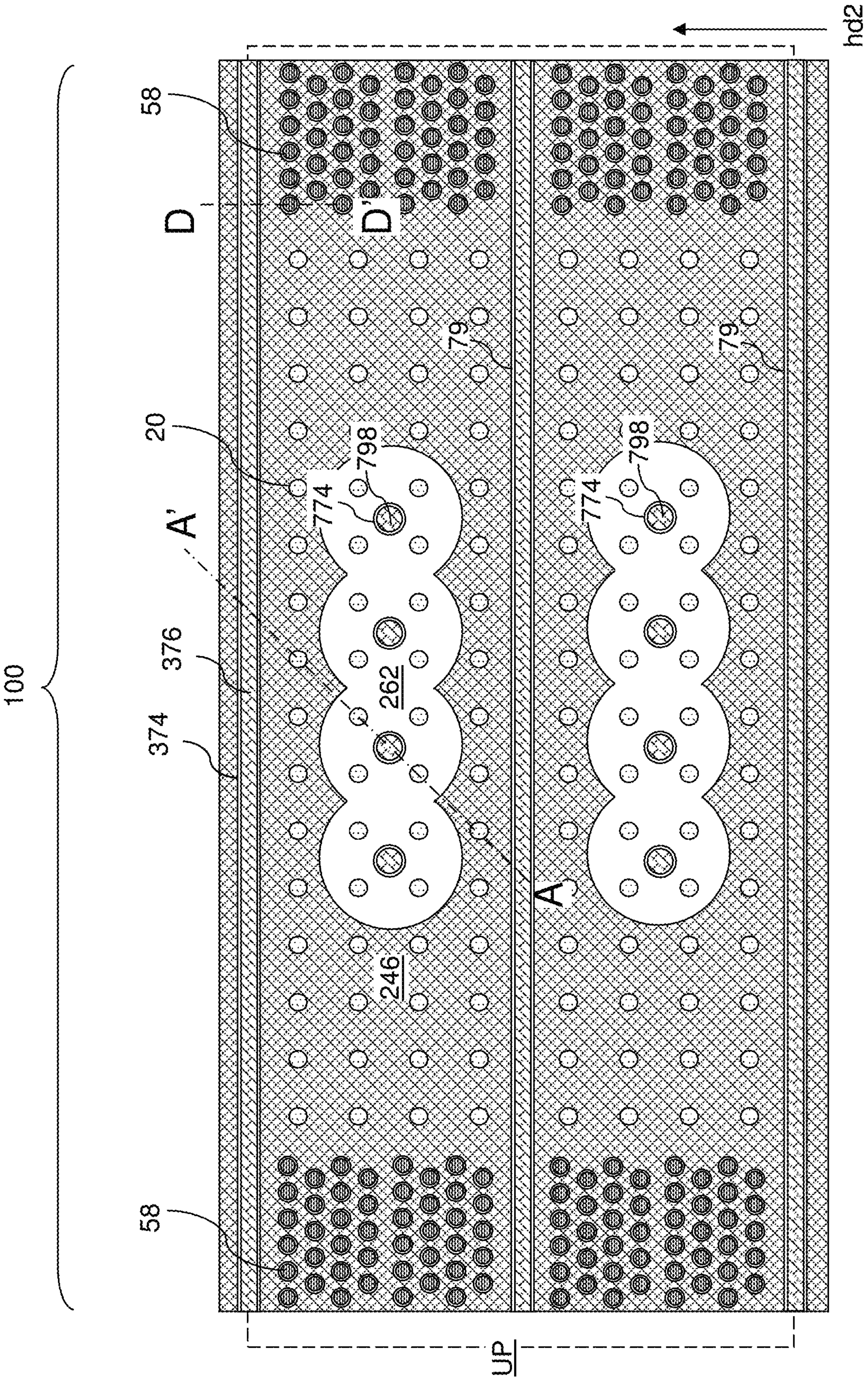
FIG. 47C is a horizontal cross-sectional view of the fourth exemplary structure along the horizontal plane C-C' of FIG. 47B. The hinged vertical plane B-B' corresponds to the plane of the vertical cross-sectional view of FIG. 47B.
Figure 47D:
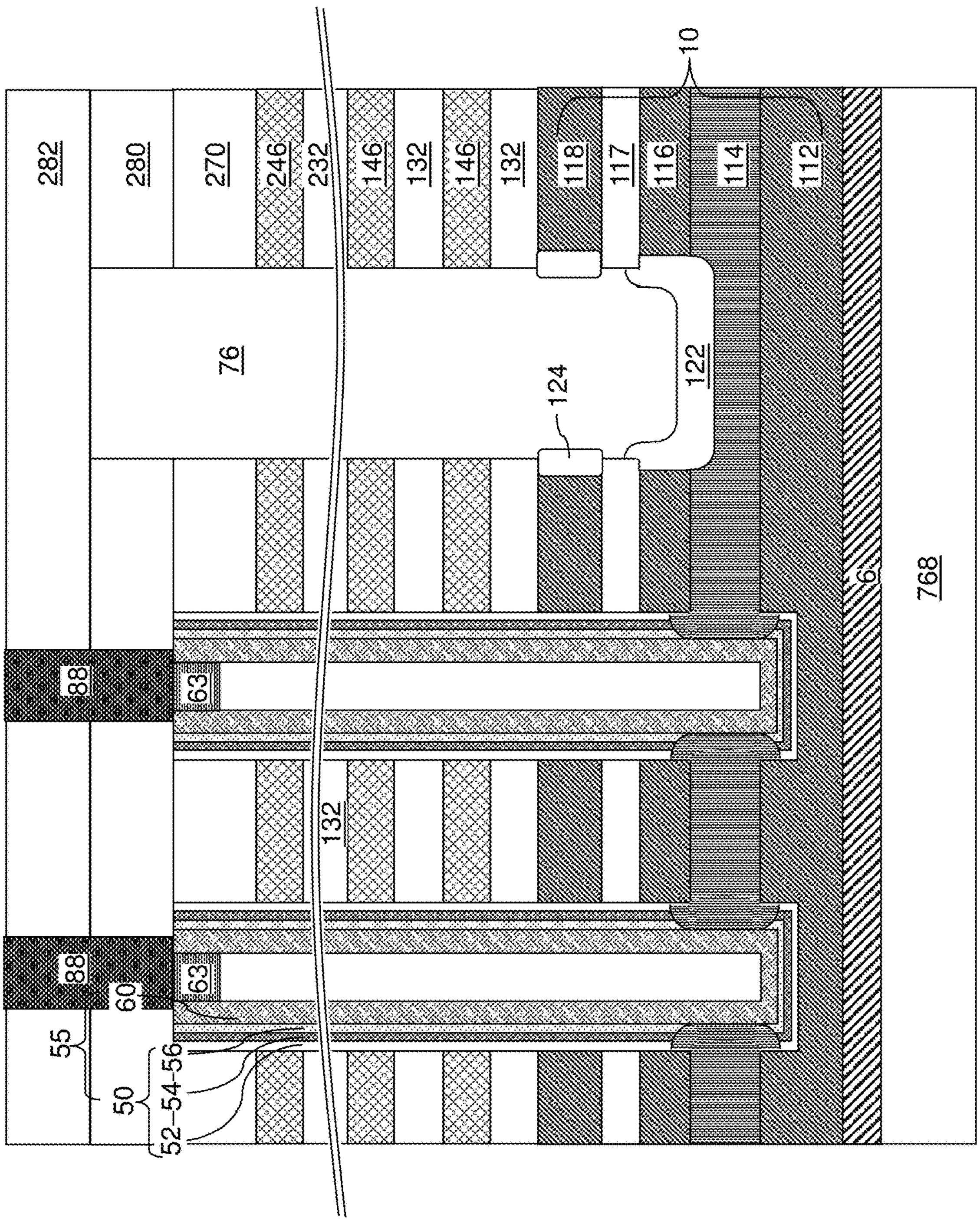
FIG. 47D is a vertical cross-sectional view of the fourth exemplary structure along the vertical plane D-D' of FIG. 47C.
Figure 47E:
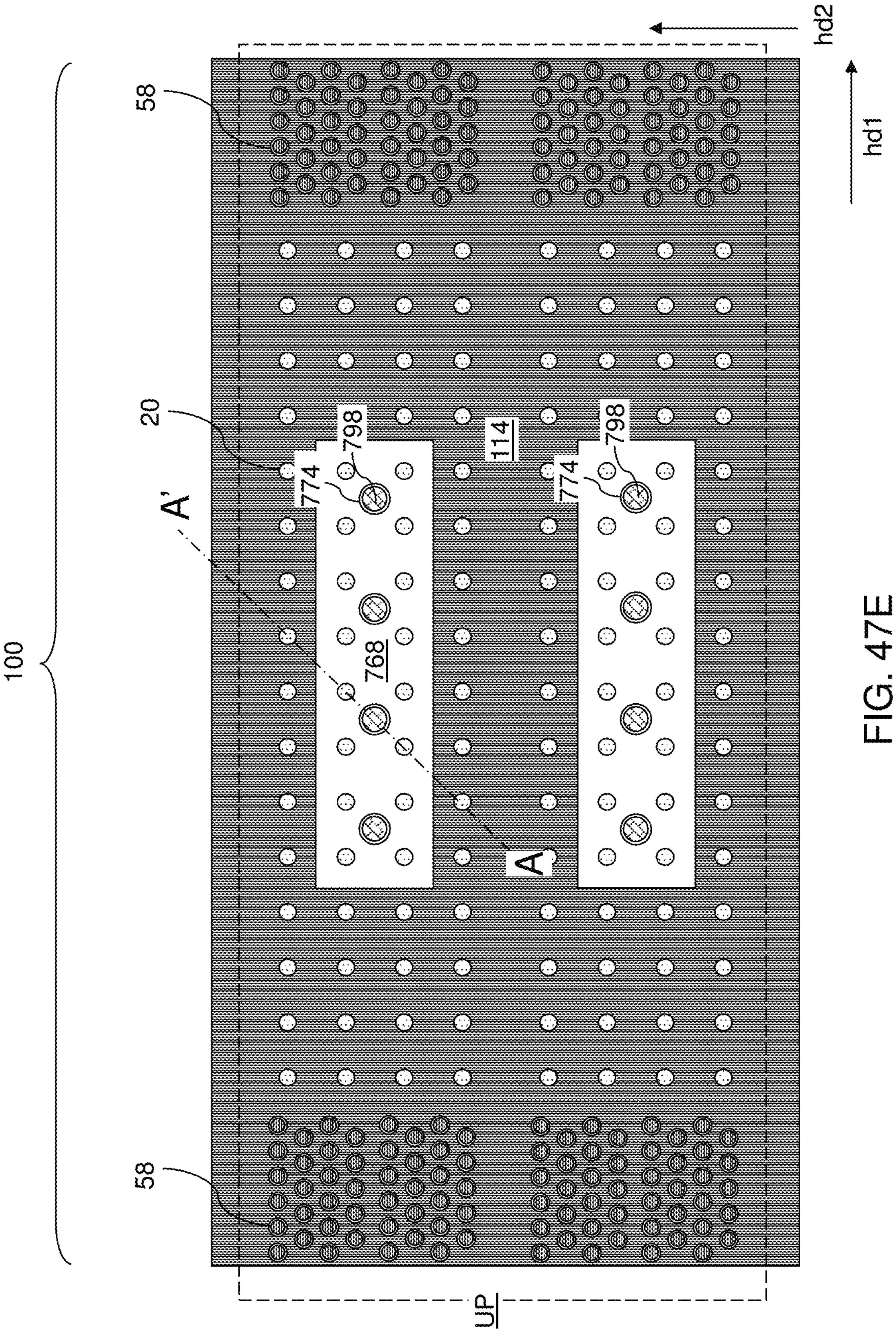

Referring to FIGS. 46A and 46B, an insulating liner can be conformally deposited in the backside trenches 79 and the array-region through-memory-level via cavities 779. The insulating liner includes an insulating material such as silicon oxide or silicon nitride, and can have a thickness in a range from 6 nm to 120 nm, although lesser and greater thicknesses can also be employed. An anisotropic etch process can be performed to remove horizontal portions of the insulating liner. Horizontal portions of the dielectric semiconductor oxide plates 122 can be removed by the anisotropic etch process, and a surface of the source contact layer 114 can be physically exposed at the bottom of each backside trench 79. A top surface of a landing-pad-level metal interconnect structure 788 can be physically exposed at the bottom of each array-region through-memory-level via cavity 779. Remaining vertically-extending portions of the insulating liner include backside-trench insulating spacers 374 that remain at peripheral regions of the backside trenches 79, and insulating via spacers 774 that are remain at peripheral regions of the array-region through-memory-level via cavities 779.

At least one conductive material can be deposited in remaining volumes of the backside trenches 79 and the array-region through-memory-level via cavities 779. The at least one conductive material can include, for example, a conductive metallic liner material (such as TiN, TaN, or WN) and a metallic fill material (such as W, Cu, Mo, Ru, Co, etc.). Excess portions of the at least one conductive material can be removed from above the horizontal plane including the top surface of the first contact-level dielectric layer 280 by a planarization process. The planarization process may employ a recess etch process and/or a chemical mechanical planarization process. Each remaining portion of the at least one conductive material in the backside trenches 79 comprise a source contact structure (e.g., source local interconnect) 376, which is a conductive wall structure that laterally extends along the first horizontal direction hd1. Each remaining portion of the at least one conductive material in the array-region through-memory-level via cavities 779 comprise an array-region through-memory-level via structure 798 that contacts a top surface of a respective landing-pad-level metal interconnect structure 788.

Referring to FIGS. 47A-47E, a second contact-level dielectric layer 282 can be formed over the first contact-level dielectric layer 280 by deposition of a dielectric material such as silicon oxide. The thickness of the second contact-level dielectric layer 282 may be in a range from 200 nm to 600 nm, although lesser and greater thicknesses can also be employed.

Various via cavities can be formed through the second contact-level dielectric layer 282 and underlying dielectric material layers and can be subsequently filled with at least one conductive material to form various contact via structures (88, 86, 486, 799). The various via cavities may be formed employing a single patterned photoresist layer as an etch mask layer and employing a single anisotropic etch process, or may be formed employing a plurality of patterned photoresist layers as etch mask layers and employing a plurality of anisotropic etch processes.

In case a single patterned photoresist layer and a single anisotropic etch process are employed to form the various via cavities, the openings in the patterned photoresist layer can include openings that overlie the drain regions 63 of the memory opening fill structures 58, openings that overlie horizontal surfaces of the first stepped surfaces of a first alternating stack of the first insulating layers 132 and the first electrically conductive layers 146 or of the second stepped surfaces of a second alternating stack of the second insulating layers 232 and the second electrically conductive layers 246, openings that overlie a respective array-region through-memory-level via structure 798, and optionally openings located over portions of the retro-stepped dielectric material portions (165, 265) that do not overlie the source-level material layers 10. In this case, the anisotropic etch process can have an etch chemistry that is selective to the materials of the drain regions 63, the materials of the first electrically conductive layers 146 and the second electrically conductive layers 246, the material of the array-region through-memory-level via structures 798, and the materials of the lower-level metal interconnect structures 780.

In case a plurality of patterned photoresist layers and a plurality of anisotropic etch processes are employed to form the various via cavities, the openings in each patterned photoresist layer includes a respective subset of the openings that overlie the drain regions 63 of the memory opening fill structures 58, the openings that overlie horizontal surfaces of the first stepped surfaces of a first alternating stack of the first insulating layers 132 and the first electrically conductive layers 146 or of the second stepped surfaces of a second alternating stack of the second insulating layers 232 and the second electrically conductive layers 246, the openings that overlie a respective array-region through-memory-level via structure 798, and optionally the openings located over portions of the retro-stepped dielectric material portions (165, 265) that do not overlie the source-level material layers 10. In this case, each anisotropic etch process can have an etch chemistry that is selective to a respective subset of the materials of the drain regions 63, the materials of the first electrically conductive layers 146 and the second electrically conductive layers 246, the material of the array-region through-memory-level via structures 798, and the materials of the lower-level metal interconnect structures 780. The various via cavities can include drain contact via cavities that are formed above the drain regions 63, layer contact via cavities that are formed on the electrically conductive layers (146, 246), peripheral through-memory-level via cavities that are formed through the retro-stepped dielectric material portions (165, 265) on a respective one of the lower-level metal interconnect structures 780 (such as a landing-pad-level metal interconnect structure 788), and array-region connection cavities that are formed on a respective one of the array-region through-memory-level via structures 798.

After formation of the various via cavities and removal of the patterned photoresist layer(s), at least one conductive material can be deposited in the various via cavities, for example, by chemical vapor deposition, physical vapor deposition, electroplating, and/or electroless plating. Excess portions of the at least one conductive material can be removed from above the horizontal plane including the top surface of the second contact-level dielectric layer 282. Contact via structures (88, 86, 486, 798) can be formed in the various via cavities.

The contact via structures (88, 86, 486, 799) include drain contact via structures 88 that contact a respective one of the drain regions 63, layer contact via structures 86 that contact a respective one of the electrically conductive layers (146, 246), peripheral through-memory-level via structures 486 that extend through the retro-stepped dielectric material portions (165, 265) and contact a respective one of the lower-level metal interconnect structures 780, and array-region connection via structures 799 that contact a respective one of the array-region through-memory-level via structures 798. Each peripheral through-memory-level via structures 486 is a contact via structure that is formed outside the areas of the memory array region 100 and the staircase region 200, and vertically extends through the memory level, i.e., the level located between the horizontal plane including the bottom surface of the source-level material layers 10 and the horizontal plane including the top surfaces of the memory opening fill structures 58. Each array-region connection via structure 799 is a conductive via structure that contacts a respective one of the through-memory-level via structures 798.

In one embodiment, each array-region through-memory-level via structure 798 can vertically extend through a respective opening in the source-level material layers 10 and can contact a portion of the lower-level dielectric material layers 760 (such as the at least one second dielectric layer 768) that fill the opening in the source-level material layer 10. In one embodiment, each array-region through-memory-level via structure 798 can contact a portion of the lower-level dielectric material layers 760 (such as the at least one second dielectric layer 768) that fill the opening in the source-level material layer 10. In one embodiment, each array-region through-memory-level via structure 798 can be formed in regions located between support pillar structures 20, and can be laterally spaced from the electrically conductive layers (146, 246) by surrounding portions of the dielectric oxide plates (162, 262). Further, each array-region through-memory-level via structure 798 can be laterally spaced from the source-level material layers 10 by portions of the lower-level dielectric material layers 760 that fill the openings in the source-level material layers 10. In one embodiment, the lower-level dielectric material layers 760 may include an etch stop dielectric layer 767 that contacts top surfaces of the landing-pad-level metal interconnect structure 788. In this case, each array-region through-memory-level via structure 798 can extend through, and contact, the etch stop dielectric layer 767, which may include a silicon nitride layer or a dielectric metal oxide layer.

Subsequently, upper-level dielectric material layers and upper-level metal interconnect structures can be formed. For example, upper-level dielectric material layers can include a line-level dielectric layer 290 and metal line structures (96, 98) embedded therein. The metal line structures (96, 98) can include bit lines 98 that contact a respective subset of the drain contact via structures 88, and interconnection metal lines 96 that contact at least one of the layer contact via structures 86, the peripheral through-memory-level via structures 486, and the array-region connection via structures 799.

FIGS. 48A-48D are vertical cross-sectional views of alternative embodiments of the fourth exemplary structure.

Figure 48A:
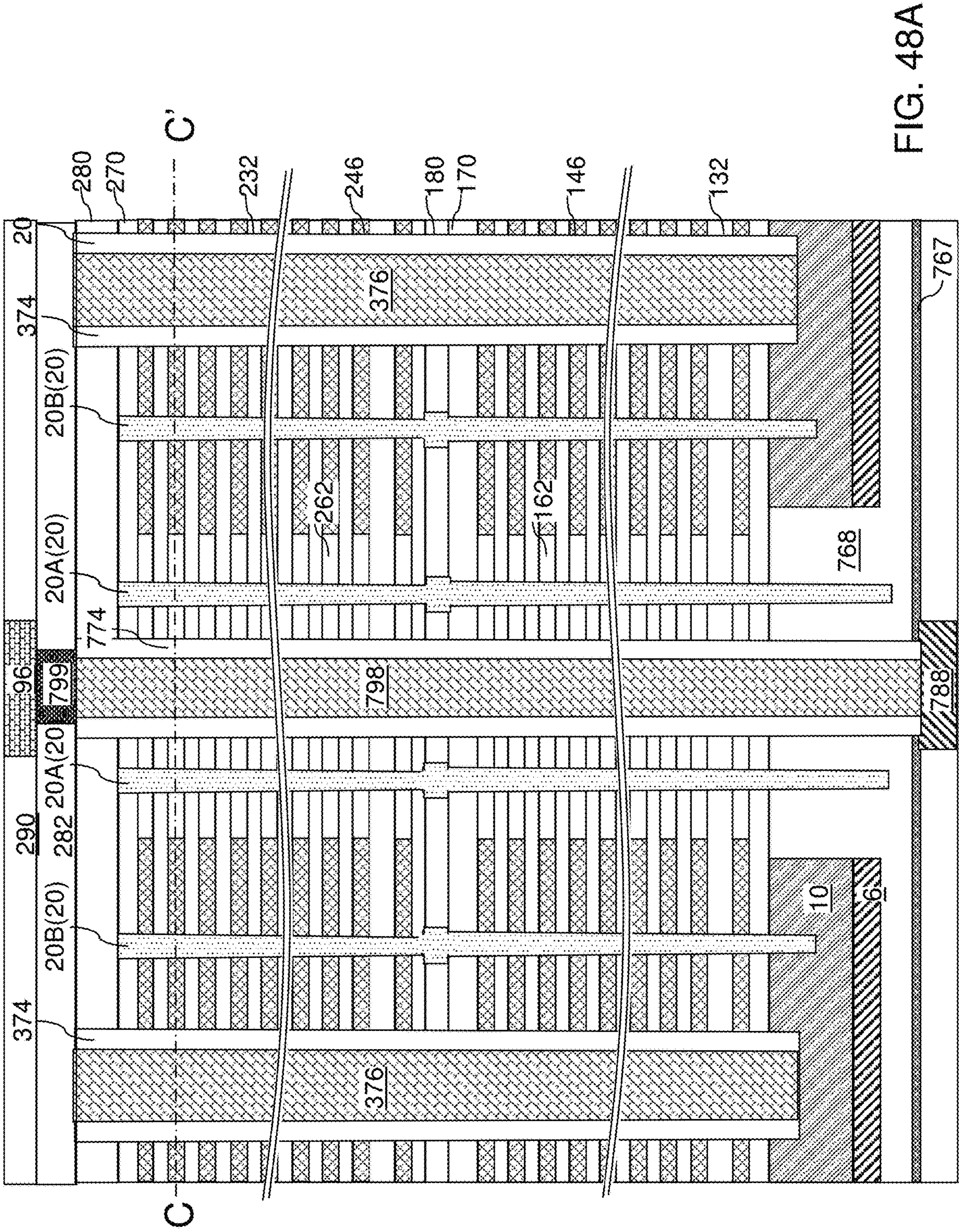

Referring to FIG. 48A, a first alternative configuration of the fourth exemplary structure can be derived from the fourth exemplary structure of FIGS. 47A-47E by extending the depth of a first subset of the first-tier support openings 119 such that bottom surfaces of first subset of the first-tier support openings 119 vertically extend below the horizontal plane including the bottom surface of the in-process source-level material layers 10'. In one embodiment, the bottom surfaces of the first support pillar structures 20A can be located below a horizontal plane including a bottom surface of a semiconductor material layer within the source-level material layer 10, which may be any of the lower source-level material layer 112, the source contact layer 114, and the upper source-level semiconductor layer 116.

Figure 48B:
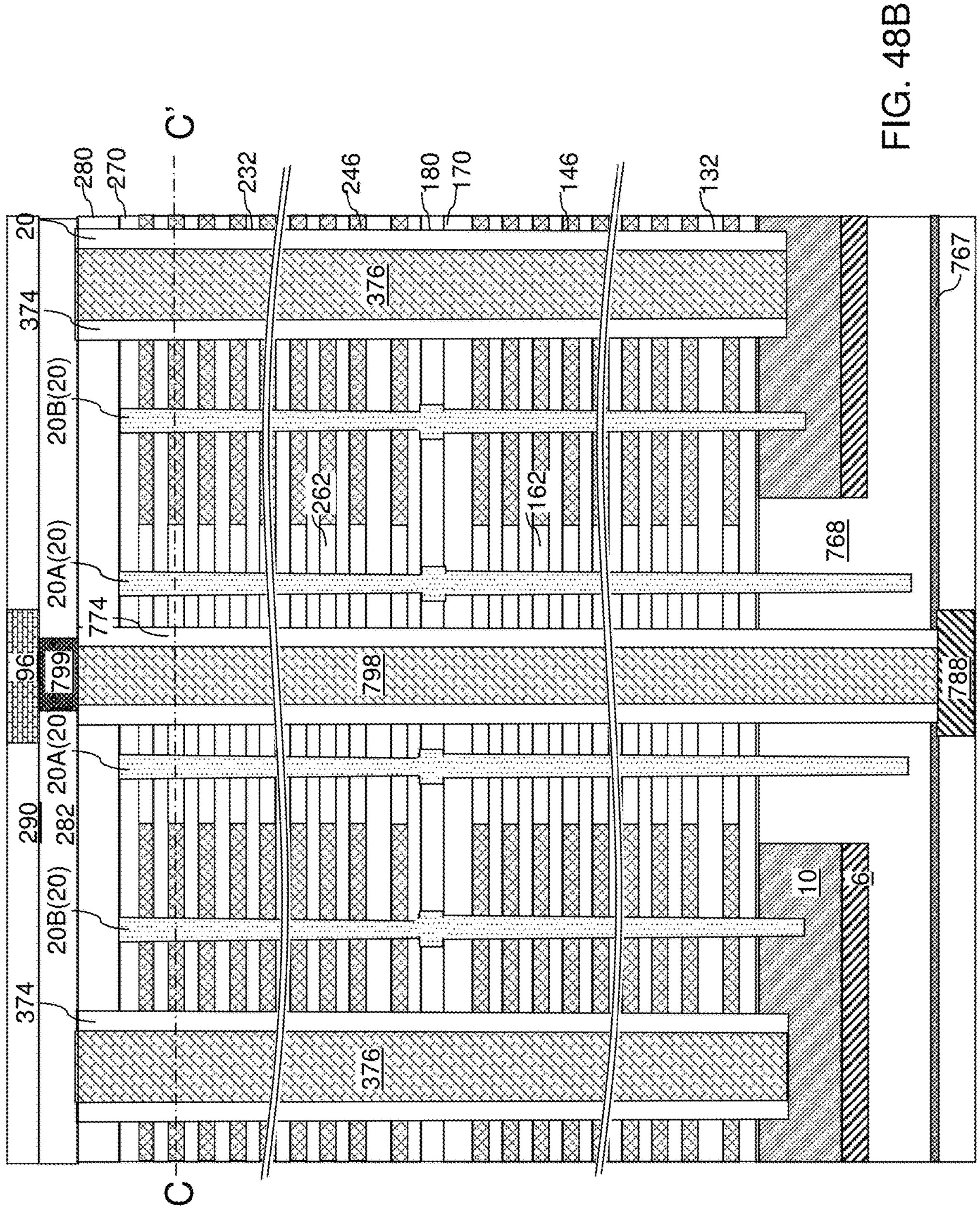

Referring to FIG. 48B, a second alternative configuration of the fourth exemplary structure can be derived from first alternative configuration of the fourth exemplary structure of FIG. 48A by increasing the thickness of a dielectric material layer within the at least one second dielectric layer 768. For example, the thickness of a dielectric material layer contacting a top surface of the etch stop dielectric layer 767 and contacting a bottom surface of the optional conductive plate layer 6 or a bottom surface of the source-level material layers 10 (in case the optional conductive plate layer is not present) may be in a range from 200 nm to 1,000 nm, although lesser and greater thicknesses may also be employed.

Figure 48C:
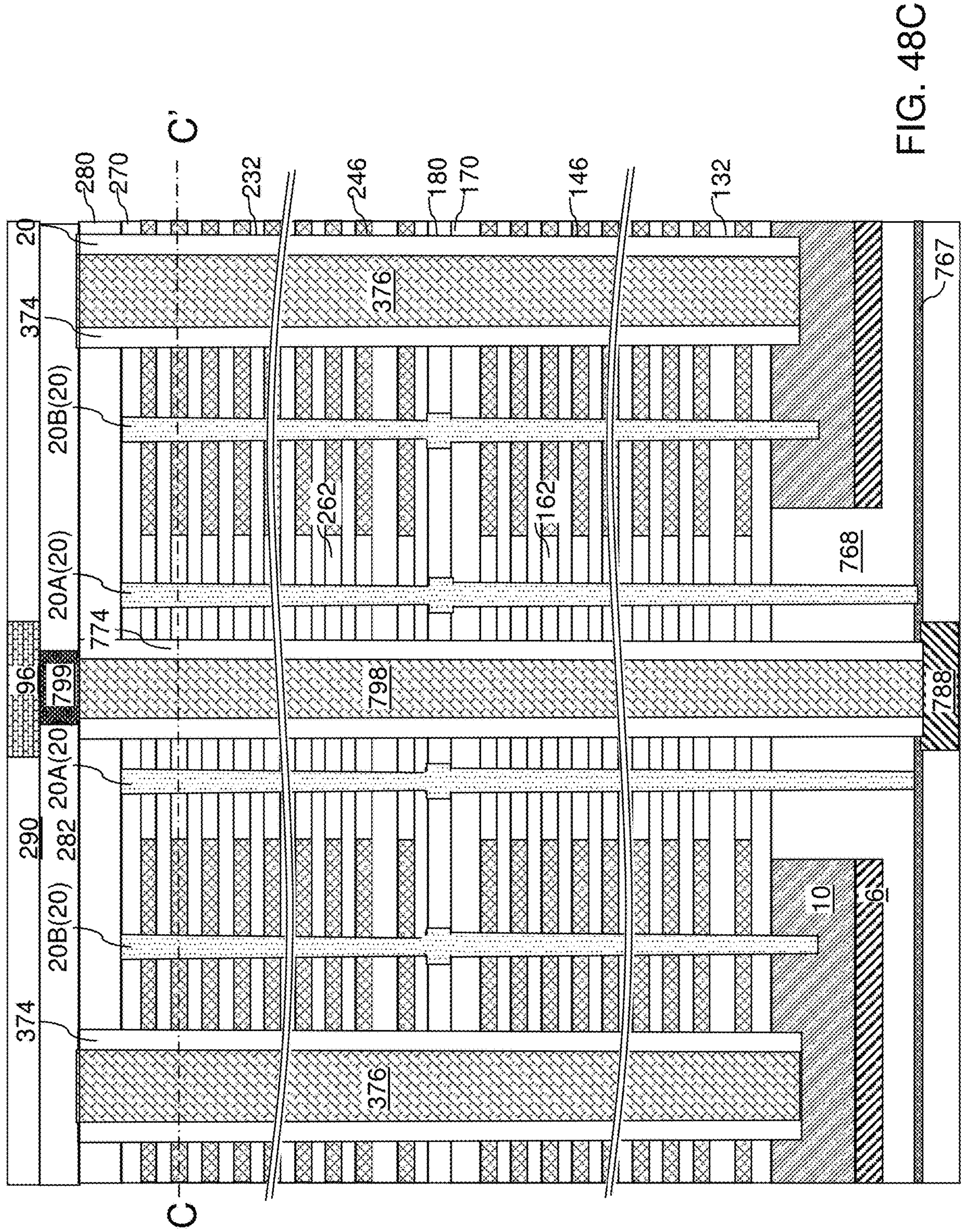

Referring to FIG. 48C, a third configuration of the fourth exemplary structure can be derived from the first alternative configuration of the fourth exemplary structure of FIG. 48A by vertically extending the depth of the first support pillar structures 20A such that first support pillar structures 20A contacts the etch stop dielectric layer 767. In one embodiment, the etch stop dielectric layer 767 may function as an etch stop structure during formation of the first-tier support openings 119, and the first support pillar structures 20A may be vertically spaced from the horizontal plane including the top surfaces of the landing-pad-level metal interconnect structures 788 by the etch stop dielectric layer 767.

Figure 48D:
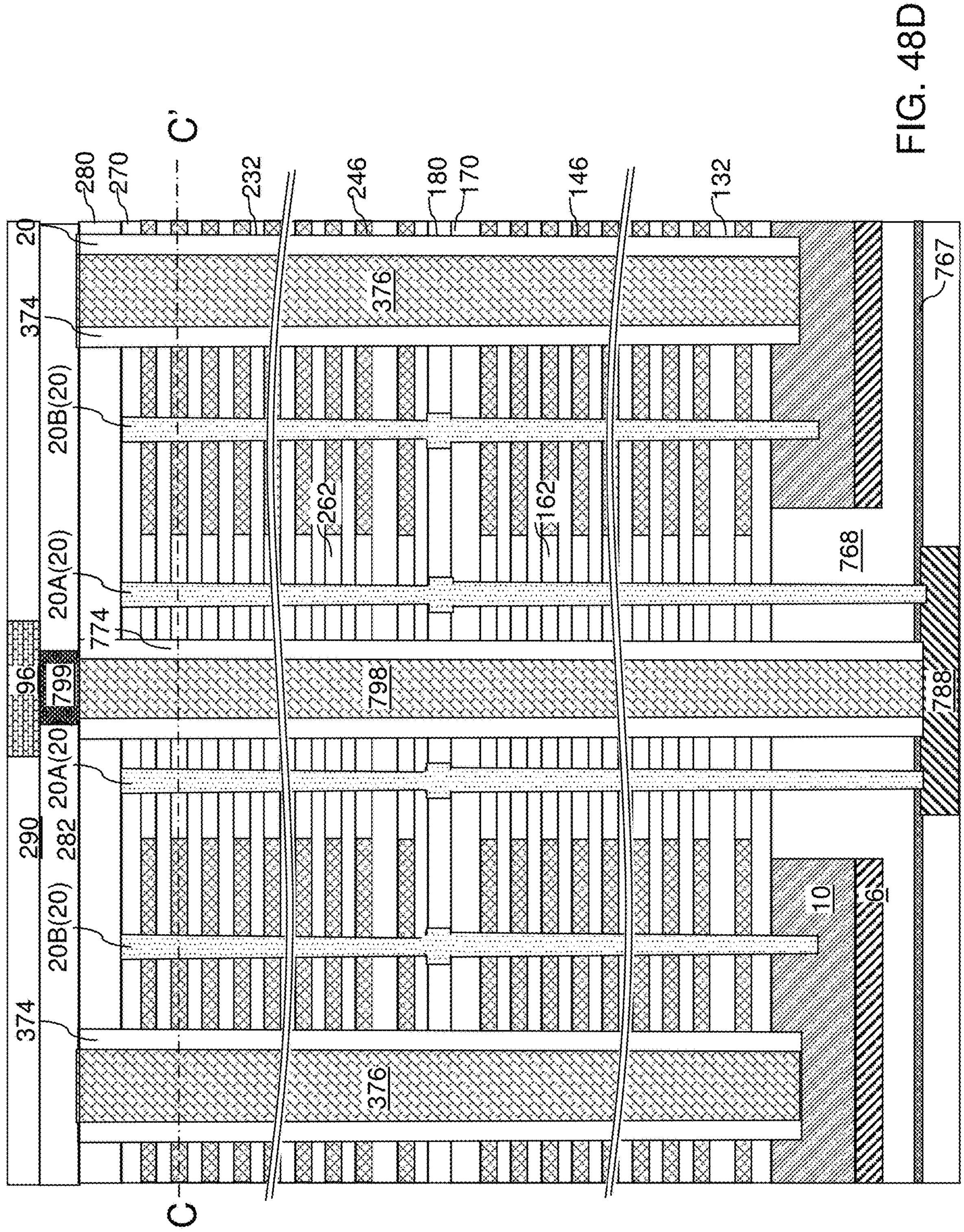

Referring to FIG. 48D, a fourth configuration of the fourth exemplary structure can be derived from the first alternative configuration of the fourth exemplary structure of FIG. 27A by vertically extending the first support pillar structures 20A through the etch stop dielectric layer 767. In one embodiment, the first support pillar structures 20A may contact top surfaces of the landing-pad-level metal interconnect structures 788.

Referring to FIGS. 26A-48D and according to various embodiments of the present disclosure, a three-dimensional memory device is provided, which comprises: a semiconductor material layer (such as a lower source-level material layer 112, a source contact layer 114, and/or an upper source-level semiconductor layer 116) overlying a substrate 8 and including an opening therein; lower-level dielectric material layers 760 located between the substrate 8 and the semiconductor material layer and extending into the opening in the semiconductor material layer; at least one alternating stack of insulating layers (132, 232) and electrically conductive layers (146, 246) overlying the semiconductor material layer; memory stack structures 55 (located within memory opening fill structures 58) vertically extending through the at least one alternating stack {(132, 146), (232, 246)}; a vertical stack of dielectric plates {(152, 252), (142', 242'), or (162, 262)} located at each level of the electrically conductive layers (146, 246); a contact via structure (such as a memory-region through-substrate-level contact via structure 798) vertically extending through the vertical stack of dielectric plates {(152, 252), (142', 242'), or (162, 262)} and through the opening in the semiconductor material layer; first support pillar structures 20A vertically extending through the vertical stack of dielectric plates {(152, 252), (142', 242'), or (162, 262)} and contacting a portion of the lower-level dielectric material layers 760 located within the opening in the semiconductor material layer; and second support pillar structures 20B vertically extending through the at least one alternating stack {(132, 146), (232, 246)} and contacting the semiconductor material layer.

In one embodiment, the first support pillar structures 20A and the second support pillar structures 20B comprise a same dielectric material. In one embodiment, bottom surfaces of the first support pillar structures 20A are located below a first horizontal plane including bottom surfaces of the second support pillar structures 20B. In one embodiment, top surfaces of the first support pillar structures 20A are located within a second horizontal plane including top surfaces of the second support pillar structures 20B. In one embodiment, the bottom surfaces of the first support pillar structures 20A are located between a horizontal plane including a bottom surface of the semiconductor material layer (which can be one of the lower source-level material layer 112, the source contact layer 114, or the upper source-level semiconductor layer 116) and another horizontal plane including a top surface of the semiconductor material layer. In one embodiment, the bottom surfaces of the first support pillar structures 20A are located below a horizontal plane including a bottom surface of the semiconductor material layer.

In one embodiment, the contact via structure (such as the memory-region through-substrate-level contact via structure 798) contacts a top surface of a metal interconnect structure (such as a landing-pad-level metal interconnect structure 788) embedded in the lower-level dielectric material layers 760. In one embodiment, the lower-level dielectric material layers 760 comprises an etch stop dielectric layer 767 contacting the top surface of the metal interconnect structure; and bottom surfaces of the first support pillar structures 20A contact the etch stop dielectric layer 767. In one embodiment, one, or each, of the first support pillar structures 20A contacts the metal interconnect structure.

In one embodiment, the dielectric plates {(152, 252), (142', 242'), or (162, 262)} in the vertical stack are interlaced with laterally extending portions of the insulating layers (132, 232) of the at least one alternating stack {(132, 146), (232, 246)}.

In one embodiment, a wall structure 176 vertically extends through the at least one alternating stack {(132, 146), (232, 246)}, contacts the insulating layers (132, 232), and contacts the vertical stack of dielectric plates (152, 252). In one embodiment, a vertical stack of insulating plates (132', 232') can be interlaced with the vertical stack of dielectric plates (142', 242'). The insulating plates (132', 232') comprise a same material as the insulating layers (132, 232) and are laterally spaced from the insulating layers (132, 232). In one embodiment, a dielectric moat fill structure 276 laterally surrounds the vertical stack of dielectric plates (142', 242') and the vertical stack of insulating plates (132', 232'), and contacts the at least one alternating stack of insulating layers (132, 232) and electrically conductive layers (146, 246). In one embodiment, each dielectric plate {(152, 252), or (162, 262)} within the vertical stack of dielectric plates {(152, 252), or (162, 262)} includes a respective sidewall segment that is equidistant from a sidewall of the contact via structure.

The various embodiments of the present disclosure can be employed to provide configurations in which first support pillar structures 20A are formed in proximity to each array-region through-substrate-level via structure 798. The proximity between the first support pillar structures 20A and volumes in which the array-region through-substrate-level via structures 798 are formed can reduce the lateral spacing among the first support pillar structures 20A. In combination with the dielectric plates {(152, 252), (142', 242'), or (162, 262)}, the first support pillar structures 20A can increase the mechanical strength of the regions in which the array-region through-substrate-level via structures 798 are subsequently formed, and enhance the structural integrity of the semiconductor structures during manufacturing.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:

a semiconductor material layer overlying a substrate and including an opening therein;

lower-level dielectric material layers located between the substrate and the semiconductor material layer and extending into the opening in the semiconductor material layer;

at least one alternating stack of insulating layers and electrically conductive layers overlying the semiconductor material layer;

memory stack structures vertically extending through the at least one alternating stack;

a vertical stack of dielectric plates located at each level of the electrically conductive layers;

a contact via structure vertically extending through the vertical stack of dielectric plates and through the opening in the semiconductor material layer;

first support pillar structures vertically extending through the vertical stack of dielectric plates and contacting a portion of the lower-level dielectric material layers located within the opening in the semiconductor material layer;

second support pillar structures vertically extending through the at least one alternating stack and contacting the semiconductor material layer; and a vertical stack of insulating plates interlaced with the vertical stack of dielectric plates, wherein the insulating plates comprise a same material as the insulating layers and are laterally spaced from the insulating layers.

2. The three-dimensional memory device of claim 1, wherein the first support pillar structures and the second support pillar structures comprise a same dielectric material.

3. The three-dimensional memory device of claim 1, wherein bottom surfaces of the first support pillar structures are located below a first horizontal plane including bottom surfaces of the second support pillar structures.

4. The three-dimensional memory device of claim 3, wherein top surfaces of the first support pillar structures are located within a second horizontal plane including top surfaces of the second support pillar structures.

5. The three-dimensional memory device of claim 3, wherein the bottom surfaces of the first support pillar structures are located between a horizontal plane including a bottom surface of the semiconductor material layer and another horizontal plane including a top surface of the semiconductor material layer.

6. The three-dimensional memory device of claim 3, wherein the bottom surfaces of the first support pillar structures are located below a horizontal plane including a bottom surface of the semiconductor material layer.

7. The three-dimensional memory device of claim 1, wherein the contact via structure contacts a top surface of a metal interconnect structure embedded in the lower-level dielectric material layers.

8. The three-dimensional memory device of claim 7, wherein:

the lower-level dielectric material layers comprise an etch stop dielectric layer contacting the top surface of the metal interconnect structure; and bottom surfaces of the first support pillar structures contact the etch stop dielectric layer.

9. The three-dimensional memory device of claim 7, wherein one of the first support pillar structures contacts the metal interconnect structure.

10. The three-dimensional memory device of claim 1, wherein the dielectric plates in the vertical stack are interlaced with laterally extending portions of the insulating layers of the at least one alternating stack.

11. The three-dimensional memory device of claim 10, further comprising a wall structure vertically extending through the at least one alternating stack, contacting the insulating layers, and contacting the vertical stack of dielectric plates.

12. The three-dimensional memory device of claim 1, further comprising a dielectric moat fill structure laterally surrounding the vertical stack of dielectric plates and the vertical stack of insulating plates and contacting the at least one alternating stack of insulating layers and electrically conductive layers.

13. The three-dimensional memory device of claim 1, wherein each dielectric plate within the vertical stack of dielectric plates includes a respective sidewall segment that is equidistant from a sidewall of the contact via structure.

14. A three-dimensional memory device comprising:

a semiconductor material layer overlying a substrate and including an opening therein;

lower-level dielectric material layers located between the substrate and the semiconductor material layer and extending into the opening in the semiconductor material layer;

at least one alternating stack of insulating layers and electrically conductive layers overlying the semiconductor material layer;

memory stack structures vertically extending through the at least one alternating stack;

a vertical stack of dielectric plates located at each level of the electrically conductive layers;

a contact via structure vertically extending through the vertical stack of dielectric plates and through the opening in the semiconductor material layer;

first support pillar structures vertically extending through the vertical stack of dielectric plates and contacting a portion of the lower-level dielectric material layers located within the opening in the semiconductor material layer; and second support pillar structures vertically extending through the at least one alternating stack and contacting the semiconductor material layer;

wherein the contact via structure contacts a top surface of a metal interconnect structure embedded in the lower-level dielectric material layers; and wherein one of the first support pillar structures contacts the metal interconnect structure.

15. A three-dimensional memory device comprising:

a semiconductor material layer overlying a substrate and including an opening therein;

lower-level dielectric material layers located between the substrate and the semiconductor material layer and extending into the opening in the semiconductor material layer;

at least one alternating stack of insulating layers and electrically conductive layers overlying the semiconductor material layer;

memory stack structures vertically extending through the at least one alternating stack;

a vertical stack of dielectric plates located at each level of the electrically conductive layers;

a contact via structure vertically extending through the vertical stack of dielectric plates and through the opening in the semiconductor material layer;

first support pillar structures vertically extending through the vertical stack of dielectric plates and contacting a portion of the lower-level dielectric material layers located within the opening in the semiconductor material layer;

second support pillar structures vertically extending through the at least one alternating stack and contacting the semiconductor material layer; and a wall structure vertically extending through the at least one alternating stack, contacting the insulating layers, and contacting the vertical stack of dielectric plates;

wherein the dielectric plates in the vertical stack are interlaced with laterally extending portions of the insulating layers of the at least one alternating stack.

* * * * *